(12) United States Patent
Henry et al.

(10) Patent No.: US 10,818,991 B2
(45) Date of Patent: *Oct. 27, 2020

(54) METHOD AND APPARATUS FOR ADJUSTING A FIELD OF A SIGNAL TO MITIGATE INTERFERENCE

(71) Applicant: AT&T Intellectual Property I, L.P., Atlanta, GA (US)

(72) Inventors: Paul Shala Henry, Holmdel, NJ (US); Robert Bennett, Southold, NY (US); Farhad Barzegar, Branchburg, NJ (US); Irwin Gerszberg, Kendall Park, NJ (US); Donald J. Barnickel, Flemington, NJ (US); Thomas M. Willis, III, Tinton Falls, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 44 days.

This patent is subject to a terminal disclaimer.

(21) Appl. No.: 16/254,238

(22) Filed: Jan. 22, 2019

(65) Prior Publication Data
US 2019/0157732 A1 May 23, 2019

Related U.S. Application Data

(60) Continuation of application No. 15/808,054, filed on Nov. 9, 2017, now Pat. No. 10,230,145, which is a
(Continued)

(51) Int. Cl.
*H01P 1/22* (2006.01)
*H04B 3/52* (2006.01)
(Continued)

(52) U.S. Cl.
CPC ............ *H01P 1/222* (2013.01); *G01R 27/32* (2013.01); *H04B 3/52* (2013.01); *H04B 3/56* (2013.01)

(58) Field of Classification Search
CPC ........... H01P 1/222; G01R 27/32; H04B 3/52; H04B 3/56
See application file for complete search history.

(56) References Cited

U.S. PATENT DOCUMENTS

| 2,542,980 A | 2/1951 | Barrow |
| 2,685,068 A | 7/1954 | Goubau |

(Continued)

FOREIGN PATENT DOCUMENTS

| CA | 2515560 A1 | 2/2007 |
| EP | 2568528 B1 | 12/2017 |

(Continued)

OTHER PUBLICATIONS

PCT/US16/36289, International Preliminary Report on Patentability, dated Jun. 29, 2017, 18 pages.
(Continued)

*Primary Examiner* — Samuel S Outten
(74) *Attorney, Agent, or Firm* — Guntin & Gust, PLC; Robert Gingher

(57) ABSTRACT

Aspects of the subject disclosure may include, for example, a system that performs operations including detecting a signal degradation of guided electromagnetic waves bound to a transmission medium without utilizing an electrical return path, the guided electromagnetic waves having a non-optical frequency range, and adjusting an alignment of at least a portion of fields of the guided electromagnetic waves to mitigate the signal degradation. Other embodiments are disclosed.

20 Claims, 50 Drawing Sheets

Related U.S. Application Data division of application No. 14/799,275, filed on Jul. 14, 2015, now Pat. No. 9,847,566.

(51) Int. Cl.
*H04B 3/56* (2006.01)
*G01R 27/32* (2006.01)

(56) References Cited

U.S. PATENT DOCUMENTS

| | | |
|---|---|---|
| 2,737,632 A | 3/1956 | Grieg et al. |
| 2,852,753 A | 9/1958 | Gent et al. |
| 2,867,776 A | 1/1959 | Wilkinson, Jr. |
| 2,912,695 A | 11/1959 | Cutler |
| 2,921,277 A | 1/1960 | Goubau |
| 3,201,724 A | 8/1965 | Hafner |
| 3,389,394 A | 6/1968 | Lewis |
| 3,566,317 A | 2/1971 | Hafner |
| 3,588,754 A | 6/1971 | Theodore |
| 4,010,799 A | 3/1977 | Kern et al. |
| 4,491,386 A | 1/1985 | Negishi et al. |
| 4,730,172 A | 3/1988 | Bengeult |
| 4,783,665 A | 11/1988 | Lier et al. |
| 4,799,031 A | 1/1989 | Lang et al. |
| 4,825,221 A | 4/1989 | Suzuki et al. |
| RE34,036 E | 8/1992 | McGeehan et al. |
| 5,235,662 A | 8/1993 | Prince et al. |
| 5,559,359 A | 9/1996 | Reyes |
| 5,642,121 A | 6/1997 | Martek et al. |
| 5,889,449 A | 3/1999 | Fiedziuszko |
| 5,937,335 A | 8/1999 | Park et al. |
| 6,239,377 B1 | 5/2001 | Nishikawa et al. |
| 6,282,354 B1 | 8/2001 | Jones et al. |
| 6,631,229 B1 | 10/2003 | Norris et al. |
| 7,009,471 B2 | 3/2006 | Elmore |
| 7,016,585 B2 | 3/2006 | Diggle, III et al. |
| 7,043,271 B1 | 5/2006 | Seto et al. |
| 7,280,033 B2 | 10/2007 | Berkman et al. |
| 7,301,424 B2 | 11/2007 | Suarez-gartner et al. |
| 7,345,623 B2 | 3/2008 | McEwan et al. |
| 7,555,182 B2 | 6/2009 | Martin et al. |
| 7,567,154 B2 | 7/2009 | Elmore |
| 7,590,404 B1 | 9/2009 | Johnson et al. |
| 7,915,980 B2 | 3/2011 | Hardacker et al. |
| 7,925,235 B2 | 4/2011 | Konya et al. |
| 8,129,817 B2 | 3/2012 | Jou et al. |
| 8,159,385 B2 | 4/2012 | Farneth et al. |
| 8,212,635 B2 | 7/2012 | Miller, II et al. |
| 8,222,977 B2 | 7/2012 | Oyama et al. |
| 8,237,617 B1 | 8/2012 | Johnson et al. |
| 8,253,516 B2 | 8/2012 | Miller, II et al. |
| 8,269,583 B2 | 9/2012 | Miller, II et al. |
| 8,344,829 B2 | 1/2013 | Miller, II et al. |
| 8,736,502 B1 | 5/2014 | Mehr et al. |
| 8,897,697 B1 | 11/2014 | Bennett et al. |
| 9,113,347 B2 | 8/2015 | Henry |
| 9,209,902 B2 | 12/2015 | Willis, III et al. |
| 9,312,919 B1 | 4/2016 | Barzegar et al. |
| 9,461,706 B1 | 10/2016 | Bennett et al. |
| 9,490,869 B1 | 11/2016 | Henry |
| 9,509,415 B1 | 11/2016 | Henry et al. |
| 9,520,945 B2 | 12/2016 | Gerszberg et al. |
| 9,525,524 B2 | 12/2016 | Barzegar et al. |
| 9,544,006 B2 | 1/2017 | Henry et al. |
| 9,564,947 B2 | 2/2017 | Stuckman et al. |
| 9,577,306 B2 | 2/2017 | Willis, III et al. |
| 9,608,692 B2 | 3/2017 | Willis, III et al. |
| 9,608,740 B2 | 3/2017 | Henry et al. |
| 9,615,269 B2 | 4/2017 | Henry et al. |
| 9,627,768 B2 | 4/2017 | Henry et al. |
| 9,628,116 B2 | 4/2017 | Willis, III et al. |
| 9,640,850 B2 | 5/2017 | Henry et al. |
| 9,653,770 B2 | 5/2017 | Henry et al. |
| 9,680,670 B2 | 6/2017 | Henry et al. |
| 9,692,101 B2 | 6/2017 | Henry et al. |
| 9,705,561 B2 | 7/2017 | Henry et al. |
| 9,705,571 B2 | 7/2017 | Gerszberg et al. |
| 9,742,462 B2 | 8/2017 | Bennett et al. |
| 9,748,626 B2 | 8/2017 | Henry et al. |
| 9,749,053 B2 | 8/2017 | Henry et al. |
| 9,722,318 B2 | 9/2017 | Adriazola et al. |
| 9,768,833 B2 | 9/2017 | Fuchs et al. |
| 9,769,020 B2 | 9/2017 | Henry et al. |
| 9,780,834 B2 | 10/2017 | Henry et al. |
| 9,793,951 B2 | 10/2017 | Henry et al. |
| 9,793,954 B2 | 10/2017 | Bennett et al. |
| 9,847,566 B2 | 12/2017 | Henry et al. |
| 9,853,342 B2 | 12/2017 | Henry et al. |
| 9,860,075 B1 | 1/2018 | Gerszberg et al. |
| 9,865,911 B2 | 1/2018 | Henry et al. |
| 9,866,309 B2 | 1/2018 | Bennett et al. |
| 9,871,282 B2 | 1/2018 | Henry et al. |
| 9,871,283 B2 | 1/2018 | Henry et al. |
| 9,876,264 B2 | 1/2018 | Barnickel et al. |
| 9,876,570 B2 | 1/2018 | Henry et al. |
| 9,876,605 B1 | 1/2018 | Henry et al. |
| 9,882,257 B2 | 1/2018 | Henry et al. |
| 9,893,795 B1 | 2/2018 | Willis et al. |
| 9,912,381 B2 | 3/2018 | Bennett et al. |
| 9,917,341 B2 | 3/2018 | Henry et al. |
| 9,991,580 B2 | 6/2018 | Henry et al. |
| 9,997,819 B2 | 6/2018 | Bennett et al. |
| 9,998,172 B1 | 6/2018 | Barzegar et al. |
| 9,998,870 B1 | 6/2018 | Bennett et al. |
| 9,999,038 B2 | 6/2018 | Barzegar et al. |
| 10,003,364 B1 | 6/2018 | Willis, III et al. |
| 10,009,063 B2 | 6/2018 | Gerszberg et al. |
| 10,009,065 B2 | 6/2018 | Henry et al. |
| 10,009,067 B2 | 6/2018 | Birk et al. |
| 10,009,901 B2 | 6/2018 | Gerszberg |
| 10,027,397 B2 | 7/2018 | Kim |
| 10,027,427 B2 | 7/2018 | Vannucci et al. |
| 10,033,107 B2 | 7/2018 | Henry et al. |
| 10,033,108 B2 | 7/2018 | Henry et al. |
| 10,044,409 B2 | 8/2018 | Barzegar et al. |
| 10,051,483 B2 | 8/2018 | Barzegar et al. |
| 10,051,488 B1 | 8/2018 | Vannucci et al. |
| 10,062,970 B1 | 8/2018 | Vannucci et al. |
| 10,069,535 B2 | 9/2018 | Vannucci et al. |
| 10,079,661 B2 | 9/2018 | Gerszberg et al. |
| 10,090,606 B2 | 10/2018 | Henry et al. |
| 10,096,883 B2 | 10/2018 | Henry et al. |
| 10,103,777 B1 | 10/2018 | Henry et al. |
| 10,103,801 B2 | 10/2018 | Bennett et al. |
| 10,123,217 B1 | 11/2018 | Barzegar et al. |
| 10,129,057 B2 | 11/2018 | Willis, III et al. |
| 10,135,145 B2 | 11/2018 | Henry et al. |
| 10,136,434 B2 | 11/2018 | Gerszberg et al. |
| 10,142,086 B2 | 11/2018 | Bennett et al. |
| 10,148,016 B2 | 12/2018 | Johnson et al. |
| 10,154,493 B2 | 12/2018 | Bennett et al. |
| 10,170,840 B2 | 1/2019 | Henry et al. |
| 10,171,158 B1 | 1/2019 | Barzegar et al. |
| 10,200,106 B1 | 2/2019 | Barzegar et al. |
| 10,205,212 B2 | 2/2019 | Henry et al. |
| 10,205,231 B1 | 2/2019 | Henry et al. |
| 10,205,655 B2 | 2/2019 | Barzegar et al. |
| 10,224,981 B2 | 3/2019 | Henry et al. |
| 10,230,426 B1 | 3/2019 | Henry et al. |
| 10,230,428 B1 | 3/2019 | Barzegar et al. |
| 10,243,270 B2 | 3/2019 | Henry et al. |
| 10,244,408 B1 | 3/2019 | Vannucci et al. |
| 10,264,586 B2 | 4/2019 | Beattie, Jr. et al. |
| 10,276,907 B2 | 4/2019 | Bennett et al. |
| 10,284,261 B1 | 5/2019 | Barzegar et al. |
| 10,291,286 B2 | 5/2019 | Henry et al. |
| 10,305,190 B2 | 5/2019 | Britz et al. |
| 10,305,192 B1 | 5/2019 | Rappaport |
| 10,305,197 B2 | 5/2019 | Henry et al. |
| 10,312,567 B2 | 6/2019 | Bennett et al. |
| 10,320,586 B2 | 6/2019 | Henry et al. |
| 10,326,495 B1 | 6/2019 | Barzegar et al. |
| 10,340,573 B2 | 7/2019 | Johnson et al. |
| 10,340,600 B2 | 7/2019 | Henry et al. |

(56) References Cited

U.S. PATENT DOCUMENTS

| | | |
|---|---|---|
| 10,340,979 B1 | 7/2019 | Barzegar et al. |
| 10,348,391 B2 | 7/2019 | Bennett et al. |
| 10,355,745 B2 | 7/2019 | Henry et al. |
| 10,361,489 B2 | 7/2019 | Britz et al. |
| 10,371,889 B1 | 8/2019 | Barzegar et al. |
| 10,374,277 B2 | 8/2019 | Henry et al. |
| 10,374,278 B2 | 8/2019 | Henry et al. |
| 10,374,281 B2 | 8/2019 | Henry et al. |
| 10,374,316 B2 | 8/2019 | Bennett et al. |
| 10,389,029 B2 | 8/2019 | Henry et al. |
| 10,389,037 B2 | 8/2019 | Johnson et al. |
| 10,389,403 B2 | 8/2019 | Henry et al. |
| 10,389,419 B2 | 8/2019 | Johnson et al. |
| 10,405,199 B1 | 9/2019 | Henry et al. |
| 10,411,356 B2 | 9/2019 | Johnson et al. |
| 10,411,920 B2 | 9/2019 | Henry et al. |
| 10,424,845 B2 | 9/2019 | Johnson et al. |
| 10,439,290 B2 | 10/2019 | Adriazola et al. |
| 10,446,899 B2 | 10/2019 | Henry et al. |
| 10,446,936 B2 | 10/2019 | Henry et al. |
| 10,454,151 B2 | 10/2019 | Henry et al. |
| 10,469,156 B1 | 11/2019 | Barzegar et al. |
| 10,469,192 B2 | 11/2019 | Wolniansky et al. |
| 10,469,228 B2 | 11/2019 | Barzegar et al. |
| 10,498,589 B2 | 12/2019 | Barzegar et al. |
| 10,505,248 B2 | 12/2019 | Henry et al. |
| 10,505,249 B2 | 12/2019 | Henry et al. |
| 10,505,250 B2 | 12/2019 | Henry et al. |
| 10,505,252 B2 | 12/2019 | Stuckman et al. |
| 10,505,584 B1 | 12/2019 | Henry et al. |
| 10,511,346 B2 | 12/2019 | Henry et al. |
| 10,516,555 B2 | 12/2019 | Henry et al. |
| 10,523,269 B1 | 12/2019 | Henry et al. |
| 10,523,388 B2 | 12/2019 | Gerszberg et al. |
| 10,530,505 B2 | 1/2020 | Henry et al. |
| 10,547,545 B2 | 1/2020 | Barzegar et al. |
| 10,553,959 B2 | 2/2020 | Vannucci et al. |
| 10,553,960 B2 | 2/2020 | Vannucci et al. |
| 10,554,454 B2 | 2/2020 | Henry et al. |
| 10,555,249 B2 | 2/2020 | Barzegar et al. |
| 10,555,318 B2 | 2/2020 | Willis, III et al. |
| 10,581,275 B2 | 3/2020 | Vannucci et al. |
| 10,587,310 B1 | 3/2020 | Bennett et al. |
| 10,601,494 B2 | 3/2020 | Vannucci |
| 10,608,312 B2 | 3/2020 | Henry et al. |
| 10,623,033 B1 | 4/2020 | Henry et al. |
| 10,623,056 B1 | 4/2020 | Bennett et al. |
| 10,623,057 B1 | 4/2020 | Bennett et al. |
| 10,629,995 B2 | 4/2020 | Rappaport |
| 10,637,149 B2 | 4/2020 | Britz |
| 10,637,535 B1 | 4/2020 | Vannucci et al. |
| 10,665,942 B2 | 5/2020 | Henry et al. |
| 10,673,116 B2 | 6/2020 | Henry et al. |
| 10,680,308 B2 | 6/2020 | Vannucci et al. |
| 10,686,493 B2 | 6/2020 | Barzegar et al. |
| 10,693,667 B2 | 6/2020 | Barzegar et al. |
| 10,714,824 B2 | 7/2020 | Bennett et al. |
| 10,714,831 B2 | 7/2020 | Vannucci et al. |
| 2003/0151548 A1 | 8/2003 | Kingsley et al. |
| 2004/0110469 A1 | 6/2004 | Judd et al. |
| 2004/0113756 A1 | 6/2004 | Mollenkopf et al. |
| 2004/0169572 A1 | 9/2004 | Elmore et al. |
| 2004/0218688 A1 | 11/2004 | Santhoff et al. |
| 2005/0017825 A1 | 1/2005 | Hansen |
| 2005/0042989 A1 | 2/2005 | Ho et al. |
| 2005/0046511 A1 | 3/2005 | Stenberg et al. |
| 2005/0085259 A1 | 4/2005 | Conner et al. |
| 2005/0111533 A1 | 5/2005 | Berkman et al. |
| 2005/0258920 A1 | 11/2005 | Elmore et al. |
| 2006/0083269 A1 | 4/2006 | Kang et al. |
| 2007/0229231 A1 | 10/2007 | Hurwitz et al. |
| 2008/0060832 A1 | 3/2008 | Razavi et al. |
| 2008/0064331 A1 | 3/2008 | Washiro et al. |
| 2008/0125036 A1 | 5/2008 | Konya et al. |
| 2008/0211727 A1 | 9/2008 | Elmore et al. |
| 2008/0252541 A1 | 10/2008 | Diaz et al. |
| 2009/0079660 A1 | 3/2009 | Elmore et al. |
| 2009/0258652 A1 | 10/2009 | Lambert et al. |
| 2010/0225426 A1 | 9/2010 | Unger et al. |
| 2010/0277003 A1 | 11/2010 | Von Novak et al. |
| 2011/0110404 A1 | 5/2011 | Washiro |
| 2011/0132658 A1 | 6/2011 | Miller, II et al. |
| 2011/0136432 A1 | 6/2011 | Miller, II et al. |
| 2011/0140911 A1 | 6/2011 | Pant et al. |
| 2011/0187578 A1 | 8/2011 | Farneth et al. |
| 2011/0215887 A1 | 9/2011 | Kunes |
| 2011/0228814 A1 | 9/2011 | Washiro et al. |
| 2011/0243255 A1 | 10/2011 | Paoletti |
| 2011/0274396 A1 | 11/2011 | Nakajima et al. |
| 2012/0105246 A1 | 5/2012 | Sexton et al. |
| 2012/0133373 A1 | 5/2012 | Ali et al. |
| 2012/0306587 A1 | 12/2012 | Strid et al. |
| 2013/0064311 A1 | 3/2013 | Turner et al. |
| 2013/0169499 A1 | 7/2013 | Lin et al. |
| 2014/0124236 A1 | 5/2014 | Vu et al. |
| 2014/0155054 A1 | 6/2014 | Henry et al. |
| 2014/0167882 A1 | 6/2014 | Shinoda et al. |
| 2014/0176340 A1 | 6/2014 | Liang et al. |
| 2014/0285277 A1 | 9/2014 | Herbsommer et al. |
| 2015/0126107 A1 | 5/2015 | Bennett et al. |
| 2015/0188584 A1 | 7/2015 | Laurent-Michel |
| 2016/0080839 A1 | 3/2016 | Fuchs et al. |
| 2016/0094879 A1 | 3/2016 | Gerszberg et al. |
| 2016/0112093 A1 | 4/2016 | Barzegar |
| 2016/0149614 A1 | 5/2016 | Barzegar |
| 2016/0164571 A1 | 6/2016 | Bennett et al. |
| 2016/0182096 A1 | 6/2016 | Panioukov et al. |
| 2016/0197642 A1 | 7/2016 | Henry et al. |
| 2016/0315660 A1 | 10/2016 | Henry |
| 2016/0315662 A1 | 10/2016 | Henry |
| 2016/0359530 A1 | 12/2016 | Bennett |
| 2016/0359541 A1 | 12/2016 | Bennett |
| 2016/0359546 A1 | 12/2016 | Bennett |
| 2017/0012667 A1 | 1/2017 | Bennett |
| 2017/0018830 A1 | 1/2017 | Henry et al. |
| 2017/0018852 A1 | 1/2017 | Adriazola et al. |
| 2017/0019130 A1 | 1/2017 | Henry et al. |
| 2017/0033465 A1 | 2/2017 | Henry et al. |
| 2017/0033953 A1 | 2/2017 | Henry et al. |
| 2017/0033954 A1 | 2/2017 | Henry et al. |
| 2017/0079037 A1 | 3/2017 | Gerszberg et al. |
| 2017/0093693 A1 | 3/2017 | Barzegar et al. |
| 2017/0110795 A1 | 4/2017 | Henry |
| 2017/0110804 A1 | 4/2017 | Henry et al. |
| 2017/0229782 A1 | 8/2017 | Adriazola et al. |
| 2018/0048497 A1 | 2/2018 | Henry et al. |
| 2018/0054232 A1 | 2/2018 | Henry et al. |
| 2018/0054233 A1 | 2/2018 | Henry et al. |
| 2018/0054234 A1 | 2/2018 | Stuckman et al. |
| 2018/0062886 A1 | 3/2018 | Henry et al. |
| 2018/0069594 A1 | 3/2018 | Henry et al. |
| 2018/0069731 A1 | 3/2018 | Henry et al. |
| 2018/0076499 A1 | 3/2018 | Henry et al. |
| 2018/0076515 A1 | 3/2018 | Perlman et al. |
| 2018/0076982 A1 | 3/2018 | Henry et al. |
| 2018/0077709 A1 | 3/2018 | Gerszberg |
| 2018/0108997 A1 | 4/2018 | Henry et al. |
| 2018/0108998 A1 | 4/2018 | Henry et al. |
| 2018/0108999 A1 | 4/2018 | Henry et al. |
| 2018/0115040 A1 | 4/2018 | Bennett et al. |
| 2018/0115058 A1 | 4/2018 | Henry et al. |
| 2018/0115060 A1 | 4/2018 | Bennett et al. |
| 2018/0115075 A1 | 4/2018 | Bennett et al. |
| 2018/0115081 A1 | 4/2018 | Johnson et al. |
| 2018/0123207 A1 | 5/2018 | Henry et al. |
| 2018/0123208 A1 | 5/2018 | Henry et al. |
| 2018/0123643 A1 | 5/2018 | Henry et al. |
| 2018/0123836 A1 | 5/2018 | Henry et al. |
| 2018/0151957 A1 | 5/2018 | Bennett et al. |
| 2018/0159195 A1 | 6/2018 | Henry et al. |
| 2018/0159228 A1 | 6/2018 | Britz et al. |
| 2018/0159229 A1 | 6/2018 | Britz |
| 2018/0159230 A1 | 6/2018 | Henry et al. |
| 2018/0159232 A1 | 6/2018 | Henry et al. |

(56) References Cited

U.S. PATENT DOCUMENTS

| | | |
|---|---|---|
| 2018/0159235 A1 | 6/2018 | Wolniansky |
| 2018/0159238 A1 | 6/2018 | Wolniansky |
| 2018/0159240 A1 | 6/2018 | Henry et al. |
| 2018/0159243 A1 | 6/2018 | Britz et al. |
| 2018/0166761 A1 | 6/2018 | Henry et al. |
| 2018/0166784 A1 | 6/2018 | Johnson et al. |
| 2018/0166785 A1 | 6/2018 | Henry et al. |
| 2018/0166787 A1 | 6/2018 | Johnson et al. |
| 2018/0167130 A1 | 6/2018 | Vannucci |
| 2018/0167927 A1 | 6/2018 | Beattie, Jr. et al. |
| 2018/0302162 A1 | 10/2018 | Gerszberg et al. |
| 2019/0013577 A1 | 1/2019 | Henry et al. |
| 2019/0013837 A1 | 1/2019 | Henry et al. |
| 2019/0074580 A1 | 3/2019 | Henry et al. |
| 2019/0074864 A1 | 3/2019 | Henry et al. |
| 2019/0074865 A1 | 3/2019 | Henry et al. |
| 2019/0075470 A1 | 3/2019 | Bennett et al. |
| 2019/0104419 A1 | 4/2019 | Barzegar et al. |
| 2019/0104420 A1 | 4/2019 | Barzegar et al. |
| 2019/0123783 A1 | 4/2019 | Henry et al. |
| 2019/0140679 A1 | 5/2019 | Vannucci et al. |
| 2019/0174506 A1 | 6/2019 | Willis, III et al. |
| 2019/0181683 A1 | 6/2019 | Vannucci et al. |
| 2019/0305413 A1 | 10/2019 | Henry et al. |
| 2020/0014423 A1 | 1/2020 | Britz |
| 2020/0076088 A1 | 3/2020 | Bennett et al. |
| 2020/0083744 A1 | 3/2020 | Vannucci et al. |
| 2020/0083927 A1 | 3/2020 | Henry et al. |
| 2020/0106477 A1 | 4/2020 | Nanni et al. |
| 2020/0153095 A1 | 5/2020 | Henry et al. |
| 2020/0153096 A1 | 5/2020 | Henry et al. |
| 2020/0161757 A1 | 5/2020 | Henry |
| 2020/0174185 A1 | 6/2020 | Barzegar et al. |
| 2020/0176847 A1 | 6/2020 | Rappaport et al. |
| 2020/0176848 A1 | 6/2020 | Bennett et al. |
| 2020/0176875 A1 | 6/2020 | Johnson |
| 2020/0176879 A1 | 6/2020 | Wolniansky et al. |
| 2020/0176881 A1 | 6/2020 | Britz et al. |
| 2020/0176890 A1 | 6/2020 | Rappaport et al. |
| 2020/0177234 A1 | 6/2020 | Barzegar et al. |
| 2020/0177237 A1 | 6/2020 | Barzegar et al. |
| 2020/0177238 A1 | 6/2020 | Barzegar et al. |
| 2020/0177239 A1 | 6/2020 | Henry et al. |
| 2020/0194863 A1 | 6/2020 | Bennett et al. |
| 2020/0195302 A1 | 6/2020 | Vannucci et al. |
| 2020/0195303 A1 | 6/2020 | Vannucci et al. |
| 2020/0195304 A1 | 6/2020 | Vannucci et al. |

FOREIGN PATENT DOCUMENTS

| | | | |
|---|---|---|---|
| EP | 1898532 | B1 | 12/2018 |
| GB | 2507269 | A | 4/2014 |
| JP | 2000077889 | A | 3/2000 |
| JP | 2013046412 | A | 3/2013 |
| WO | 8605327 | A1 | 9/1986 |
| WO | 03099740 | A1 | 12/2003 |
| WO | 2004011995 | A1 | 2/2004 |
| WO | 2008003939 | A1 | 1/2008 |
| WO | 2013008292 | A1 | 1/2013 |
| WO | 2013076499 | A3 | 7/2014 |
| WO | 2015069431 | A2 | 5/2015 |
| WO | 2016171914 | A1 | 10/2016 |
| WO | 2017/011099 | | 1/2017 |
| WO | 2018106455 | A1 | 6/2018 |
| WO | 2018106684 | A1 | 6/2018 |
| WO | 2018106915 | A1 | 6/2018 |
| WO | 2019050752 | A1 | 3/2019 |

OTHER PUBLICATIONS

"Amendment Under Article 34, Response to Written Opinion", PCT/US16/36289, Filed May 11, 2017, 8 pages.

"International Search Report and Written Opinion", PCT/US2016/036289, dated Aug. 11, 2016.

"International Search Report and Written Opinion", PCT/US2018/015634, dated Jun. 25, 2018, 8 pages.

Akalin, Tahsin et al., "Single-Wire Transmission Lines at Terahertz Frequencies", IEEE Transactions on Microwave Theory and Techniques, vol. 54, No. 6, 2006, 2762-2767.

Alam, M. N. et al., "Novel Surface Wave Exciters for Power Line Fault Detection and Communications", Department of Electrical Engineering, University of South Carolina, Antennas and Propagation (APSURSI), 2011 IEEE International Symposium, IEEE, 2011, 1-4.

Arage, Alebel et al., "Measurement of wet antenna effects on millimetre wave propagation", 2006 IEEE Conference on Radar, Abstract Only, 2006, 1 page.

Barlow, H. M. et al., "Surface Waves", 621.396.11 : 538.566, Paper No. 1482 Radio Section, 1953, pp. 329-341.

Corridor Systems, "A New Approach to Outdoor DAS Network Physical Layer Using E-Line Technology", Mar. 2011, 5 pages.

Crane, Robert K. , "Analysis of the effects of water on the ACTS propagation terminal antenna", Antennas and Propagation, IEEE Transactions on 50.7: 954965, Abstract Only, 2002, 1 page.

Elmore, Glenn et al., "A Surface Wave Transmission Line", QEX, May/Jun. 2012, pp. 3-9.

Elmore, Glenn, "Introduction to the Propagating Wave on a Single Conductor", www.corridor.biz, Jul. 27, 2009, 30 pages.

Freyer, Dan et al., "Combating the Challenges of Ka-Band Signal Degradation", SatMagazine, satmagzine.com, Sep. 2014, 9 pages.

Friedman, M et al., "Low-Loss RF Transport Over Long Distances", IEEE Transactions on Microwave Theory and Techniques, vol. 49, No. 2, Feb. 2001, 8 pages.

Goubau, Georg et al., "Investigation of a Surface-Wave Line for Long Distance Transmission", 1952, 263-267.

Goubau, Georg et al., "Investigations with a Model Surface Wave Transmission Line", IRE Transactions on Antennas and Propagation, 1957, 222-227.

Goubau, Georg, "Open Wire Lines", IRE Transactions on Microwave Theory and Techniques, 1956, 197-200.

Goubau, Georg, "Single-Conductor Surface-Wave Transmission Lines", Proceedings of the I.R.E., 1951, 619-624.

Goubau, Georg, "Surface Waves and Their Application to Transmission Lines", Radio Communication Branch, Coles Signal Laboratory, Mar. 10, 1950, 1119-1128.

Goubau, Georg , "Waves on Interfaces", IRE Transactions on Antennas and Propagation, Dec. 1959, 140-146.

Ippolito, Louis J. , "Propagation effects handbook for satellite systems design. A summary of propagation impairments on 10 to 100 GHz satellite links with techniques for system design", 1989, Abstract Only, 1989, 1 page.

Rahim, S. K. A. et al., "Measurement of wet antenna losses on 26 GHz terrestrial microwave link in Malaysia", Wireless Personal Communications 64.2, 2012, 225-231.

Ren-Bin, Zhong et al., "Surface plasmon wave propagation along single metal wire", Chin. Phys. B, vol. 21, No. 11, May 2, 2012, 9 pages.

Sommerfeld, A. , "On the propagation of electrodynamic waves along a wire", Annals of Physics and Chemistry New Edition, vol. 67, No. 2, 1899, 72 pages.

Wang, Hao et al., "Dielectric Loaded Substrate Integrated Waveguide (SIW)—Plan Horn Antennas", IEEE Transactions on Antennas and Propagation, IEEE Service Center, Piscataway, NJ, US, vol. 56, No. 3, Mar. 1, 2010, 640-647.

Wang, Kanglin, "Dispersion of Surface Plasmon Polaritons on Metal Wires in the Terahertz Frequency Range", Physical Review Letters, PRL 96, 157401, 2006, 4 pages.

Villaran, Michael et al., "Condition Monitoring of Cables Task 3 Report: Condition Monitoring Techniques for Electric Cables", Brookhaven National Laboratory, Technical Report, Nov. 30, 2009, 89 pages.

300

400

500

550

600

900

950

1100

1200

2000

2020

```
┌─────────────────────────────────┐
│ Generate first electromagnetic  │
│ waves from a first communication│
│ signal                     2032 │
└─────────────────────────────────┘
                 │
                 ▼
┌─────────────────────────────────┐
│ Induce the first electromagnetic waves with │
│ a fundamental wave mode at an interface of  │
│ a transmission medium                  2034 │
└─────────────────────────────────┘
```

```
┌─────────────────────────────────────────────┐
│ Receive second electromagnetic waves at the │
│ interface of the transmission medium   2042 │
└─────────────────────────────────────────────┘
                 │
                 ▼
┌─────────────────────────────────────────────┐
│ Generate a second communication signal      │
│ from the second electromagnetic waves       │
│ 2044                                        │
└─────────────────────────────────────────────┘
```

```
┌─────────────────────────────────┐
│ Generate first electromagnetic  │
│ waves from a first communication│
│ signal                    2052  │
└─────────────────────────────────┘
                 │
                 ▼
┌─────────────────────────────────┐
│ Induce second electromagnetic waves with a │
│ non-fundamental wave mode at an interface  │
│ of a transmission medium        2054       │
└─────────────────────────────────┘
```

```
┌─────────────────────────────────────────┐
│ Receive electromagnetic waves at the    │
│ interface of the transmission medium 2062│
└─────────────────────────────────────────┘
                 │
                 ▼
┌─────────────────────────────────────────┐
│ Generate a second communication signal  │
│ from the electromagnetic waves 2064     │
└─────────────────────────────────────────┘
```

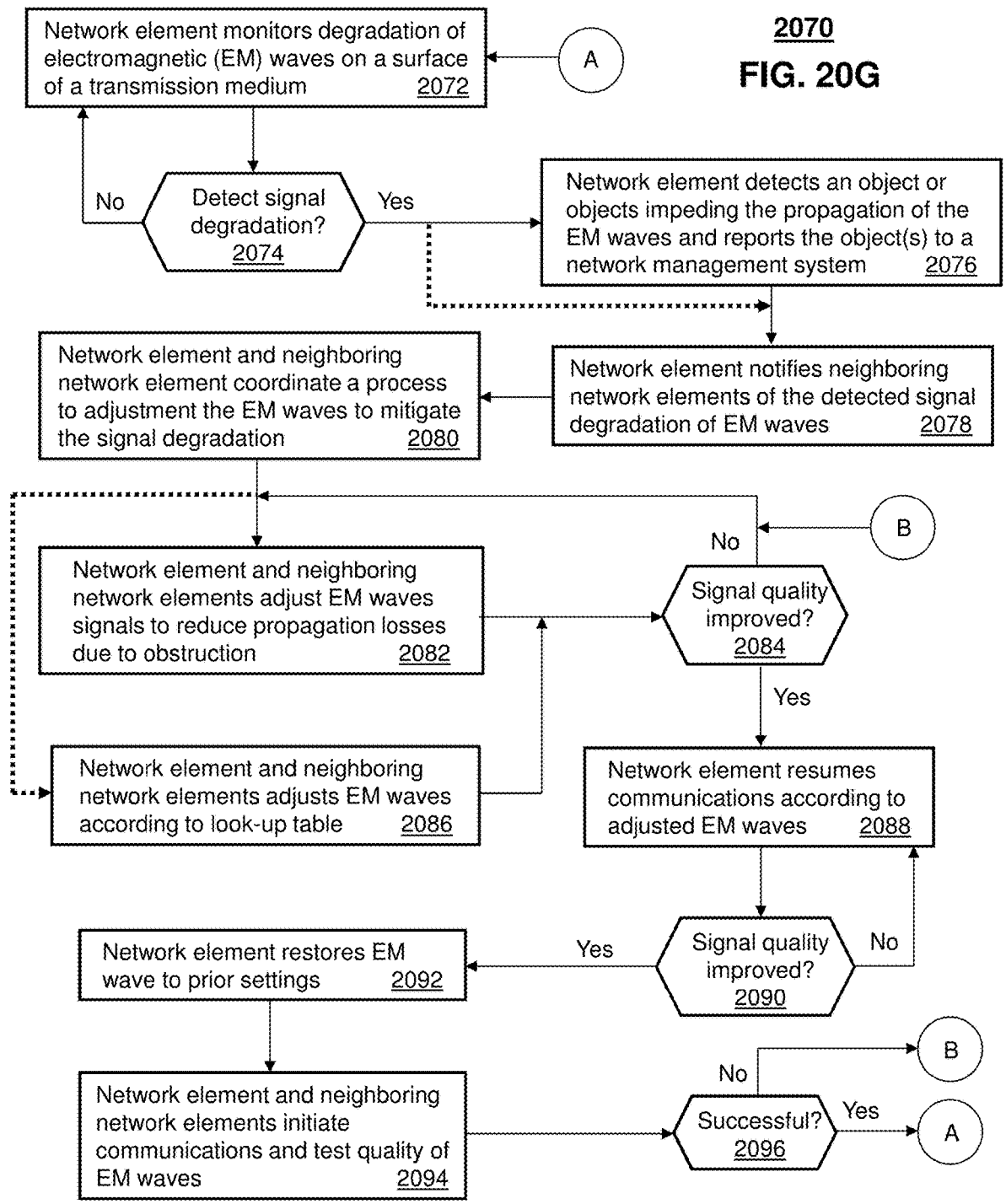

Longitudinal Section of Cable showing e-fields of TM01 waves at 40 GHz

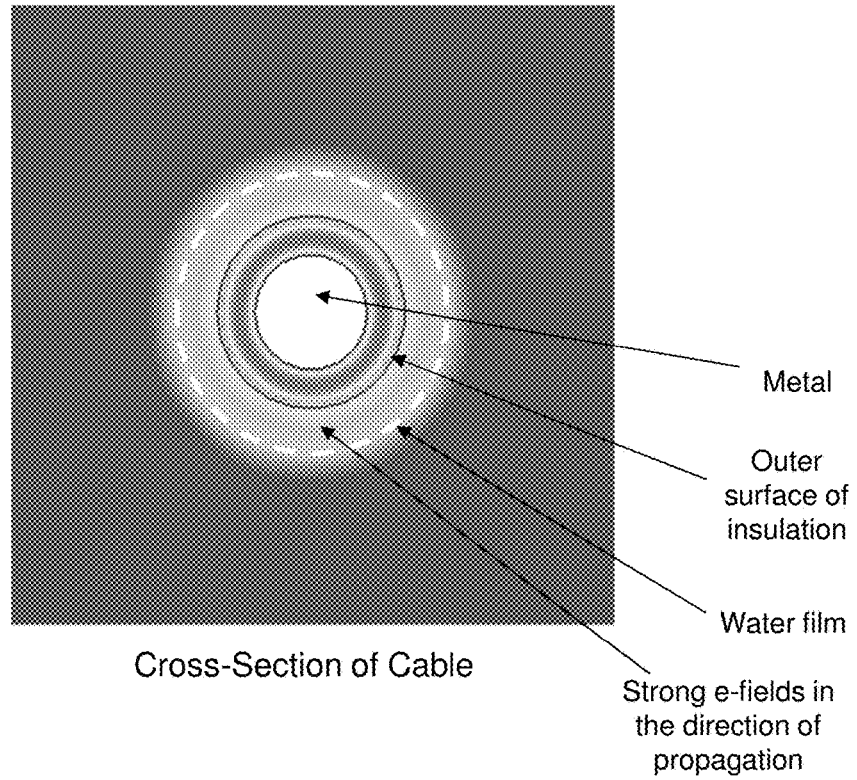

2011
FIG. 20I

Plot shows strong e-fields in direction of propagation for TM01 mode @ 45 GHz

Cross-Section of Cable

Metal

Outer surface of insulation

Water film

Strong e-fields in the direction of propagation

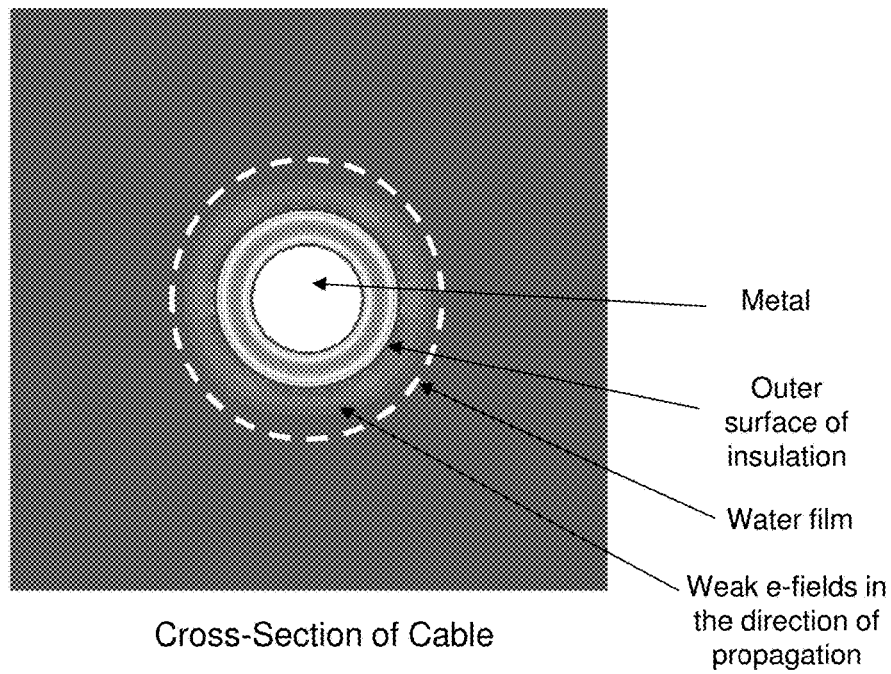

2021
FIG. 20J

Plot shows weak e-fields in direction of propagation for TM01 mode @ 40 GHz

Cross-Section of Cable

Metal

Outer surface of insulation

Water film

Weak e-fields in the direction of propagation

2031

*Goubau Wave Mode (Small Mode Size)*

2041

*HE Wave Mode (Large Mode Size)*

2051

2500

METHOD AND APPARATUS FOR ADJUSTING A FIELD OF A SIGNAL TO MITIGATE INTERFERENCE

FIELD OF THE DISCLOSURE

This application is a continuation of U.S. patent application Ser. No. 15/808,054 filed Nov. 9, 2017, which is a divisional of U.S. patent application Ser. No. 14/799,275, filed Jul. 14, 2015 (now U.S. Pat. No. 9,847,566). The contents of the foregoing are hereby incorporated by reference into this application as if set forth herein in full.

FIELD OF THE DISCLOSURE

The subject disclosure relates to communications via microwave transmission in a communication network.

BACKGROUND

As smart phones and other portable devices increasingly become ubiquitous, and data usage increases, macrocell base station devices and existing wireless infrastructure in turn require higher bandwidth capability in order to address the increased demand. To provide additional mobile bandwidth, small cell deployment is being pursued, with microcells and picocells providing coverage for much smaller areas than traditional macrocells.

In addition, most homes and businesses have grown to rely on broadband data access for services such as voice, video and Internet browsing, etc. Broadband access networks include satellite, 4G or 5G wireless, power line communication, fiber, cable, and telephone networks.

BRIEF DESCRIPTION OF THE DRAWINGS

Reference will now be made to the accompanying drawings, which are not necessarily drawn to scale, and wherein:

FIG. 20C illustrates a flow diagram of an example, non-limiting embodiment of a method for inducing electromagnetic waves on a transmission medium.

FIG. 20D illustrates a flow diagram of an example, non-limiting embodiment of a method for receiving electromagnetic waves from a transmission medium.

FIG. 20E illustrates a flow diagram of an example, non-limiting embodiment of a method for inducing electromagnetic waves on a transmission medium.

FIG. 20F illustrates a flow diagram of an example, non-limiting embodiment of a method for receiving electromagnetic waves from a transmission medium.

FIG. 20G illustrates a flow diagram of an example, non-limiting embodiment of a method for detecting and mitigating disturbances occurring in a communication network.

FIGS. 20I and 20J are block diagrams illustrating example, non-limiting embodiments of electric field intensities of different electromagnetic waves propagating in the cable illustrated in FIG. 20H in accordance with various aspects described herein.

DETAILED DESCRIPTION

Figure 1:
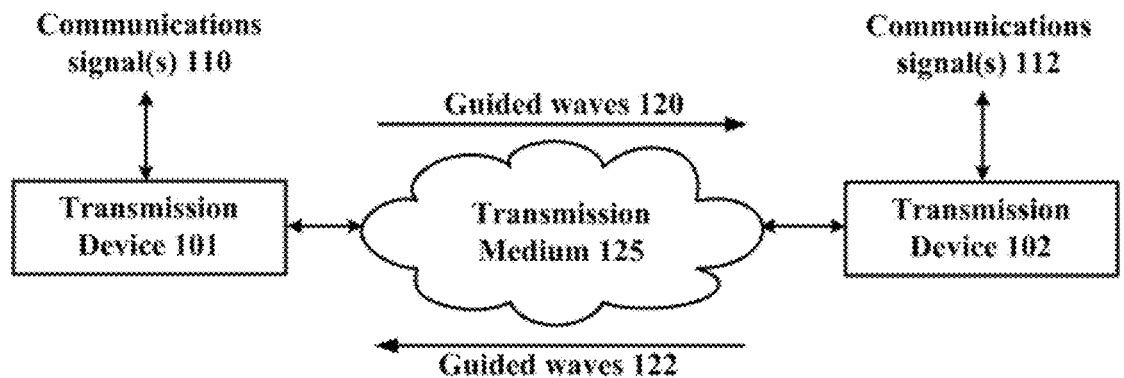
FIG. 1 is a block diagram illustrating an example, non-limiting embodiment of a guided-wave communications system in accordance with various aspects described herein.

One or more embodiments are now described with reference to the drawings, wherein like reference numerals are used to refer to like elements throughout. In the following description, for purposes of explanation, numerous details are set forth in order to provide a thorough understanding of the various embodiments. It is evident, however, that the various embodiments can be practiced without these details (and without applying to any particular networked environment or standard).

In an embodiment, a guided wave communication system is presented for sending and receiving communication signals such as data or other signaling via guided electromagnetic waves. The guided electromagnetic waves include, for example, surface waves or other electromagnetic waves that are bound to or guided by a transmission medium. It will be appreciated that a variety of transmission media can be utilized with guided wave communications without departing from example embodiments. Examples of such transmission media can include one or more of the following, either alone or in one or more combinations: wires, whether insulated or not, and whether single-stranded or multi-stranded; conductors of other shapes or configurations including wire bundles, cables, rods, rails, pipes; non-conductors such as dielectric pipes, rods, rails, or other dielectric members; combinations of conductors and dielectric materials; or other guided wave transmission media.

The inducement of guided electromagnetic waves on a transmission medium can be independent of any electrical potential, charge or current that is injected or otherwise transmitted through the transmission medium as part of an electrical circuit. For example, in the case where the transmission medium is a wire, it is to be appreciated that while a small current in the wire may be formed in response to the propagation of the guided waves along the wire, this can be due to the propagation of the electromagnetic wave along the wire surface, and is not formed in response to electrical potential, charge or current that is injected into the wire as part of an electrical circuit. The electromagnetic waves traveling on the wire therefore do not require a circuit to propagate along the wire surface. The wire therefore is a single wire transmission line that is not part of a circuit. Also, in some embodiments, a wire is not necessary, and the electromagnetic waves can propagate along a single line transmission medium that is not a wire.

More generally, "guided electromagnetic waves" or "guided waves" as described by the subject disclosure are affected by the presence of a physical object that is at least a part of the transmission medium (e.g., a bare wire or other conductor, a dielectric, an insulated wire, a conduit or other hollow element, a bundle of insulated wires that is coated, covered or surrounded by a dielectric or insulator or other wire bundle, or another form of solid, liquid or otherwise non-gaseous transmission medium) so as to be at least partially bound to or guided by the physical object and so as to propagate along a transmission path of the physical object. Such a physical object can operate as at least a part of a transmission medium that guides, by way of an interface of the transmission medium (e.g., an outer surface, inner surface, an interior portion between the outer and the inner surfaces or other boundary between elements of the transmission medium), the propagation of guided electromagnetic waves, which in turn can carry energy, data and/or other signals along the transmission path from a sending device to a receiving device.

Unlike free space propagation of wireless signals such as unguided (or unbounded) electromagnetic waves that decrease in intensity inversely by the square of the distance traveled by the unguided electromagnetic waves, guided electromagnetic waves can propagate along a transmission medium with less loss in magnitude per unit distance than experienced by unguided electromagnetic waves.

Unlike electrical signals, guided electromagnetic waves can propagate from a sending device to a receiving device without requiring a separate electrical return path between the sending device and the receiving device. As a consequence, guided electromagnetic waves can propagate from a sending device to a receiving device along a transmission medium having no conductive components (e.g., a dielectric strip), or via a transmission medium having no more than a single conductor (e.g., a single bare wire or insulated wire). Even if a transmission medium includes one or more conductive components and the guided electromagnetic waves propagating along the transmission medium generate currents that flow in the one or more conductive components in a direction of the guided electromagnetic waves, such guided electromagnetic waves can propagate along the transmission medium from a sending device to a receiving device without requiring a flow of opposing currents on an electrical return path between the sending device and the receiving device.

In a non-limiting illustration, consider electrical systems that transmit and receive electrical signals between sending and receiving devices by way of conductive media. Such systems generally rely on electrically separate forward and return paths. For instance, consider a coaxial cable having a center conductor and a ground shield that are separated by an insulator. Typically, in an electrical system a first terminal of a sending (or receiving) device can be connected to the center conductor, and a second terminal of the sending (or receiving) device can be connected to the ground shield. If the sending device injects an electrical signal in the center conductor via the first terminal, the electrical signal will propagate along the center conductor causing forward currents in the center conductor, and return currents in the ground shield. The same conditions apply for a two terminal receiving device.

In contrast, consider a guided wave communication system such as described in the subject disclosure, which can utilize different embodiments of a transmission medium (including among others a coaxial cable) for transmitting and receiving guided electromagnetic waves without an electrical return path. In one embodiment, for example, the guided wave communication system of the subject disclosure can be configured to induce guided electromagnetic waves that propagate along an outer surface of a coaxial cable. Although the guided electromagnetic waves will cause forward currents on the ground shield, the guided electromagnetic waves do not require return currents to enable the guided electromagnetic waves to propagate along the outer surface of the coaxial cable. The same can be said of other transmission media used by a guided wave communication system for the transmission and reception of guided electromagnetic waves. For example, guided electromagnetic waves induced by the guided wave communication system on an outer surface of a bare wire, or an insulated wire can propagate along the bare wire or the insulated bare wire without an electrical return path.

Consequently, electrical systems that require two or more conductors for carrying forward and reverse currents on separate conductors to enable the propagation of electrical signals injected by a sending device are distinct from guided wave systems that induce guided electromagnetic waves on an interface of a transmission medium without the need of an electrical return path to enable the propagation of the guided electromagnetic waves along the interface of the transmission medium.

It is further noted that guided electromagnetic waves as described in the subject disclosure can have an electromagnetic field structure that lies primarily or substantially outside of a transmission medium so as to be bound to or guided by the transmission medium and so as to propagate non-trivial distances on or along an outer surface of the transmission medium. In other embodiments, guided electromagnetic waves can have an electromagnetic field structure that lies primarily or substantially inside a transmission medium so as to be bound to or guided by the transmission medium and so as to propagate non-trivial distances within the transmission medium. In other embodiments, guided electromagnetic waves can have an electromagnetic field structure that lies partially inside and partially outside a transmission medium so as to be bound to or guided by the transmission medium and so as to propagate non-trivial distances along the transmission medium. The desired electronic field structure in an embodiment may vary based upon a variety of factors, including the desired transmission distance, the characteristics of the transmission medium itself, and environmental conditions/characteristics outside of the transmission medium (e.g., presence of rain, fog, atmospheric conditions, etc.).

Various embodiments described herein relate to coupling devices, that can be referred to as "waveguide coupling devices", "waveguide couplers" or more simply as "couplers", "coupling devices" or "launchers" for launching and/or extracting guided electromagnetic waves to and from a transmission medium at millimeter-wave frequencies (e.g., 30 to 300 GHz), wherein the wavelength can be small compared to one or more dimensions of the coupling device and/or the transmission medium such as the circumference of a wire or other cross sectional dimension, or lower microwave frequencies such as 300 MHz to 30 GHz. Transmissions can be generated to propagate as waves guided by a coupling device, such as: a strip, arc or other length of dielectric material; a horn, monopole, rod, slot or other antenna; an array of antennas; a magnetic resonant cavity, or other resonant coupler; a coil, a strip line, a waveguide or other coupling device. In operation, the coupling device receives an electromagnetic wave from a transmitter or transmission medium. The electromagnetic field structure of the electromagnetic wave can be carried inside the coupling device, outside the coupling device or some combination thereof. When the coupling device is in close proximity to a transmission medium, at least a portion of an electromagnetic wave couples to or is bound to the transmission medium, and continues to propagate as guided electromagnetic waves. In a reciprocal fashion, a coupling device can extract guided waves from a transmission medium and transfer these electromagnetic waves to a receiver.

According to an example embodiment, a surface wave is a type of guided wave that is guided by a surface of a transmission medium, such as an exterior or outer surface of the wire, or another surface of the wire that is adjacent to or exposed to another type of medium having different properties (e.g., dielectric properties). Indeed, in an example embodiment, a surface of the wire that guides a surface wave can represent a transitional surface between two different types of media. For example, in the case of a bare or uninsulated wire, the surface of the wire can be the outer or exterior conductive surface of the bare or uninsulated wire that is exposed to air or free space. As another example, in the case of insulated wire, the surface of the wire can be the conductive portion of the wire that meets the insulator portion of the wire, or can otherwise be the insulator surface of the wire that is exposed to air or free space, or can otherwise be any material region between the insulator surface of the wire and the conductive portion of the wire that meets the insulator portion of the wire, depending upon the relative differences in the properties (e.g., dielectric properties) of the insulator, air, and/or the conductor and further dependent on the frequency and propagation mode or modes of the guided wave.

According to an example embodiment, the term "about" a wire or other transmission medium used in conjunction with a guided wave can include fundamental guided wave propagation modes such as a guided waves having a circular or substantially circular field distribution, a symmetrical electromagnetic field distribution (e.g., electric field, magnetic field, electromagnetic field, etc.) or other fundamental mode pattern at least partially around a wire or other transmission medium. In addition, when a guided wave propagates "about" a wire or other transmission medium, it can do so according to a guided wave propagation mode that includes not only the fundamental wave propagation modes (e.g., zero order modes), but additionally or alternatively non-fundamental wave propagation modes such as higher-order guided wave modes (e.g., $1^{st}$ order modes, $2^{nd}$ order modes, etc.), asymmetrical modes and/or other guided (e.g., surface) waves that have non-circular field distributions around a wire or other transmission medium. As used herein, the term "guided wave mode" refers to a guided wave propagation mode of a transmission medium, coupling device or other system component of a guided wave communication system.

For example, such non-circular field distributions can be unilateral or multi-lateral with one or more axial lobes characterized by relatively higher field strength and/or one or more nulls or null regions characterized by relatively low-field strength, zero-field strength or substantially zero-field strength. Further, the field distribution can otherwise vary as a function of azimuthal orientation around the wire such that one or more angular regions around the wire have an electric or magnetic field strength (or combination thereof) that is higher than one or more other angular regions of azimuthal orientation, according to an example embodiment. It will be appreciated that the relative orientations or positions of the guided wave higher order modes or asymmetrical modes can vary as the guided wave travels along the wire.

As used herein, the term "millimeter-wave" can refer to electromagnetic waves/signals that fall within the "millimeter-wave frequency band" of 30 GHz to 300 GHz. The term "microwave" can refer to electromagnetic waves/signals that fall within a "microwave frequency band" of 300 MHz to 300 GHz. The term "radio frequency" or "RF" can refer to electromagnetic waves/signals that fall within the "radio frequency band" of 10 kHz to 1 THz. It is appreciated that wireless signals, electrical signals, and guided electromagnetic waves as described in the subject disclosure can be configured to operate at any desirable frequency range, such as, for example, at frequencies within, above or below millimeter-wave and/or microwave frequency bands. In particular, when a coupling device or transmission medium includes a conductive element, the frequency of the guided electromagnetic waves that are carried by the coupling device and/or propagate along the transmission medium can be below the mean collision frequency of the electrons in the conductive element. Further, the frequency of the guided electromagnetic waves that are carried by the coupling device and/or propagate along the transmission medium can be a non-optical frequency, e.g., a radio frequency below the range of optical frequencies that begins at 1 THz.

As used herein, the term "antenna" can refer to a device that is part of a transmitting or receiving system to transmit/radiate or receive wireless signals.

In accordance with one or more embodiments, a method can include receiving, by a waveguide system, electromagnetic waves guided by an outer surface of a transmission medium without utilizing an electrical return path, the electromagnetic waves having a non-optical frequency range, detecting, by the waveguide system, an attenuation of the electromagnetic waves, and coordinating, by the waveguide system with a neighboring waveguide system, an adjustment of an orientation of at least a portion of electric fields of the electromagnetic waves to mitigate the attenuation.

In accordance with one or more embodiments, a waveguide system can include a processor, and a memory that stores executable instructions that, when executed by the processor, facilitate performance of operations. The operations can include receiving electromagnetic waves guided by an outer surface of a transmission medium that propagate on the outer surface of the transmission medium without utilizing an electrical return path, and coordinating with a neighboring waveguide system an adjustment of a polarization of at least a portion of fields of the electromagnetic waves responsive to determining that the electromagnetic waves do not conform to a quality metric.

In accordance with one or more embodiments, a machine-readable storage medium, including executable instructions that, when executed by a processor, facilitate performance of operations. The operations can include detecting a signal degradation of guided electromagnetic waves bound to a transmission medium without utilizing an electrical return path, the guided electromagnetic waves having a non-optical frequency range, and adjusting an alignment of at least a portion of fields of the guided electromagnetic waves to mitigate the signal degradation.

Referring now to FIG. 1, a block diagram 100 illustrating an example, non-limiting embodiment of a guided wave communications system is shown. In operation, a transmission device 101 receives one or more communication signals 110 from a communication network or other communications device that includes data and generates guided waves 120 to convey the data via the transmission medium 125 to the transmission device 102. The transmission device 102 receives the guided waves 120 and converts them to communication signals 112 that include the data for transmission to a communications network or other communications device. The guided waves 120 can be modulated to convey data via a modulation technique such as phase shift keying, frequency shift keying, quadrature amplitude modulation, amplitude modulation, multi-carrier modulation such as orthogonal frequency division multiplexing and via multiple access techniques such as frequency division multiplexing, time division multiplexing, code division multiplexing, multiplexing via differing wave propagation modes and via other modulation and access strategies.

The communication network or networks can include a wireless communication network such as a mobile data network, a cellular voice and data network, a wireless local area network (e.g., WiFi or an 802.xx network), a satellite communications network, a personal area network or other wireless network. The communication network or networks can also include a wired communication network such as a telephone network, an Ethernet network, a local area network, a wide area network such as the Internet, a broadband access network, a cable network, a fiber optic network, or other wired network. The communication devices can include a network edge device, bridge device or home gateway, a set-top box, broadband modem, telephone adapter, access point, base station, or other fixed communication device, a mobile communication device such as an automotive gateway or automobile, laptop computer, tablet, smartphone, cellular telephone, or other communication device.

In an example embodiment, the guided wave communication system 100 can operate in a bi-directional fashion where transmission device 102 receives one or more communication signals 112 from a communication network or device that includes other data and generates guided waves 122 to convey the other data via the transmission medium 125 to the transmission device 101. In this mode of operation, the transmission device 101 receives the guided waves 122 and converts them to communication signals 110 that include the other data for transmission to a communications network or device. The guided waves 122 can be modulated to convey data via a modulation technique such as phase shift keying, frequency shift keying, quadrature amplitude modulation, amplitude modulation, multi-carrier modulation such as orthogonal frequency division multiplexing and via multiple access techniques such as frequency division multiplexing, time division multiplexing, code division multiplexing, multiplexing, multiplexing via differing wave propagation modes and via other modulation and access strategies.

The transmission medium 125 can include a cable having at least one inner portion surrounded by a dielectric material such as an insulator or other dielectric cover, coating or other dielectric material, the dielectric material having an outer surface and a corresponding circumference. In an example embodiment, the transmission medium 125 operates as a single-wire transmission line to guide the transmission of an electromagnetic wave. When the transmission medium 125 is implemented as a single wire transmission system, it can include a wire. The wire can be insulated or uninsulated, and single-stranded or multi-stranded (e.g., braided). In other embodiments, the transmission medium 125 can contain conductors of other shapes or configurations including wire bundles, cables, rods, rails, pipes. In addition, the transmission medium 125 can include non-conductors such as dielectric pipes, rods, rails, or other dielectric members; combinations of conductors and dielectric materials, conductors without dielectric materials or other guided wave transmission media. It should be noted that the transmission medium 125 can otherwise include any of the transmission media previously discussed.

Further, as previously discussed, the guided waves 120 and 122 can be contrasted with radio transmissions over free space/air or conventional propagation of electrical power or signals through the conductor of a wire via an electrical circuit. In addition to the propagation of guided waves 120 and 122, the transmission medium 125 may optionally contain one or more wires that propagate electrical power or other communication signals in a conventional manner as a part of one or more electrical circuits.

Figure 2:
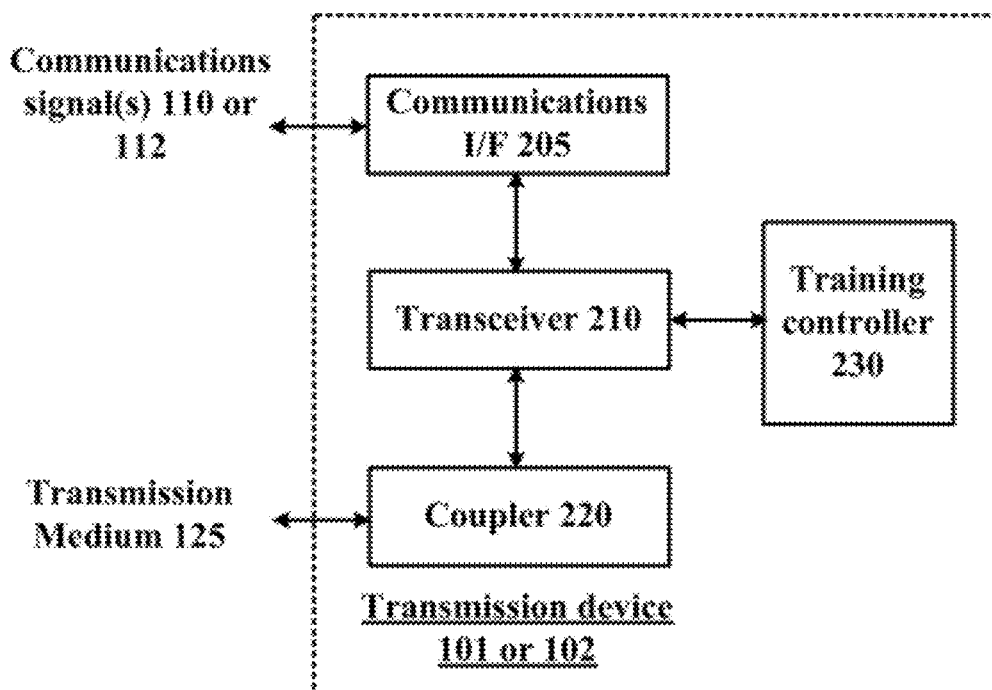
FIG. 2 is a block diagram illustrating an example, non-limiting embodiment of a transmission device in accordance with various aspects described herein.

Referring now to FIG. 2, a block diagram 200 illustrating an example, non-limiting embodiment of a transmission device is shown. The transmission device 101 or 102 includes a communications interface (I/F) 205, a transceiver 210 and a coupler 220.

In an example of operation, the communications interface 205 receives a communication signal 110 or 112 that includes data. In various embodiments, the communications interface 205 can include a wireless interface for receiving a wireless communication signal in accordance with a wireless standard protocol such as LTE or other cellular voice and data protocol, WiFi or an 802.11 protocol, WIMAX protocol, Ultra Wideband protocol, Bluetooth protocol, ZigBee protocol, a direct broadcast satellite (DBS) or other satellite communication protocol or other wireless protocol. In addition or in the alternative, the communications interface 205 includes a wired interface that operates in accordance with an Ethernet protocol, universal serial bus (USB) protocol, a data over cable service interface specification (DOCSIS) protocol, a digital subscriber line (DSL) protocol, a Firewire (IEEE 1394) protocol, or other wired protocol. In additional to standards-based protocols, the communications interface 205 can operate in conjunction with other wired or wireless protocol. In addition, the communications interface 205 can optionally operate in conjunction with a protocol stack that includes multiple protocol layers including a MAC protocol, transport protocol, application protocol, etc.

In an example of operation, the transceiver 210 generates an electromagnetic wave based on the communication signal 110 or 112 to convey the data. The electromagnetic wave has at least one carrier frequency and at least one corresponding wavelength. The carrier frequency can be within a millimeter-wave frequency band of 30 GHz-300 GHz, such as 60 GHz or a carrier frequency in the range of 30-40 GHz or a lower frequency band of 300 MHz-30 GHz in the microwave frequency range such as 26-30 GHz, 11 GHz, 6 GHz or 3 GHz, but it will be appreciated that other carrier frequencies are possible in other embodiments. In one mode of operation, the transceiver 210 merely upconverts the communications signal or signals 110 or 112 for transmission of the electromagnetic signal in the microwave or millimeter-wave band as a guided electromagnetic wave that is guided by or bound to the transmission medium 125. In another mode of operation, the communications interface 205 either converts the communication signal 110 or 112 to a baseband or near baseband signal or extracts the data from the communication signal 110 or 112 and the transceiver 210 modulates a high-frequency carrier with the data, the baseband or near baseband signal for transmission. It should be appreciated that the transceiver 210 can modulate the data received via the communication signal 110 or 112 to preserve one or more data communication protocols of the communication signal 110 or 112 either by encapsulation in the payload of a different protocol or by simple frequency shifting. In the alternative, the transceiver 210 can otherwise translate the data received via the communication signal 110 or 112 to a protocol that is different from the data communication protocol or protocols of the communication signal 110 or 112.

In an example of operation, the coupler 220 couples the electromagnetic wave to the transmission medium 125 as a guided electromagnetic wave to convey the communications signal or signals 110 or 112. While the prior description has focused on the operation of the transceiver 210 as a transmitter, the transceiver 210 can also operate to receive electromagnetic waves that convey other data from the single wire transmission medium via the coupler 220 and to generate communications signals 110 or 112, via communications interface 205 that includes the other data. Consider embodiments where an additional guided electromagnetic wave conveys other data that also propagates along the transmission medium 125. The coupler 220 can also couple this additional electromagnetic wave from the transmission medium 125 to the transceiver 210 for reception.

The transmission device 101 or 102 includes an optional training controller 230. In an example embodiment, the training controller 230 is implemented by a standalone processor or a processor that is shared with one or more other components of the transmission device 101 or 102. The training controller 230 selects the carrier frequencies, modulation schemes and/or guided wave modes for the guided electromagnetic waves based on feedback data received by the transceiver 210 from at least one remote transmission device coupled to receive the guided electromagnetic wave.

In an example embodiment, a guided electromagnetic wave transmitted by a remote transmission device 101 or 102 conveys data that also propagates along the transmission medium 125. The data from the remote transmission device 101 or 102 can be generated to include the feedback data. In operation, the coupler 220 also couples the guided electromagnetic wave from the transmission medium 125 and the transceiver receives the electromagnetic wave and processes the electromagnetic wave to extract the feedback data.

In an example embodiment, the training controller 230 operates based on the feedback data to evaluate a plurality of candidate frequencies, modulation schemes and/or transmission modes to select a carrier frequency, modulation scheme and/or transmission mode to enhance performance, such as throughput, signal strength, reduce propagation loss, etc.

Consider the following example: a transmission device 101 begins operation under control of the training controller 230 by sending a plurality of guided waves as test signals such as pilot waves or other test signals at a corresponding plurality of candidate frequencies and/or candidate modes directed to a remote transmission device 102 coupled to the transmission medium 125. The guided waves can include, in addition or in the alternative, test data. The test data can indicate the particular candidate frequency and/or guidewave mode of the signal. In an embodiment, the training controller 230 at the remote transmission device 102 receives the test signals and/or test data from any of the guided waves that were properly received and determines the best candidate frequency and/or guided wave mode, a set of acceptable candidate frequencies and/or guided wave modes, or a rank ordering of candidate frequencies and/or guided wave modes. This selection of candidate frequenc(ies) or/and guided-mode(s) are generated by the training controller 230 based on one or more optimizing criteria such as received signal strength, bit error rate, packet error rate, signal to noise ratio, propagation loss, etc. The training controller 230 generates feedback data that indicates the selection of candidate frequenc(ies) or/and guided wave mode(s) and sends the feedback data to the transceiver 210 for transmission to the transmission device 101. The transmission device 101 and 102 can then communicate data with one another based on the selection of candidate frequenc(ies) or/and guided wave mode(s).

In other embodiments, the guided electromagnetic waves that contain the test signals and/or test data are reflected back, repeated back or otherwise looped back by the remote transmission device 102 to the transmission device 101 for reception and analysis by the training controller 230 of the transmission device 101 that initiated these waves. For example, the transmission device 101 can send a signal to the remote transmission device 102 to initiate a test mode where a physical reflector is switched on the line, a termination impedance is changed to cause reflections, a loop back mode is switched on to couple electromagnetic waves back to the source transmission device 102, and/or a repeater mode is enabled to amplify and retransmit the electromagnetic waves back to the source transmission device 102. The training controller 230 at the source transmission device 102 receives the test signals and/or test data from any of the guided waves that were properly received and determines selection of candidate frequenc(ies) or/and guided wave mode(s).

While the procedure above has been described in a start-up or initialization mode of operation, each transmission device 101 or 102 can send test signals, evaluate candidate frequencies or guided wave modes via non-test such as normal transmissions or otherwise evaluate candidate frequencies or guided wave modes at other times or continuously as well. In an example embodiment, the communication protocol between the transmission devices 101 and 102 can include an on-request or periodic test mode where either full testing or more limited testing of a subset of candidate frequencies and guided wave modes are tested and evaluated. In other modes of operation, the re-entry into such a test mode can be triggered by a degradation of performance due to a disturbance, weather conditions, etc. In an example embodiment, the receiver bandwidth of the transceiver 210 is either sufficiently wide or swept to receive all candidate frequencies or can be selectively adjusted by the training controller 230 to a training mode where the receiver bandwidth of the transceiver 210 is sufficiently wide or swept to receive all candidate frequencies.

Figure 3:
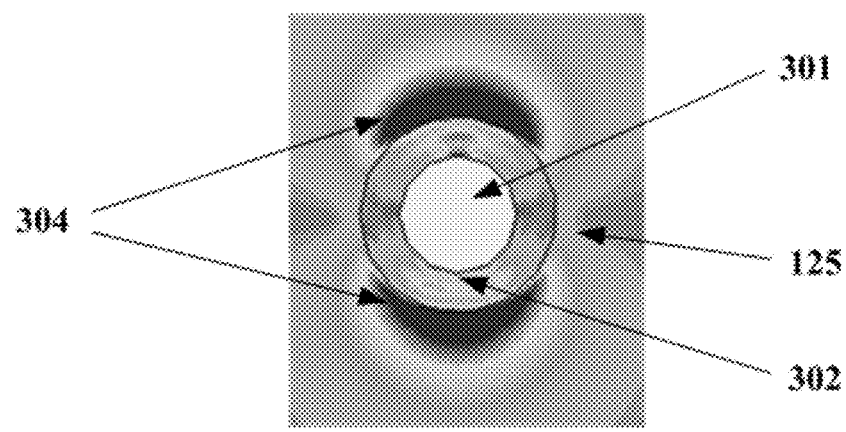
FIG. 3 is a graphical diagram illustrating an example, non-limiting embodiment of an electromagnetic field distribution in accordance with various aspects described herein.

Referring now to FIG. 3, a graphical diagram 300 illustrating an example, non-limiting embodiment of an electromagnetic field distribution is shown. In this embodiment, a transmission medium 125 in air includes an inner conductor 301 and an insulating jacket 302 of dielectric material, as shown in cross section. The diagram 300 includes different gray-scales that represent differing electromagnetic field strengths generated by the propagation of the guided wave having an asymmetrical and non-fundamental guided wave mode.

In particular, the electromagnetic field distribution corresponds to a modal "sweet spot" that enhances guided electromagnetic wave propagation along an insulated transmission medium and reduces end-to-end transmission loss. In this particular mode, electromagnetic waves are guided by the transmission medium 125 to propagate along an outer surface of the transmission medium—in this case, the outer surface of the insulating jacket 302. Electromagnetic waves are partially embedded in the insulator and partially radiating on the outer surface of the insulator. In this fashion, electromagnetic waves are "lightly" coupled to the insulator so as to enable electromagnetic wave propagation at long distances with low propagation loss.

As shown, the guided wave has a field structure that lies primarily or substantially outside of the transmission medium 125 that serves to guide the electromagnetic waves. The regions inside the conductor 301 have little or no field. Likewise regions inside the insulating jacket 302 have low field strength. The majority of the electromagnetic field strength is distributed in the lobes 304 at the outer surface of the insulating jacket 302 and in close proximity thereof. The presence of an asymmetric guided wave mode is shown by the high electromagnetic field strengths at the top and bottom of the outer surface of the insulating jacket 302 (in the orientation of the diagram)—as opposed to very small field strengths on the other sides of the insulating jacket 302.

The example shown corresponds to a 38 GHz electromagnetic wave guided by a wire with a diameter of 1.1 cm and a dielectric insulation of thickness of 0.36 cm. Because the electromagnetic wave is guided by the transmission medium 125 and the majority of the field strength is concentrated in the air outside of the insulating jacket 302 within a limited distance of the outer surface, the guided wave can propagate longitudinally down the transmission medium 125 with very low loss. In the example shown, this "limited distance" corresponds to a distance from the outer surface that is less than half the largest cross sectional dimension of the transmission medium 125. In this case, the largest cross sectional dimension of the wire corresponds to the overall diameter of 1.82 cm, however, this value can vary with the size and shape of the transmission medium 125. For example, should the transmission medium 125 be of a rectangular shape with a height of 0.3 cm and a width of 0.4 cm, the largest cross sectional dimension would be the diagonal of 0.5 cm and the corresponding limited distance would be 0.25 cm. The dimensions of the area containing the majority of the field strength also vary with the frequency, and in general, increase as carrier frequencies decrease.

It should also be noted that the components of a guided wave communication system, such as couplers and transmission media can have their own cut-off frequencies for each guided wave mode. The cut-off frequency generally sets forth the lowest frequency that a particular guided wave mode is designed to be supported by that particular component. In an example embodiment, the particular asymmetric mode of propagation shown is induced on the transmission medium 125 by an electromagnetic wave having a frequency that falls within a limited range (such as Fc to 2Fc) of the lower cut-off frequency Fc for this particular asymmetric mode. The lower cut-off frequency Fc is particular to the characteristics of transmission medium 125. For embodiments as shown that include an inner conductor 301 surrounded by an insulating jacket 302, this cutoff frequency can vary based on the dimensions and properties of the insulating jacket 302 and potentially the dimensions and properties of the inner conductor 301 and can be determined experimentally to have a desired mode pattern. It should be noted however, that similar effects can be found for a hollow dielectric or insulator without an inner conductor. In this case, the cutoff frequency can vary based on the dimensions and properties of the hollow dielectric or insulator.

At frequencies lower than the lower cut-off frequency, the asymmetric mode is difficult to induce in the transmission medium 125 and fails to propagate for all but trivial distances. As the frequency increases above the limited range of frequencies about the cut-off frequency, the asymmetric mode shifts more and more inward of the insulating jacket 302. At frequencies much larger than the cut-off frequency, the field strength is no longer concentrated outside of the insulating jacket, but primarily inside of the insulating jacket 302. While the transmission medium 125 provides strong guidance to the electromagnetic wave and propagation is still possible, ranges are more limited by increased losses due to propagation within the insulating jacket 302—as opposed to the surrounding air.

Figure 4:
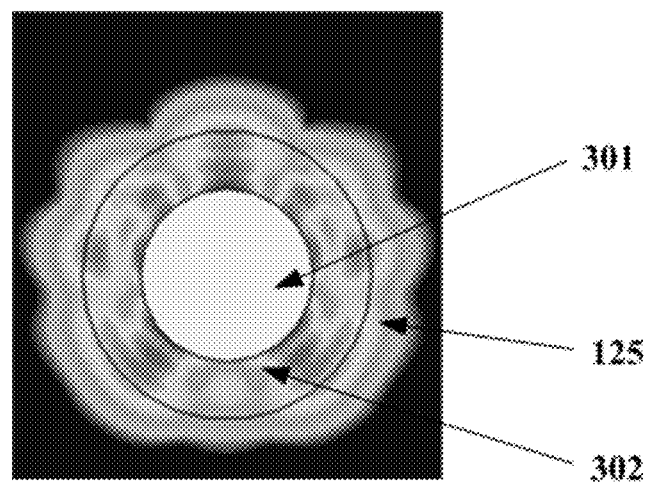
FIG. 4 is a graphical diagram illustrating an example, non-limiting embodiment of an electromagnetic field distribution in accordance with various aspects described herein.

Referring now to FIG. 4, a graphical diagram 400 illustrating an example, non-limiting embodiment of an electromagnetic field distribution is shown. In particular, a cross section diagram 400, similar to FIG. 3 is shown with common reference numerals used to refer to similar elements. The example shown corresponds to a 60 GHz wave guided by a wire with a diameter of 1.1 cm and a dielectric insulation of thickness of 0.36 cm. Because the frequency of the guided wave is above the limited range of the cut-off frequency of this particular asymmetric mode, much of the field strength has shifted inward of the insulating jacket 302. In particular, the field strength is concentrated primarily inside of the insulating jacket 302. While the transmission medium 125 provides strong guidance to the electromagnetic wave and propagation is still possible, ranges are more limited when compared with the embodiment of FIG. 3, by increased losses due to propagation within the insulating jacket 302.

Figure 5A:
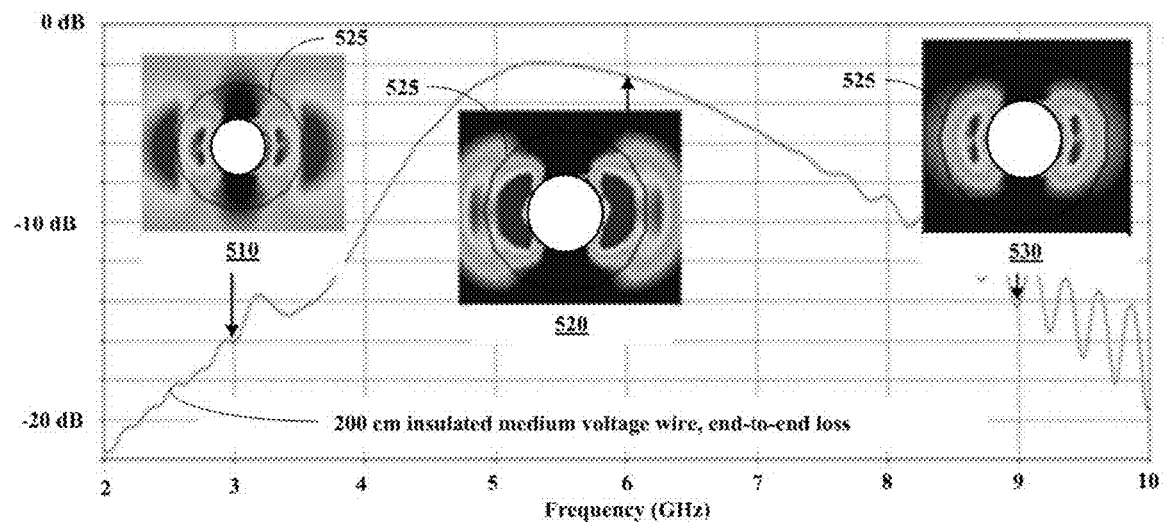
FIG. 5A is a graphical diagram illustrating an example, non-limiting embodiment of a frequency response in accordance with various aspects described herein.

Referring now to FIG. 5A, a graphical diagram illustrating an example, non-limiting embodiment of a frequency response is shown. In particular, diagram 500 presents a graph of end-to-end loss (in dB) as a function of frequency, overlaid with electromagnetic field distributions 510, 520 and 530 at three points for a 200 cm insulated medium voltage wire. The boundary between the insulator and the surrounding air is represented by reference numeral 525 in each electromagnetic field distribution.

As discussed in conjunction with FIG. 3, an example of a desired asymmetric mode of propagation shown is induced on the transmission medium 125 by an electromagnetic wave having a frequency that falls within a limited range (such as Fc to 2Fc) of the lower cut-off frequency Fc of the transmission medium for this particular asymmetric mode. In particular, the electromagnetic field distribution 520 at 6 GHz falls within this modal "sweet spot" that enhances electromagnetic wave propagation along an insulated transmission medium and reduces end-to-end transmission loss. In this particular mode, guided waves are partially embedded in the insulator and partially radiating on the outer surface of the insulator. In this fashion, the electromagnetic waves are "lightly" coupled to the insulator so as to enable guided electromagnetic wave propagation at long distances with low propagation loss.

At lower frequencies represented by the electromagnetic field distribution 510 at 3 GHz, the asymmetric mode radiates more heavily generating higher propagation losses. At higher frequencies represented by the electromagnetic field distribution 530 at 9 GHz, the asymmetric mode shifts more and more inward of the insulating jacket providing too much absorption, again generating higher propagation losses.

Figure 5B:
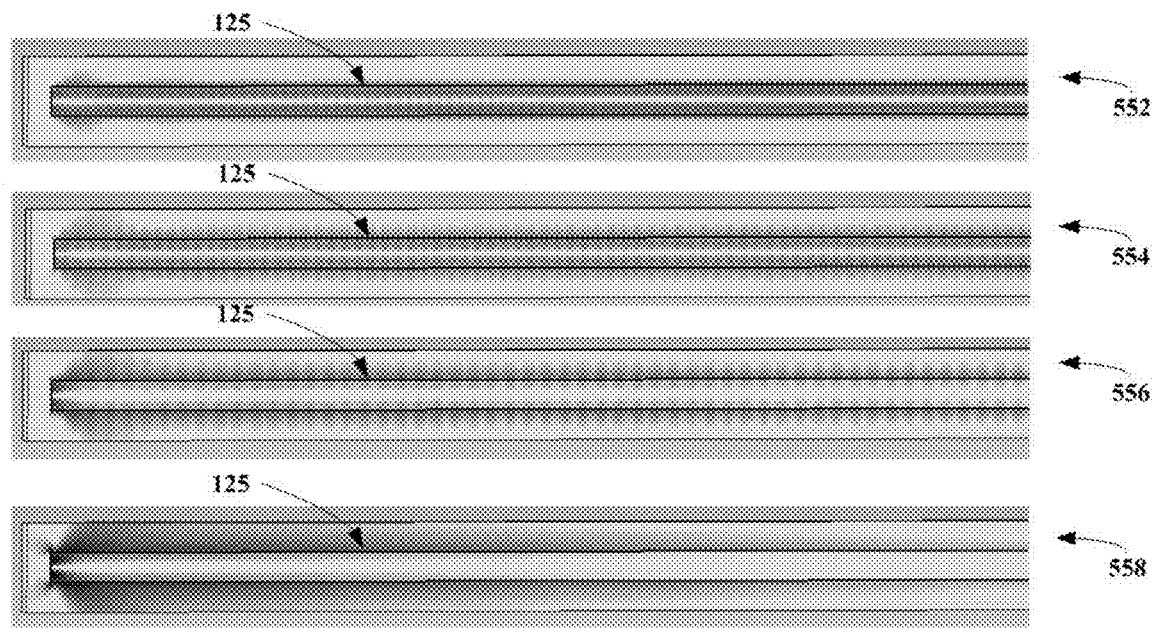
FIG. 5B is a graphical diagram illustrating example, non-limiting embodiments of a longitudinal cross-section of an insulated wire depicting fields of guided electromagnetic waves at various operating frequencies in accordance with various aspects described herein.

Referring now to FIG. 5B, a graphical diagram 550 illustrating example, non-limiting embodiments of a longitudinal cross-section of a transmission medium 125, such as an insulated wire, depicting fields of guided electromagnetic waves at various operating frequencies is shown. As shown in diagram 556, when the guided electromagnetic waves are at approximately the cutoff frequency ($f_c$) corresponding to the modal "sweet spot", the guided electromagnetic waves are loosely coupled to the insulated wire so that absorption is reduced, and the fields of the guided electromagnetic waves are bound sufficiently to reduce the amount radiated into the environment (e.g., air). Because absorption and radiation of the fields of the guided electromagnetic waves is low, propagation losses are consequently low, enabling the guided electromagnetic waves to propagate for longer distances.

As shown in diagram 554, propagation losses increase when an operating frequency of the guide electromagnetic waves increases above about two-times the cutoff frequency ($f_c$)—or as referred to, above the range of the "sweet spot". More of the field strength of the electromagnetic wave is driven inside the insulating layer, increasing propagation losses. At frequencies much higher than the cutoff frequency ($f_c$) the guided electromagnetic waves are strongly bound to the insulated wire as a result of the fields emitted by the guided electromagnetic waves being concentrated in the insulation layer of the wire, as shown in diagram 552. This in turn raises propagation losses further due to absorption of the guided electromagnetic waves by the insulation layer. Similarly, propagation losses increase when the operating frequency of the guided electromagnetic waves is substantially below the cutoff frequency ($f_c$), as shown in diagram 558. At frequencies much lower than the cutoff frequency ($f_c$) the guided electromagnetic waves are weakly (or nominally) bound to the insulated wire and thereby tend to radiate into the environment (e.g., air), which in turn, raises propagation losses due to radiation of the guided electromagnetic waves.

Figure 6:
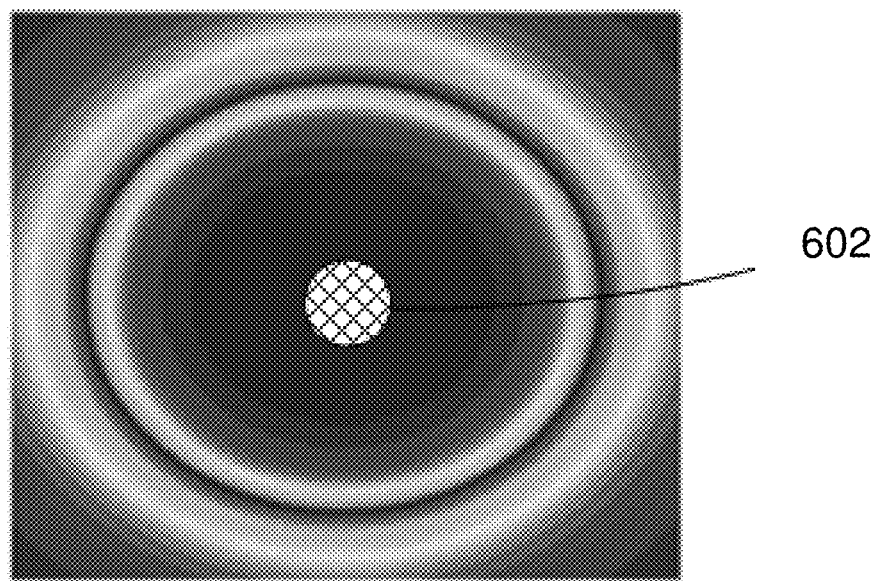
FIG. 6 is a graphical diagram illustrating an example, non-limiting embodiment of an electromagnetic field distribution in accordance with various aspects described herein.

Referring now to FIG. 6, a graphical diagram 600 illustrating an example, non-limiting embodiment of an electromagnetic field distribution is shown. In this embodiment, a transmission medium 602 is a bare wire, as shown in cross section. The diagram 300 includes different gray-scales that represent differing electromagnetic field strengths generated by the propagation of a guided wave having a symmetrical and fundamental guided wave mode at a single carrier frequency.

In this particular mode, electromagnetic waves are guided by the transmission medium 602 to propagate along an outer surface of the transmission medium—in this case, the outer surface of the bare wire. Electromagnetic waves are "lightly" coupled to the wire so as to enable electromagnetic wave propagation at long distances with low propagation loss. As shown, the guided wave has a field structure that lies substantially outside of the transmission medium 602 that serves to guide the electromagnetic waves. The regions inside the conductor 602 have little or no field.

Figure 7:
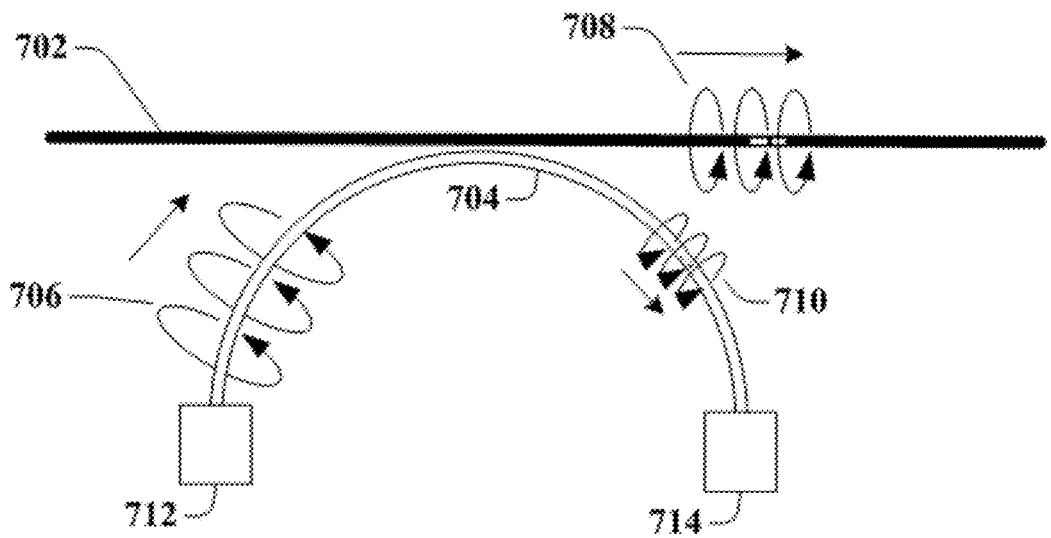
FIG. 7 is a block diagram illustrating an example, non-limiting embodiment of an arc coupler in accordance with various aspects described herein.

Referring now to FIG. 7, a block diagram 700 illustrating an example, non-limiting embodiment of an arc coupler is shown. In particular a coupling device is presented for use in a transmission device, such as transmission device 101 or 102 presented in conjunction with FIG. 1. The coupling device includes an arc coupler 704 coupled to a transmitter circuit 712 and termination or damper 714. The arc coupler 704 can be made of a dielectric material, or other low-loss insulator (e.g., Teflon, polyethylene, etc.), or made of a conducting (e.g., metallic, non-metallic, etc.) material, or any combination of the foregoing materials. As shown, the arc coupler 704 operates as a waveguide and has a wave 706 propagating as a guided wave about a waveguide surface of the arc coupler 704. In the embodiment shown, at least a portion of the arc coupler 704 can be placed near a wire 702 or other transmission medium, (such as transmission medium 125), in order to facilitate coupling between the arc coupler 704 and the wire 702 or other transmission medium, as described herein to launch the guided wave 708 on the wire. The arc coupler 704 can be placed such that a portion of the curved arc coupler 704 is tangential to, and parallel to or substantially parallel to the wire 702. The portion of the arc coupler 704 that is parallel to the wire can be an apex of the curve, or any point where a tangent of the curve is parallel to the wire 702. When the arc coupler 704 is positioned or placed thusly, the wave 706 travelling along the arc coupler 704 couples, at least in part, to the wire 702, and propagates as guided wave 708 around or about the wire surface of the wire 702 and longitudinally along the wire 702. The guided wave 708 can be characterized as a surface wave or other electromagnetic wave that is guided by or bound to the wire 702 or other transmission medium.

A portion of the wave 706 that does not couple to the wire 702 propagates as a wave 710 along the arc coupler 704. It will be appreciated that the arc coupler 704 can be configured and arranged in a variety of positions in relation to the wire 702 to achieve a desired level of coupling or non-coupling of the wave 706 to the wire 702. For example, the curvature and/or length of the arc coupler 704 that is parallel or substantially parallel, as well as its separation distance (which can include zero separation distance in an embodiment), to the wire 702 can be varied without departing from example embodiments. Likewise, the arrangement of arc coupler 704 in relation to the wire 702 may be varied based upon considerations of the respective intrinsic characteristics (e.g., thickness, composition, electromagnetic properties, etc.) of the wire 702 and the arc coupler 704, as well as the characteristics (e.g., frequency, energy level, etc.) of the waves 706 and 708.

The guided wave 708 stays parallel or substantially parallel to the wire 702, even as the wire 702 bends and flexes. Bends in the wire 702 can increase transmission losses, which are also dependent on wire diameters, frequency, and materials. If the dimensions of the arc coupler 704 are chosen for efficient power transfer, most of the power in the wave 706 is transferred to the wire 702, with little power remaining in wave 710. It will be appreciated that the guided wave 708 can still be multi-modal in nature (discussed herein), including having modes that are non-fundamental or asymmetric, while traveling along a path that is parallel or substantially parallel to the wire 702, with or without a fundamental transmission mode. In an embodiment, non-fundamental or asymmetric modes can be utilized to minimize transmission losses and/or obtain increased propagation distances.

It is noted that the term parallel is generally a geometric construct which often is not exactly achievable in real systems. Accordingly, the term parallel as utilized in the subject disclosure represents an approximation rather than an exact configuration when used to describe embodiments disclosed in the subject disclosure. In an embodiment, substantially parallel can include approximations that are within 30 degrees of true parallel in all dimensions.

In an embodiment, the wave 706 can exhibit one or more wave propagation modes. The arc coupler modes can be dependent on the shape and/or design of the coupler 704. The one or more arc coupler modes of wave 706 can generate, influence, or impact one or more wave propagation modes of the guided wave 708 propagating along wire 702. It should be particularly noted however that the guided wave modes present in the guided wave 706 may be the same or different from the guided wave modes of the guided wave 708. In this fashion, one or more guided wave modes of the guided wave 706 may not be transferred to the guided wave 708, and further one or more guided wave modes of guided wave 708 may not have been present in guided wave 706. It should also be noted that the cut-off frequency of the arc coupler 704 for a particular guided wave mode may be different than the cutoff frequency of the wire 702 or other transmission medium for that same mode. For example, while the wire 702 or other transmission medium may be operated slightly above its cutoff frequency for a particular guided wave mode, the arc coupler 704 may be operated well above its cut-off frequency for that same mode for low loss, slightly below its cut-off frequency for that same mode to, for example, induce greater coupling and power transfer, or some other point in relation to the arc coupler's cutoff frequency for that mode.

In an embodiment, the wave propagation modes on the wire 702 can be similar to the arc coupler modes since both waves 706 and 708 propagate about the outside of the arc coupler 704 and wire 702 respectively. In some embodiments, as the wave 706 couples to the wire 702, the modes can change form, or new modes can be created or generated, due to the coupling between the arc coupler 704 and the wire 702. For example, differences in size, material, and/or impedances of the arc coupler 704 and wire 702 may create additional modes not present in the arc coupler modes and/or suppress some of the arc coupler modes. The wave propagation modes can comprise the fundamental transverse electromagnetic mode (Quasi-TEM$_{00}$), where only small electric and/or magnetic fields extend in the direction of propagation, and the electric and magnetic fields extend radially outwards while the guided wave propagates along the wire. This guided wave mode can be donut shaped, where few of the electromagnetic fields exist within the arc coupler 704 or wire 702.

Waves 706 and 708 can comprise a fundamental TEM mode where the fields extend radially outwards, and also comprise other, non-fundamental (e.g., asymmetric, higher-level, etc.) modes. While particular wave propagation modes are discussed above, other wave propagation modes are likewise possible such as transverse electric (TE) and transverse magnetic (TM) modes, based on the frequencies employed, the design of the arc coupler 704, the dimensions and composition of the wire 702, as well as its surface characteristics, its insulation if present, the electromagnetic properties of the surrounding environment, etc. It should be noted that, depending on the frequency, the electrical and physical characteristics of the wire 702 and the particular wave propagation modes that are generated, guided wave 708 can travel along the conductive surface of an oxidized uninsulated wire, an unoxidized uninsulated wire, an insulated wire and/or along the insulating surface of an insulated wire.

In an embodiment, a diameter of the arc coupler 704 is smaller than the diameter of the wire 702. For the millimeter-band wavelength being used, the arc coupler 704 supports a single waveguide mode that makes up wave 706. This single waveguide mode can change as it couples to the wire 702 as guided wave 708. If the arc coupler 704 were larger, more than one waveguide mode can be supported, but these additional waveguide modes may not couple to the wire 702 as efficiently, and higher coupling losses can result. However, in some alternative embodiments, the diameter of the arc coupler 704 can be equal to or larger than the diameter of the wire 702, for example, where higher coupling losses are desirable or when used in conjunction with other techniques to otherwise reduce coupling losses (e.g., impedance matching with tapering, etc.).

In an embodiment, the wavelength of the waves 706 and 708 are comparable in size, or smaller than a circumference of the arc coupler 704 and the wire 702. In an example, if the wire 702 has a diameter of 0.5 cm, and a corresponding circumference of around 1.5 cm, the wavelength of the transmission is around 1.5 cm or less, corresponding to a frequency of 70 GHz or greater. In another embodiment, a suitable frequency of the transmission and the carrier-wave signal is in the range of 30-100 GHz, perhaps around 30-60 GHz, and around 38 GHz in one example. In an embodiment, when the circumference of the arc coupler 704 and wire 702 is comparable in size to, or greater than a wavelength of the transmission, the waves 706 and 708 can exhibit multiple wave propagation modes including fundamental and/or non-fundamental (symmetric and/or asymmetric) modes that propagate over sufficient distances to support various communication systems described herein. The waves 706 and 708 can therefore comprise more than one type of electric and magnetic field configuration. In an embodiment, as the guided wave 708 propagates down the wire 702, the electrical and magnetic field configurations will remain the same from end to end of the wire 702. In other embodiments, as the guided wave 708 encounters interference (distortion or obstructions) or loses energy due to transmission losses or scattering, the electric and magnetic field configurations can change as the guided wave 708 propagates down wire 702.

In an embodiment, the arc coupler 704 can be composed of nylon, Teflon, polyethylene, a polyamide, or other plastics. In other embodiments, other dielectric materials are possible. The wire surface of wire 702 can be metallic with either a bare metallic surface, or can be insulated using plastic, dielectric, insulator or other coating, jacket or sheathing. In an embodiment, a dielectric or otherwise non-conducting/insulated waveguide can be paired with either a bare/metallic wire or insulated wire. In other embodiments, a metallic and/or conductive waveguide can be paired with a bare/metallic wire or insulated wire. In an embodiment, an oxidation layer on the bare metallic surface of the wire 702 (e.g., resulting from exposure of the bare metallic surface to oxygen/air) can also provide insulating or dielectric properties similar to those provided by some insulators or sheathings.

It is noted that the graphical representations of waves 706, 708 and 710 are presented merely to illustrate the principles that wave 706 induces or otherwise launches a guided wave 708 on a wire 702 that operates, for example, as a single wire transmission line. Wave 710 represents the portion of wave 706 that remains on the arc coupler 704 after the generation of guided wave 708. The actual electric and magnetic fields generated as a result of such wave propagation may vary depending on the frequencies employed, the particular wave propagation mode or modes, the design of the arc coupler 704, the dimensions and composition of the wire 702, as well as its surface characteristics, its optional insulation, the electromagnetic properties of the surrounding environment, etc.

It is noted that arc coupler 704 can include a termination circuit or damper 714 at the end of the arc coupler 704 that can absorb leftover radiation or energy from wave 710. The termination circuit or damper 714 can prevent and/or minimize the leftover radiation or energy from wave 710 reflecting back toward transmitter circuit 712. In an embodiment, the termination circuit or damper 714 can include termination resistors, and/or other components that perform impedance matching to attenuate reflection. In some embodiments, if the coupling efficiencies are high enough, and/or wave 710 is sufficiently small, it may not be necessary to use a termination circuit or damper 714. For the sake of simplicity, these transmitter 712 and termination circuits or dampers 714 may not be depicted in the other figures, but in those embodiments, transmitter and termination circuits or dampers may possibly be used.

Further, while a single arc coupler 704 is presented that generates a single guided wave 708, multiple arc couplers 704 placed at different points along the wire 702 and/or at different azimuthal orientations about the wire can be employed to generate and receive multiple guided waves 708 at the same or different frequencies, at the same or different phases, at the same or different wave propagation modes.

Figure 8:
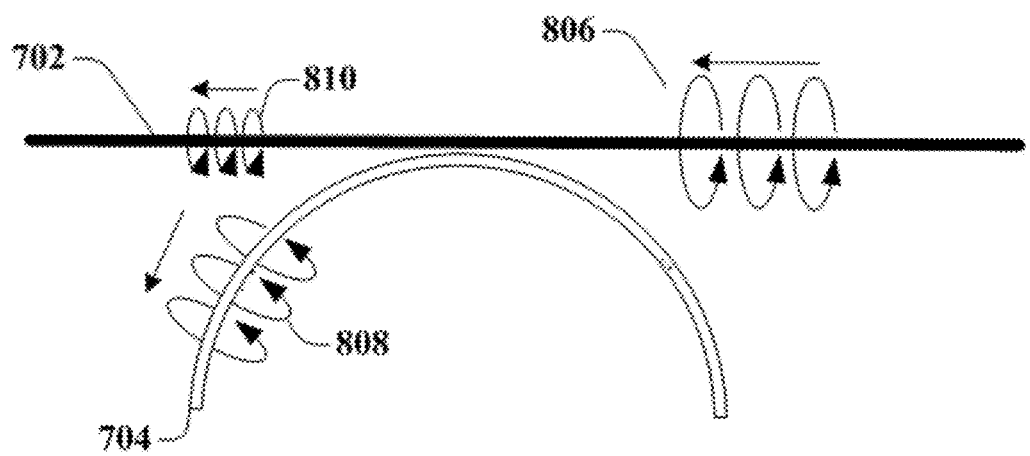
FIG. 8 is a block diagram illustrating an example, non-limiting embodiment of an arc coupler in accordance with various aspects described herein.

FIG. 8, a block diagram 800 illustrating an example, non-limiting embodiment of an arc coupler is shown. In the embodiment shown, at least a portion of the coupler 704 can be placed near a wire 702 or other transmission medium, (such as transmission medium 125), in order to facilitate coupling between the arc coupler 704 and the wire 702 or other transmission medium, to extract a portion of the guided wave 806 as a guided wave 808 as described herein. The arc coupler 704 can be placed such that a portion of the curved arc coupler 704 is tangential to, and parallel or substantially parallel to the wire 702. The portion of the arc coupler 704 that is parallel to the wire can be an apex of the curve, or any point where a tangent of the curve is parallel to the wire 702. When the arc coupler 704 is positioned or placed thusly, the wave 806 travelling along the wire 702 couples, at least in part, to the arc coupler 704, and propagates as guided wave 808 along the arc coupler 704 to a receiving device (not expressly shown). A portion of the wave 806 that does not couple to the arc coupler propagates as wave 810 along the wire 702 or other transmission medium.

In an embodiment, the wave 806 can exhibit one or more wave propagation modes. The arc coupler modes can be dependent on the shape and/or design of the coupler 704. The one or more modes of guided wave 806 can generate, influence, or impact one or more guide-wave modes of the guided wave 808 propagating along the arc coupler 704. It should be particularly noted however that the guided wave modes present in the guided wave 806 may be the same or different from the guided wave modes of the guided wave 808. In this fashion, one or more guided wave modes of the guided wave 806 may not be transferred to the guided wave 808, and further one or more guided wave modes of guided wave 808 may not have been present in guided wave 806.

Figure 9A:
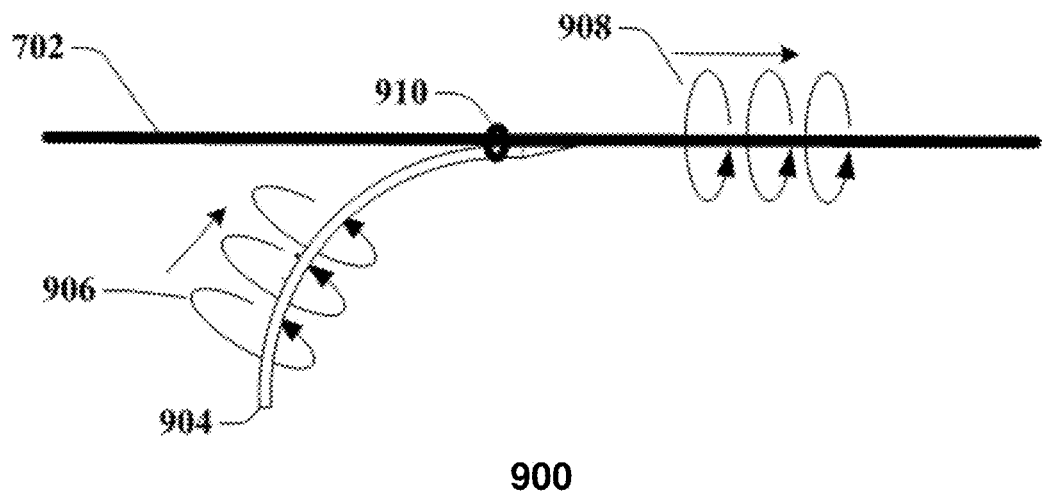
FIG. 9A is a block diagram illustrating an example, non-limiting embodiment of a stub coupler in accordance with various aspects described herein.

Referring now to FIG. 9A, a block diagram 900 illustrating an example, non-limiting embodiment of a stub coupler is shown. In particular a coupling device that includes stub coupler 904 is presented for use in a transmission device, such as transmission device 101 or 102 presented in conjunction with FIG. 1. The stub coupler 904 can be made of a dielectric material, or other low-loss insulator (e.g., Teflon, polyethylene and etc.), or made of a conducting (e.g., metallic, non-metallic, etc.) material, or any combination of the foregoing materials. As shown, the stub coupler 904 operates as a waveguide and has a wave 906 propagating as a guided wave about a waveguide surface of the stub coupler 904. In the embodiment shown, at least a portion of the stub coupler 904 can be placed near a wire 702 or other transmission medium, (such as transmission medium 125), in order to facilitate coupling between the stub coupler 904 and the wire 702 or other transmission medium, as described herein to launch the guided wave 908 on the wire.

In an embodiment, the stub coupler 904 is curved, and an end of the stub coupler 904 can be tied, fastened, or otherwise mechanically coupled to a wire 702. When the end of the stub coupler 904 is fastened to the wire 702, the end of the stub coupler 904 is parallel or substantially parallel to the wire 702. Alternatively, another portion of the dielectric waveguide beyond an end can be fastened or coupled to wire 702 such that the fastened or coupled portion is parallel or substantially parallel to the wire 702. The fastener 910 can be a nylon cable tie or other type of non-conducting/dielectric material that is either separate from the stub coupler 904 or constructed as an integrated component of the stub coupler 904. The stub coupler 904 can be adjacent to the wire 702 without surrounding the wire 702.

Like the arc coupler 704 described in conjunction with FIG. 7, when the stub coupler 904 is placed with the end parallel to the wire 702, the guided wave 906 travelling along the stub coupler 904 couples to the wire 702, and propagates as guided wave 908 about the wire surface of the wire 702. In an example embodiment, the guided wave 908 can be characterized as a surface wave or other electromagnetic wave.

It is noted that the graphical representations of waves 906 and 908 are presented merely to illustrate the principles that wave 906 induces or otherwise launches a guided wave 908 on a wire 702 that operates, for example, as a single wire transmission line. The actual electric and magnetic fields generated as a result of such wave propagation may vary depending on one or more of the shape and/or design of the coupler, the relative position of the dielectric waveguide to the wire, the frequencies employed, the design of the stub coupler 904, the dimensions and composition of the wire 702, as well as its surface characteristics, its optional insulation, the electromagnetic properties of the surrounding environment, etc.

In an embodiment, an end of stub coupler 904 can taper towards the wire 702 in order to increase coupling efficiencies. Indeed, the tapering of the end of the stub coupler 904 can provide impedance matching to the wire 702 and reduce reflections, according to an example embodiment of the subject disclosure. For example, an end of the stub coupler 904 can be gradually tapered in order to obtain a desired level of coupling between waves 906 and 908 as illustrated in FIG. 9A.

In an embodiment, the fastener 910 can be placed such that there is a short length of the stub coupler 904 between the fastener 910 and an end of the stub coupler 904. Maximum coupling efficiencies are realized in this embodiment when the length of the end of the stub coupler 904 that is beyond the fastener 910 is at least several wavelengths long for whatever frequency is being transmitted.

Figure 9B:
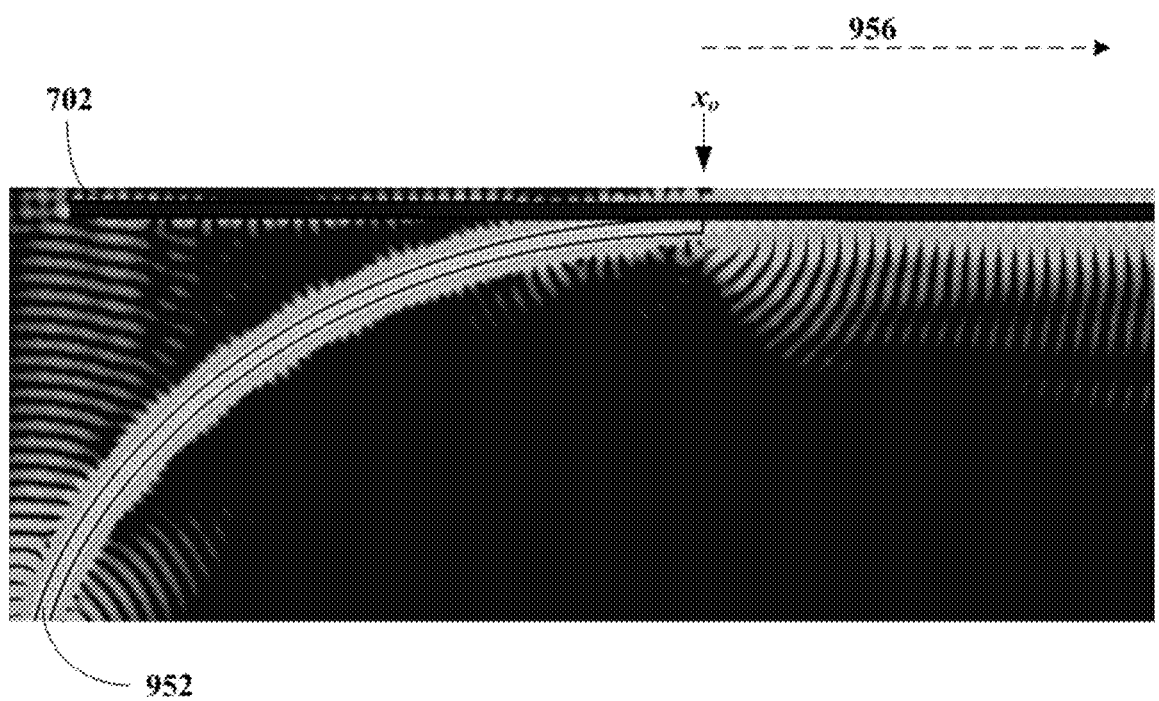
FIG. 9B is a diagram illustrating an example, non-limiting embodiment of an electromagnetic distribution in accordance with various aspects described herein.

Turning now to FIG. 9B, a diagram 950 illustrating an example, non-limiting embodiment of an electromagnetic distribution in accordance with various aspects described herein is shown. In particular, an electromagnetic distribution is presented in two dimensions for a transmission device that includes coupler 952, shown in an example stub coupler constructed of a dielectric material. The coupler 952 couples an electromagnetic wave for propagation as a guided wave along an outer surface of a wire 702 or other transmission medium.

The coupler 952 guides the electromagnetic wave to a junction at $x_0$ via a symmetrical guided wave mode. While some of the energy of the electromagnetic wave that propagates along the coupler 952 is outside of the coupler 952, the majority of the energy of this electromagnetic wave is contained within the coupler 952. The junction at $x_0$ couples the electromagnetic wave to the wire 702 or other transmission medium at an azimuthal angle corresponding to the bottom of the transmission medium. This coupling induces an electromagnetic wave that is guided to propagate along the outer surface of the wire 702 or other transmission medium via at least one guided wave mode in direction 956. The majority of the energy of the guided electromagnetic wave is outside or, but in close proximity to the outer surface of the wire 702 or other transmission medium. In the example shown, the junction at $x_0$ forms an electromagnetic wave that propagates via both a symmetrical mode and at least one asymmetrical surface mode, such as the first order mode presented in conjunction with FIG. 3, that skims the surface of the wire 702 or other transmission medium.

It is noted that the graphical representations of guided waves are presented merely to illustrate an example of guided wave coupling and propagation. The actual electric and magnetic fields generated as a result of such wave propagation may vary depending on the frequencies employed, the design and/or configuration of the coupler 952, the dimensions and composition of the wire 702 or other transmission medium, as well as its surface characteristics, its insulation if present, the electromagnetic properties of the surrounding environment, etc.

Figure 10A:
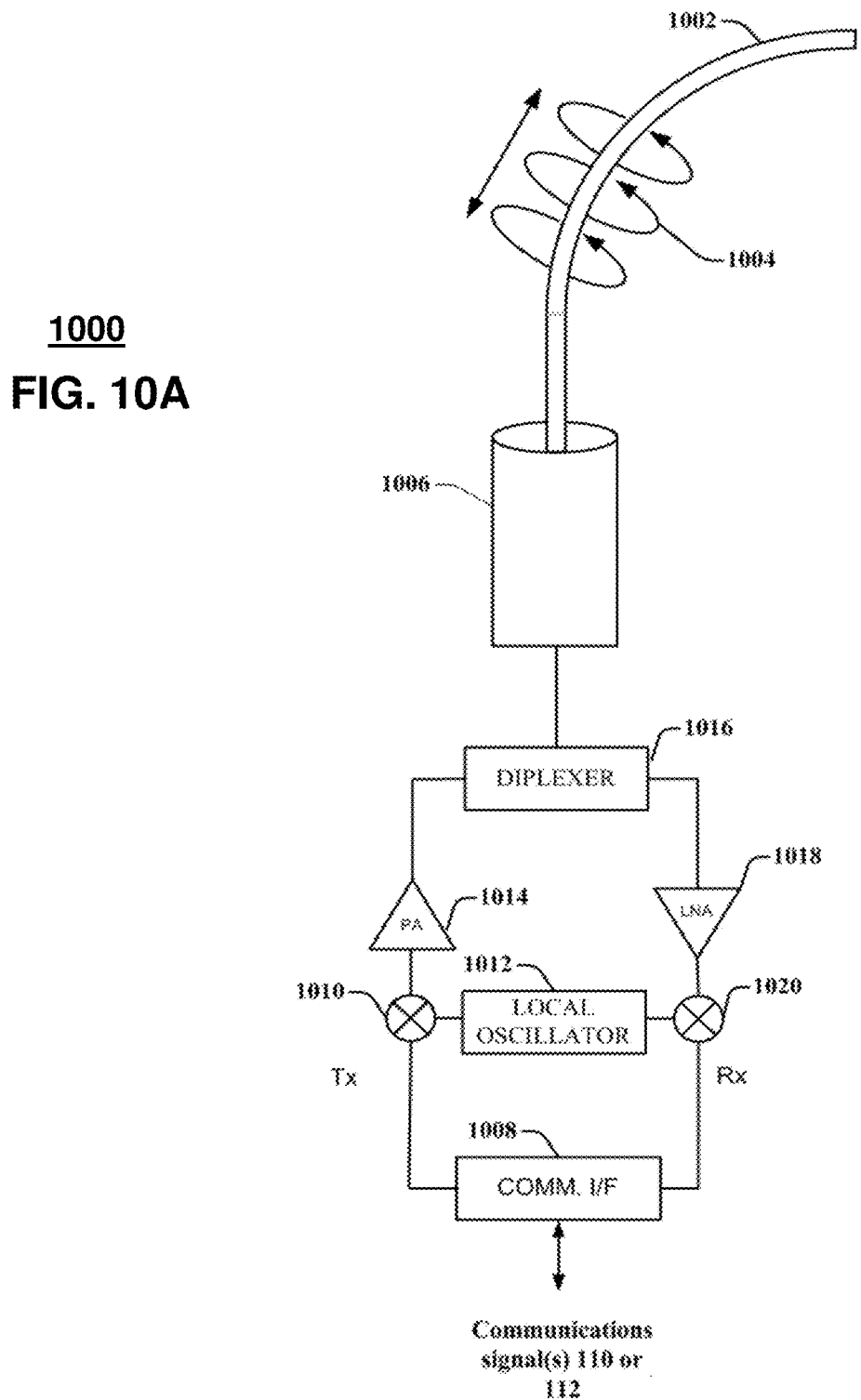
FIGS. 10A and 10B are block diagrams illustrating example, non-limiting embodiments of couplers and transceivers in accordance with various aspects described herein.

Turning now to FIG. 10A, illustrated is a block diagram 1000 of an example, non-limiting embodiment of a coupler and transceiver system in accordance with various aspects described herein. The system is an example of transmission device 101 or 102. In particular, the communication interface 1008 is an example of communications interface 205, the stub coupler 1002 is an example of coupler 220, and the transmitter/receiver device 1006, diplexer 1016, power amplifier 1014, low noise amplifier 1018, frequency mixers 1010 and 1020 and local oscillator 1012 collectively form an example of transceiver 210.

In operation, the transmitter/receiver device 1006 launches and receives waves (e.g., guided wave 1004 onto stub coupler 1002). The guided waves 1004 can be used to transport signals received from and sent to a host device, base station, mobile devices, a building or other device by way of a communications interface 1008. The communications interface 1008 can be an integral part of system 1000. Alternatively, the communications interface 1008 can be tethered to system 1000. The communications interface 1008 can comprise a wireless interface for interfacing to the host device, base station, mobile devices, a building or other device utilizing any of various wireless signaling protocols (e.g., LTE, WiFi, WiMAX, IEEE 802.xx, etc.) including an infrared protocol such as an infrared data association (IrDA) protocol or other line of sight optical protocol. The communications interface 1008 can also comprise a wired interface such as a fiber optic line, coaxial cable, twisted pair, category 5 (CAT-5) cable or other suitable wired or optical mediums for communicating with the host device, base station, mobile devices, a building or other device via a protocol such as an Ethernet protocol, universal serial bus (USB) protocol, a data over cable service interface specification (DOCSIS) protocol, a digital subscriber line (DSL) protocol, a Firewire (IEEE 1394) protocol, or other wired or optical protocol. For embodiments where system 1000 functions as a repeater, the communications interface 1008 may not be necessary.

The output signals (e.g., Tx) of the communications interface 1008 can be combined with a carrier wave (e.g., millimeter-wave carrier wave) generated by a local oscillator 1012 at frequency mixer 1010. Frequency mixer 1010 can use heterodyning techniques or other frequency shifting techniques to frequency shift the output signals from communications interface 1008. For example, signals sent to and from the communications interface 1008 can be modulated signals such as orthogonal frequency division multiplexed (OFDM) signals formatted in accordance with a Long-Term Evolution (LTE) wireless protocol or other wireless 3G, 4G, 5G or higher voice and data protocol, a ZigBee, WIMAX, UltraWideband or IEEE 802.11 wireless protocol; a wired protocol such as an Ethernet protocol, universal serial bus (USB) protocol, a data over cable service interface specification (DOCSIS) protocol, a digital subscriber line (DSL) protocol, a Firewire (IEEE 1394) protocol or other wired or wireless protocol. In an example embodiment, this frequency conversion can be done in the analog domain, and as a result, the frequency shifting can be done without regard to the type of communications protocol used by a base station, mobile devices, or in-building devices. As new communications technologies are developed, the communications interface 1008 can be upgraded (e.g., updated with software, firmware, and/or hardware) or replaced and the frequency shifting and transmission apparatus can remain, simplifying upgrades. The carrier wave can then be sent to a power amplifier ("PA") 1014 and can be transmitted via the transmitter receiver device 1006 via the diplexer 1016.

Signals received from the transmitter/receiver device 1006 that are directed towards the communications interface 1008 can be separated from other signals via diplexer 1016. The received signal can then be sent to low noise amplifier ("LNA") 1018 for amplification. A frequency mixer 1020, with help from local oscillator 1012 can downshift the received signal (which is in the millimeter-wave band or around 38 GHz in some embodiments) to the native frequency. The communications interface 1008 can then receive the transmission at an input port (Rx).

In an embodiment, transmitter/receiver device 1006 can include a cylindrical or non-cylindrical metal (which, for example, can be hollow in an embodiment, but not necessarily drawn to scale) or other conducting or non-conducting waveguide and an end of the stub coupler 1002 can be placed in or in proximity to the waveguide or the transmitter/receiver device 1006 such that when the transmitter/receiver device 1006 generates a transmission, the guided wave couples to stub coupler 1002 and propagates as a guided wave 1004 about the waveguide surface of the stub coupler 1002. In some embodiments, the guided wave 1004 can propagate in part on the outer surface of the stub coupler 1002 and in part inside the stub coupler 1002. In other embodiments, the guided wave 1004 can propagate substantially or completely on the outer surface of the stub coupler 1002. In yet other embodiments, the guided wave 1004 can propagate substantially or completely inside the stub coupler 1002. In this latter embodiment, the guided wave 1004 can radiate at an end of the stub coupler 1002 (such as the tapered end shown in FIG. 4) for coupling to a transmission medium such as a wire 702 of FIG. 7. Similarly, if guided wave 1004 is incoming (coupled to the stub coupler 1002 from a wire 702), guided wave 1004 then enters the transmitter/receiver device 1006 and couples to the cylindrical waveguide or conducting waveguide. While transmitter/receiver device 1006 is shown to include a separate waveguide—an antenna, cavity resonator, klystron, magnetron, travelling wave tube, or other radiating element can be employed to induce a guided wave on the coupler 1002, with or without the separate waveguide.

In an embodiment, stub coupler 1002 can be wholly constructed of a dielectric material (or another suitable insulating material), without any metallic or otherwise conducting materials therein. Stub coupler 1002 can be composed of nylon, Teflon, polyethylene, a polyamide, other plastics, or other materials that are non-conducting and suitable for facilitating transmission of electromagnetic waves at least in part on an outer surface of such materials. In another embodiment, stub coupler 1002 can include a core that is conducting/metallic, and have an exterior dielectric surface. Similarly, a transmission medium that couples to the stub coupler 1002 for propagating electromagnetic waves induced by the stub coupler 1002 or for supplying electromagnetic waves to the stub coupler 1002 can, in addition to being a bare or insulated wire, be wholly constructed of a dielectric material (or another suitable insulating material), without any metallic or otherwise conducting materials therein.

It is noted that although FIG. 10A shows that the opening of transmitter receiver device 1006 is much wider than the stub coupler 1002, this is not to scale, and that in other embodiments the width of the stub coupler 1002 is comparable or slightly smaller than the opening of the hollow waveguide. It is also not shown, but in an embodiment, an end of the coupler 1002 that is inserted into the transmitter/receiver device 1006 tapers down in order to reduce reflection and increase coupling efficiencies.

Before coupling to the stub coupler 1002, the one or more waveguide modes of the guided wave generated by the transmitter/receiver device 1006 can couple to the stub coupler 1002 to induce one or more wave propagation modes of the guided wave 1004. The wave propagation modes of the guided wave 1004 can be different than the hollow metal waveguide modes due to the different characteristics of the hollow metal waveguide and the dielectric waveguide. For instance, wave propagation modes of the guided wave 1004 can comprise the fundamental transverse electromagnetic mode (Quasi-TEM$_{00}$), where only small electrical and/or magnetic fields extend in the direction of propagation, and the electric and magnetic fields extend radially outwards from the stub coupler 1002 while the guided waves propagate along the stub coupler 1002. The fundamental transverse electromagnetic mode wave propagation mode may or may not exist inside a waveguide that is hollow. Therefore, the hollow metal waveguide modes that are used by transmitter/receiver device 1006 are waveguide modes that can couple effectively and efficiently to wave propagation modes of stub coupler 1002.

Figure 10B:
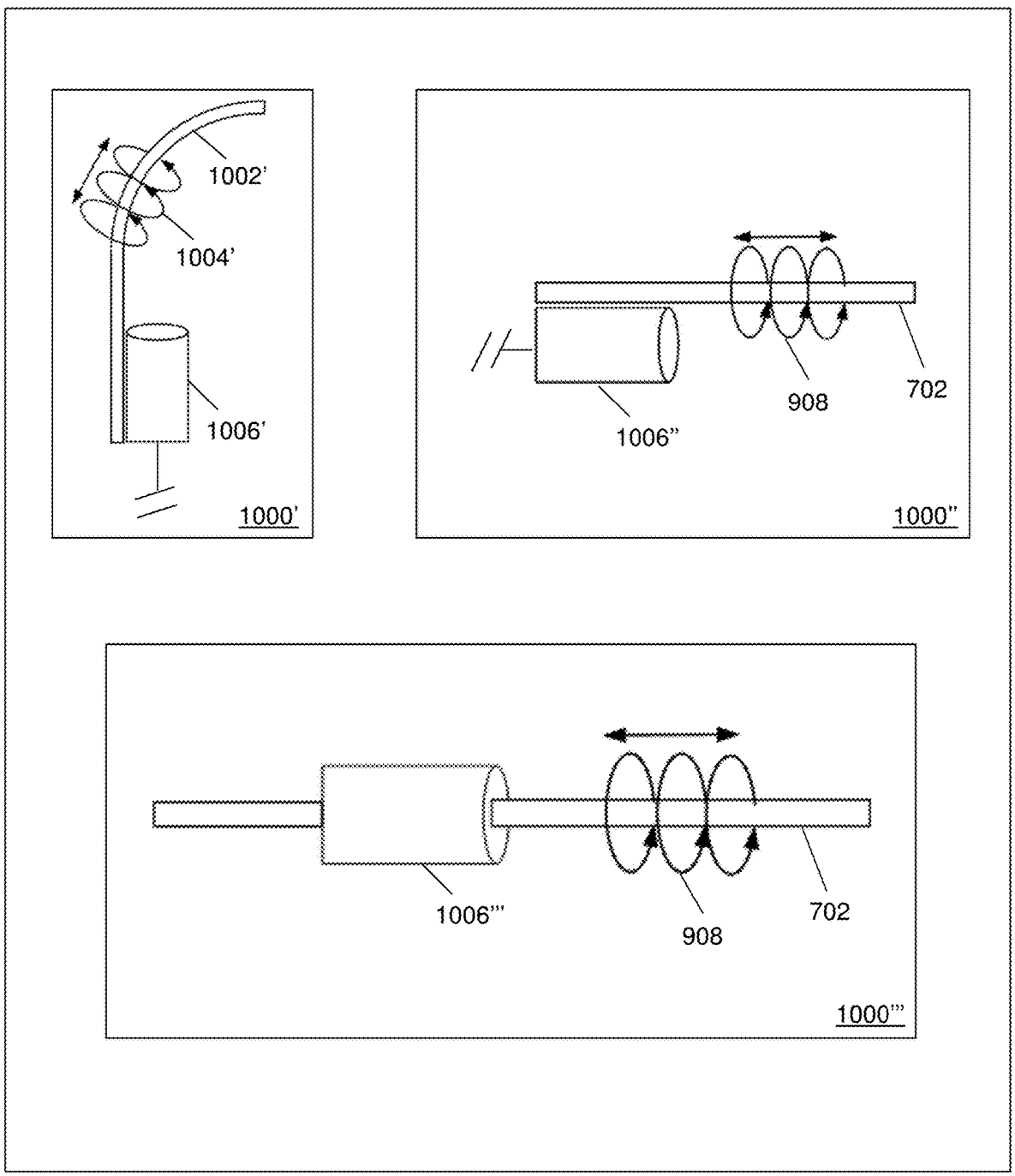

It will be appreciated that other constructs or combinations of the transmitter/receiver device 1006 and stub coupler 1002 are possible. For example, a stub coupler 1002' can be placed tangentially or in parallel (with or without a gap) with respect to an outer surface of the hollow metal waveguide of the transmitter/receiver device 1006' (corresponding circuitry not shown) as depicted by reference 1000' of FIG. 10B. In another embodiment, not shown by reference 1000', the stub coupler 1002' can be placed inside the hollow metal waveguide of the transmitter/receiver device 1006' without an axis of the stub coupler 1002' being coaxially aligned with an axis of the hollow metal waveguide of the transmitter/receiver device 1006'. In either of these embodiments, the guided wave generated by the transmitter/receiver device 1006' can couple to a surface of the stub coupler 1002' to induce one or more wave propagation modes of the guided wave 1004' on the stub coupler 1002' including a fundamental mode (e.g., a symmetric mode) and/or a non-fundamental mode (e.g., asymmetric mode).

In one embodiment, the guided wave 1004' can propagate in part on the outer surface of the stub coupler 1002' and in part inside the stub coupler 1002'. In another embodiment, the guided wave 1004' can propagate substantially or completely on the outer surface of the stub coupler 1002'. In yet other embodiments, the guided wave 1004' can propagate substantially or completely inside the stub coupler 1002'. In this latter embodiment, the guided wave 1004' can radiate at an end of the stub coupler 1002' (such as the tapered end shown in FIG. 9) for coupling to a transmission medium such as a wire 702 of FIG. 9.

It will be further appreciated that other constructs the transmitter/receiver device 1006 are possible. For example, a hollow metal waveguide of a transmitter/receiver device 1006" (corresponding circuitry not shown), depicted in FIG. 10B as reference 1000", can be placed tangentially or in parallel (with or without a gap) with respect to an outer surface of a transmission medium such as the wire 702 of FIG. 4 without the use of the stub coupler 1002. In this embodiment, the guided wave generated by the transmitter/receiver device 1006" can couple to a surface of the wire 702 to induce one or more wave propagation modes of a guided wave 908 on the wire 702 including a fundamental mode (e.g., a symmetric mode) and/or a non-fundamental mode (e.g., asymmetric mode). In another embodiment, the wire 702 can be positioned inside a hollow metal waveguide of a transmitter/receiver device 1006''' (corresponding circuitry not shown) so that an axis of the wire 702 is coaxially (or not coaxially) aligned with an axis of the hollow metal waveguide without the use of the stub coupler 1002—see FIG. 10B reference 1000'''. In this embodiment, the guided wave generated by the transmitter/receiver device 1006''' can couple to a surface of the wire 702 to induce one or more wave propagation modes of a guided wave 908 on the wire including a fundamental mode (e.g., a symmetric mode) and/or a non-fundamental mode (e.g., asymmetric mode).

In the embodiments of 1000" and 1000''', for a wire 702 having an insulated outer surface, the guided wave 908 can propagate in part on the outer surface of the insulator and in part inside the insulator. In embodiments, the guided wave 908 can propagate substantially or completely on the outer surface of the insulator, or substantially or completely inside the insulator. In the embodiments of 1000" and 1000''', for a wire 702 that is a bare conductor, the guided wave 908 can propagate in part on the outer surface of the conductor and in part inside the conductor. In another embodiment, the guided wave 908 can propagate substantially or completely on the outer surface of the conductor.

Figure 11:
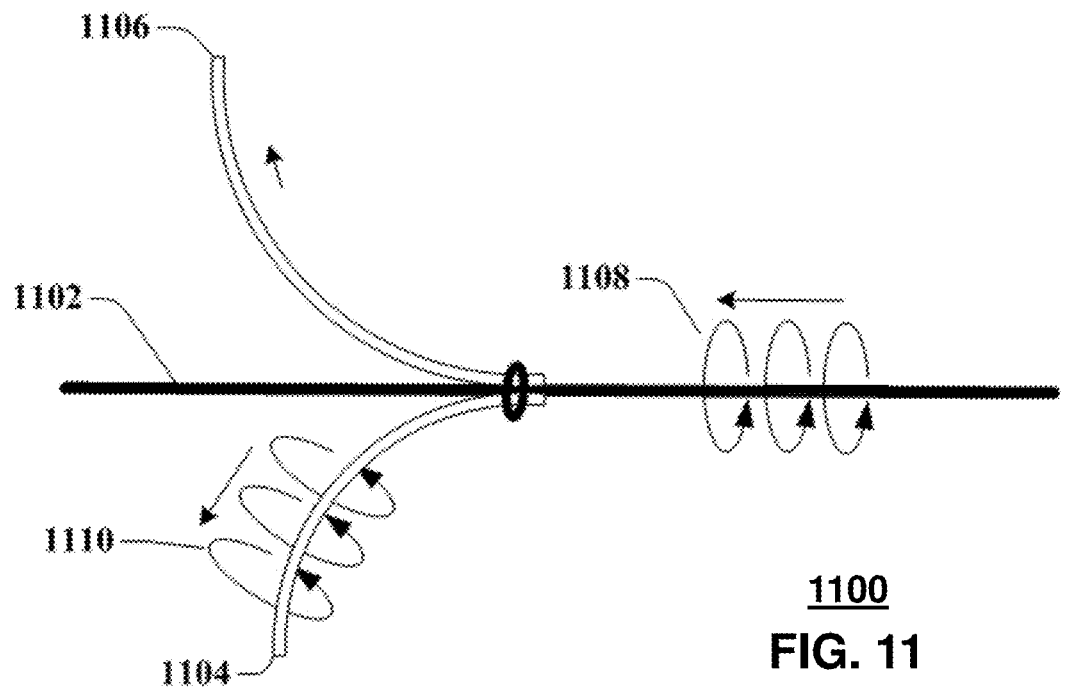
FIG. 11 is a block diagram illustrating an example, non-limiting embodiment of a dual stub coupler in accordance with various aspects described herein.

Referring now to FIG. 11, a block diagram 1100 illustrating an example, non-limiting embodiment of a dual stub coupler is shown. In particular, a dual coupler design is presented for use in a transmission device, such as transmission device 101 or 102 presented in conjunction with FIG. 1. In an embodiment, two or more couplers (such as the stub couplers 1104 and 1106) can be positioned around a wire 1102 in order to receive guided wave 1108. In an embodiment, one coupler is enough to receive the guided wave 1108. In that case, guided wave 1108 couples to coupler 1104 and propagates as guided wave 1110. If the field structure of the guided wave 1108 oscillates or undulates around the wire 1102 due to the particular guided wave mode(s) or various outside factors, then coupler 1106 can be placed such that guided wave 1108 couples to coupler 1106. In some embodiments, four or more couplers can be placed around a portion of the wire 1102, e.g., at 90 degrees or another spacing with respect to each other, in order to receive guided waves that may oscillate or rotate around the wire 1102, that have been induced at different azimuthal orientations or that have non-fundamental or higher order modes that, for example, have lobes and/or nulls or other asymmetries that are orientation dependent. However, it will be appreciated that there may be less than or more than four couplers placed around a portion of the wire 1102 without departing from example embodiments.

It should be noted that while couplers 1106 and 1104 are illustrated as stub couplers, any other of the coupler designs described herein including arc couplers, antenna or horn couplers, magnetic couplers, etc., could likewise be used. It will also be appreciated that while some example embodiments have presented a plurality of couplers around at least a portion of a wire 1102, this plurality of couplers can also be considered as part of a single coupler system having multiple coupler subcomponents. For example, two or more couplers can be manufactured as single system that can be installed around a wire in a single installation such that the couplers are either pre-positioned or adjustable relative to each other (either manually or automatically with a controllable mechanism such as a motor or other actuator) in accordance with the single system.

Receivers coupled to couplers 1106 and 1104 can use diversity combining to combine signals received from both couplers 1106 and 1104 in order to maximize the signal quality. In other embodiments, if one or the other of the couplers 1104 and 1106 receive a transmission that is above a predetermined threshold, receivers can use selection diversity when deciding which signal to use. Further, while reception by a plurality of couplers 1106 and 1104 is illustrated, transmission by couplers 1106 and 1104 in the same configuration can likewise take place. In particular, a wide range of multi-input multi-output (MIMO) transmission and reception techniques can be employed for transmissions where a transmission device, such as transmission device 101 or 102 presented in conjunction with FIG. 1 includes multiple transceivers and multiple couplers.

It is noted that the graphical representations of waves 1108 and 1110 are presented merely to illustrate the principles that guided wave 1108 induces or otherwise launches a wave 1110 on a coupler 1104. The actual electric and magnetic fields generated as a result of such wave propagation may vary depending on the frequencies employed, the design of the coupler 1104, the dimensions and composition of the wire 1102, as well as its surface characteristics, its insulation if any, the electromagnetic properties of the surrounding environment, etc.

Figure 12:
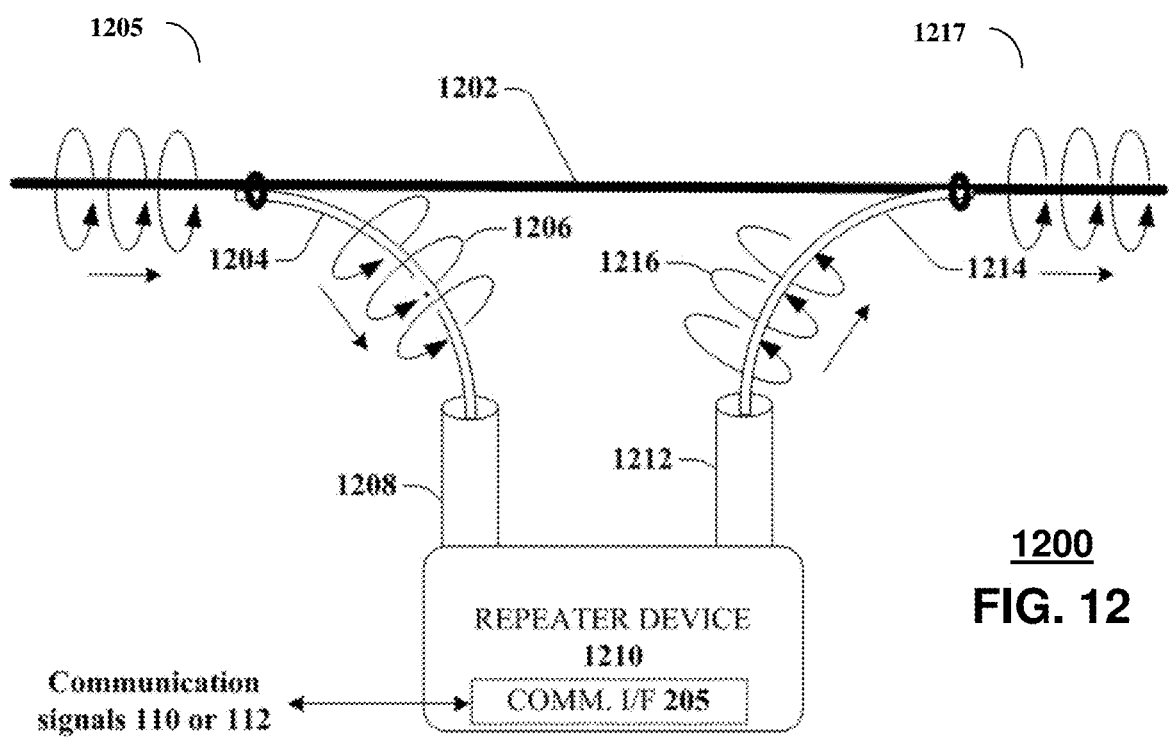
FIG. 12 is a block diagram illustrating an example, non-limiting embodiment of a repeater system in accordance with various aspects described herein.

Referring now to FIG. 12, a block diagram 1200 illustrating an example, non-limiting embodiment of a repeater system is shown. In particular, a repeater device 1210 is presented for use in a transmission device, such as transmission device 101 or 102 presented in conjunction with FIG. 1. In this system, two couplers 1204 and 1214 can be placed near a wire 1202 or other transmission medium such that guided waves 1205 propagating along the wire 1202 are extracted by coupler 1204 as wave 1206 (e.g. as a guided wave), and then are boosted or repeated by repeater device 1210 and launched as a wave 1216 (e.g. as a guided wave) onto coupler 1214. The wave 1216 can then be launched on the wire 1202 and continue to propagate along the wire 1202 as a guided wave 1217. In an embodiment, the repeater device 1210 can receive at least a portion of the power utilized for boosting or repeating through magnetic coupling with the wire 1202, for example, when the wire 1202 is a power line or otherwise contains a power-carrying conductor. It should be noted that while couplers 1204 and 1214 are illustrated as stub couplers, any other of the coupler designs described herein including arc couplers, antenna or horn couplers, magnetic couplers, or the like, could likewise be used.

In some embodiments, repeater device 1210 can repeat the transmission associated with wave 1206, and in other embodiments, repeater device 1210 can include a communications interface 205 that extracts data or other signals from the wave 1206 for supplying such data or signals to another network and/or one or more other devices as communication signals 110 or 112 and/or receiving communication signals 110 or 112 from another network and/or one or more other devices and launch guided wave 1216 having embedded therein the received communication signals 110 or 112. In a repeater configuration, receiver waveguide 1208 can receive the wave 1206 from the coupler 1204 and transmitter waveguide 1212 can launch guided wave 1216 onto coupler 1214 as guided wave 1217. Between receiver waveguide 1208 and transmitter waveguide 1212, the signal embedded in guided wave 1206 and/or the guided wave 1216 itself can be amplified to correct for signal loss and other inefficiencies associated with guided wave communications or the signal can be received and processed to extract the data contained therein and regenerated for transmission. In an embodiment, the receiver waveguide 1208 can be configured to extract data from the signal, process the data to correct for data errors utilizing for example error correcting codes, and regenerate an updated signal with the corrected data. The transmitter waveguide 1212 can then transmit guided wave 1216 with the updated signal embedded therein. In an embodiment, a signal embedded in guided wave 1206 can be extracted from the transmission and processed for communication with another network and/or one or more other devices via communications interface 205 as communication signals 110 or 112. Similarly, communication signals 110 or 112 received by the communications interface 205 can be inserted into a transmission of guided wave 1216 that is generated and launched onto coupler 1214 by transmitter waveguide 1212.

It is noted that although FIG. 12 shows guided wave transmissions 1206 and 1216 entering from the left and exiting to the right respectively, this is merely a simplification and is not intended to be limiting. In other embodiments, receiver waveguide 1208 and transmitter waveguide 1212 can also function as transmitters and receivers respectively, allowing the repeater device 1210 to be bi-directional.

In an embodiment, repeater device 1210 can be placed at locations where there are discontinuities or obstacles on the wire 1202 or other transmission medium. In the case where the wire 1202 is a power line, these obstacles can include transformers, connections, utility poles, and other such power line devices. The repeater device 1210 can help the guided (e.g., surface) waves jump over these obstacles on the line and boost the transmission power at the same time. In other embodiments, a coupler can be used to jump over the obstacle without the use of a repeater device. In that embodiment, both ends of the coupler can be tied or fastened to the wire, thus providing a path for the guided wave to travel without being blocked by the obstacle.

Figure 13:
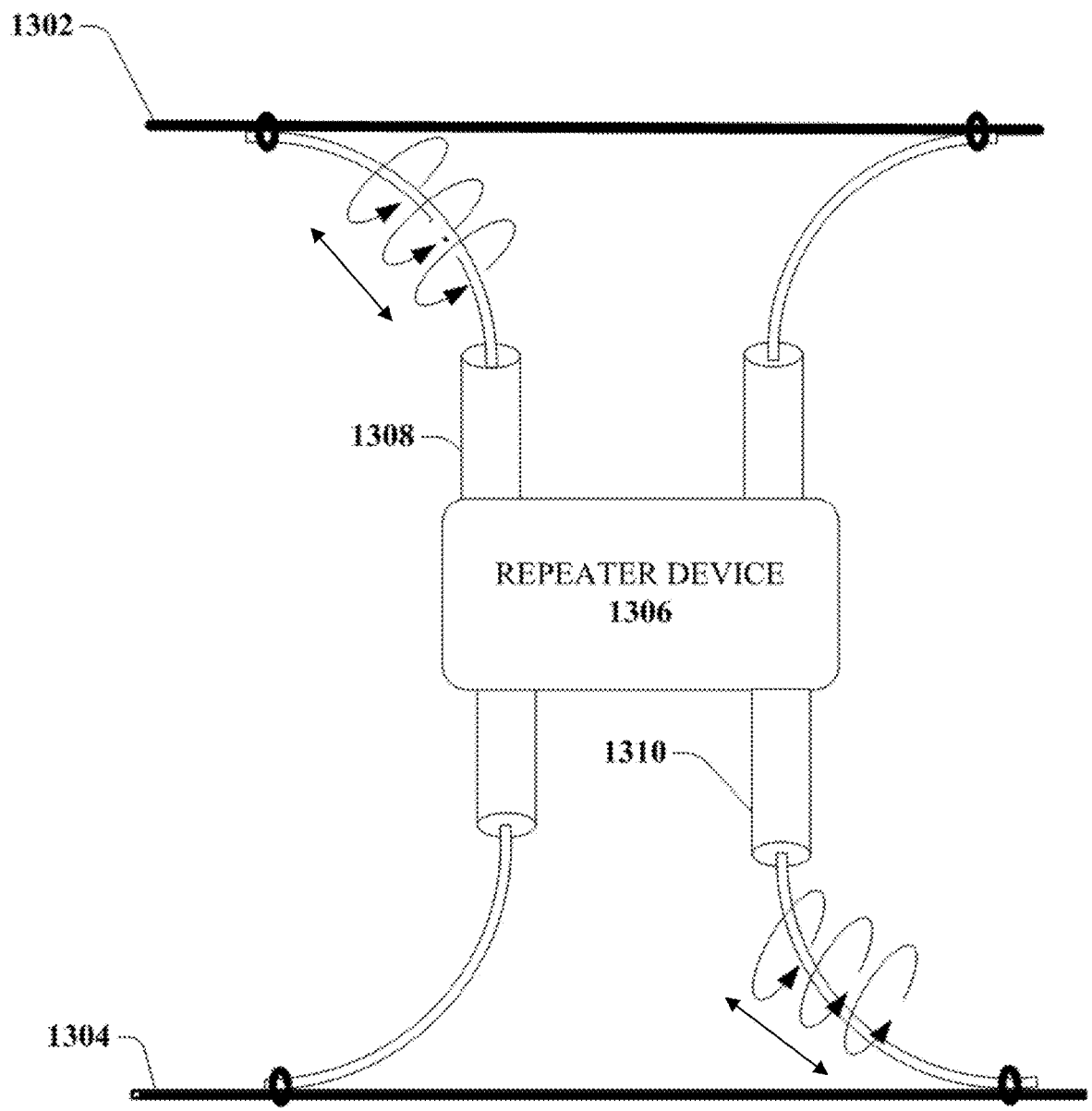
FIG. 13 illustrates a block diagram illustrating an example, non-limiting embodiment of a bidirectional repeater in accordance with various aspects described herein.

Turning now to FIG. 13, illustrated is a block diagram 1300 of an example, non-limiting embodiment of a bidirectional repeater in accordance with various aspects described herein. In particular, a bidirectional repeater device 1306 is presented for use in a transmission device, such as transmission device 101 or 102 presented in conjunction with FIG. 1. It should be noted that while the couplers are illustrated as stub couplers, any other of the coupler designs described herein including arc couplers, antenna or horn couplers, magnetic couplers, or the like, could likewise be used. The bidirectional repeater 1306 can employ diversity paths in the case of when two or more wires or other transmission media are present. Since guided wave transmissions have different transmission efficiencies and coupling efficiencies for transmission medium of different types such as insulated wires, un-insulated wires or other types of transmission media and further, if exposed to the elements, can be affected by weather, and other atmospheric conditions, it can be advantageous to selectively transmit on different transmission media at certain times. In various embodiments, the various transmission media can be designated as a primary, secondary, tertiary, etc. whether or not such designation indicates a preference of one transmission medium over another.

In the embodiment shown, the transmission media include an insulated or uninsulated wire 1302 and an insulated or uninsulated wire 1304 (referred to herein as wires 1302 and 1304, respectively). The repeater device 1306 uses a receiver coupler 1308 to receive a guided wave traveling along wire 1302 and repeats the transmission using transmitter waveguide 1310 as a guided wave along wire 1304. In other embodiments, repeater device 1306 can switch from the wire 1304 to the wire 1302, or can repeat the transmissions along the same paths. Repeater device 1306 can include sensors, or be in communication with sensors (or a network management system 1601 depicted in FIG. 16A) that indicate conditions that can affect the transmission. Based on the feedback received from the sensors, the repeater device 1306 can make the determination about whether to keep the transmission along the same wire, or transfer the transmission to the other wire.

Figure 14:
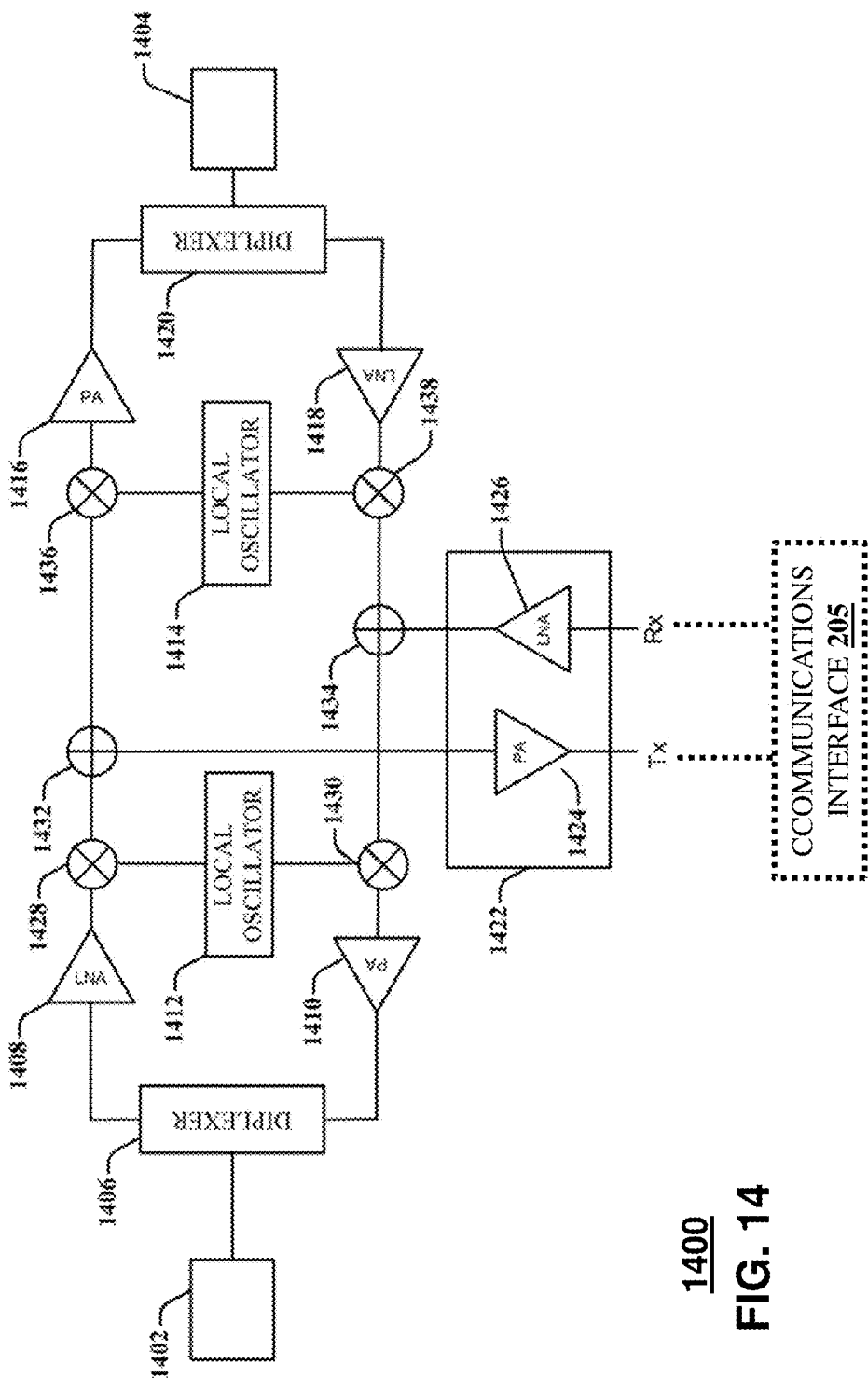
FIG. 14 is a block diagram illustrating an example, non-limiting embodiment of a waveguide system in accordance with various aspects described herein.

Turning now to FIG. 14, illustrated is a block diagram 1400 illustrating an example, non-limiting embodiment of a bidirectional repeater system. In particular, a bidirectional repeater system is presented for use in a transmission device, such as transmission device 101 or 102 presented in conjunction with FIG. 1. The bidirectional repeater system includes waveguide coupling devices 1402 and 1404 that receive and transmit transmissions from other coupling devices located in a distributed antenna system or backhaul system.

In various embodiments, waveguide coupling device 1402 can receive a transmission from another waveguide coupling device, wherein the transmission has a plurality of subcarriers. Diplexer 1406 can separate the transmission from other transmissions, and direct the transmission to low-noise amplifier ("LNA") 1408. A frequency mixer 1428, with help from a local oscillator 1412, can downshift the transmission (which is in the millimeter-wave band or around 38 GHz in some embodiments) to a lower frequency, such as a cellular band (~1.9 GHz) for a distributed antenna system, a native frequency, or other frequency for a backhaul system. An extractor (or demultiplexer) 1432 can extract the signal on a subcarrier and direct the signal to an output component 1422 for optional amplification, buffering or isolation by power amplifier 1424 for coupling to communications interface 205. The communications interface 205 can further process the signals received from the power amplifier 1424 or otherwise transmit such signals over a wireless or wired interface to other devices such as a base station, mobile devices, a building, etc. For the signals that are not being extracted at this location, extractor 1432 can redirect them to another frequency mixer 1436, where the signals are used to modulate a carrier wave generated by local oscillator 1414. The carrier wave, with its subcarriers, is directed to a power amplifier ("PA") 1416 and is retransmitted by waveguide coupling device 1404 to another system, via diplexer 1420.

An LNA 1426 can be used to amplify, buffer or isolate signals that are received by the communication interface 205 and then send the signal to a multiplexer 1434 which merges the signal with signals that have been received from waveguide coupling device 1404. The signals received from coupling device 1404 have been split by diplexer 1420, and then passed through LNA 1418, and downshifted in frequency by frequency mixer 1438. When the signals are combined by multiplexer 1434, they are upshifted in frequency by frequency mixer 1430, and then boosted by PA 1410, and transmitted to another system by waveguide coupling device 1402. In an embodiment bidirectional repeater system can be merely a repeater without the output device 1422. In this embodiment, the multiplexer 1434 would not be utilized and signals from LNA 1418 would be directed to mixer 1430 as previously described. It will be appreciated that in some embodiments, the bidirectional repeater system could also be implemented using two distinct and separate unidirectional repeaters. In an alternative embodiment, a bidirectional repeater system could also be a booster or otherwise perform retransmissions without downshifting and upshifting. Indeed in example embodiment, the retransmissions can be based upon receiving a signal or guided wave and performing some signal or guided wave processing or reshaping, filtering, and/or amplification, prior to retransmission of the signal or guided wave.

Figure 15:
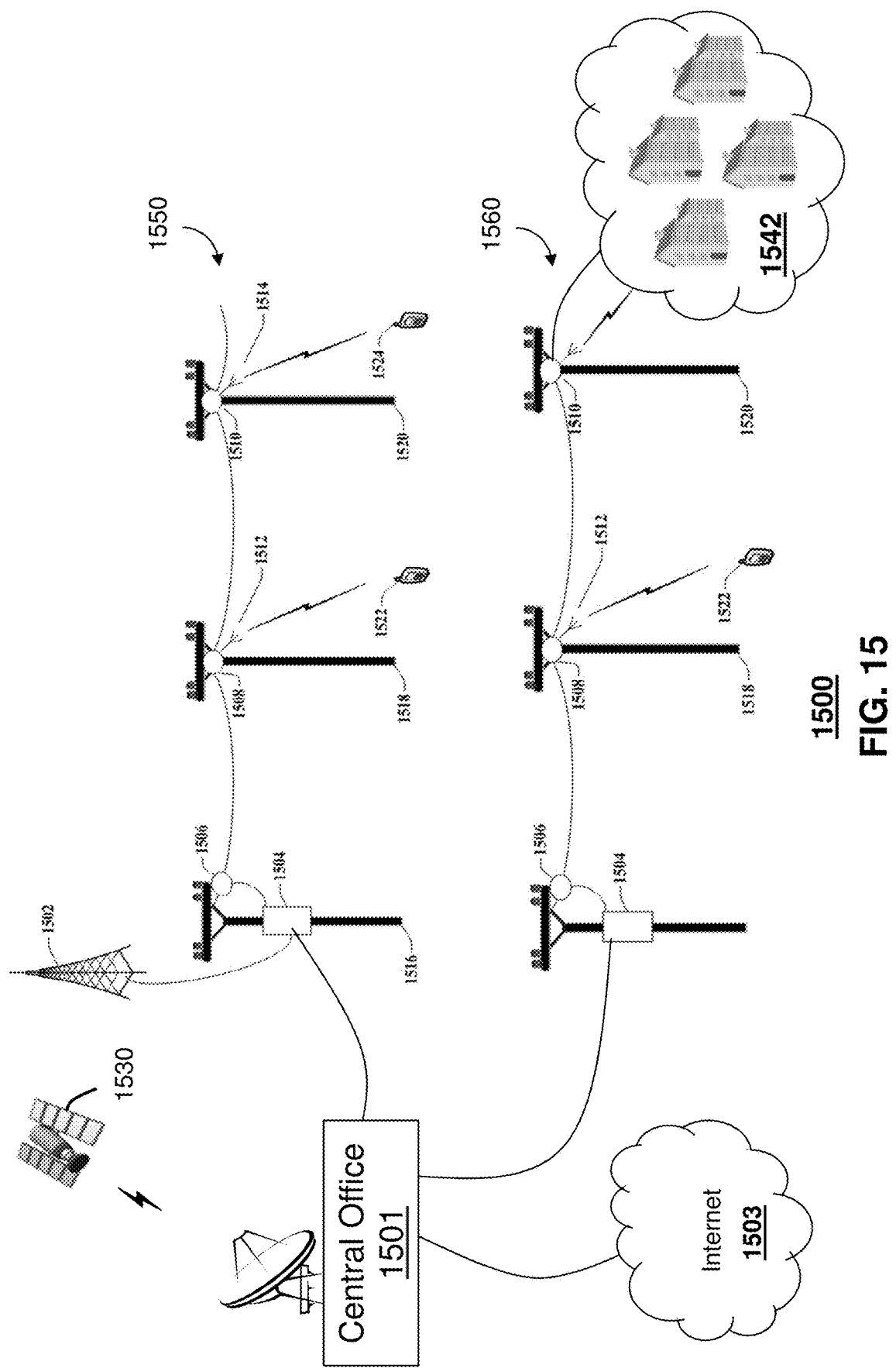
FIG. 15 is a block diagram illustrating an example, non-limiting embodiment of a guided-wave communications system in accordance with various aspects described herein.

Referring now to FIG. 15, a block diagram 1500 illustrating an example, non-limiting embodiment of a guided wave communications system is shown. This diagram depicts an exemplary environment in which a guided wave communication system, such as the guided wave communication system presented in conjunction with FIG. 1, can be used.

To provide network connectivity to additional base station devices, a backhaul network that links the communication cells (e.g., macrocells and macrocells) to network devices of a core network correspondingly expands. Similarly, to provide network connectivity to a distributed antenna system, an extended communication system that links base station devices and their distributed antennas is desirable. A guided wave communication system 1500 such as shown in FIG. 15 can be provided to enable alternative, increased or additional network connectivity and a waveguide coupling system can be provided to transmit and/or receive guided wave (e.g., surface wave) communications on a transmission medium such as a wire that operates as a single-wire transmission line (e.g., a utility line), and that can be used as a waveguide and/or that otherwise operates to guide the transmission of an electromagnetic wave.

The guided wave communication system 1500 can comprise a first instance of a distribution system 1550 that includes one or more base station devices (e.g., base station device 1504) that are communicably coupled to a central office 1501 and/or a macrocell site 1502. Base station device 1504 can be connected by a wired (e.g., fiber and/or cable), or by a wireless (e.g., microwave wireless) connection to the macrocell site 1502 and the central office 1501. A second instance of the distribution system 1560 can be used to provide wireless voice and data services to mobile device 1522 and to residential and/or commercial establishments 1542 (herein referred to as establishments 1542). System 1500 can have additional instances of the distribution systems 1550 and 1560 for providing voice and/or data services to mobile devices 1522-1524 and establishments 1542 as shown in FIG. 15.

Macrocells such as macrocell site 1502 can have dedicated connections to a mobile network and base station device 1504 or can share and/or otherwise use another connection. Central office 1501 can be used to distribute media content and/or provide internet service provider (ISP) services to mobile devices 1522-1524 and establishments 1542. The central office 1501 can receive media content from a constellation of satellites 1530 (one of which is shown in FIG. 15) or other sources of content, and distribute such content to mobile devices 1522-1524 and establishments 1542 via the first and second instances of the distribution system 1550 and 1560. The central office 1501 can also be communicatively coupled to the Internet 1503 for providing internet data services to mobile devices 1522-1524 and establishments 1542.

Base station device 1504 can be mounted on, or attached to, utility pole 1516. In other embodiments, base station device 1504 can be near transformers and/or other locations situated nearby a power line. Base station device 1504 can facilitate connectivity to a mobile network for mobile devices 1522 and 1524. Antennas 1512 and 1514, mounted on or near utility poles 1518 and 1520, respectively, can receive signals from base station device 1504 and transmit those signals to mobile devices 1522 and 1524 over a much wider area than if the antennas 1512 and 1514 were located at or near base station device 1504.

It is noted that FIG. 15 displays three utility poles, in each instance of the distribution systems 1550 and 1560, with one base station device, for purposes of simplicity. In other embodiments, utility pole 1516 can have more base station devices, and more utility poles with distributed antennas and/or tethered connections to establishments 1542.

A transmission device 1506, such as transmission device 101 or 102 presented in conjunction with FIG. 1, can transmit a signal from base station device 1504 to antennas 1512 and 1514 via utility or power line(s) that connect the utility poles 1516, 1518, and 1520. To transmit the signal, radio source and/or transmission device 1506 upconverts the signal (e.g., via frequency mixing) from base station device 1504 or otherwise converts the signal from the base station device 1504 to a microwave band signal and the transmission device 1506 launches a microwave band wave that propagates as a guided wave traveling along the utility line or other wire as described in previous embodiments. At utility pole 1518, another transmission device 1508 receives the guided wave (and optionally can amplify it as needed or desired or operate as a repeater to receive it and regenerate it) and sends it forward as a guided wave on the utility line or other wire. The transmission device 1508 can also extract a signal from the microwave band guided wave and shift it down in frequency or otherwise convert it to its original cellular band frequency (e.g., 1.9 GHz or other defined cellular frequency) or another cellular (or non-cellular) band frequency. An antenna 1512 can wireless transmit the downshifted signal to mobile device 1522. The process can be repeated by transmission device 1510, antenna 1514 and mobile device 1524, as necessary or desirable.

Transmissions from mobile devices 1522 and 1524 can also be received by antennas 1512 and 1514 respectively. The transmission devices 1508 and 1510 can upshift or otherwise convert the cellular band signals to microwave band and transmit the signals as guided wave (e.g., surface wave or other electromagnetic wave) transmissions over the power line(s) to base station device 1504.

Media content received by the central office 1501 can be supplied to the second instance of the distribution system 1560 via the base station device 1504 for distribution to mobile devices 1522 and establishments 1542. The transmission device 1510 can be tethered to the establishments 1542 by one or more wired connections or a wireless interface. The one or more wired connections may include without limitation, a power line, a coaxial cable, a fiber cable, a twisted pair cable, a guided wave transmission medium or other suitable wired mediums for distribution of media content and/or for providing internet services. In an example embodiment, the wired connections from the transmission device 1510 can be communicatively coupled to one or more very high bit rate digital subscriber line (VDSL) modems located at one or more corresponding service area interfaces (SAIs—not shown) or pedestals, each SAI or pedestal providing services to a portion of the establishments 1542. The VDSL modems can be used to selectively distribute media content and/or provide internet services to gateways (not shown) located in the establishments 1542. The SAIs or pedestals can also be communicatively coupled to the establishments 1542 over a wired medium such as a power line, a coaxial cable, a fiber cable, a twisted pair cable, a guided wave transmission medium or other suitable wired mediums. In other example embodiments, the transmission device 1510 can be communicatively coupled directly to establishments 1542 without intermediate interfaces such as the SAIs or pedestals.

In another example embodiment, system 1500 can employ diversity paths, where two or more utility lines or other wires are strung between the utility poles 1516, 1518, and 1520 (e.g., for example, two or more wires between poles 1516 and 1520) and redundant transmissions from base station/macrocell site 1502 are transmitted as guided waves down the surface of the utility lines or other wires. The utility lines or other wires can be either insulated or uninsulated, and depending on the environmental conditions that cause transmission losses, the coupling devices can selectively receive signals from the insulated or uninsulated utility lines or other wires. The selection can be based on measurements of the signal-to-noise ratio of the wires, or based on determined weather/environmental conditions (e.g., moisture detectors, weather forecasts, etc.). The use of diversity paths with system 1500 can enable alternate routing capabilities, load balancing, increased load handling, concurrent bi-directional or synchronous communications, spread spectrum communications, etc.

It is noted that the use of the transmission devices 1506, 1508, and 1510 in FIG. 15 are by way of example only, and that in other embodiments, other uses are possible. For instance, transmission devices can be used in a backhaul communication system, providing network connectivity to base station devices. Transmission devices 1506, 1508, and 1510 can be used in many circumstances where it is desirable to transmit guided wave communications over a wire, whether insulated or not insulated. Transmission devices 1506, 1508, and 1510 are improvements over other coupling devices due to no contact or limited physical and/or electrical contact with the wires that may carry high voltages. The transmission device can be located away from the wire (e.g., spaced apart from the wire) and/or located on the wire so long as it is not electrically in contact with the wire, as the dielectric acts as an insulator, allowing for cheap, easy, and/or less complex installation. However, as previously noted conducting or non-dielectric couplers can be employed, for example in configurations where the wires correspond to a telephone network, cable television network, broadband data service, fiber optic communications system or other network employing low voltages or having insulated transmission lines.

It is further noted, that while base station device 1504 and macrocell site 1502 are illustrated in an embodiment, other network configurations are likewise possible. For example, devices such as access points or other wireless gateways can be employed in a similar fashion to extend the reach of other networks such as a wireless local area network, a wireless personal area network or other wireless network that operates in accordance with a communication protocol such as a 802.11 protocol, WIMAX protocol, UltraWideband protocol, Bluetooth protocol, ZigBee protocol or other wireless protocol.

Figure 16A:
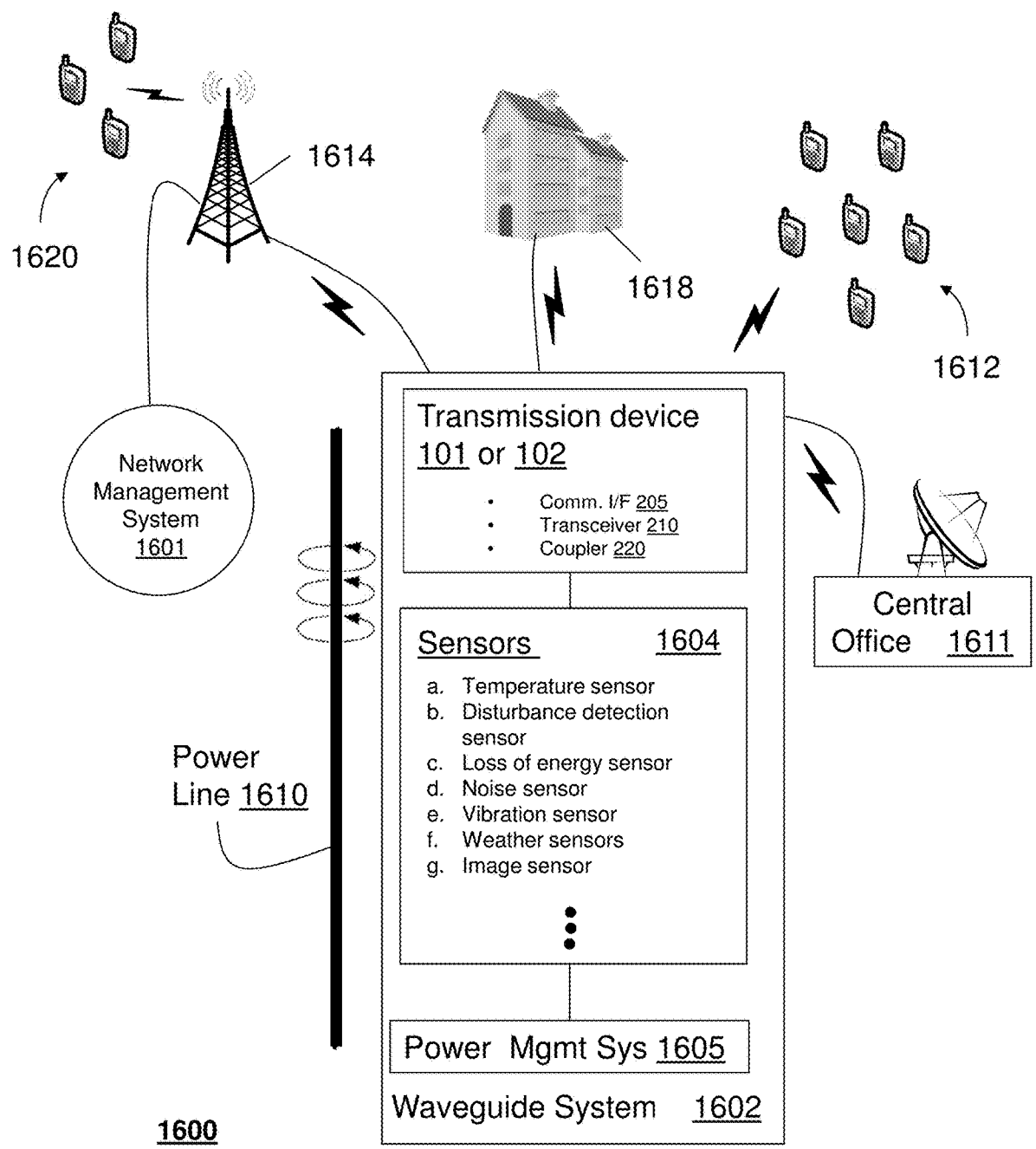
FIGS. 16A & 16B are block diagrams illustrating an example, non-limiting embodiment of a system for managing a power grid communication system in accordance with various aspects described herein.
Figure 16B:
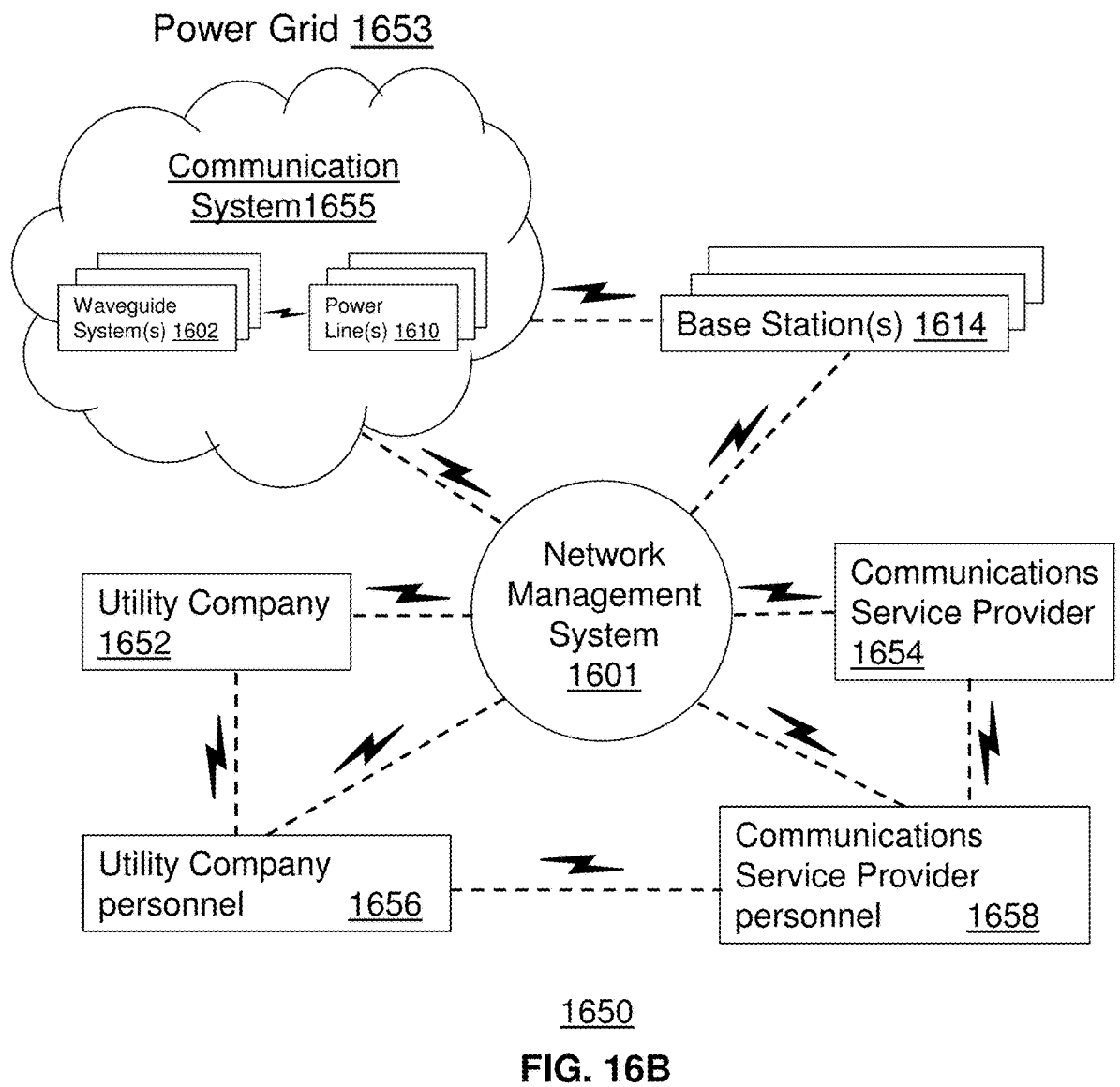

Referring now to FIGS. 16A & 16B, block diagrams illustrating an example, non-limiting embodiment of a system for managing a power grid communication system are shown. Considering FIG. 16A, a waveguide system 1602 is presented for use in a guided wave communications system, such as the system presented in conjunction with FIG. 15. The waveguide system 1602 can comprise sensors 1604, a power management system 1605, a transmission device 101 or 102 that includes at least one communication interface 205, transceiver 210 and coupler 220.

The waveguide system 1602 can be coupled to a power line 1610 for facilitating guided wave communications in accordance with embodiments described in the subject disclosure. In an example embodiment, the transmission device 101 or 102 includes coupler 220 for inducing electromagnetic waves on a surface of the power line 1610 that longitudinally propagate along the surface of the power line 1610 as described in the subject disclosure. The transmission device 101 or 102 can also serve as a repeater for retransmitting electromagnetic waves on the same power line 1610 or for routing electromagnetic waves between power lines 1610 as shown in FIGS. 12-13.

The transmission device 101 or 102 includes transceiver 210 configured to, for example, up-convert a signal operating at an original frequency range to electromagnetic waves operating at, exhibiting, or associated with a carrier frequency that propagate along a coupler to induce corresponding guided electromagnetic waves that propagate along a surface of the power line 1610. A carrier frequency can be represented by a center frequency having upper and lower cutoff frequencies that define the bandwidth of the electromagnetic waves. The power line 1610 can be a wire (e.g., single stranded or multi-stranded) having a conducting surface or insulated surface. The transceiver 210 can also receive signals from the coupler 220 and down-convert the electromagnetic waves operating at a carrier frequency to signals at their original frequency.

Signals received by the communications interface 205 of transmission device 101 or 102 for up-conversion can include without limitation signals supplied by a central office 1611 over a wired or wireless interface of the communications interface 205, a base station 1614 over a wired or wireless interface of the communications interface 205, wireless signals transmitted by mobile devices 1620 to the base station 1614 for delivery over the wired or wireless interface of the communications interface 205, signals supplied by in-building communication devices 1618 over the wired or wireless interface of the communications interface 205, and/or wireless signals supplied to the communications interface 205 by mobile devices 1612 roaming in a wireless communication range of the communications interface 205. In embodiments where the waveguide system 1602 functions as a repeater, such as shown in FIGS. 12-13, the communications interface 205 may or may not be included in the waveguide system 1602.

The electromagnetic waves propagating along the surface of the power line 1610 can be modulated and formatted to include packets or frames of data that include a data payload and further include networking information (such as header information for identifying one or more destination waveguide systems 1602). The networking information may be provided by the waveguide system 1602 or an originating device such as the central office 1611, the base station 1614, mobile devices 1620, or in-building devices 1618, or a combination thereof. Additionally, the modulated electromagnetic waves can include error correction data for mitigating signal disturbances. The networking information and error correction data can be used by a destination waveguide system 1602 for detecting transmissions directed to it, and for down-converting and processing with error correction data transmissions that include voice and/or data signals directed to recipient communication devices communicatively coupled to the destination waveguide system 1602.

Referring now to the sensors 1604 of the waveguide system 1602, the sensors 1604 can comprise one or more of a temperature sensor 1604a, a disturbance detection sensor 1604b, a loss of energy sensor 1604c, a noise sensor 1604d, a vibration sensor 1604e, an environmental (e.g., weather) sensor 1604f, and/or an image sensor 1604g. The temperature sensor 1604a can be used to measure ambient temperature, a temperature of the transmission device 101 or 102, a temperature of the power line 1610, temperature differentials (e.g., compared to a setpoint or baseline, between transmission device 101 or 102 and 1610, etc.), or any combination thereof. In one embodiment, temperature metrics can be collected and reported periodically to a network management system 1601 by way of the base station 1614.

The disturbance detection sensor 1604b can perform measurements on the power line 1610 to detect disturbances such as signal reflections, which may indicate a presence of a downstream disturbance that may impede the propagation of electromagnetic waves on the power line 1610. A signal reflection can represent a distortion resulting from, for example, an electromagnetic wave transmitted on the power line 1610 by the transmission device 101 or 102 that reflects in whole or in part back to the transmission device 101 or 102 from a disturbance in the power line 1610 located downstream from the transmission device 101 or 102.

Signal reflections can be caused by obstructions on the power line 1610. For example, a tree limb may cause electromagnetic wave reflections when the tree limb is lying on the power line 1610, or is in close proximity to the power line 1610 which may cause a corona discharge. Other obstructions that can cause electromagnetic wave reflections can include without limitation an object that has been entangled on the power line 1610 (e.g., clothing, a shoe wrapped around a power line 1610 with a shoe string, etc.), a corroded build-up on the power line 1610 or an ice build-up. Power grid components may also impede or obstruct with the propagation of electromagnetic waves on the surface of power lines 1610. Illustrations of power grid components that may cause signal reflections include without limitation a transformer and a joint for connecting spliced power lines. A sharp angle on the power line 1610 may also cause electromagnetic wave reflections.

The disturbance detection sensor 1604b can comprise a circuit to compare magnitudes of electromagnetic wave reflections to magnitudes of original electromagnetic waves transmitted by the transmission device 101 or 102 to determine how much a downstream disturbance in the power line 1610 attenuates transmissions. The disturbance detection sensor 1604b can further comprise a spectral analyzer circuit for performing spectral analysis on the reflected waves. The spectral data generated by the spectral analyzer circuit can be compared with spectral profiles via pattern recognition, an expert system, curve fitting, matched filtering or other artificial intelligence, classification or comparison technique to identify a type of disturbance based on, for example, the spectral profile that most closely matches the spectral data. The spectral profiles can be stored in a memory of the disturbance detection sensor 1604*b* or may be remotely accessible by the disturbance detection sensor 1604*b*. The profiles can comprise spectral data that models different disturbances that may be encountered on power lines 1610 to enable the disturbance detection sensor 1604*b* to identify disturbances locally. An identification of the disturbance if known can be reported to the network management system 1601 by way of the base station 1614. The disturbance detection sensor 1604*b* can also utilize the transmission device 101 or 102 to transmit electromagnetic waves as test signals to determine a roundtrip time for an electromagnetic wave reflection. The round trip time measured by the disturbance detection sensor 1604*b* can be used to calculate a distance traveled by the electromagnetic wave up to a point where the reflection takes place, which enables the disturbance detection sensor 1604*b* to calculate a distance from the transmission device 101 or 102 to the downstream disturbance on the power line 1610.

The distance calculated can be reported to the network management system 1601 by way of the base station 1614. In one embodiment, the location of the waveguide system 1602 on the power line 1610 may be known to the network management system 1601, which the network management system 1601 can use to determine a location of the disturbance on the power line 1610 based on a known topology of the power grid. In another embodiment, the waveguide system 1602 can provide its location to the network management system 1601 to assist in the determination of the location of the disturbance on the power line 1610. The location of the waveguide system 1602 can be obtained by the waveguide system 1602 from a pre-programmed location of the waveguide system 1602 stored in a memory of the waveguide system 1602, or the waveguide system 1602 can determine its location using a GPS receiver (not shown) included in the waveguide system 1602.

The power management system 1605 provides energy to the aforementioned components of the waveguide system 1602. The power management system 1605 can receive energy from solar cells, or from a transformer (not shown) coupled to the power line 1610, or by inductive coupling to the power line 1610 or another nearby power line. The power management system 1605 can also include a backup battery and/or a super capacitor or other capacitor circuit for providing the waveguide system 1602 with temporary power. The loss of energy sensor 1604*c* can be used to detect when the waveguide system 1602 has a loss of power condition and/or the occurrence of some other malfunction. For example, the loss of energy sensor 1604*c* can detect when there is a loss of power due to defective solar cells, an obstruction on the solar cells that causes them to malfunction, loss of power on the power line 1610, and/or when the backup power system malfunctions due to expiration of a backup battery, or a detectable defect in a super capacitor. When a malfunction and/or loss of power occurs, the loss of energy sensor 1604*c* can notify the network management system 1601 by way of the base station 1614.

The noise sensor 1604*d* can be used to measure noise on the power line 1610 that may adversely affect transmission of electromagnetic waves on the power line 1610. The noise sensor 1604*d* can sense unexpected electromagnetic interference, noise bursts, or other sources of disturbances that may interrupt reception of modulated electromagnetic waves on a surface of a power line 1610. A noise burst can be caused by, for example, a corona discharge, or other source of noise. The noise sensor 1604*d* can compare the measured noise to a noise profile obtained by the waveguide system 1602 from an internal database of noise profiles or from a remotely located database that stores noise profiles via pattern recognition, an expert system, curve fitting, matched filtering or other artificial intelligence, classification or comparison technique. From the comparison, the noise sensor 1604*d* may identify a noise source (e.g., corona discharge or otherwise) based on, for example, the noise profile that provides the closest match to the measured noise. The noise sensor 1604*d* can also detect how noise affects transmissions by measuring transmission metrics such as bit error rate, packet loss rate, jitter, packet retransmission requests, etc. The noise sensor 1604*d* can report to the network management system 1601 by way of the base station 1614 the identity of noise sources, their time of occurrence, and transmission metrics, among other things.

The vibration sensor 1604*e* can include accelerometers and/or gyroscopes to detect 2D or 3D vibrations on the power line 1610. The vibrations can be compared to vibration profiles that can be stored locally in the waveguide system 1602, or obtained by the waveguide system 1602 from a remote database via pattern recognition, an expert system, curve fitting, matched filtering or other artificial intelligence, classification or comparison technique. Vibration profiles can be used, for example, to distinguish fallen trees from wind gusts based on, for example, the vibration profile that provides the closest match to the measured vibrations. The results of this analysis can be reported by the vibration sensor 1604*e* to the network management system 1601 by way of the base station 1614.

The environmental sensor 1604*f* can include a barometer for measuring atmospheric pressure, ambient temperature (which can be provided by the temperature sensor 1604*a*), wind speed, humidity, wind direction, and rainfall, among other things. The environmental sensor 1604*f* can collect raw information and process this information by comparing it to environmental profiles that can be obtained from a memory of the waveguide system 1602 or a remote database to predict weather conditions before they arise via pattern recognition, an expert system, knowledge-based system or other artificial intelligence, classification or other weather modeling and prediction technique. The environmental sensor 1604*f* can report raw data as well as its analysis to the network management system 1601.

The image sensor 1604*g* can be a digital camera (e.g., a charged coupled device or CCD imager, infrared camera, etc.) for capturing images in a vicinity of the waveguide system 1602. The image sensor 1604*g* can include an electromechanical mechanism to control movement (e.g., actual position or focal points/zooms) of the camera for inspecting the power line 1610 from multiple perspectives (e.g., top surface, bottom surface, left surface, right surface and so on). Alternatively, the image sensor 1604*g* can be designed such that no electromechanical mechanism is needed in order to obtain the multiple perspectives. The collection and retrieval of imaging data generated by the image sensor 1604*g* can be controlled by the network management system 1601, or can be autonomously collected and reported by the image sensor 1604*g* to the network management system 1601.

Other sensors that may be suitable for collecting telemetry information associated with the waveguide system 1602 and/or the power lines 1610 for purposes of detecting, predicting and/or mitigating disturbances that can impede the propagation of electromagnetic wave transmissions on power lines 1610 (or any other form of a transmission medium of electromagnetic waves) may be utilized by the waveguide system 1602.

Referring now to FIG. 16B, block diagram 1650 illustrates an example, non-limiting embodiment of a system for managing a power grid 1653 and a communication system 1655 embedded therein or associated therewith in accordance with various aspects described herein. The communication system 1655 comprises a plurality of waveguide systems 1602 coupled to power lines 1610 of the power grid 1653. At least a portion of the waveguide systems 1602 used in the communication system 1655 can be in direct communication with a base station 1614 and/or the network management system 1601. Waveguide systems 1602 not directly connected to a base station 1614 or the network management system 1601 can engage in communication sessions with either a base station 1614 or the network management system 1601 by way of other downstream waveguide systems 1602 connected to a base station 1614 or the network management system 1601.

The network management system 1601 can be communicatively coupled to equipment of a utility company 1652 and equipment of a communications service provider 1654 for providing each entity, status information associated with the power grid 1653 and the communication system 1655, respectively. The network management system 1601, the equipment of the utility company 1652, and the communications service provider 1654 can access communication devices utilized by utility company personnel 1656 and/or communication devices utilized by communications service provider personnel 1658 for purposes of providing status information and/or for directing such personnel in the management of the power grid 1653 and/or communication system 1655.

Figure 17A:
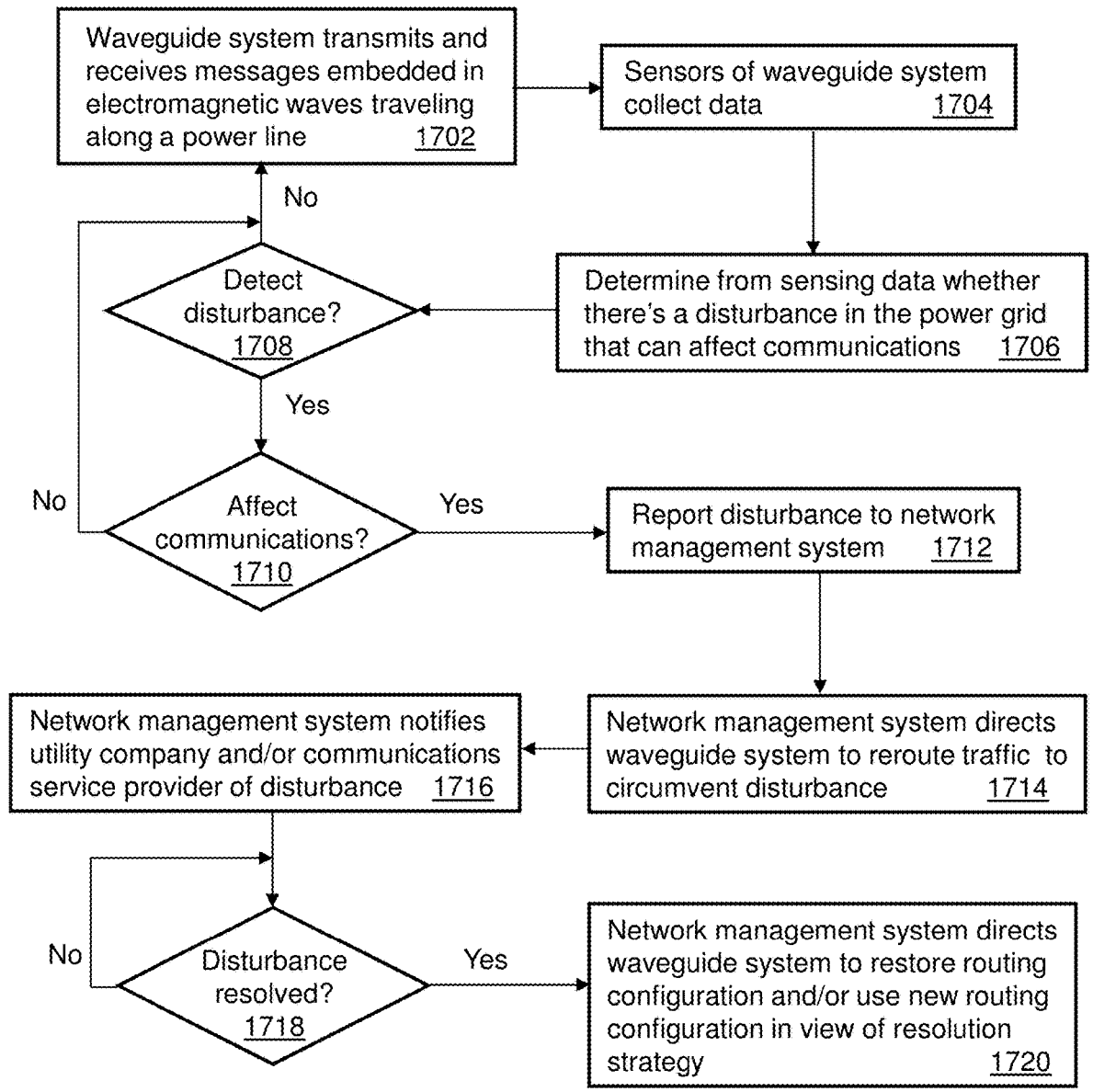
FIG. 17A illustrates a flow diagram of an example, non-limiting embodiment of a method for detecting and mitigating disturbances occurring in a communication network of the system of FIGS. 16A and 16B.

FIG. 17A illustrates a flow diagram of an example, non-limiting embodiment of a method 1700 for detecting and mitigating disturbances occurring in a communication network of the systems of FIGS. 16A & 16B. Method 1700 can begin with step 1702 where a waveguide system 1602 transmits and receives messages embedded in, or forming part of, modulated electromagnetic waves or another type of electromagnetic waves traveling along a surface of a power line 1610. The messages can be voice messages, streaming video, and/or other data/information exchanged between communication devices communicatively coupled to the communication system 1655. At step 1704 the sensors 1604 of the waveguide system 1602 can collect sensing data. In an embodiment, the sensing data can be collected in step 1704 prior to, during, or after the transmission and/or receipt of messages in step 1702. At step 1706 the waveguide system 1602 (or the sensors 1604 themselves) can determine from the sensing data an actual or predicted occurrence of a disturbance in the communication system 1655 that can affect communications originating from (e.g., transmitted by) or received by the waveguide system 1602. The waveguide system 1602 (or the sensors 1604) can process temperature data, signal reflection data, loss of energy data, noise data, vibration data, environmental data, or any combination thereof to make this determination. The waveguide system 1602 (or the sensors 1604) may also detect, identify, estimate, or predict the source of the disturbance and/or its location in the communication system 1655. If a disturbance is neither detected/identified nor predicted/estimated at step 1708, the waveguide system 1602 can proceed to step 1702 where it continues to transmit and receive messages embedded in, or forming part of, modulated electromagnetic waves traveling along a surface of the power line 1610.

If at step 1708 a disturbance is detected/identified or predicted/estimated to occur, the waveguide system 1602 proceeds to step 1710 to determine if the disturbance adversely affects (or alternatively, is likely to adversely affect or the extent to which it may adversely affect) transmission or reception of messages in the communication system 1655. In one embodiment, a duration threshold and a frequency of occurrence threshold can be used at step 1710 to determine when a disturbance adversely affects communications in the communication system 1655. For illustration purposes only, assume a duration threshold is set to 500 ms, while a frequency of occurrence threshold is set to 5 disturbances occurring in an observation period of 10 sec. Thus, a disturbance having a duration greater than 500 ms will trigger the duration threshold. Additionally, any disturbance occurring more than 5 times in a 10 sec time interval will trigger the frequency of occurrence threshold.

In one embodiment, a disturbance may be considered to adversely affect signal integrity in the communication systems 1655 when the duration threshold alone is exceeded. In another embodiment, a disturbance may be considered as adversely affecting signal integrity in the communication systems 1655 when both the duration threshold and the frequency of occurrence threshold are exceeded. The latter embodiment is thus more conservative than the former embodiment for classifying disturbances that adversely affect signal integrity in the communication system 1655. It will be appreciated that many other algorithms and associated parameters and thresholds can be utilized for step 1710 in accordance with example embodiments.

Referring back to method 1700, if at step 1710 the disturbance detected at step 1708 does not meet the condition for adversely affected communications (e.g., neither exceeds the duration threshold nor the frequency of occurrence threshold), the waveguide system 1602 may proceed to step 1702 and continue processing messages. For instance, if the disturbance detected in step 1708 has a duration of 1 ms with a single occurrence in a 10 sec time period, then neither threshold will be exceeded. Consequently, such a disturbance may be considered as having a nominal effect on signal integrity in the communication system 1655 and thus would not be flagged as a disturbance requiring mitigation. Although not flagged, the occurrence of the disturbance, its time of occurrence, its frequency of occurrence, spectral data, and/or other useful information, may be reported to the network management system 1601 as telemetry data for monitoring purposes.

Referring back to step 1710, if on the other hand the disturbance satisfies the condition for adversely affected communications (e.g., exceeds either or both thresholds), the waveguide system 1602 can proceed to step 1712 and report the incident to the network management system 1601. The report can include raw sensing data collected by the sensors 1604, a description of the disturbance if known by the waveguide system 1602, a time of occurrence of the disturbance, a frequency of occurrence of the disturbance, a location associated with the disturbance, parameters readings such as bit error rate, packet loss rate, retransmission requests, jitter, latency and so on. If the disturbance is based on a prediction by one or more sensors of the waveguide system 1602, the report can include a type of disturbance expected, and if predictable, an expected time occurrence of the disturbance, and an expected frequency of occurrence of the predicted disturbance when the prediction is based on historical sensing data collected by the sensors 1604 of the waveguide system 1602.

At step 1714, the network management system 1601 can determine a mitigation, circumvention, or correction technique, which may include directing the waveguide system 1602 to reroute traffic to circumvent the disturbance if the location of the disturbance can be determined. In one embodiment, the waveguide coupling device 1402 detecting the disturbance may direct a repeater such as the one shown in FIGS. 13-14 to connect the waveguide system 1602 from a primary power line affected by the disturbance to a secondary power line to enable the waveguide system 1602 to reroute traffic to a different transmission medium and avoid the disturbance. In an embodiment where the waveguide system 1602 is configured as a repeater the waveguide system 1602 can itself perform the rerouting of traffic from the primary power line to the secondary power line. It is further noted that for bidirectional communications (e.g., full or half-duplex communications), the repeater can be configured to reroute traffic from the secondary power line back to the primary power line for processing by the waveguide system 1602.

In another embodiment, the waveguide system 1602 can redirect traffic by instructing a first repeater situated upstream of the disturbance and a second repeater situated downstream of the disturbance to redirect traffic from a primary power line temporarily to a secondary power line and back to the primary power line in a manner that avoids the disturbance. It is further noted that for bidirectional communications (e.g., full or half-duplex communications), repeaters can be configured to reroute traffic from the secondary power line back to the primary power line.

To avoid interrupting existing communication sessions occurring on a secondary power line, the network management system 1601 may direct the waveguide system 1602 to instruct repeater(s) to utilize unused time slot(s) and/or frequency band(s) of the secondary power line for redirecting data and/or voice traffic away from the primary power line to circumvent the disturbance.

At step 1716, while traffic is being rerouted to avoid the disturbance, the network management system 1601 can notify equipment of the utility company 1652 and/or equipment of the communications service provider 1654, which in turn may notify personnel of the utility company 1656 and/or personnel of the communications service provider 1658 of the detected disturbance and its location if known. Field personnel from either party can attend to resolving the disturbance at a determined location of the disturbance. Once the disturbance is removed or otherwise mitigated by personnel of the utility company and/or personnel of the communications service provider, such personnel can notify their respective companies and/or the network management system 1601 utilizing field equipment (e.g., a laptop computer, smartphone, etc.) communicatively coupled to network management system 1601, and/or equipment of the utility company and/or the communications service provider. The notification can include a description of how the disturbance was mitigated and any changes to the power lines 1610 that may change a topology of the communication system 1655.

Once the disturbance has been resolved (as determined in decision 1718), the network management system 1601 can direct the waveguide system 1602 at step 1720 to restore the previous routing configuration used by the waveguide system 1602 or route traffic according to a new routing configuration if the restoration strategy used to mitigate the disturbance resulted in a new network topology of the communication system 1655. In another embodiment, the waveguide system 1602 can be configured to monitor mitigation of the disturbance by transmitting test signals on the power line 1610 to determine when the disturbance has been removed. Once the waveguide system 1602 detects an absence of the disturbance it can autonomously restore its routing configuration without assistance by the network management system 1601 if it determines the network topology of the communication system 1655 has not changed, or it can utilize a new routing configuration that adapts to a detected new network topology.

Figure 17B:
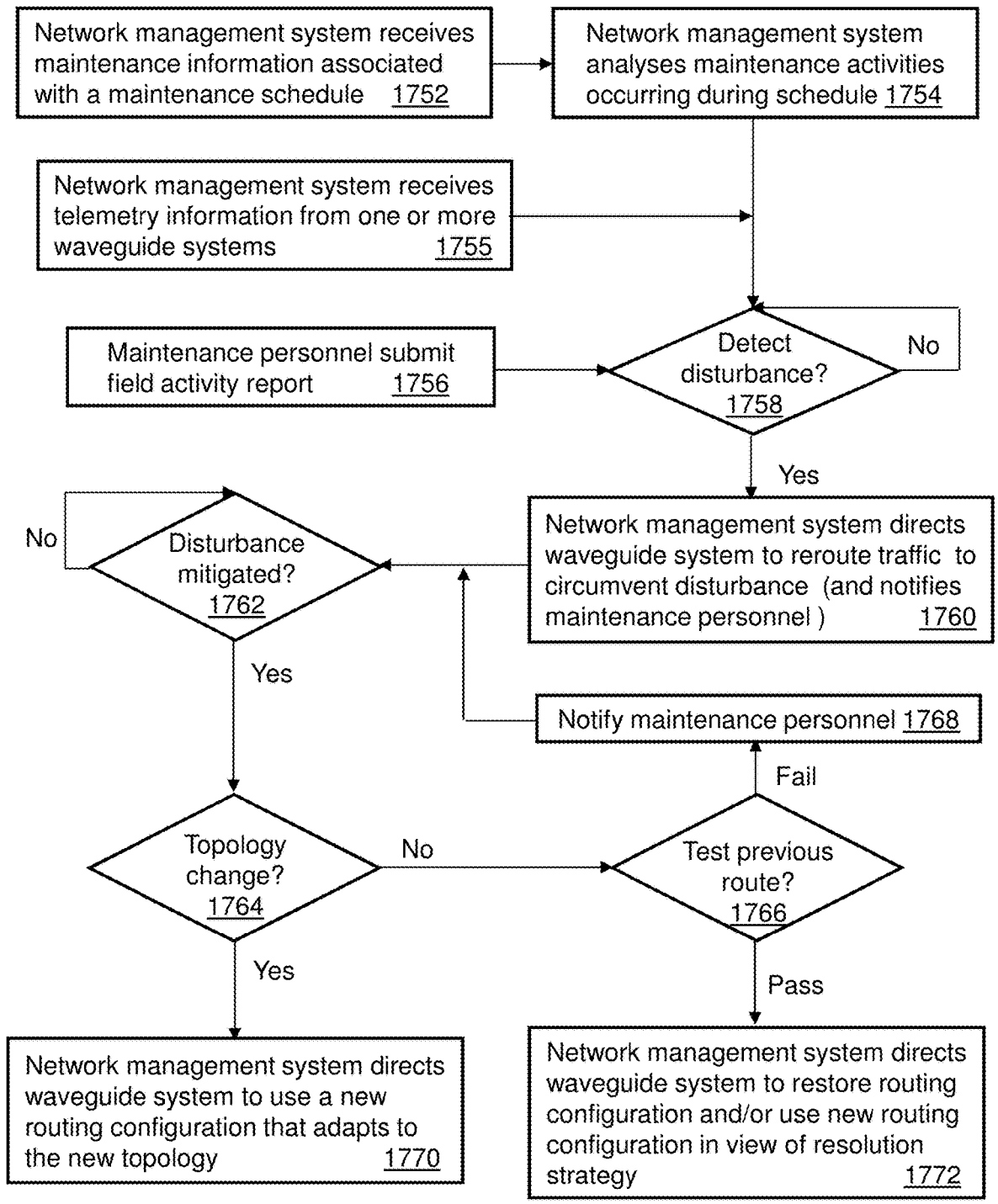
FIG. 17B illustrates a flow diagram of an example, non-limiting embodiment of a method for detecting and mitigating disturbances occurring in a communication network of the system of FIGS. 16A and 16B.

FIG. 17B illustrates a flow diagram of an example, non-limiting embodiment of a method 1750 for detecting and mitigating disturbances occurring in a communication network of the system of FIGS. 16A and 16B. In one embodiment, method 1750 can begin with step 1752 where a network management system 1601 receives from equipment of the utility company 1652 or equipment of the communications service provider 1654 maintenance information associated with a maintenance schedule. The network management system 1601 can at step 1754 identify from the maintenance information, maintenance activities to be performed during the maintenance schedule. From these activities, the network management system 1601 can detect a disturbance resulting from the maintenance (e.g., scheduled replacement of a power line 1610, scheduled replacement of a waveguide system 1602 on the power line 1610, scheduled reconfiguration of power lines 1610 in the power grid 1653, etc.).

In another embodiment, the network management system 1601 can receive at step 1755 telemetry information from one or more waveguide systems 1602. The telemetry information can include among other things an identity of each waveguide system 1602 submitting the telemetry information, measurements taken by sensors 1604 of each waveguide system 1602, information relating to predicted, estimated, or actual disturbances detected by the sensors 1604 of each waveguide system 1602, location information associated with each waveguide system 1602, an estimated location of a detected disturbance, an identification of the disturbance, and so on. The network management system 1601 can determine from the telemetry information a type of disturbance that may be adverse to operations of the waveguide, transmission of the electromagnetic waves along the wire surface, or both. The network management system 1601 can also use telemetry information from multiple waveguide systems 1602 to isolate and identify the disturbance. Additionally, the network management system 1601 can request telemetry information from waveguide systems 1602 in a vicinity of an affected waveguide system 1602 to triangulate a location of the disturbance and/or validate an identification of the disturbance by receiving similar telemetry information from other waveguide systems 1602.

In yet another embodiment, the network management system 1601 can receive at step 1756 an unscheduled activity report from maintenance field personnel. Unscheduled maintenance may occur as result of field calls that are unplanned or as a result of unexpected field issues discovered during field calls or scheduled maintenance activities. The activity report can identify changes to a topology configuration of the power grid 1653 resulting from field personnel addressing discovered issues in the communication system 1655 and/or power grid 1653, changes to one or more waveguide systems 1602 (such as replacement or repair thereof), mitigation of disturbances performed if any, and so on.

At step 1758, the network management system 1601 can determine from reports received according to steps 1752 through 1756 if a disturbance will occur based on a maintenance schedule, or if a disturbance has occurred or is predicted to occur based on telemetry data, or if a disturbance has occurred due to an unplanned maintenance identified in a field activity report. From any of these reports, the network management system 1601 can determine whether a detected or predicted disturbance requires rerouting of traffic by the affected waveguide systems 1602 or other waveguide systems 1602 of the communication system 1655.

When a disturbance is detected or predicted at step 1758, the network management system 1601 can proceed to step 1760 where it can direct one or more waveguide systems 1602 to reroute traffic to circumvent the disturbance. When the disturbance is permanent due to a permanent topology change of the power grid 1653, the network management system 1601 can proceed to step 1770 and skip steps 1762, 1764, 1766, and 1772. At step 1770, the network management system 1601 can direct one or more waveguide systems 1602 to use a new routing configuration that adapts to the new topology. However, when the disturbance has been detected from telemetry information supplied by one or more waveguide systems 1602, the network management system 1601 can notify maintenance personnel of the utility company 1656 or the communications service provider 1658 of a location of the disturbance, a type of disturbance if known, and related information that may be helpful to such personnel to mitigate the disturbance. When a disturbance is expected due to maintenance activities, the network management system 1601 can direct one or more waveguide systems 1602 to reconfigure traffic routes at a given schedule (consistent with the maintenance schedule) to avoid disturbances caused by the maintenance activities during the maintenance schedule.

Returning back to step 1760 and upon its completion, the process can continue with step 1762. At step 1762, the network management system 1601 can monitor when the disturbance(s) have been mitigated by field personnel. Mitigation of a disturbance can be detected at step 1762 by analyzing field reports submitted to the network management system 1601 by field personnel over a communications network (e.g., cellular communication system) utilizing field equipment (e.g., a laptop computer or handheld computer/device). If field personnel have reported that a disturbance has been mitigated, the network management system 1601 can proceed to step 1764 to determine from the field report whether a topology change was required to mitigate the disturbance. A topology change can include rerouting a power line 1610, reconfiguring a waveguide system 1602 to utilize a different power line 1610, otherwise utilizing an alternative link to bypass the disturbance and so on. If a topology change has taken place, the network management system 1601 can direct at step 1770 one or more waveguide systems 1602 to use a new routing configuration that adapts to the new topology.

If, however, a topology change has not been reported by field personnel, the network management system 1601 can proceed to step 1766 where it can direct one or more waveguide systems 1602 to send test signals to test a routing configuration that had been used prior to the detected disturbance(s). Test signals can be sent to affected waveguide systems 1602 in a vicinity of the disturbance. The test signals can be used to determine if signal disturbances (e.g., electromagnetic wave reflections) are detected by any of the waveguide systems 1602. If the test signals confirm that a prior routing configuration is no longer subject to previously detected disturbance(s), then the network management system 1601 can at step 1772 direct the affected waveguide systems 1602 to restore a previous routing configuration. If, however, test signals analyzed by one or more waveguide coupling device 1402 and reported to the network management system 1601 indicate that the disturbance(s) or new disturbance(s) are present, then the network management system 1601 will proceed to step 1768 and report this information to field personnel to further address field issues. The network management system 1601 can in this situation continue to monitor mitigation of the disturbance(s) at step 1762.

In the aforementioned embodiments, the waveguide systems 1602 can be configured to be self-adapting to changes in the power grid 1653 and/or to mitigation of disturbances. That is, one or more affected waveguide systems 1602 can be configured to self-monitor mitigation of disturbances and reconfigure traffic routes without requiring instructions to be sent to them by the network management system 1601. In this embodiment, the one or more waveguide systems 1602 that are self-configurable can inform the network management system 1601 of its routing choices so that the network management system 1601 can maintain a macro-level view of the communication topology of the communication system 1655.

While for purposes of simplicity of explanation, the respective processes are shown and described as a series of blocks in FIGS. 17A and 17B, respectively, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 18A:
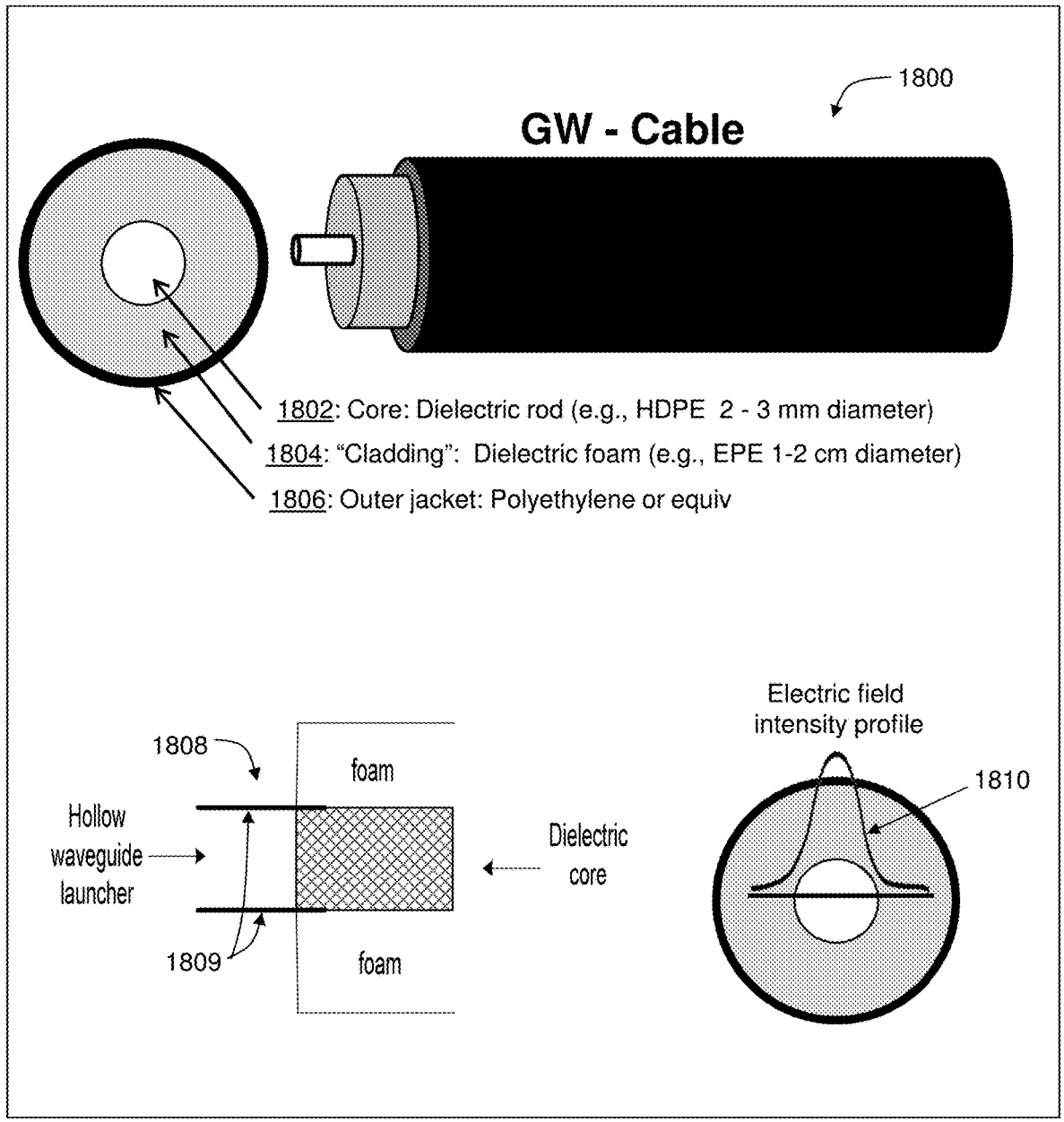
FIGS. 18A, 18B, and 18C are block diagrams illustrating example, non-limiting embodiment of a transmission medium for propagating guided electromagnetic waves.

Turning now to FIG. 18A, a block diagram illustrating an example, non-limiting embodiment of a transmission medium 1800 for propagating guided electromagnetic waves is shown. In particular, a further example of transmission medium 125 presented in conjunction with FIG. 1 is presented. In an embodiment, the transmission medium 1800 can comprise a first dielectric material 1802 and a second dielectric material 1804 disposed thereon. In an embodiment, the first dielectric material 1802 can comprise a dielectric core (referred to herein as dielectric core 1802) and the second dielectric material 1804 can comprise a cladding or shell such as a dielectric foam that surrounds in whole or in part the dielectric core (referred to herein as dielectric foam 1804). In an embodiment, the dielectric core 1802 and dielectric foam 1804 can be coaxially aligned to each other (although not necessary). In an embodiment, the combination of the dielectric core 1802 and the dielectric foam 1804 can be flexed or bent at least by 45 degrees without damaging the materials of the dielectric core 1802 and the dielectric foam 1804. In an embodiment, an outer surface of the dielectric foam 1804 can be further surrounded in whole or in part by a third dielectric material 1806, which can serve as an outer jacket (referred to herein as jacket 1806). The jacket 1806 can prevent exposure of the dielectric core 1802 and the dielectric foam 1804 to an environment that can adversely affect the propagation of electromagnetic waves (e.g., water, soil, etc.).

The dielectric core 1802 can comprise, for example, a high density polyethylene material, a high density polyurethane material, or other suitable dielectric material(s). The dielectric foam 1804 can comprise, for example, a cellular plastic material such an expanded polyethylene material, or other suitable dielectric material(s). The jacket 1806 can comprise, for example, a polyethylene material or equivalent. In an embodiment, the dielectric constant of the dielectric foam 1804 can be (or substantially) lower than the dielectric constant of the dielectric core 1802. For example, the dielectric constant of the dielectric core 1802 can be approximately 2.3 while the dielectric constant of the dielectric foam 1804 can be approximately 1.15 (slightly higher than the dielectric constant of air).

The dielectric core 1802 can be used for receiving signals in the form of electromagnetic waves from a launcher or other coupling device described herein which can be configured to launch guided electromagnetic waves on the transmission medium 1800. In one embodiment, the transmission 1800 can be coupled to a hollow waveguide 1808 structured as, for example, a circular waveguide 1809, which can receive electromagnetic waves from a radiating device such as a stub antenna (not shown). The hollow waveguide 1808 can in turn induce guided electromagnetic waves in the dielectric core 1802. In this configuration, the guided electromagnetic waves are guided by or bound to the dielectric core 1802 and propagate longitudinally along the dielectric core 1802. By adjusting electronics of the launcher, an operating frequency of the electromagnetic waves can be chosen such that a field intensity profile 1810 of the guided electromagnetic waves extends nominally (or not at all) outside of the jacket 1806.

By maintaining most (if not all) of the field strength of the guided electromagnetic waves within portions of the dielectric core 1802, the dielectric foam 1804 and/or the jacket 1806, the transmission medium 1800 can be used in hostile environments without adversely affecting the propagation of the electromagnetic waves propagating therein. For example, the transmission medium 1800 can be buried in soil with no (or nearly no) adverse effect to the guided electromagnetic waves propagating in the transmission medium 1800. Similarly, the transmission medium 1800 can be exposed to water (e.g., rain or placed underwater) with no (or nearly no) adverse effect to the guided electromagnetic waves propagating in the transmission medium 1800. In an embodiment, the propagation loss of guided electromagnetic waves in the foregoing embodiments can be 1 to 2 dB per meter or better at an operating frequency of 60 GHz. Depending on the operating frequency of the guided electromagnetic waves and/or the materials used for the transmission medium 1800 other propagation losses may be possible. Additionally, depending on the materials used to construct the transmission medium 1800, the transmission medium 1800 can in some embodiments be flexed laterally with no (or nearly no) adverse effect to the guided electromagnetic waves propagating through the dielectric core 1802 and the dielectric foam 1804.

Figure 18B:
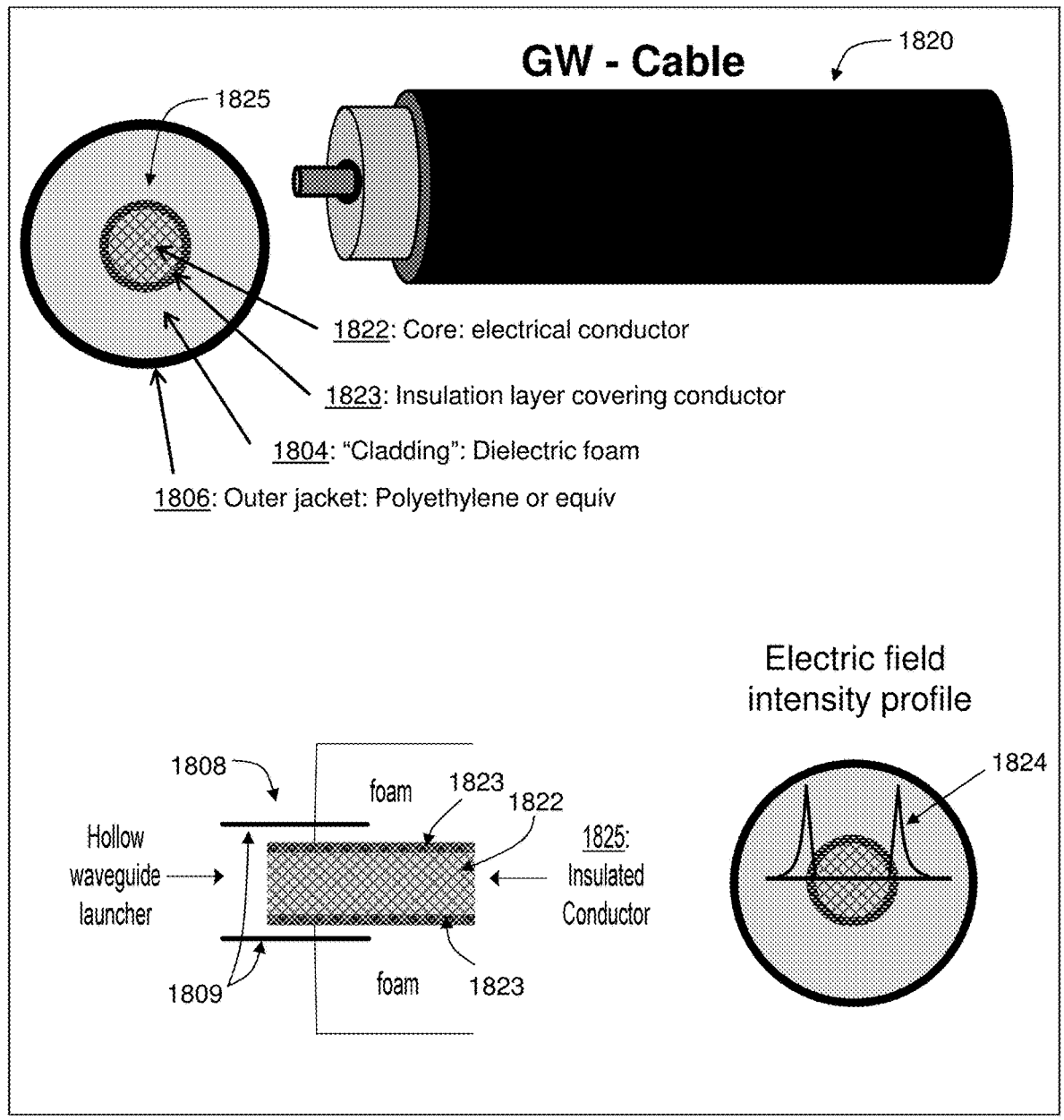

FIG. 18B depicts a transmission medium 1820 that differs from the transmission medium 1800 of FIG. 18A, yet provides a further example of the transmission medium 125 presented in conjunction with FIG. 1. The transmission medium 1820 shows similar reference numerals for similar elements of the transmission medium 1800 of FIG. 18A. In contrast to the transmission medium 1800, the transmission medium 1820 comprises a conductive core 1822 having an insulation layer 1823 surrounding the conductive core 1822 in whole or in part. The combination of the insulation layer 1823 and the conductive core 1822 will be referred to herein as an insulated conductor 1825. In the illustration of FIG. 18B, the insulation layer 1823 is covered in whole or in part by a dielectric foam 1804 and jacket 1806, which can be constructed from the materials previously described. In an embodiment, the insulation layer 1823 can comprise a dielectric material, such as polyethylene, having a higher dielectric constant than the dielectric foam 1804 (e.g., 2.3 and 1.15, respectively). In an embodiment, the components of the transmission medium 1820 can be coaxially aligned (although not necessary). In an embodiment, a hollow waveguide 1808 having metal plates 1809, which can be separated from the insulation layer 1823 (although not necessary) can be used to launch guided electromagnetic waves that substantially propagate on an outer surface of the insulation layer 1823, however other coupling devices as described herein can likewise be employed. In an embodiment, the guided electromagnetic waves can be sufficiently guided by or bound by the insulation layer 1823 to guide the electromagnetic waves longitudinally along the insulation layer 1823. By adjusting operational parameters of the launcher, an operating frequency of the guided electromagnetic waves launched by the hollow waveguide 1808 can generate an electric field intensity profile 1824 that results in the guided electromagnetic waves being substantially confined within the dielectric foam 1804 thereby preventing the guided electromagnetic waves from being exposed to an environment (e.g., water, soil, etc.) that adversely affects propagation of the guided electromagnetic waves via the transmission medium 1820.

Figure 18C:
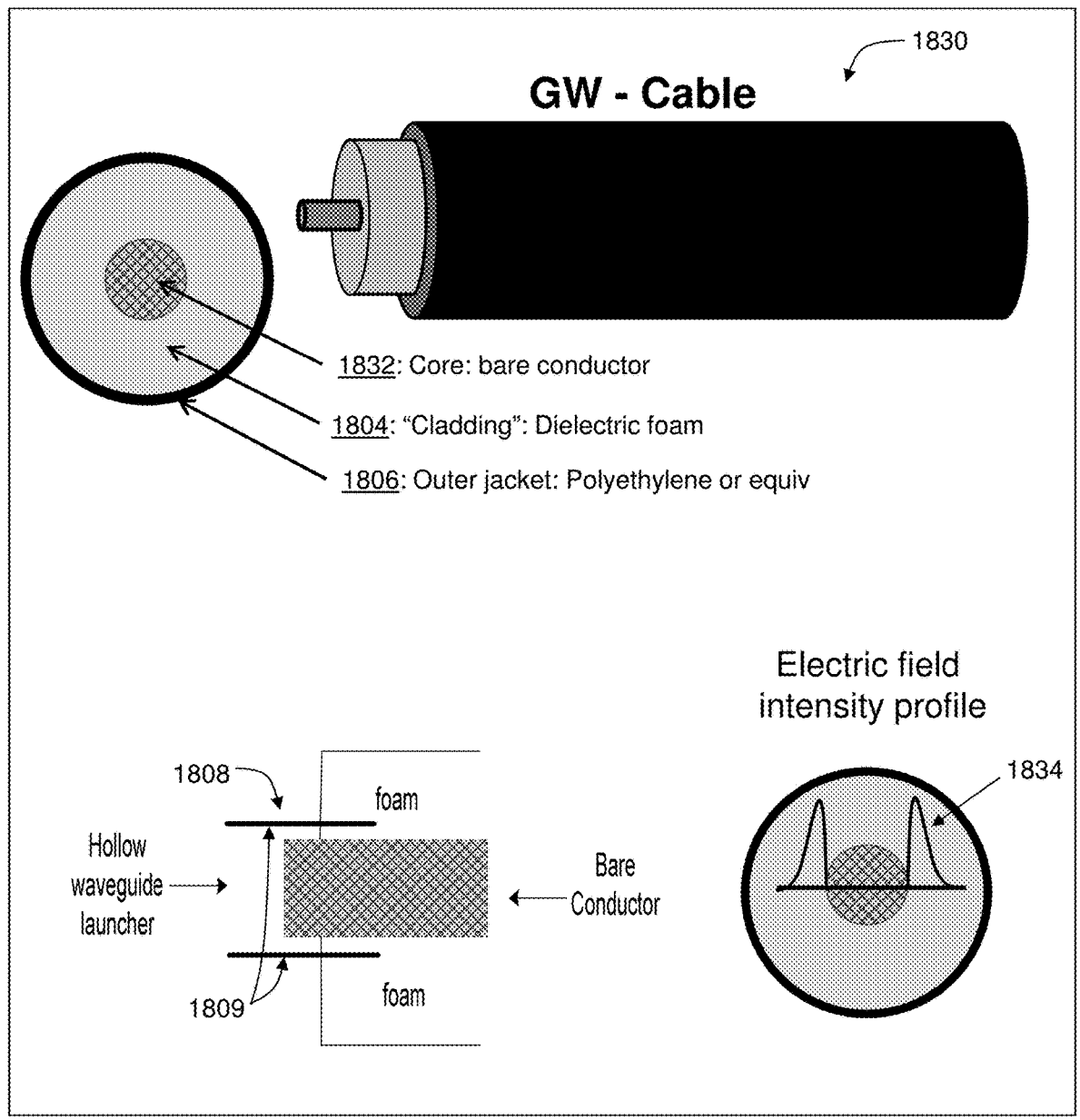

FIG. 18C depicts a transmission medium 1830 that differs from the transmission mediums 1800 and 1820 of FIGS. 18A and 18B, yet provides a further example of the transmission medium 125 presented in conjunction with FIG. 1. The transmission medium 1830 shows similar reference numerals for similar elements of the transmission mediums 1800 and 1820 of FIGS. 18A and 18B, respectively. In contrast to the transmission mediums 1800 and 1820, the transmission medium 1830 comprises a bare (or uninsulated) conductor 1832 surrounded in whole or in part by the dielectric foam 1804 and the jacket 1806, which can be constructed from the materials previously described. In an embodiment, the components of the transmission medium 1830 can be coaxially aligned (although not necessary). In an embodiment, a hollow waveguide 1808 having metal plates 1809 coupled to the bare conductor 1832 can be used to launch guided electromagnetic waves that substantially propagate on an outer surface of the bare conductor 1832, however other coupling devices described herein can likewise be employed. In an embodiment, the guided electromagnetic waves can be sufficiently guided by or bound by the bare conductor 1832 to guide the guided electromagnetic waves longitudinally along the bare conductor 1832. By adjusting operational parameters of the launcher, an operating frequency of the guided electromagnetic waves launched by the hollow waveguide 1808 can generate an electric field intensity profile 1834 that results in the guided electromagnetic waves being substantially confined within the dielectric foam 1804 thereby preventing the guided electromagnetic waves from being exposed to an environment (e.g., water, soil, etc.) that adversely affects propagation of the electromagnetic waves via the transmission medium 1830.

It should be noted that the hollow launcher 1808 used with the transmission mediums 1800, 1820 and 1830 of FIGS. 18A, 18B and 18C, respectively, can be replaced with other launchers or coupling devices. Additionally, the propagation mode(s) of the electromagnetic waves for any of the foregoing embodiments can be fundamental mode(s), a non-fundamental (or asymmetric) mode(s), or combinations thereof.

Figure 18D:
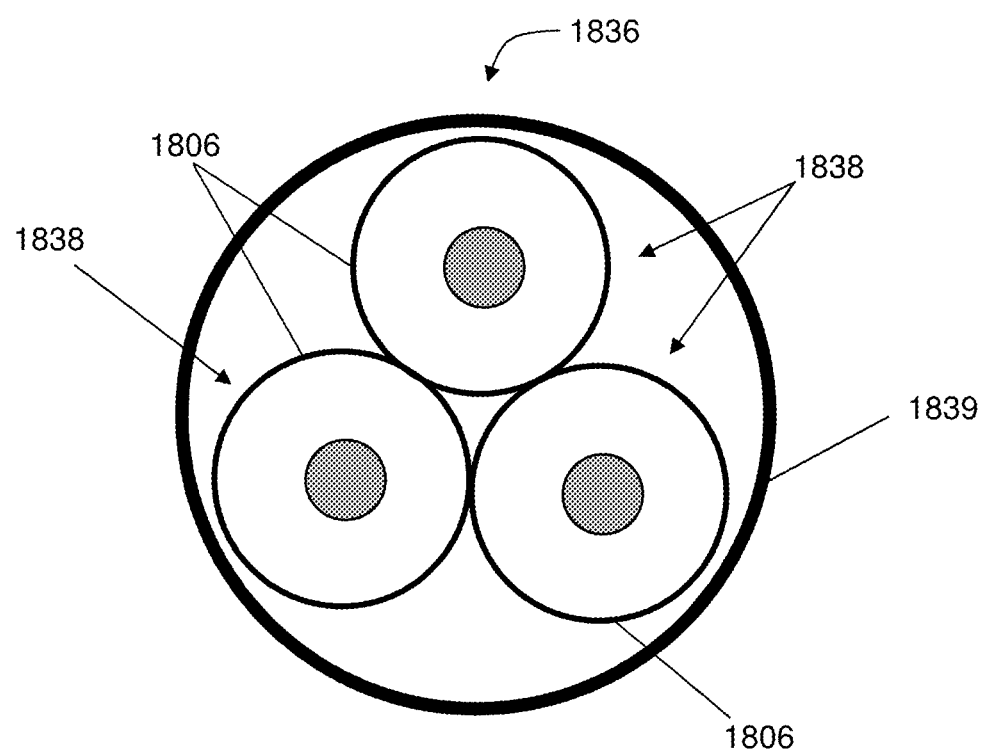
FIG. 18D is a block diagram illustrating an example, non-limiting embodiment of bundled transmission media in accordance with various aspects described herein.

FIG. 18D is a block diagram illustrating an example, non-limiting embodiment of bundled transmission media 1836 in accordance with various aspects described herein.

The bundled transmission media 1836 can comprise a plurality of cables 1838 held in place by a flexible sleeve 1839. The plurality of cables 1838 can comprise multiple instances of cable 1800 of FIG. 18A, multiple instances of cable 1820 of FIG. 18B, multiple instances of cable 1830 of FIG. 18C, or any combinations thereof. The sleeve 1839 can comprise a dielectric material that prevents soil, water or other external materials from making contact with the plurality of cables 1838. In an embodiment, a plurality of launchers, each utilizing a transceiver similar to the one depicted in FIG. 10A or other coupling devices described herein, can be adapted to selectively induce a guided electromagnetic wave in each cable, each guided electromagnetic wave conveys different data (e.g., voice, video, messaging, content, etc.). In an embodiment, by adjusting operational parameters of each launcher or other coupling device, the electric field intensity profile of each guided electromagnetic wave can be fully or substantially confined within layers of a corresponding cable 1838 to reduce cross-talk between cables 1838.

Figure 18E:
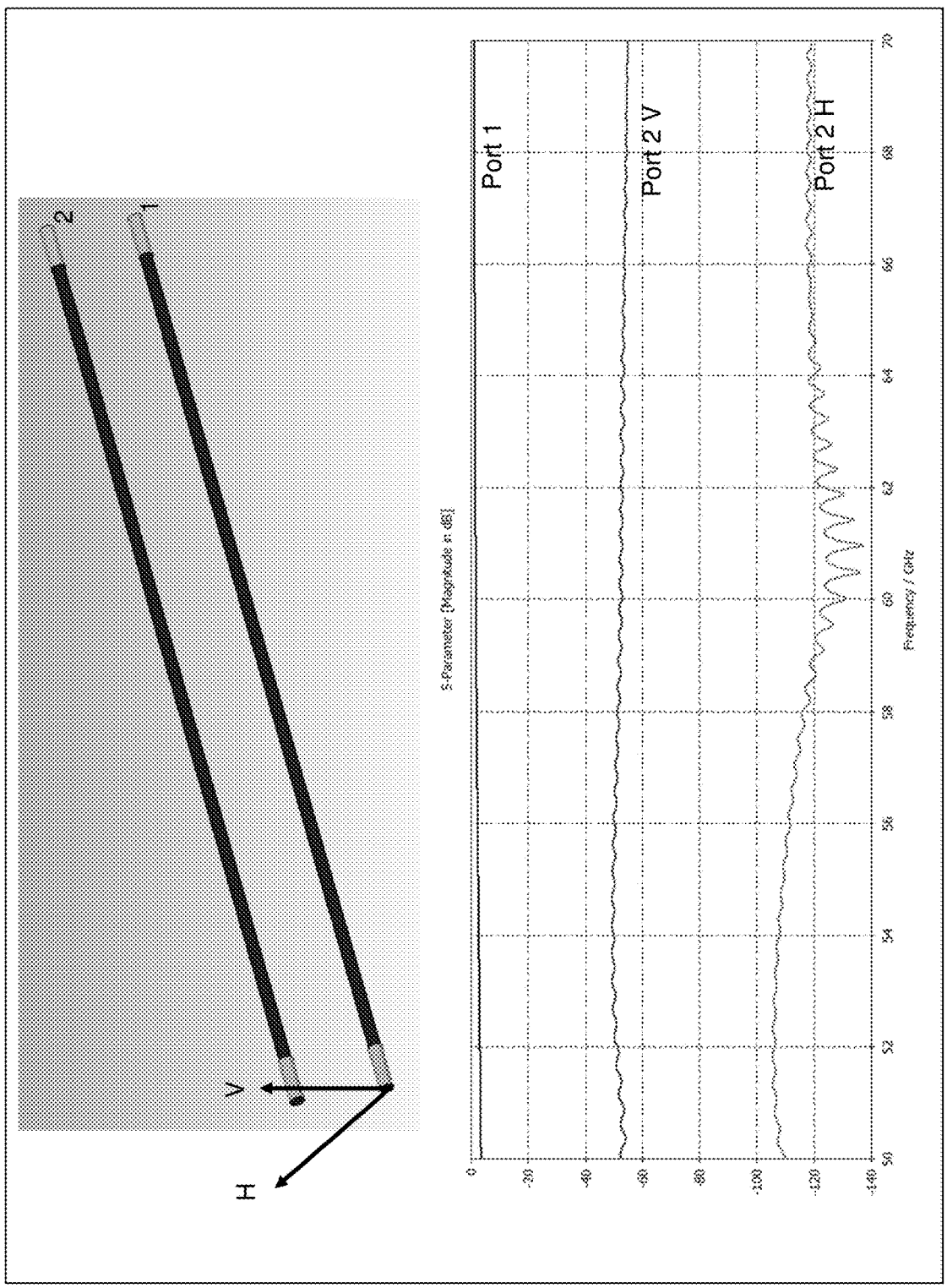
FIG. 18E is a block diagram illustrating an example, non-limiting embodiment of a plot depicting cross-talk between first and second transmission mediums of the bundled transmission media of FIG. 18D in accordance with various aspects described herein.
Figure 18F:
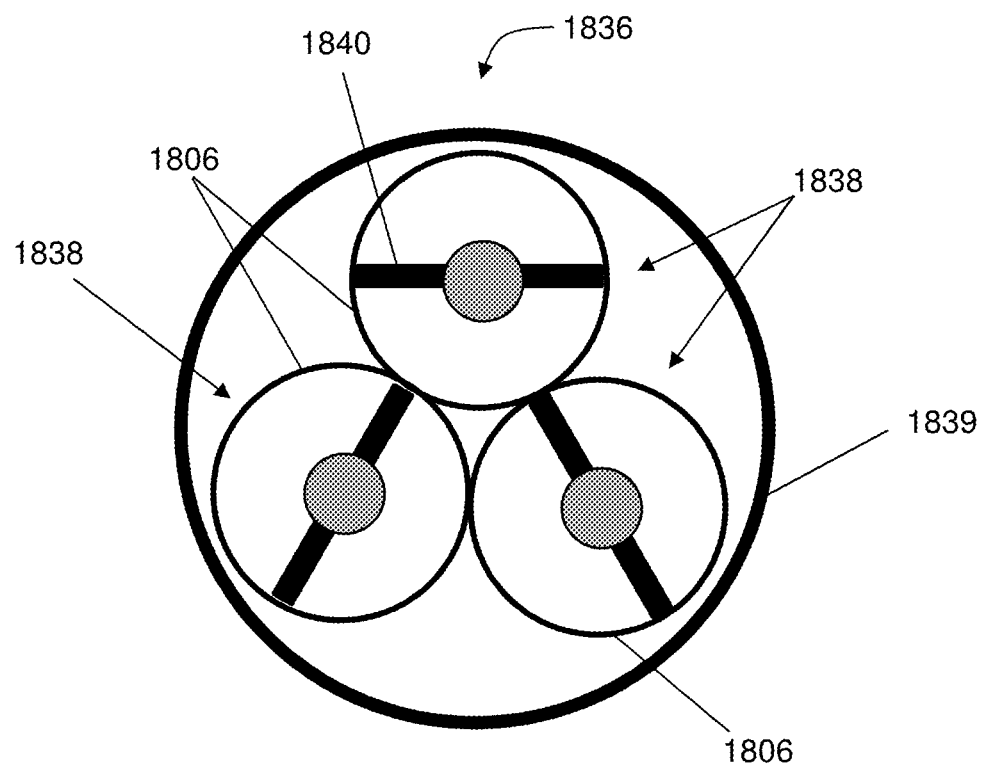
FIG. 18F is a block diagram illustrating an example, non-limiting embodiment of bundled transmission media to mitigate cross-talk in accordance with various aspects described herein.

In situations where the electric field intensity profile of each guided electromagnetic wave is not fully or substantially confined within a corresponding cable 1838, cross-talk of electromagnetic signals can occur between cables 1838 as illustrated by signal plots associated with two cables depicted in FIG. 18E. The plots in FIG. 18E show that when a guided electromagnetic wave is induced on a first cable, the emitted electric and magnetic fields of the first cable can induce signals on the second cable, which results in cross-talk. Several mitigation options can be used to reduce cross-talk between the cables 1838 of FIG. 18D. In an embodiment, an absorption material 1840 that can absorb electromagnetic fields, such as carbon, can be applied to the cables 1838 as shown in FIG. 18F to polarize each guided electromagnetic wave at various polarization states to reduce cross-talk between cables 1838. In another embodiment (not shown), carbon beads can be added to gaps between the cables 1838 to reduce cross-talk.

In yet another embodiment (not shown), a diameter of cable 1838 can be configured differently to vary a speed of propagation of guided electromagnetic waves between the cables 1838 in order to reduce cross-talk between cables 1838. In an embodiment (not shown), a shape of each cable 1838 can be made asymmetric (e.g., elliptical) to direct the guided electromagnetic fields of each cable 1838 away from each other to reduce cross-talk. In an embodiment (not shown), a filler material such as dielectric foam can be added between cables 1838 to sufficiently separate the cables 1838 to reduce cross-talk therebetween. In an embodiment (not shown), longitudinal carbon strips or swirls can be applied to on an outer surface of the jacket 1806 of each cable 1838 to reduce radiation of guided electromagnetic waves outside of the jacket 1806 and thereby reduce cross-talk between cables 1838. In yet another embodiment, each launcher can be configured to launch a guided electromagnetic wave having a different frequency, modulation, wave propagation mode, such as an orthogonal frequency, modulation or mode, to reduce cross-talk between the cables 1838.

In yet another embodiment (not shown), pairs of cables 1838 can be twisted in a helix to reduce cross-talk between the pairs and other cables 1838 in a vicinity of the pairs. In some embodiments, certain cables 1838 can be twisted while other cables 1838 are not twisted to reduce cross-talk between the cables 1838. Additionally, each twisted pair cable 1838 can have different pitches (i.e., different twist rates, such as twists per meter) to further reduce cross-talk between the pairs and other cables 1838 in a vicinity of the pairs. In another embodiment (not shown), launchers or other coupling devices can be configured to induce guided electromagnetic waves in the cables 1838 having electromagnetic fields that extend beyond the jacket 1806 into gaps between the cables to reduce cross-talk between the cables 1838. It is submitted that any one of the foregoing embodiments for mitigating cross-talk between cables 1838 can be combined to further reduce cross-talk therebetween.

Figure 18G:
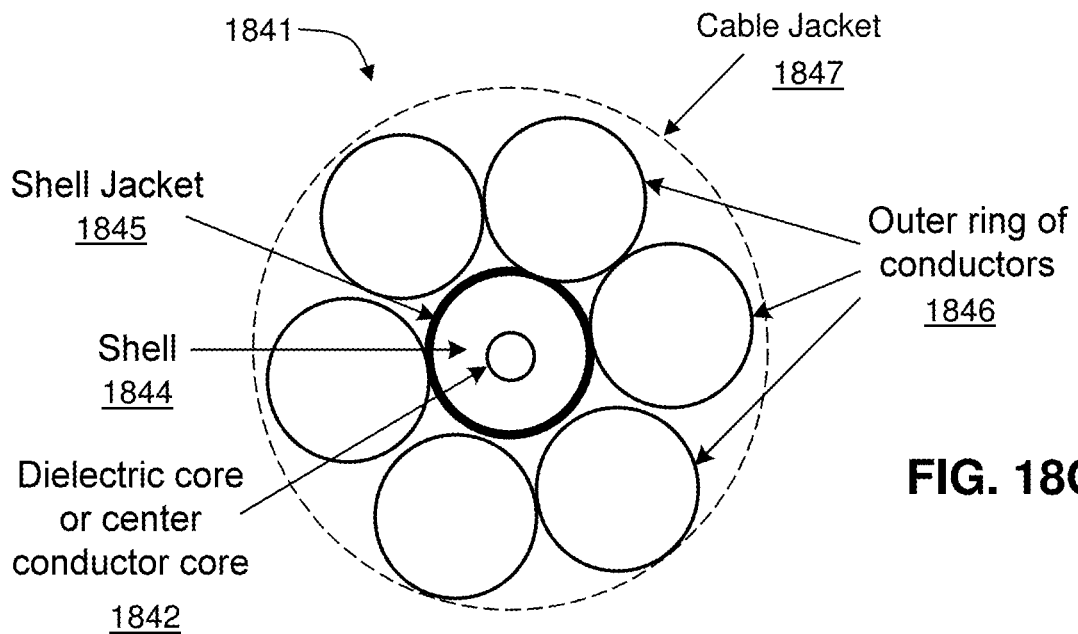
FIGS. 18G and 18H are block diagrams illustrating example, non-limiting embodiments of a transmission medium with an inner waveguide in accordance with various aspects described herein.
Figure 18H:
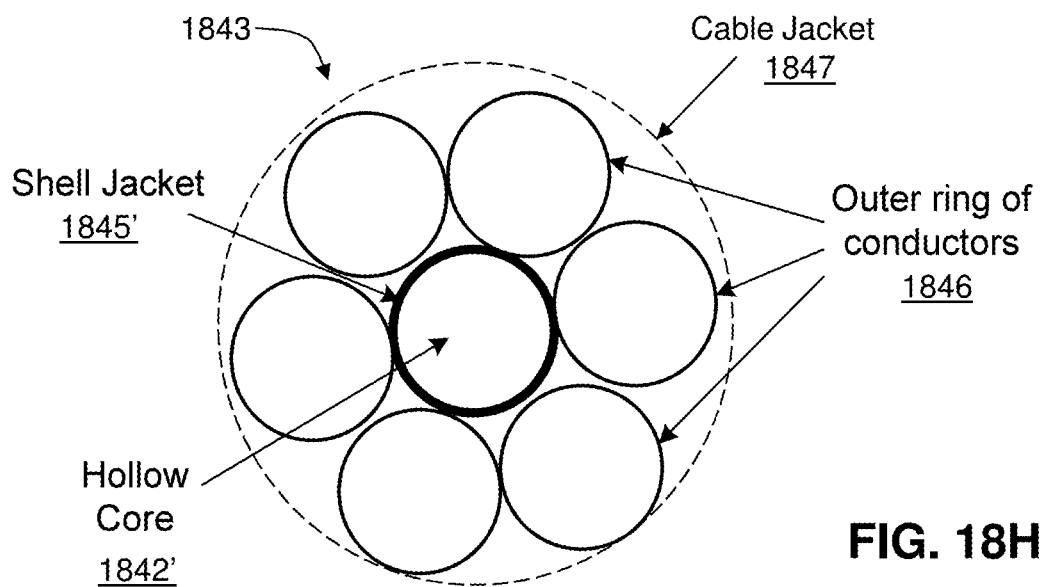

FIGS. 18G and 18H are block diagrams illustrating example, non-limiting embodiments of a transmission medium with an inner waveguide in accordance with various aspects described herein. In an embodiment, a transmission medium 1841 can comprise a core 1842. In one embodiment, the core 1842 can be a dielectric core 1842 (e.g., polyethylene). In another embodiment, the core 1842 can be an insulated or uninsulated conductor. The core 1842 can be surrounded by a shell 1844 comprising a dielectric foam (e.g., expanded polyethylene material) having a lower dielectric constant than the dielectric constant of a dielectric core, or insulation layer of a conductive core. The difference in dielectric constants enables electromagnetic waves to be bound and guided by the core 1842. The shell 1844 can be covered by a shell jacket 1845. The shell jacket 1845 can be made of rigid material (e.g., high density plastic) or a high tensile strength material (e.g., synthetic fiber). In an embodiment, the shell jacket 1845 can be used to prevent exposure of the shell 1844 and core 1842 from an adverse environment (e.g., water, moisture, soil, etc.). In an embodiment, the shell jacket 1845 can be sufficiently rigid to separate an outer surface of the core 1842 from an inner surface of the shell jacket 1845 thereby resulting in a longitudinal gap between the shell jacket 1854 and the core 1842. The longitudinal gap can be filled with the dielectric foam of the shell 1844.

The transmission medium 1841 can further include a plurality of outer ring conductors 1846. The outer ring conductors 1846 can be strands of conductive material that are woven around the shell jacket 1845, thereby covering the shell jacket 1845 in whole or in part. The outer ring conductors 1846 can serve the function of a power line having a return electrical path similar to the embodiments described in the subject disclosure for receiving power signals from a source (e.g., a transformer, a power generator, etc.). In one embodiment, the outer ring conductors 1846 can be covered by a cable jacket 1847 to prevent exposure of the outer ring conductors 1846 to water, soil, or other environmental factors. The cable jacket 1847 can be made of an insulating material such as polyethylene. The core 1842 can be used as a center waveguide for the propagation of electromagnetic waves. A hollow waveguide launcher 1808, such as the circular waveguide previously described, can be used to launch signals that induce electromagnetic waves guided by the core 1842 in ways similar to those described for the embodiments of FIGS. 18A, 18B, and 18C. The electromagnetic waves can be guided by the core 1842 without utilizing the electrical return path of the outer ring conductors 1846 or any other electrical return path. By adjusting electronics of the launcher 1808, an operating frequency of the electromagnetic waves can be chosen such that a field intensity profile of the guided electromagnetic waves extends nominally (or not at all) outside of the shell jacket 1845.

In another embodiment, a transmission medium 1843 can comprise a hollow core 1842' surrounded by a shell jacket 1845'. The shell jacket 1845' can have an inner conductive surface or other surface materials that enable the hollow core 1842' to be used as a conduit for electromagnetic waves. The shell jacket 1845' can be covered at least in part with the outer ring conductors 1846 described earlier for conducting a power signal. In an embodiment, a cable jacket 1847 can be disposed on an outer surface of the outer ring conductors 1846 to prevent exposure of the outer ring conductors 1846 to water, soil or other environmental factors. A waveguide launcher 1808 can be used to launch electromagnetic waves guided by the hollow core 1842' and the conductive inner surface of the shell jacket 1845'. In an embodiment (not shown) the hollow core 1842' can further include a dielectric foam such as described earlier.

Transmission medium 1841 can represent a multi-purpose cable that conducts power on the outer ring conductors 1846 utilizing an electrical return path and that provides communication services by way of an inner waveguide comprising a combination of the core 1842, the shell 1844 and the shell jacket 1845. The inner waveguide can be used for transmitting or receiving electromagnetic waves (without utilizing an electrical return path) guided by the core 1842. Similarly, transmission medium 1843 can represent a multi-purpose cable that conducts power on the outer ring conductors 1846 utilizing an electrical return path and that provides communication services by way of an inner waveguide comprising a combination of the hollow core 1842' and the shell jacket 1845'. The inner waveguide can be used for transmitting or receiving electromagnetic waves (without utilizing an electrical return path) guided the hollow core 1842' and the shell jacket 1845'.

It is submitted that embodiments of FIGS. 18G-18H can be adapted to use multiple inner waveguides surrounded by outer ring conductors 1846. The inner waveguides can be adapted to use to cross-talk mitigation techniques described above (e.g., twisted pairs of waveguides, waveguides of different structural dimensions, use of polarizers within the shell, use of different wave modes, etc.).

For illustration purposes only, the transmission mediums 1800, 1820, 1830 1836, 1841 and 1843 will be referred to herein as a cable 1850 with an understanding that cable 1850 can represent any one of the transmission mediums described in the subject disclosure, or a bundling of multiple instances thereof. For illustration purposes only, the dielectric core 1802, insulated conductor 1825, bare conductor 1832, core 1842, or hollow core 1842' of the transmission mediums 1800, 1820, 1830, 1836, 1841 and 1843, respectively, will be referred to herein as transmission core 1852 with an understanding that cable 1850 can utilize the dielectric core 1802, insulated conductor 1825, bare conductor 1832, core 1842, or hollow core 1842' of transmission mediums 1800, 1820, 1830, 1836, 1841 and/or 1843, respectively.

Figure 18I:
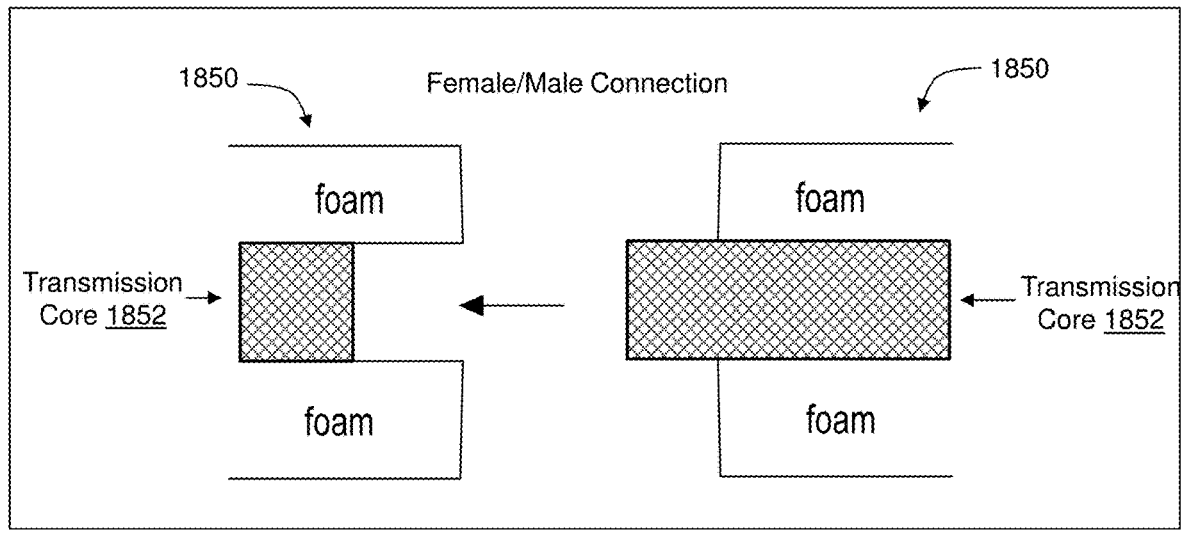
FIGS. 18I and 18J are block diagrams illustrating example, non-limiting embodiments of connector configurations that can be used with the transmission medium of FIG. 18A, 18B, or 18C.
Figure 18J:
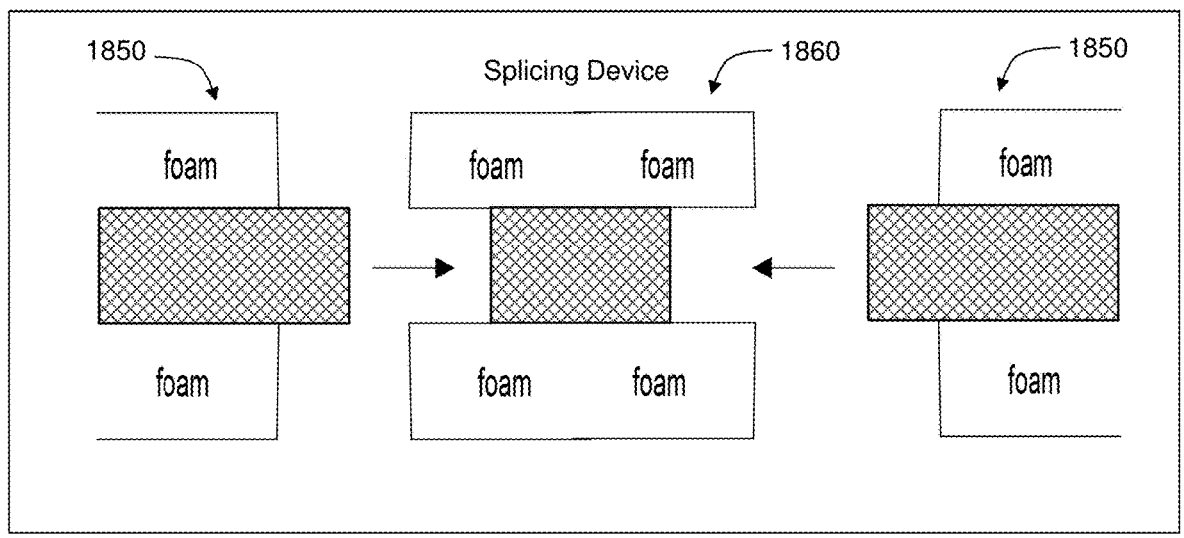

Turning now to FIGS. 18I and 18J, block diagrams illustrating example, non-limiting embodiments of connector configurations that can be used by cable 1850 are shown. In one embodiment, cable 1850 can be configured with a female connection arrangement or a male connection arrangement as depicted in FIG. 18I. The male configuration on the right of FIG. 18I can be accomplished by stripping the dielectric foam 1804 (and jacket 1806 if there is one) to expose a portion of the transmission core 1852. The female configuration on the left of FIG. 18I can be accomplished by removing a portion of the transmission core 1852, while maintaining the dielectric foam 1804 (and jacket 1806 if there is one). In an embodiment in which the transmission core 1852 is hollow as described in relation to FIG. 18H, the male portion of the transmission core 1852 can represent a hollow core with a rigid outer surface that can slide into the female arrangement on the left side of FIG. 18I to align the hollow cores together. It is further noted that in the embodiments of FIGS. 18G-18H, the outer ring of conductors 1846 can be modified to connect male and female portions of cable 1850.

Based on the aforementioned embodiments, the two cables 1850 having male and female connector arrangements can be mated together. A sleeve with an adhesive inner lining or a shrink wrap material (not shown) can be applied to an area of a joint between cables 1850 to maintain the joint in a fixed position and prevent exposure (e.g., to water, soil, etc.). When the cables 1850 are mated, the transmission core 1852 of one cable will be in close proximity to the transmission core 1852 of the other cable. Guided electromagnetic waves propagating by way of either the transmission core 1852 of cables 1850 traveling from either direction can cross over between the disjoint the transmission cores 1852 whether or not the transmission cores 1852 touch, whether or not the transmission cores 1852 are coaxially aligned, and/or whether or not there is a gap between the transmission cores 1852.

In another embodiment, a splicing device 1860 having female connector arrangements at both ends can be used to mate cables 1850 having male connector arrangements as shown in FIG. 18J. In an alternative embodiment not shown in FIG. 18J, the splicing device 1860 can be adapted to have male connector arrangements at both ends which can be mated to cables 1850 having female connector arrangements. In another embodiment not shown in FIG. 18J, the splicing device 1860 can be adapted to have a male connector arrangement and a female connector arrangement at opposite ends which can be mated to cables 1850 having female and male connector arrangements, respectively. It is further noted that for a transmission core 1852 having a hollow core, the male and female arrangements described in FIG. 18I can be applied to the splicing device 1860 whether the ends of the splicing device 1860 are both male, both female, or a combination thereof.

The foregoing embodiments for connecting cables illustrated in FIGS. 18I-18J can be applied to each single instance of cable 1838 of bundled transmission media 1836. Similarly, the foregoing embodiments illustrated in FIGS. 18I-18J can be applied to each single instance of an inner waveguide for a cable 1841 or 1843 having multiple inner waveguides.

Figure 18K:
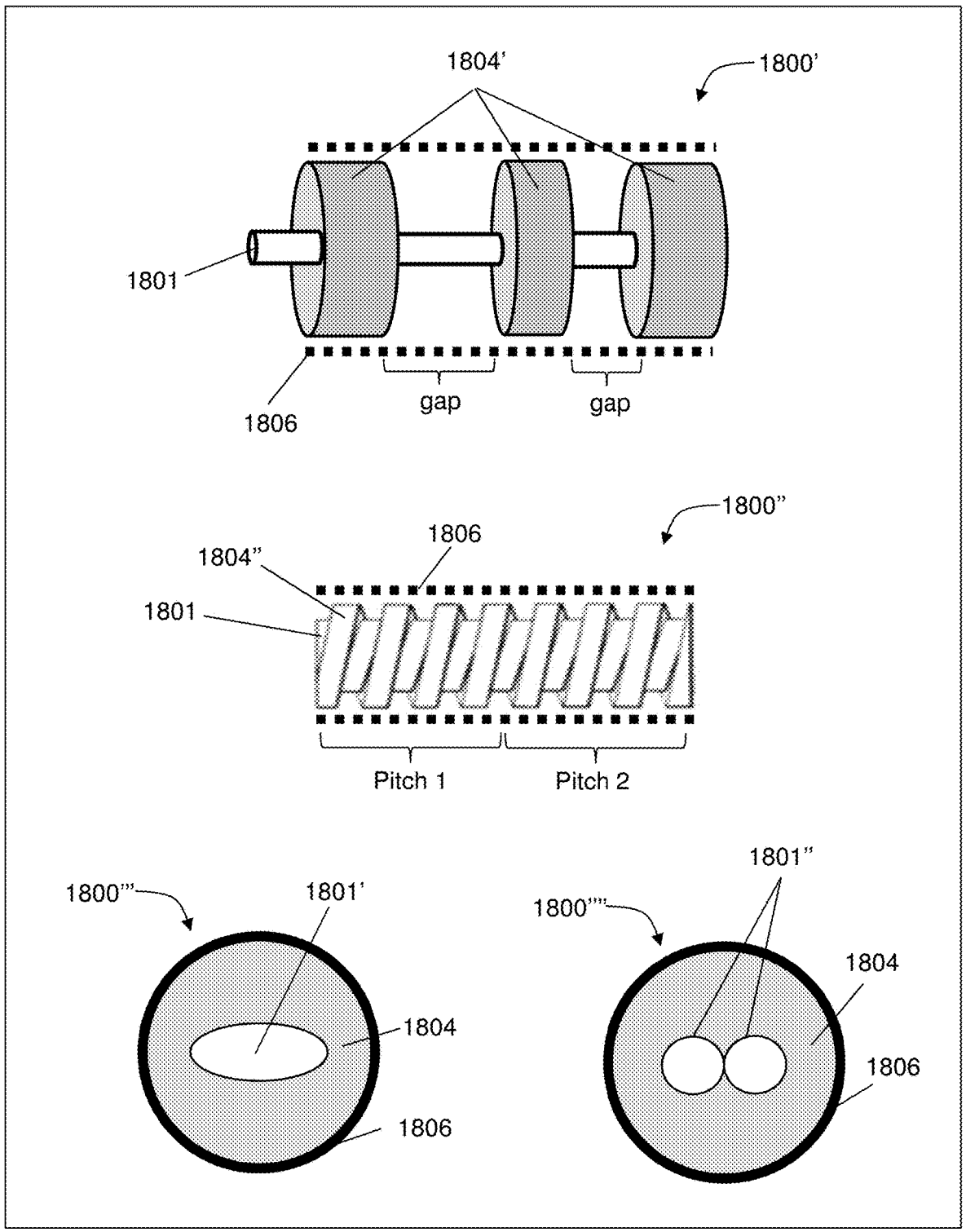
FIG. 18K is a block diagram illustrating example, non-limiting embodiments of transmission mediums for propagating guided electromagnetic waves.

Turning now to FIG. 18K, a block diagram illustrating example, non-limiting embodiments of transmission mediums 1800', 1800", 1800''' and 1800'''' for propagating guided electromagnetic waves is shown. In an embodiment, a transmission medium 1800' can include a core 1801, and a dielectric foam 1804' divided into sections and covered by a jacket 1806 as shown in FIG. 18K. The core 1801 can be represented by the dielectric core 1802 of FIG. 18A, the insulated conductor 1825 of FIG. 18B, or the bare conductor 1832 of FIG. 18C. Each section of dielectric foam 1804' can be separated by a gap (e.g., air, gas, vacuum, or a substance with a low dielectric constant). In an embodiment, the gap separations between the sections of dielectric foam 1804' can be quasi-random as shown in FIG. 18K, which can be helpful in reducing reflections of electromagnetic waves occurring at each section of dielectric foam 1804' as they propagate longitudinally along the core 1801. The sections of the dielectric foam 1804' can be constructed, for example, as washers made of a dielectric foam having an inner opening for supporting the core 1801 in a fixed position. For illustration purposes only, the washers will be referred to herein as washers 1804'. In an embodiment, the inner opening of each washer 1804' can be coaxially aligned with an axis of the core 1801. In another embodiment, the inner opening of each washer 1804' can be offset from the axis of the core 1801. In another embodiment (not shown), each washer 1804' can have a variable longitudinal thickness as shown by differences in thickness of the washers 1804'.

In an alternative embodiment, a transmission medium 1800" can include a core 1801, and a strip of dielectric foam 1804" wrapped around the core in a helix covered by a jacket 1806 as shown in FIG. 18K. Although it may not be apparent from the drawing shown in FIG. 18K, in an embodiment the strip of dielectric foam 1804" can be twisted around the core 1801 with variable pitches (i.e., different twist rates) for different sections of the strip of dielectric foam 1804". Utilizing variable pitches can help reduce reflections or other disturbances of the electromagnetic waves occurring between areas of the core 1801 not covered by the strip of dielectric foam 1804". It is further noted that the thickness (diameter) of the strip of dielectric foam 1804" can be substantially larger (e.g., 2 or more times larger) than diameter of the core 1801 shown in FIG. 18K.

In an alternative embodiment, a transmission medium 1800''' (shown in a cross-sectional view) can include a non-circular core 1801' covered by a dielectric foam 1804 and jacket 1806. In an embodiment, the non-circular core 1801' can have an elliptical structure as shown in FIG. 18K, or other suitable non-circular structure. In another embodiment, the non-circular core 1801' can have an asymmetric structure. A non-circular core 1801' can be used to polarize the fields of electromagnetic waves induced on the non-circular core 1801'. The structure of the non-circular core 1801' can help preserve the polarization of the electromagnetic waves as they propagate along the non-circular core 1801'.

In an alternative embodiment, a transmission medium 1800'''' (shown in a cross-sectional view) can include multiple cores 1801" (only two cores are shown but more are possible). The multiple cores 1801" can be covered by a dielectric foam 1804 and jacket 1806. The multiple cores 1801" can be used to polarize the fields of electromagnetic waves induced on the multiple cores 1801". The structure of the multiple cores 1801' can preserve the polarization of the guided electromagnetic waves as they propagate along the multiple cores 1801".

It will be appreciated that the embodiments of FIG. 18K can be used to modify the embodiments of FIGS. 18G-18H. For example, core 1842 or core 1842' can be adapted to utilized sectionalized shells 1804' with gaps therebetween, or one or more strips of dielectric foam 1804". Similarly, core 1842 or core 1842' can be adapted to have a non-circular core 1801' that may have symmetric or asymmetric cross-sectional structure. Additionally, core 1842 or core 1842' can be adapted to use multiple cores 1801" in a single inner waveguide, or different numbers of cores when multiple inner waveguides are used. Accordingly, any of the embodiments shown in FIG. 18K can be applied singly or in combination to the embodiments of 18G-18H.

Figure 18L:
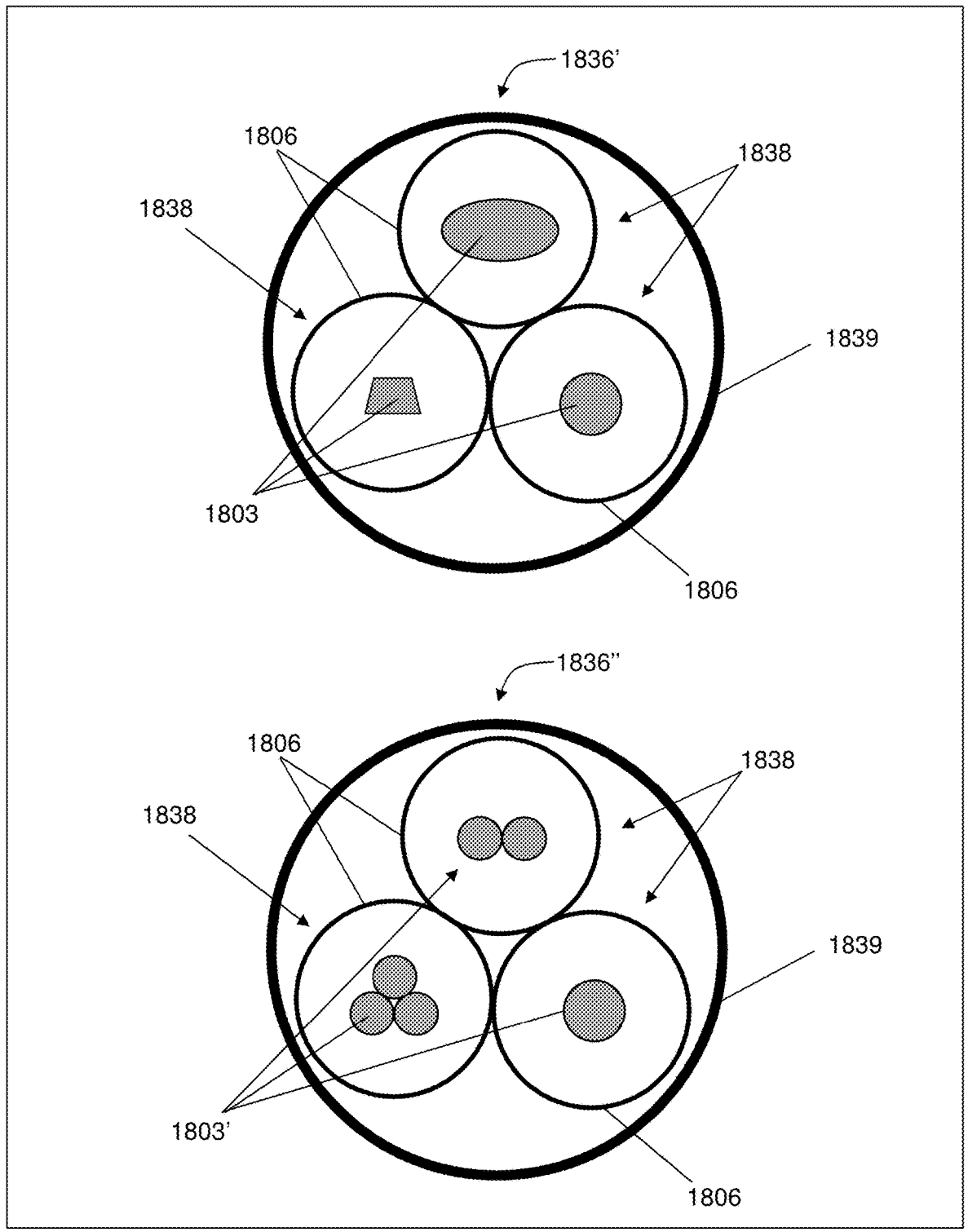
FIG. 18L is a block diagram illustrating example, non-limiting embodiments of bundled transmission media to mitigate cross-talk in accordance with various aspects described herein.

Turning now to FIG. 18L is a block diagram illustrating example, non-limiting embodiments of bundled transmission media to mitigate cross-talk in accordance with various aspects described herein. In an embodiment, a bundled transmission medium 1836' can include variable core structures 1803. By varying the structures of cores 1803, fields of guided electromagnetic waves induced in each of the cores of transmission medium 1836' may differ sufficiently to reduce cross-talk between cables 1838. In another embodiment, a bundled transmission media 1836" can include a variable number of cores 1803' per cable 1838. By varying the number of cores 1803' per cable 1838, fields of guided electromagnetic waves induced in the one or more cores of transmission medium 1836" may differ sufficiently to reduce cross-talk between cables 1838. In another embodiment, the cores 1803 or 1803' can be of different materials. For example, the cores 1803 or 1803' can be a dielectric core 1802, an insulated conductor core 1825, a bare conductor core 1832, or any combinations thereof.

It is noted that the embodiments illustrated in FIGS. 18A-18D and 18F-18H can be modified by and/or combined with some of the embodiments of FIGS. 18K-18L. It is further noted that one or more of the embodiments illustrated in FIGS. 18K-18L can be combined (e.g., using sectionalized dielectric foam 1804' or a helix strip of dielectric foam 1804" with cores 1801', 1801", 1803 or 1803'). In some embodiments guided electromagnetic waves propagating in the transmission mediums 1800', 1800", 1800''', and/or 1800'''' of FIG. 18K may experience less propagation losses than guided electromagnetic waves propagating in the transmission mediums 1800, 1820 and 1830 of FIGS. 18A-18C. Additionally, the embodiments illustrated in FIGS. 18K-18L can be adapted to use the connectivity embodiments illustrated in FIGS. 18I-18J.

Figure 18M:
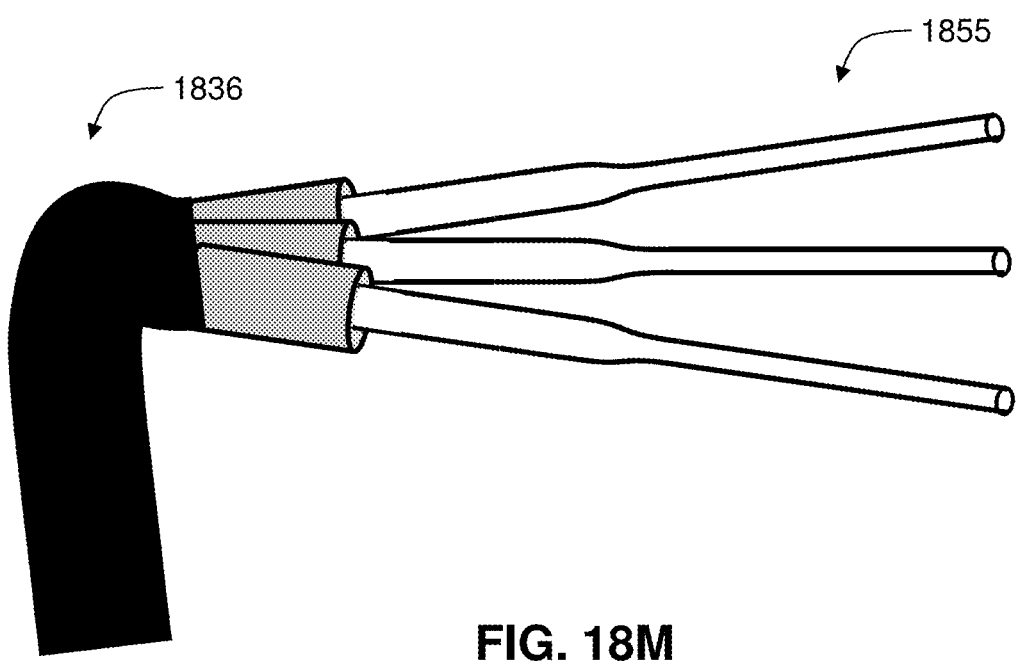
FIG. 18M is a block diagram illustrating an example, non-limiting embodiment of exposed stubs from the bundled transmission media for use as antennas in accordance with various aspects described herein.

Turning now to FIG. 18M, a block diagram illustrating an example, non-limiting embodiment of exposed tapered stubs from the bundled transmission media 1836 for use as antennas 1855 is shown. Each antenna 1855 can serve as a directional antenna for radiating wireless signals directed to wireless communication devices or for inducing electromagnetic wave propagation on a surface of a transmission medium (e.g., a power line). In an embodiment, the wireless signals radiated by the antennas 1855 can be beam steered by adapting the phase and/or other characteristics of the wireless signals generated by each antenna 1855. In an embodiment, the antennas 1855 can individually be placed in a pie-pan antenna assembly for directing wireless signals in various directions.

It is further noted that the terms "core", "cladding", "shell", and "foam" as utilized in the subject disclosure can comprise any types of materials (or combinations of materials) that enable electromagnetic waves to remain bound to the core while propagating longitudinally along the core. For example, a strip of dielectric foam 1804" described earlier can be replaced with a strip of an ordinary dielectric material (e.g., polyethylene) for wrapping around the dielectric core 1802 (referred to herein for illustration purposes only as a "wrap"). In this configuration an average density of the wrap can be small as a result of air space between sections of the wrap. Consequently, an effective dielectric constant of the wrap can be less than the dielectric constant of the dielectric core 1802, thereby enabling guided electromagnetic waves to remain bound to the core. Accordingly, any of the embodiments of the subject disclosure relating to materials used for core(s) and wrappings about the core(s) can be structurally adapted and/or modified with other dielectric materials that achieve the result of maintaining electromagnetic waves bound to the core(s) while they propagate along the core(s). Additionally, a core in whole or in part as described in any of the embodiments of the subject disclosure can comprise an opaque material (e.g., polyethylene). Accordingly, electromagnetic waves guided and bound to the core will have a non-optical frequency range (e.g., less than the lowest frequency of visible light).

Figure 18N:
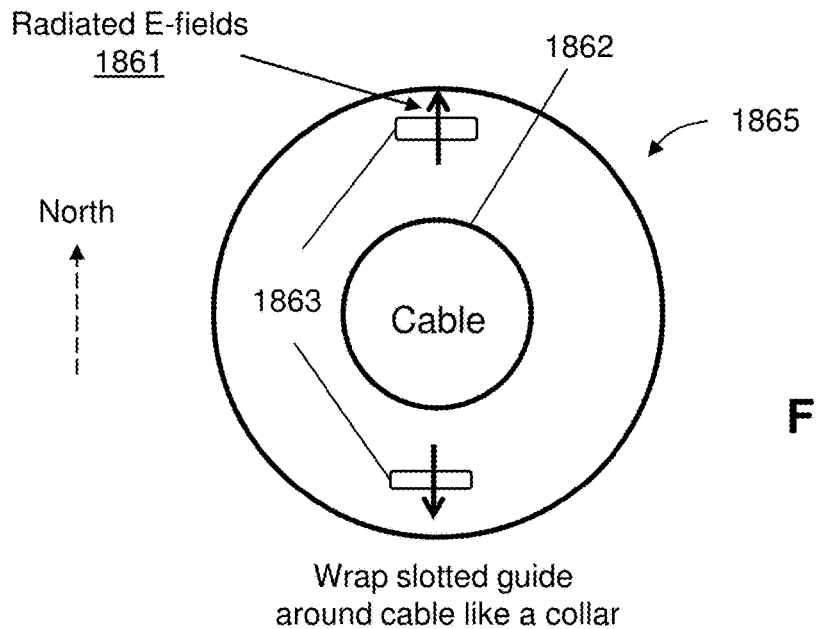
FIGS. 18N, 18O, 18P, 18Q, 18R, 18S, 18T, 18U, 18V and 18W are block diagrams illustrating example, non-limiting embodiments of a waveguide device for transmitting or receiving electromagnetic waves in accordance with various aspects described herein.

FIGS. 18N, 18O, 18P, 18Q, 18R, 18S and 18T are block diagrams illustrating example, non-limiting embodiments of a waveguide device for transmitting or receiving electromagnetic waves in accordance with various aspects described herein. In an embodiment, FIG. 18N illustrates a front view of a waveguide device 1865 having a plurality of slots 1863 (e.g., openings or apertures) for emitting electromagnetic waves having radiated electric fields (e-fields) 1861. In an embodiment, the radiated e-fields 1861 of pairs of symmetrically positioned slots 1863 (e.g., north and south slots of the waveguide 1865) can be directed away from each other (i.e., polar opposite radial orientations about the cable 1862). While the slots 1863 are shown as having a rectangular shape, other shapes such as other polygons, sector and arc shapes, ellipsoid shapes and other shapes are likewise possible. For illustration purposes only, the term north will refer to a relative direction as shown in the figures. All references in the subject disclosure to other directions (e.g., south, east, west, northwest, and so forth) will be relative to northern illustration. In an embodiment, to achieve e-fields with opposing orientations at the north and south slots 1863, for example, the north and south slots 1863 can be arranged to have a circumferential distance between each other that is approximately one wavelength of electromagnetic waves signals supplied to these slots. The waveguide 1865 can have a cylindrical cavity in a center of the waveguide 1865 to enable placement of a cable 1862. In one embodiment, the cable 1862 can comprise an insulated conductor. In another embodiment, the cable 1862 can comprise an uninsulated conductor. In yet other embodiments, the cable 1862 can comprise any of the embodiments of a transmission core 1852 of cable 1850 previously described.

In one embodiment, the cable 1862 can slide into the cylindrical cavity of the waveguide 1865. In another embodiment, the waveguide 1865 can utilize an assembly mechanism (not shown). The assembly mechanism (e.g., a hinge or other suitable mechanism that provides a way to open the waveguide 1865 at one or more locations) can be used to enable placement of the waveguide 1865 on an outer surface of the cable 1862 or otherwise to assemble separate pieces together to form the waveguide 1865 as shown. According to these and other suitable embodiments, the waveguide 1865 can be configured to wrap around the cable 1862 like a collar.

Figure 18O:
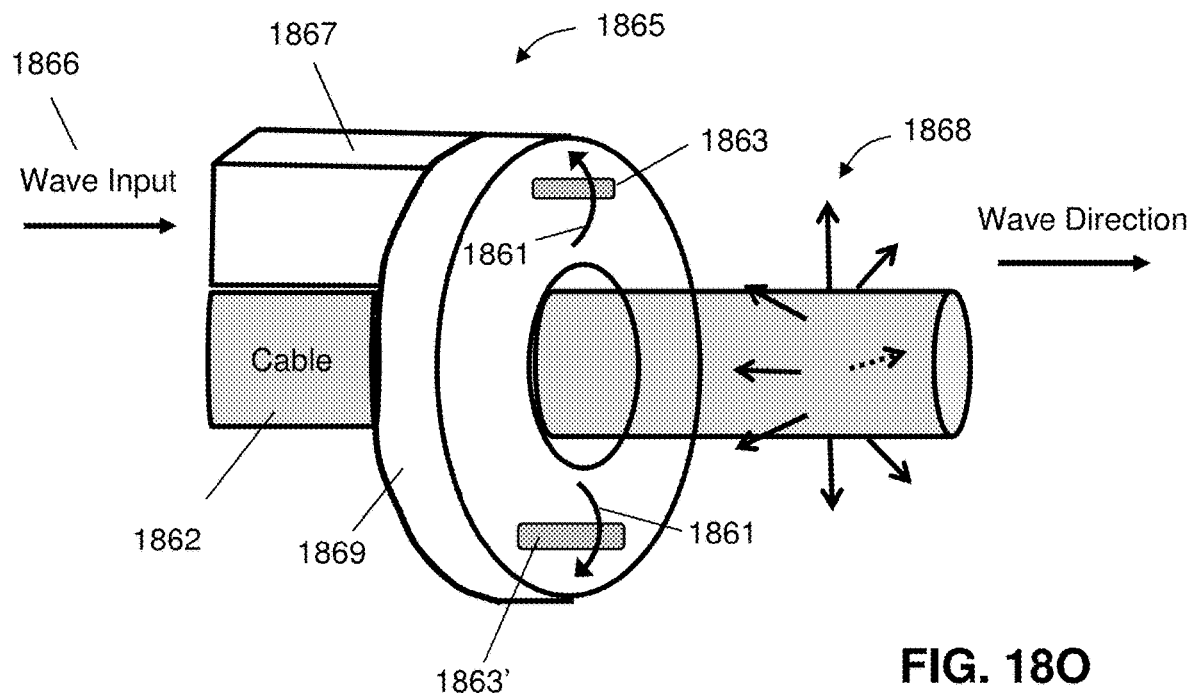

FIG. 18O illustrates a side view of an embodiment of the waveguide 1865. The waveguide 1865 can be adapted to have a hollow rectangular waveguide portion 1867 that receives electromagnetic waves 1866 generated by a transmitter circuit as previously described in the subject disclosure (e.g., see reference 101, 1000 of FIGS. 1 and 10A). The electromagnetic waves 1866 can be distributed by the hollow rectangular waveguide portion 1867 into in a hollow collar 1869 of the waveguide 1865. The rectangular waveguide portion 1867 and the hollow collar 1869 can be constructed of materials suitable for maintaining the electromagnetic waves within the hollow chambers of these assemblies (e.g., carbon fiber materials). It should be noted that while the waveguide portion 1867 is shown and described in a hollow rectangular configuration, other shapes and/or other non-hollow configurations can be employed. In particular, the waveguide portion 1867 can have a square or other polygonal cross section, an arc or sector cross section that is truncated to conform to the outer surface of the cable 1862, a circular or ellipsoid cross section or cross sectional shape. In addition, the waveguide portion 1867 can be configured as, or otherwise include, a solid dielectric material.

As previously described, the hollow collar 1869 can be configured to emit electromagnetic waves from each slot 1863 with opposite e-fields 1861 at pairs of symmetrically positioned slots 1863 and 1863'. In an embodiment, the electromagnetic waves emitted by the combination of slots 1863 and 1863' can in turn induce electromagnetic waves 1868 on that are bound to the cable 1862 for propagation according to a fundamental wave mode without other wave modes present—such as non-fundamental wave modes. In this configuration, the electromagnetic waves 1868 can propagate longitudinally along the cable 1862 to other downstream waveguide systems coupled to the cable 1862.

It should be noted that since the hollow rectangular waveguide portion 1867 of FIG. 18O is closer to slot 1863 (at the northern position of the waveguide 1865), slot 1863 can emit electromagnetic waves having a stronger magnitude than electromagnetic waves emitted by slot 1863' (at the southern position). To reduce magnitude differences between these slots, slot 1863' can be made larger than slot 1863. The technique of utilizing different slot sizes to balance signal magnitudes between slots can be applied to any of the embodiments of the subject disclosure relating to FIGS. 18N, 18O, 18Q, 18S, 18U and 18V—some of which are described below.

Figure 18P:
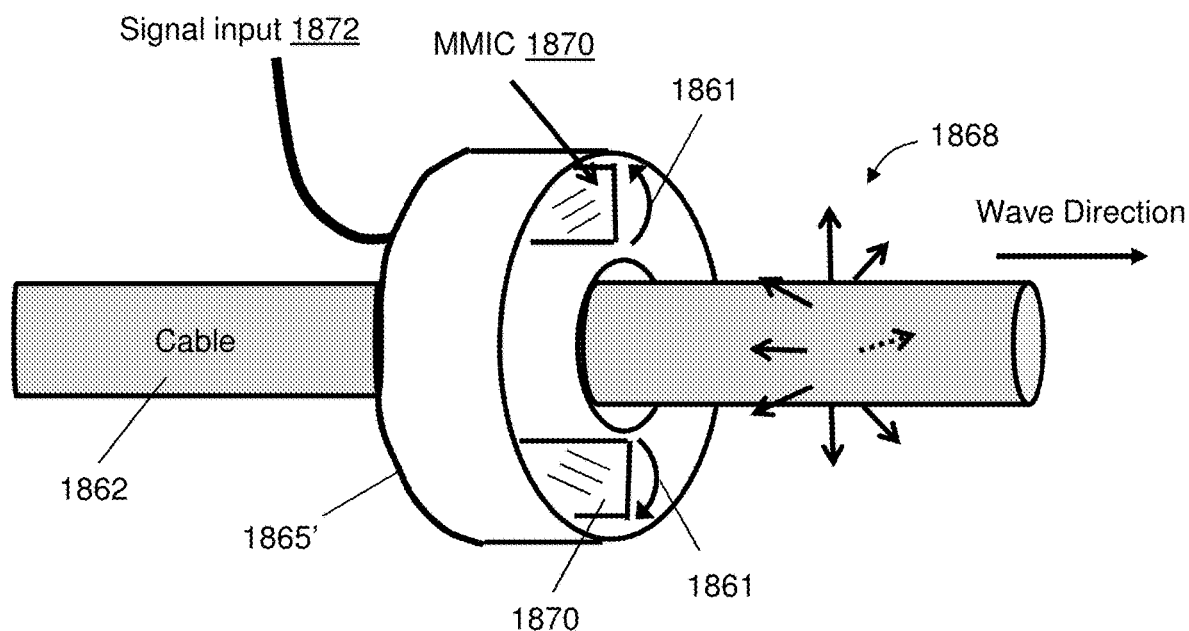

In another embodiment, FIG. 18P depicts a waveguide 1865' that can be configured to utilize circuitry such as monolithic microwave integrated circuits (MMICs) 1870 each coupled to a signal input 1872 (e.g., coaxial cable that provides a communication signal). The signal input 1872 can be generated by a transmitter circuit as previously described in the subject disclosure (e.g., see reference 101, 1000 of FIGS. 1 and 10A) adapted to provide electrical signals to the MMICs 1870. Each MMIC 1870 can be configured to receive signal 1872 which the MMIC 1870 can modulate and transmit with a radiating element (e.g., an antenna) to emit electromagnetic waves having radiated e-fields 1861. In one embodiment, the MMICs 1870 can be configured to receive the same signal 1872, but transmit electromagnetic waves having e-fields 1861 of opposing orientation. This can be accomplished by configuring one of the MMICs 1870 to transmit electromagnetic waves that are 180 degrees out of phase with the electromagnetic waves transmitted by the other MMIC 1870. In an embodiment, the combination of the electromagnetic waves emitted by the MMICs 1870 can together induce electromagnetic waves 1868 that are bound to the cable 1862 for propagation according to a fundamental wave mode without other wave modes present—such as non-fundamental wave modes. In this configuration, the electromagnetic waves 1868 can propagate longitudinally along the cable 1862 to other downstream waveguide systems coupled to the cable 1862.

Figure 18Q:
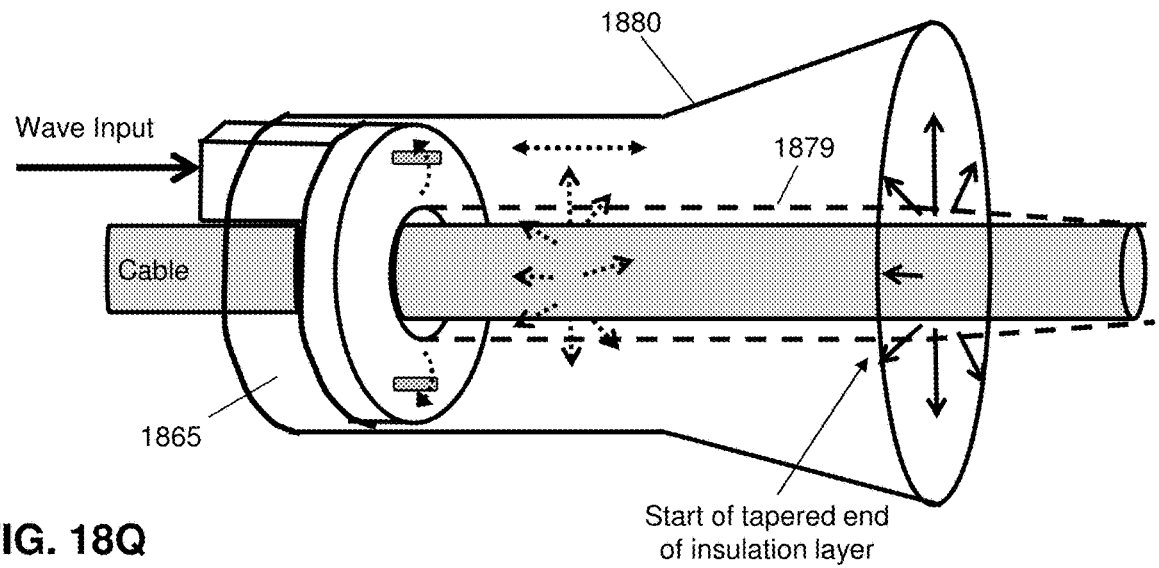
Figure 18R:
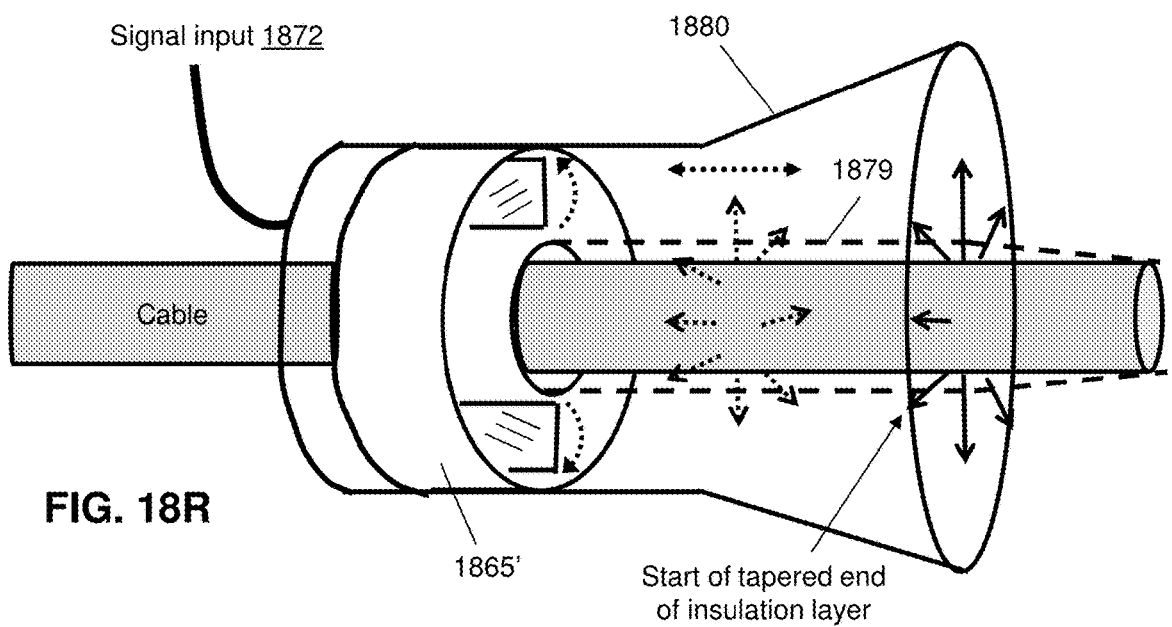

A tapered horn 1880 can be added to the embodiments of FIGS. 18O and 18P to assist in the inducement of the electromagnetic waves 1868 on cable 1862 as depicted in FIGS. 18Q and 18R. In an embodiment where the cable 1862 is an uninsulated conductor, the electromagnetic waves induced on the cable 1862 can have a large radial dimension (e.g., 1 meter). To enable use of a smaller tapered horn 1880, an insulation layer 1879 can be applied on a portion of the cable 1862 at or near the cavity as depicted with hash lines in FIGS. 18Q and 18R. The insulation layer 1879 can have a tapered end facing away from the waveguide 1865. The added insulation enables the electromagnetic waves 1868 initially launched by the waveguide 1865 (or 1865') to be tightly bound to the insulation, which in turn reduces the radial dimension of the electromagnetic fields 1868 (e.g., centimeters). As the electromagnetic waves 1868 propagate away from the waveguide 1865 (1865') and reach the tapered end of the insulation layer 1879, the radial dimension of the electromagnetic waves 1868 begin to increase eventually achieving the radial dimension they would have had had the electromagnetic waves 1868 been induced on the uninsulated conductor without an insulation layer. In the illustration of FIGS. 18Q and 18R the tapered end begins at an end of the tapered horn 1880. In other embodiments, the tapered end of the insulation layer 1879 can begin before or after the end of the tapered horn 1880. The tapered horn can be metallic or constructed of other conductive material or constructed of a plastic or other non-conductive material that is coated or clad with a dielectric layer or doped with a conductive material to provide reflective properties similar to a metallic horn.

Figure 18S:
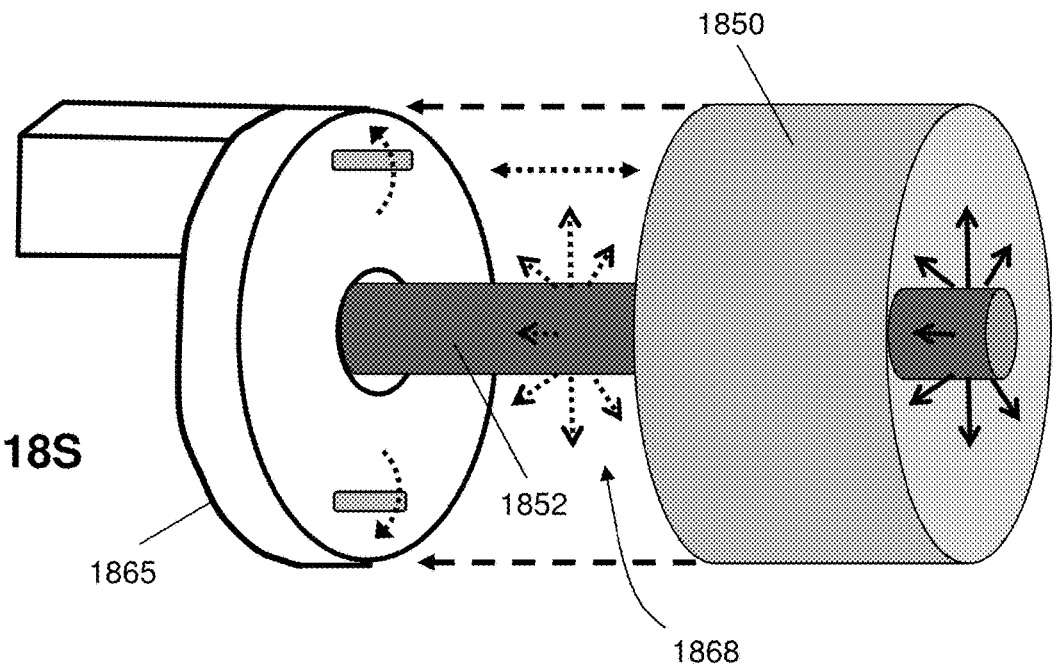
Figure 18T:
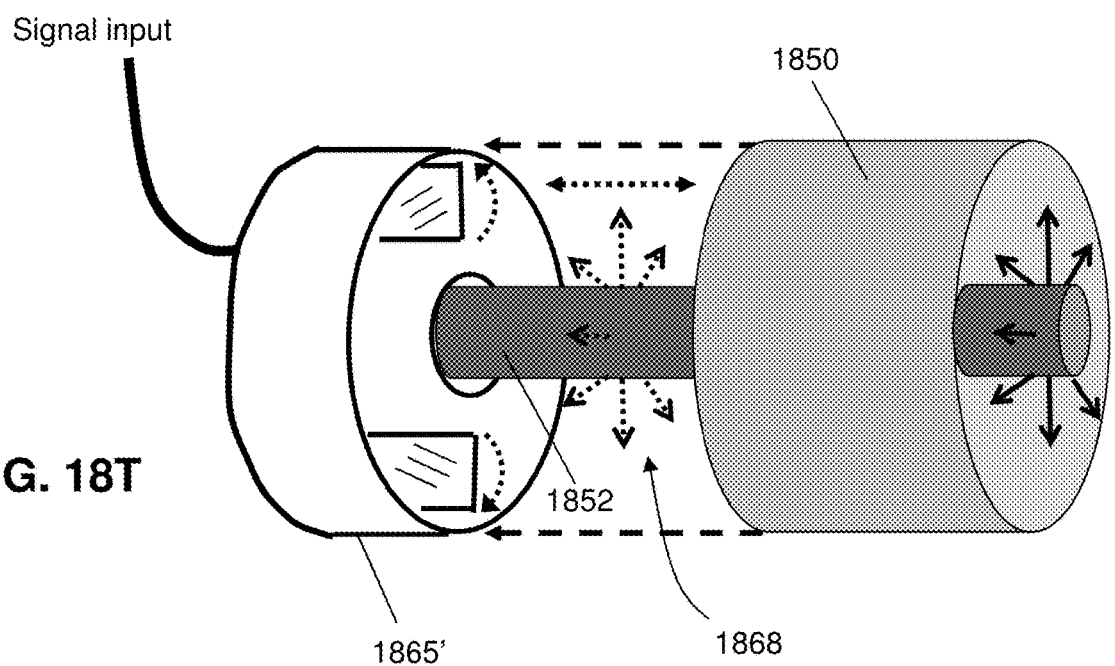

In an embodiment, cable 1862 can comprise any of the embodiments of cable 1850 described earlier. In this embodiment, waveguides 1865 and 1865' can be coupled to a transmission core 1852 of cable 1850 as depicted in FIGS. 18S and 18T. The waveguides 1865 and 1865' can induce, as previously described, electromagnetic waves 1868 on the transmission core 1852 for propagation entirely or partially within inner layers of cable 1850.

It is noted that for the foregoing embodiments of FIGS. 18Q, 18R, 18S and 18T, electromagnetic waves 1868 can be bidirectional. For example, electromagnetic waves 1868 of a different operating frequency can be received by slots 1863 or MMICs 1870 of the waveguides 1865 and 1865', respectively. Once received, the electromagnetic waves can be converted by a receiver circuit (e.g., see reference 101, 1000 of FIGS. 1 and 10A) for generating a communication signal for processing.

Although not shown, it is further noted that the waveguides 1865 and 1865' can be adapted so that the waveguides 1865 and 1865' can direct electromagnetic waves 1868 upstream or downstream longitudinally. For example, a first tapered horn 1880 coupled to a first instance of a waveguide 1865 or 1865' can be directed westerly on cable 1862, while a second tapered horn 1880 coupled to a second instance of a waveguide 1865 or 1865' can be directed easterly on cable 1862. The first and second instances of the waveguides 1865 or 1865' can be coupled so that in a repeater configuration, signals received by the first waveguide 1865 or 1865' can be provided to the second waveguide 1865 or 1865' for retransmission in an easterly direction on cable 1862. The repeater configuration just described can also be applied from an easterly to westerly direction on cable 1862.

Figure 18U:
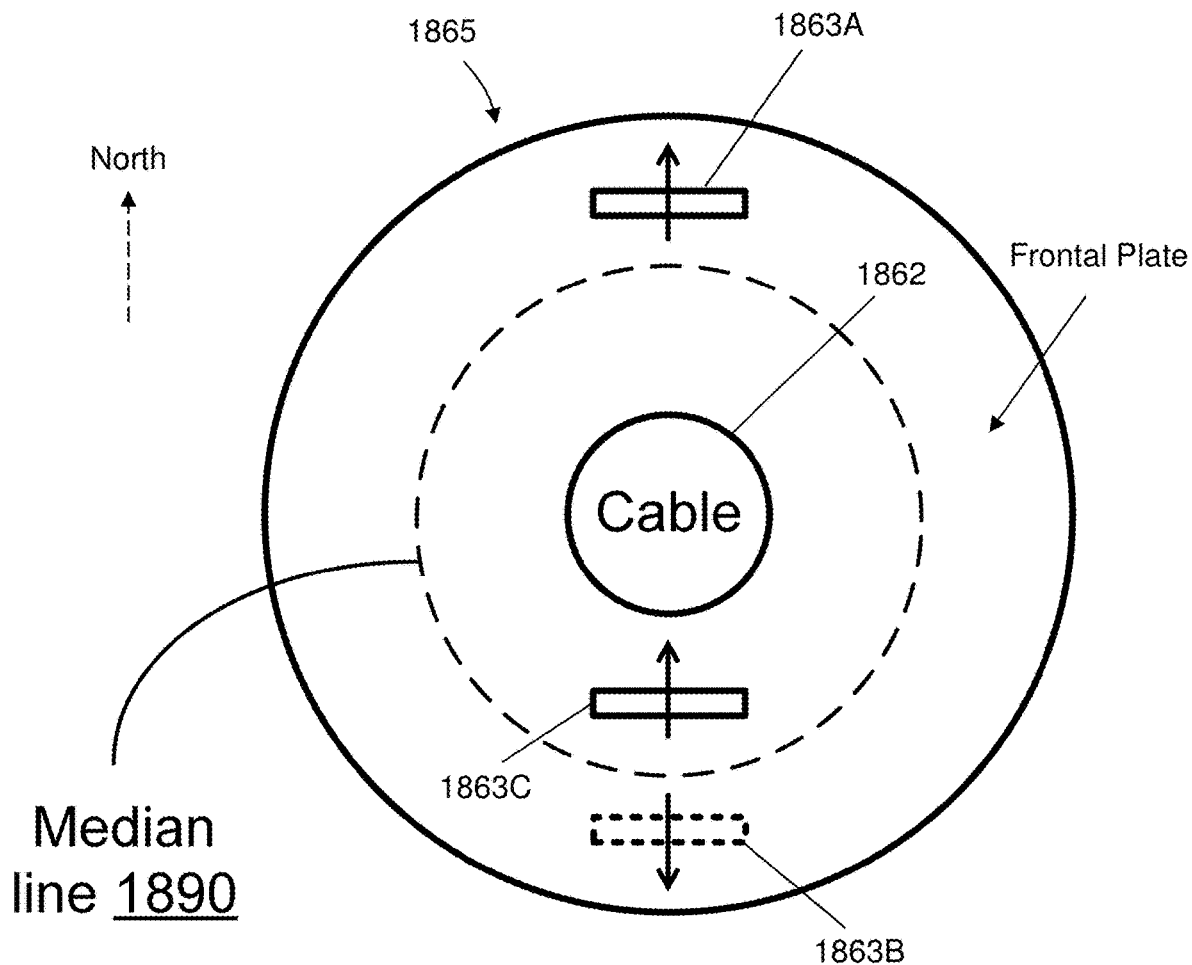

The waveguide 1865 of FIGS. 18N, 18O, 18Q and 18S can also be configured to generate electromagnetic fields having only non-fundamental or asymmetric wave modes. FIG. 18U depicts an embodiment of a waveguide 1865 that can be adapted to generate electromagnetic fields having only non-fundamental wave modes. A median line 1890 represents a separation between slots where electrical currents on a backside (not shown) of a frontal plate of the waveguide 1865 change polarity. For example, electrical currents on the backside of the frontal plate corresponding to e-fields that are radially outward (i.e., point away from a center point of cable 1862) can in some embodiments be associated with slots located outside of the median line 1890 (e.g., slots 1863A and 1863B). Electrical currents on the backside of the frontal plate corresponding to e-fields that are radially inward (i.e., point towards a center point of cable 1862) can in some embodiments be associated with slots located inside of the median line 1890. The direction of the currents can depend on the operating frequency of the electromagnetic waves 1866 supplied to the hollow rectangular waveguide portion 1867 (see FIG. 18O) among other parameters.

For illustration purposes, assume the electromagnetic waves 1866 supplied to the hollow rectangular waveguide portion 1867 have an operating frequency whereby a circumferential distance between slots 1863A and 1863B is one full wavelength of the electromagnetic waves 1866. In this instance, the e-fields of the electromagnetic waves emitted by slots 1863A and 1863B point radially outward (i.e., have opposing orientations). When the electromagnetic waves emitted by slots 1863A and 1863B are combined, the resulting electromagnetic waves on cable 1862 will propagate according to the fundamental wave mode. In contrast, by repositioning one of the slots (e.g., slot 1863B) inside the media line 1890 (i.e., slot 1863C), slot 1863C will generate electromagnetic waves that have e-fields that are approximately 180 degrees out of phase with the e-fields of the electromagnetic waves generated by slot 1863A. Consequently, the e-field orientations of the electromagnetic waves generated by slot pairs 1863A and 1863C will be substantially aligned. The combination of the electromagnetic waves emitted by slot pairs 1863A and 1863C will thus generate electromagnetic waves that are bound to the cable 1862 for propagation according to a non-fundamental wave mode.

Figure 18V:
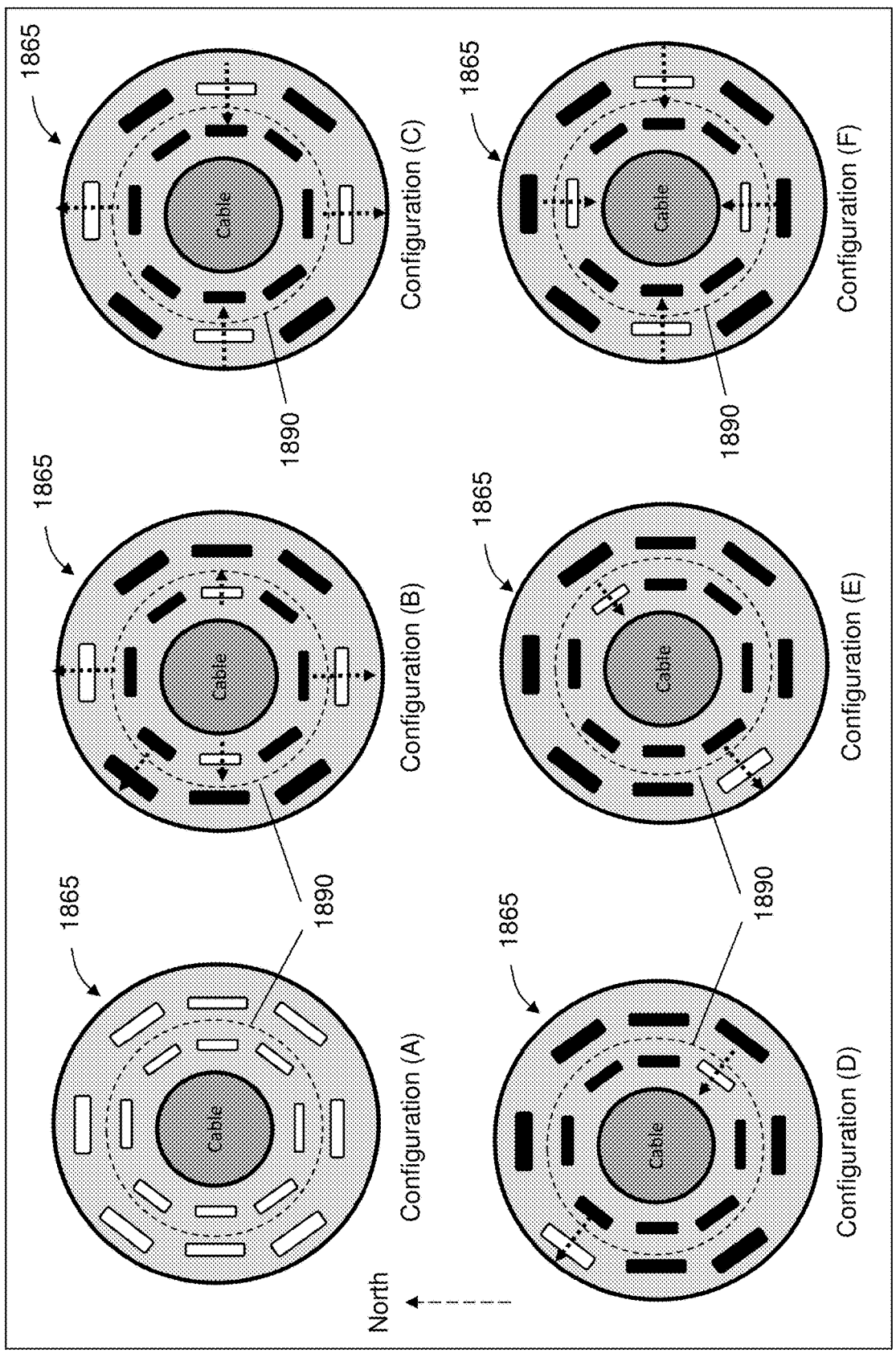

To achieve a reconfigurable slot arrangement, waveguide 1865 can be adapted according to the embodiments depicted in FIG. 18V. Configuration (A) depicts a waveguide 1865 having a plurality of symmetrically positioned slots. Each of the slots 1863 of configuration (A) can be selectively disabled by blocking the slot with a material (e.g., carbon fiber or metal) to prevent the emission of electromagnetic waves. A blocked (or disabled) slot 1863 is shown in black, while an enabled (or unblocked) slot 1863 is shown in white. Although not shown, a blocking material can be placed behind (or in front) of the frontal plate of the waveguide 1865. A mechanism (not shown) can be coupled to the blocking material so that the blocking material can slide in or out of a particular slot 1863 much like closing or opening a window with a cover. The mechanism can be coupled to a linear motor controllable by circuitry of the waveguide 1865 to selectively enable or disable individual slots 1863. With such a mechanism at each slot 1863, the waveguide 1865 can be configured to select different configurations of enabled and disabled slots 1863 as depicted in the embodiments of FIG. 18V. Other methods or techniques for covering or opening slots (e.g., utilizing rotatable disks behind or in front of the waveguide 1865) can be applied to the embodiments of the subject disclosure.

In one embodiment, the waveguide system 1865 can be configured to enable certain slots 1863 outside the median line 1890 and disable certain slots 1863 inside the median line 1890 as shown in configuration (B) to generate fundamental waves. Assume, for example, that the circumferential distance between slots 1863 outside the median line 1890 (i.e., in the northern and southern locations of the waveguide system 1865) is one full wavelength. These slots will therefore have electric fields (e-fields) pointing at certain instances in time radially outward as previously described. In contrast, the slots inside the median line 1890 (i.e., in the western and eastern locations of the waveguide system 1865) will have a circumferential distance of one-half a wavelength relative to either of the slots 1863 outside the median line. Since the slots inside the median line 1890 are half a wavelength apart, such slots will produce electromagnetic waves having e-fields pointing radially outward. If the western and eastern slots 1863 outside the median line 1890 had been enabled instead of the western and eastern slots inside the median line 1890, then the e-fields emitted by those slots would have pointed radially inward, which when combined with the electric fields of the northern and southern would produce non-fundamental wave mode propagation. Accordingly, configuration (B) as depicted in FIG. 18V can be used to generate electromagnetic waves at the northern and southern slots 1863 having e-fields that point radially outward and electromagnetic waves at the western and eastern slots 1863 with e-fields that also point radially outward, which when combined induce electromagnetic waves on cable 1862 having a fundamental wave mode.

In another embodiment, the waveguide system 1865 can be configured to enable a northerly, southerly, westerly and easterly slots 1863 all outside the median line 1890, and disable all other slots 1863 as shown in configuration (C). Assuming the circumferential distance between a pair of opposing slots (e.g., northerly and southerly, or westerly and easterly) is a full wavelength apart, then configuration (C) can be used to generate electromagnetic waves having a non-fundamental wave mode with some e-fields pointing radially outward and other fields pointing radially inward. In yet another embodiment, the waveguide system 1865 can be configured to enable a northwesterly slot 1863 outside the median line 1890, enable a southeasterly slot 1863 inside the median line 1890, and disable all other slots 1863 as shown in configuration (D). Assuming the circumferential distance between such a pair of slots is a full wavelength apart, then such a configuration can be used to generate electromagnetic waves having a non-fundamental wave mode with e-fields aligned in a northwesterly direction.

In another embodiment, the waveguide system 1865 can be configured to produce electromagnetic waves having a non-fundamental wave mode with e-fields aligned in a southwesterly direction. This can be accomplished by utilizing a different arrangement than used in configuration (D). Configuration (E) can be accomplished by enabling a southwesterly slot 1863 outside the median line 1890, enabling a northeasterly slot 1863 inside the median line 1890, and disabling all other slots 1863 as shown in configuration (E). Assuming the circumferential distance between such a pair of slots is a full wavelength apart, then such a configuration can be used to generate electromagnetic waves having a non-fundamental wave mode with e-fields aligned in a southwesterly direction. Configuration (E) thus generates a non-fundamental wave mode that is orthogonal to the non-fundamental wave mode of configuration (D).

In yet another embodiment, the waveguide system 1865 can be configured to generate electromagnetic waves having a fundamental wave mode with e-fields that point radially inward. This can be accomplished by enabling a northerly slot 1863 inside the median line 1890, enabling a southerly slot 1863 inside the median line 1890, enabling an easterly slot outside the median 1890, enabling a westerly slot 1863 outside the median 1890, and disabling all other slots 1863 as shown in configuration (F). Assuming the circumferential distance between the northerly and southerly slots is a full wavelength apart, then such a configuration can be used to generate electromagnetic waves having a fundamental wave mode with radially inward e-fields. Although the slots selected in configurations (B) and (F) are different, the fundamental wave modes generated by configurations (B) and (F) are the same.

It yet another embodiment, e-fields can be manipulated between slots to generate fundamental or non-fundamental wave modes by varying the operating frequency of the electromagnetic waves 1866 supplied to the hollow rectangular waveguide portion 1867. For example, assume in the illustration of FIG. 18U that for a particular operating frequency of the electromagnetic waves 1866 the circumferential distance between slot 1863A and 1863B is one full wavelength of the electromagnetic waves 1866. In this instance, the e-fields of electromagnetic waves emitted by slots 1863A and 1863B will point radially outward as shown, and can be used in combination to induce electromagnetic waves on cable 1862 having a fundamental wave mode. In contrast, the e-fields of electromagnetic waves emitted by slots 1863A and 1863C will be radially aligned (i.e., pointing northerly) as shown, and can be used in combination to induce electromagnetic waves on cable 1862 having a non-fundamental wave mode.

Now suppose that the operating frequency of the electromagnetic waves 1866 supplied to the hollow rectangular waveguide portion 1867 is changed so that the circumferential distance between slot 1863A and 1863B is one-half a wavelength of the electromagnetic waves 1866. In this instance, the e-fields of electromagnetic waves emitted by slots 1863A and 1863B will be radially aligned (i.e., point in the same direction). That is, the e-fields of electromagnetic waves emitted by slot 1863B will point in the same direction as the e-fields of electromagnetic waves emitted by slot 1863A. Such electromagnetic waves can be used in combination to induce electromagnetic waves on cable 1862 having a non-fundamental wave mode. In contrast, the e-fields of electromagnetic waves emitted by slots 1863A and 1863C will be radially outward (i.e., away from cable 1862), and can be used in combination to induce electromagnetic waves on cable 1862 having a fundamental wave mode.

Figure 18W:
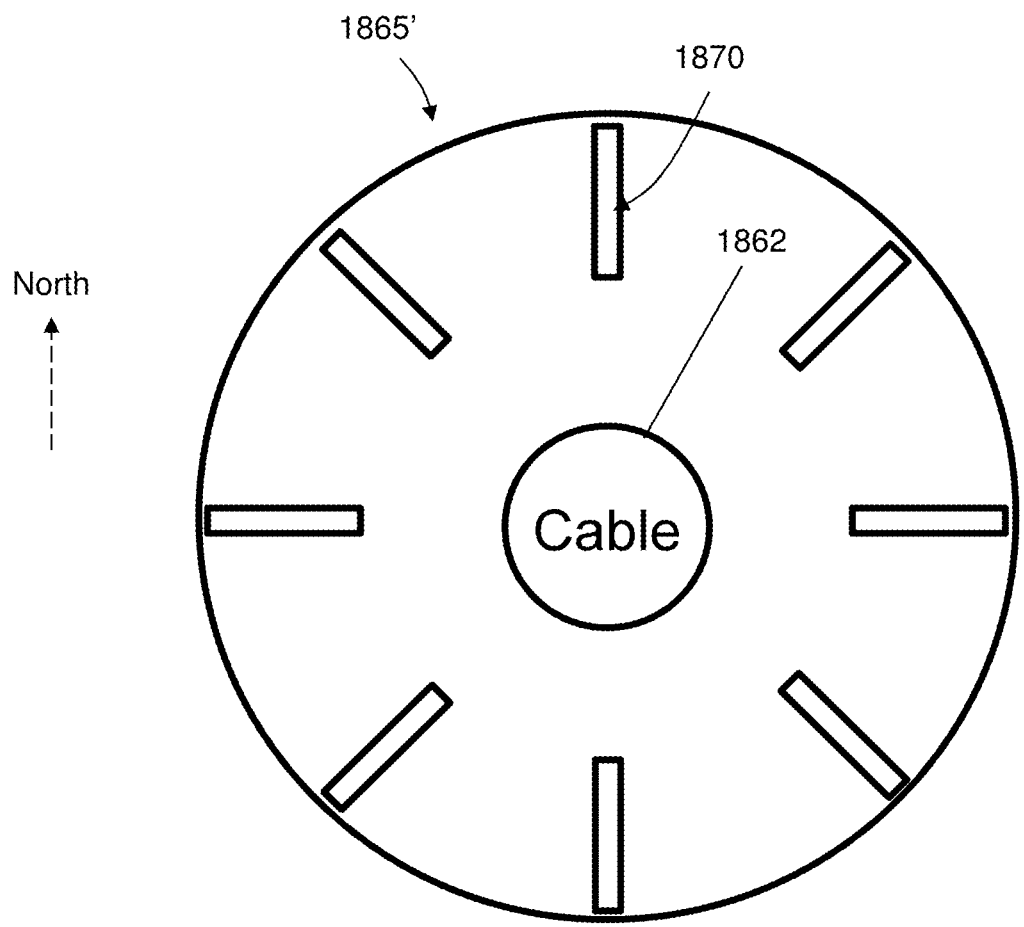

In another embodiment, the waveguide 1865' of FIGS. 18P, 18R and 18T can also be configured to generate electromagnetic waves having only non-fundamental wave modes. This can be accomplished by adding more MMICs 1870 as depicted in FIG. 18W. Each MMIC 1870 can be configured to receive the same signal input 1872. However, MMICs 1870 can selectively be configured to emit electromagnetic waves having differing phases using controllable phase-shifting circuitry in each MMIC 1870. For example, the northerly and southerly MMICs 1870 can be configured to emit electromagnetic waves having a 180 degree phase difference, thereby aligning the e-fields either in a northerly or southerly direction. Any combination of pairs of MMICs 1870 (e.g., westerly and easterly MMICs 1870, northwesterly and southeasterly MMICs 1870, northeasterly and southwesterly MMICs 1870) can be configured with opposing or aligned e-fields. Consequently, waveguide 1865' can be configured to generate electromagnetic waves with one or more non-fundamental wave modes, electromagnetic waves with one or more fundamental wave modes, or any combinations thereof.

It is submitted that it is not necessary to select slots 1863 in pairs to generate electromagnetic waves having a non-fundamental wave mode. For example, electromagnetic waves having a non-fundamental wave mode can be generated by enabling a single slot from the plurality of slots shown in configuration (A) of FIG. 18V and disabling all other slots. Similarly, a single MMIC 1870 of the MMICs 1870 shown in FIG. 18W can be configured to generate electromagnetic waves having a non-fundamental wave mode while all other MMICs 1870 are not in use or disabled. Likewise other wave modes and wave mode combinations can be induced by enabling other non-null proper subsets of waveguide slots 1863 or the MMICs 1870.

It is further submitted that the e-field arrows shown in FIGS. 18U-18V are illustrative only and represent a static depiction of e-fields. In practice, the electromagnetic waves may have oscillating e-fields, which at one instance in time point outwardly, and at another instance in time point inwardly. For example, in the case of non-fundamental wave modes having e-fields that are aligned in one direction (e.g., northerly), such waves may at another instance in time have e-fields that point in an opposite direction (e.g., southerly). Similarly, fundamental wave modes having e-fields that are radial may at one instance have e-fields that point radially away from the cable 1862 and at another instance in time point radially towards the cable 1862. It is further noted that the embodiments of FIGS. 18U-18W can be adapted to generate electromagnetic waves with one or more non-fundamental wave modes, electromagnetic waves with one or more fundamental wave modes (e.g., TM00 and HE11 modes), or any combinations thereof. It is further noted that such adaptions can be used in combination with any embodiments described in the subject disclosure. It is also noted that the embodiments of FIGS. 18U-18W can be combined (e.g., slots used in combination with MMICs).

It is further noted that in some embodiments, the waveguide systems 1865 and 1865' of FIGS. 18N-18W may generate combinations of fundamental and non-fundamental wave modes where one wave mode is dominant over the other. For example, in one embodiment electromagnetic waves generated by the waveguide systems 1865 and 1865' of FIGS. 18N-18W may have a weak signal component that has a non-fundamental wave mode, and a substantially strong signal component that has a fundamental wave mode. Accordingly, in this embodiment, the electromagnetic waves have a substantially fundamental wave mode. In another embodiment electromagnetic waves generated by the waveguide systems 1865 and 1865' of FIGS. 18N-18W may have a weak signal component that has a fundamental wave mode, and a substantially strong signal component that has a non-fundamental wave mode. Accordingly, in this embodiment, the electromagnetic waves have a substantially non-fundamental wave mode. Further, a non-dominant wave mode may be generated that propagates only trivial distances along the length of the transmission medium.

It is also noted that the waveguide systems 1865 and 1865' of FIGS. 18N-18W can be configured to generate instances of electromagnetic waves that have wave modes that can differ from a resulting wave mode or modes of the combined electromagnetic wave. It is further noted that each MMIC 1870 of the waveguide system 1865' of FIG. 18W can be configured to generate an instance of electromagnetic waves having wave characteristics that differ from the wave characteristics of another instance of electromagnetic waves generated by another MMIC 1870. One MMIC 1870, for example, can generate an instance of an electromagnetic wave having a spatial orientation and a phase, frequency, magnitude, electric field orientation, and/or magnetic field orientation that differs from the spatial orientation and phase, frequency, magnitude, electric field orientation, and/or magnetic field orientation of a different instance of another electromagnetic wave generated by another MMIC 1870. The waveguide system 1865' can thus be configured to generate instances of electromagnetic waves having different wave and spatial characteristics, which when combined achieve resulting electromagnetic waves having one or more desirable wave modes.

From these illustrations, it is submitted that the waveguide systems 1865 and 1865' of FIGS. 18N-18W can be adapted to generate electromagnetic waves with one or more selectable wave modes. In one embodiment, for example, the waveguide systems 1865 and 1865' can be adapted to select one or more wave modes and generate electromagnetic waves having a single wave mode or multiple wave modes selected and produced from a process of combining instances of electromagnetic waves having one or more configurable wave and spatial characteristics. In an embodiment, for example, parametric information can be stored in a look-up table. Each entry in the look-up table can represent a selectable wave mode. A selectable wave mode can represent a single wave mode, or a combination of wave modes. The combination of wave modes can have one or dominant wave modes. The parametric information can provide configuration information for generating instances of electromagnetic waves for producing resultant electromagnetic waves that have the desired wave mode.

For example, once a wave mode or modes is selected, the parametric information obtained from the look-up table from the entry associated with the selected wave mode(s) can be used to identify which of one or more MMICs 1870 to utilize, and/or their corresponding configurations to achieve electromagnetic waves having the desired wave mode(s). The parametric information may identify the selection of the one or more MMICs 1870 based on the spatial orientations of the MMICs 1870, which may be required for producing electromagnetic waves with the desired wave mode. The parametric information can also provide information to configure each of the one or more MMICs 1870 with a particular phase, frequency, magnitude, electric field orientation, and/or magnetic field orientation which may or may not be the same for each of the selected MMICs 1870. A look-up table with selectable wave modes and corresponding parametric information can be adapted for configuring the slotted waveguide system 1865.

In some embodiments, a guided electromagnetic wave can be considered to have a desired wave mode if the corresponding wave mode propagates non-trivial distances on a transmission medium and has a field strength that is substantially greater in magnitude (e.g., 20 dB higher in magnitude) than other wave modes that may or may not be desirable. Such a desired wave mode or modes can be referred to as dominant wave mode(s) with the other wave modes being referred to as non-dominant wave modes. In a similar fashion, a guided electromagnetic wave that is said to be substantially without the fundamental wave mode has either no fundamental wave mode or a non-dominant fundamental wave mode. A guided electromagnetic wave that is said to be substantially without a non-fundamental wave mode has either no non-fundamental wave mode(s) or only non-dominant non-fundamental wave mode(s). In some embodiments, a guided electromagnetic wave that is said to have only a single wave mode or a selected wave mode may have only one corresponding dominant wave mode.

It is further noted that the embodiments of FIGS. 18U-18W can be applied to other embodiments of the subject disclosure. For example, the embodiments of FIGS. 18U-18W can be used as alternate embodiments to the embodiments depicted in FIGS. 18N-18T or can be combined with the embodiments depicted in FIGS. 18N-18T.

Figure 19A:
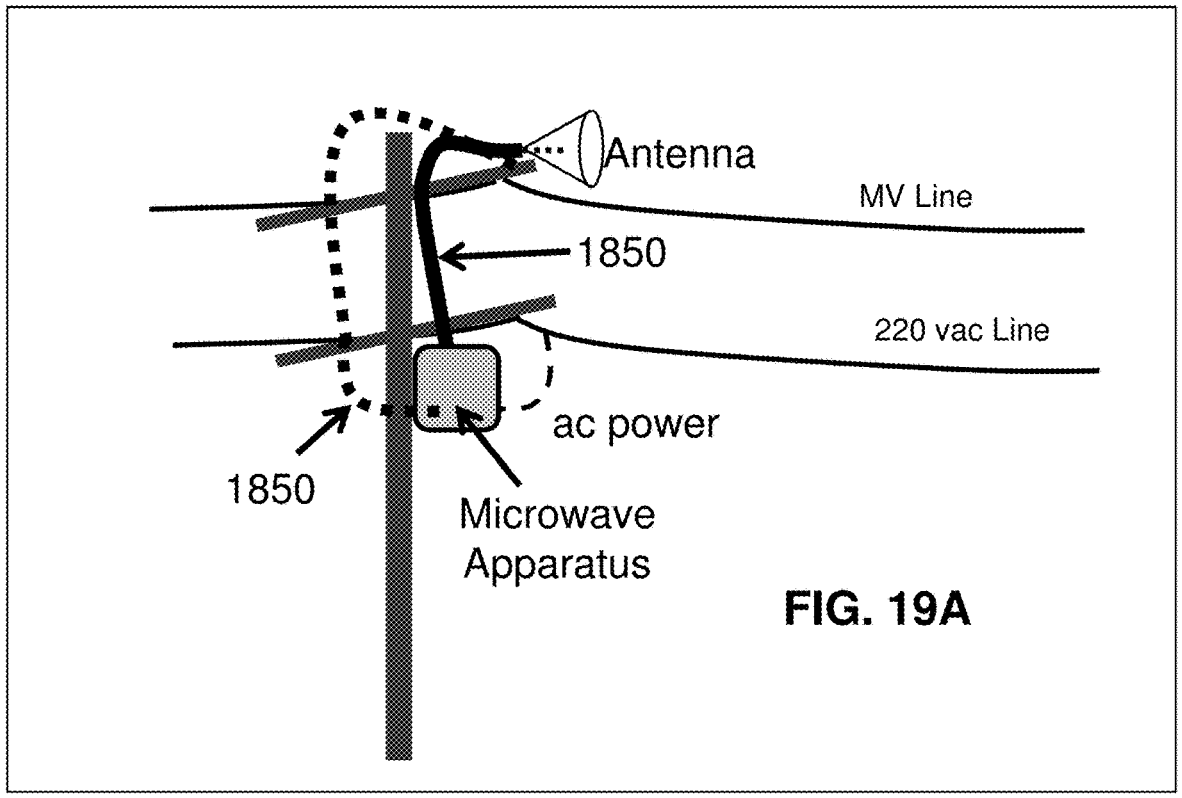
FIGS. 19A and 19B are block diagrams illustrating example, non-limiting embodiments of the transmission medium of FIG. 18A used for inducing guided electromagnetic waves on power lines supported by utility poles.
Figure 19B:
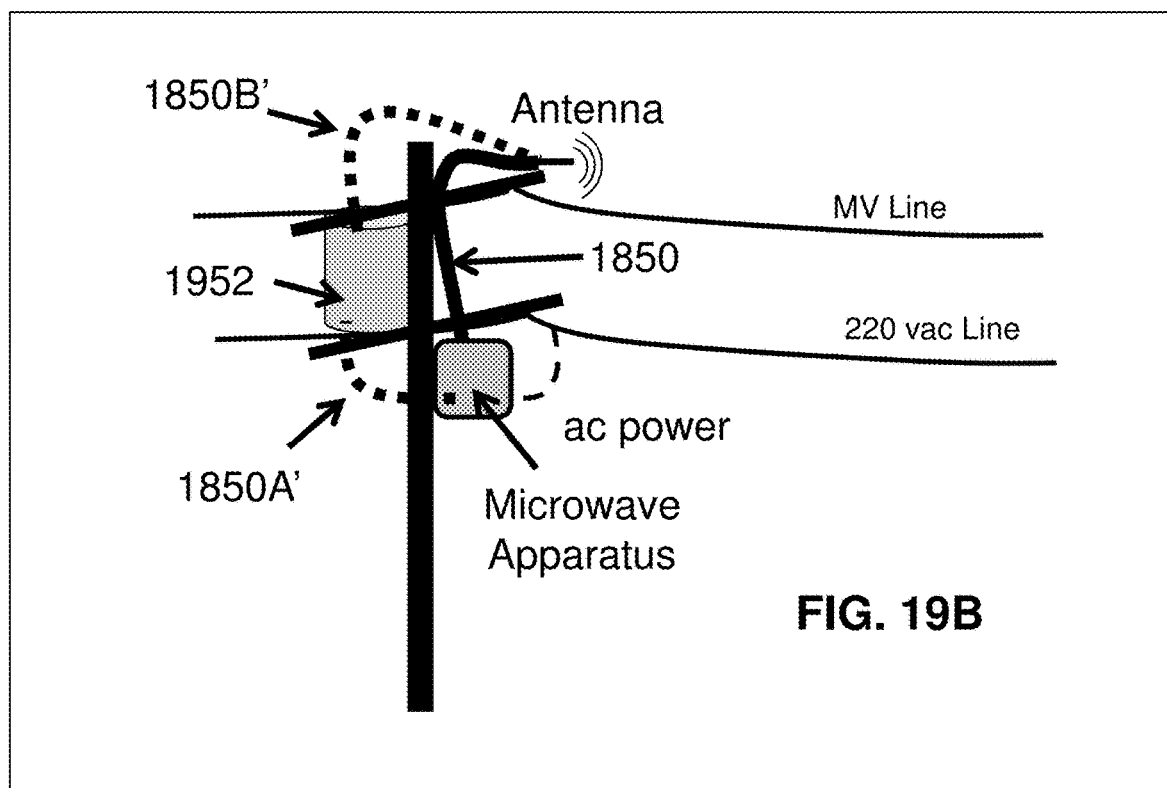

Turning now to FIGS. 19A and 19B, block diagrams illustrating example, non-limiting embodiments of the cable 1850 of FIG. 18A used for inducing guided electromagnetic waves on power lines supported by utility poles. In one embodiment, as depicted in FIG. 19A, a cable 1850 can be coupled at one end to a microwave apparatus that launches guided electromagnetic waves within one or more inner layers of cable 1850 utilizing, for example, the hollow waveguide 1808 shown in FIGS. 18A-18C. The microwave apparatus can utilize a microwave transceiver such as shown in FIG. 10A for transmitting or receiving signals from cable 1850. The guided electromagnetic waves induced in the one or more inner layers of cable 1850 can propagate to an exposed stub of the cable 1850 located inside a horn antenna (shown as a dotted line in FIG. 19A) for radiating the electromagnetic waves via the horn antenna. The radiated signals from the horn antenna in turn can induce guided electromagnetic waves that propagate longitudinally on a medium voltage (MV) power line. In one embodiment, the microwave apparatus can receive AC power from a low voltage (e.g., 220V) power line. Alternatively, the horn antenna can be replaced with a stub antenna as shown in FIG. 19B to induce guided electromagnetic waves that propagate longitudinally on the MV power line or to transmit wireless signals to other antenna system(s).

In alternate embodiments, first and second cables 1850A' and 1850B' can be coupled to the microwave apparatus and to a transformer 1952, respectively, as shown in FIGS. 19A and 19B. The first and second cables 1850A' and 1850B' can be represented by, for example, cable 1820 or cable 1830 of FIGS. 18B and 18C, respectively, each having a conductive core. A first end of the conductive core of the first cable 1850A' can be coupled to the microwave apparatus for propagating guided electromagnetic waves launched therein. A second end of the conductive core of the first cable 1850A' can be coupled to a first end of a conductive coil of the transformer 1952 for receiving the guided electromagnetic waves propagating in the first cable 1850A' and for supplying signals associated therewith to a first end of a second cable 1850B' by way of a second end of the conductive coil of the transformer 1952. A second end of the second cable 1850B' can be coupled to the horn antenna of FIG. 19A or can be exposed as a stub antenna of FIG. 19B for inducing guided electromagnetic waves that propagate longitudinally on the MV power line.

In an embodiment where cable 1850, 1850A' and 1850B' each comprise multiple instances of transmission mediums 1800, 1820, and/or 1830, a poly-rod structure of antennas 1855 can be formed such as shown in FIG. 18K. Each antenna 1855 can be coupled, for example, to a horn antenna assembly as shown in FIG. 19A or a pie-pan antenna assembly (not shown) for radiating multiple wireless signals. Alternatively, the antennas 1855 can be used as stub antennas in FIG. 19B. The microwave apparatus of FIGS. 19A-19B can be configured to adjust the guided electromagnetic waves to beam steer the wireless signals emitted by the antennas 1855. One or more of the antennas 1855 can also be used for inducing guided electromagnetic waves on a power line.

Figure 19C:
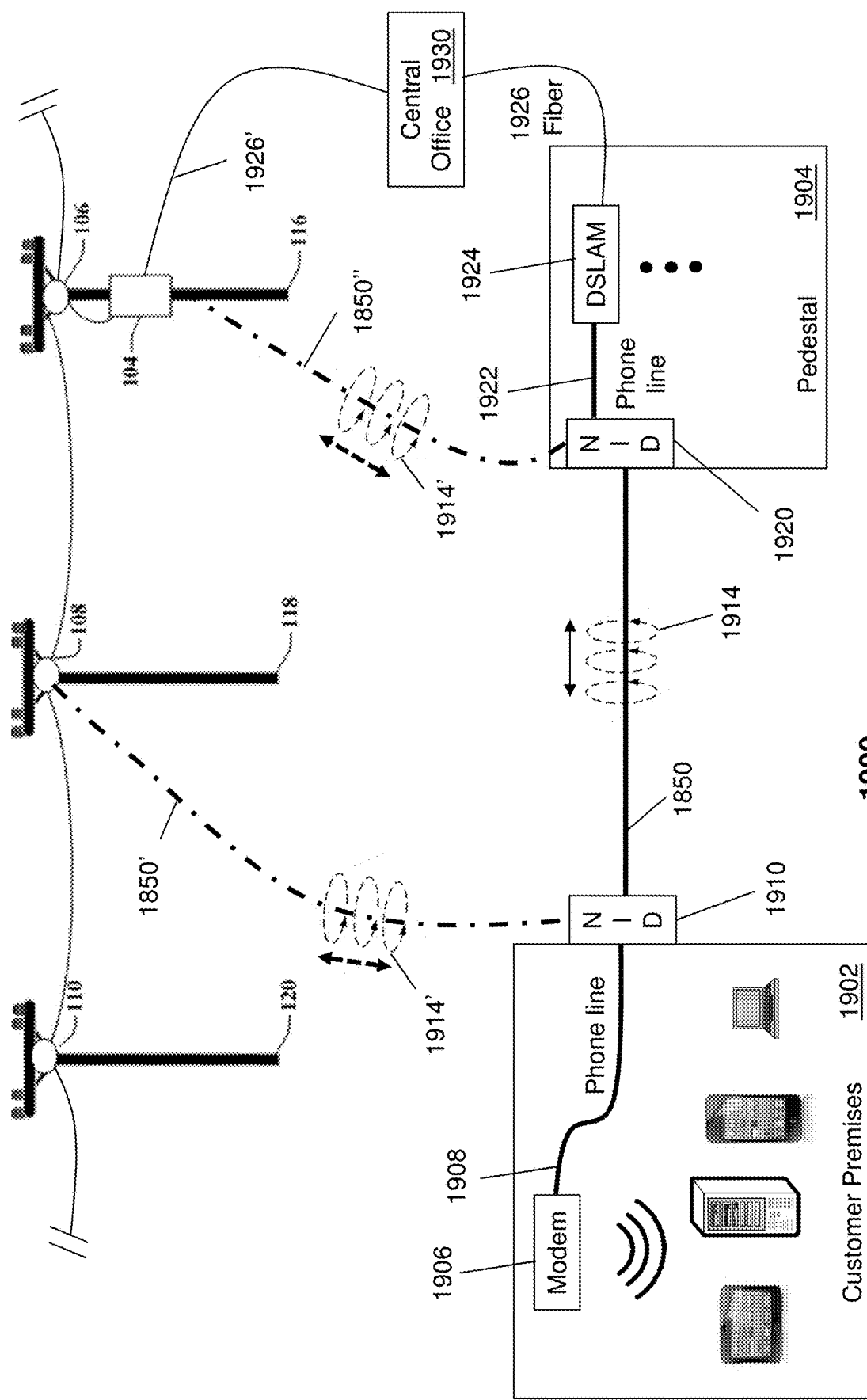
FIG. 19C is a block diagram of an example, non-limiting embodiment of a communication network in accordance with various aspects described herein.

Turning now to FIG. 19C, a block diagram of an example, non-limiting embodiment of a communication network 1900 in accordance with various aspects described herein is shown. In one embodiment, for example, the waveguide system 1602 of FIG. 16A can be incorporated into network interface devices (NIDs) such as NIDs 1910 and 1920 of FIG. 19C. A NID having the functionality of waveguide system 1602 can be used to enhance transmission capabilities between customer premises 1902 (enterprise or residential) and a pedestal 1904 (sometimes referred to as a service area interface or SAI).

In one embodiment, a central office 1930 can supply one or more fiber cables 1926 to the pedestal 1904. The fiber cables 1926 can provide high-speed full-duplex data services (e.g., 1-100 Gbps or higher) to mini-DSLAMs 1924 located in the pedestal 1904. The data services can be used for transport of voice, internet traffic, media content services (e.g., streaming video services, broadcast TV), and so on. In prior art systems, mini-DSLAMs 1924 typically connect to twisted pair phone lines (e.g., twisted pairs included in category 5e or Cat. 5e unshielded twisted-pair (UTP) cables that include an unshielded bundle of twisted pair cables, such as 24 gauge insulated solid wires, surrounded by an outer insulating sheath), which in turn connect to the customer premises 1902 directly. In such systems, DSL data rates taper off at 100 Mbps or less due in part to the length of legacy twisted pair cables to the customer premises 1902 among other factors.

The embodiments of FIG. 19C, however, are distinct from prior art DSL systems. In the illustration of FIG. 19C, a mini-DSLAM 1924, for example, can be configured to connect to NID 1920 via cable 1850 (which can represent in whole or in part any of the cable embodiments described in relation to FIGS. 18A-18D and 18F-18L singly or in combination). Utilizing cable 1850 between customer premises 1902 and a pedestal 1904, enables NIDs 1910 and 1920 to transmit and receive guide electromagnetic waves for uplink and downlink communications. Based on embodiments previously described, cable 1850 can be exposed to rain, or can be buried without adversely affecting electromagnetic wave propagation either in a downlink path or an uplink path so long as the electric field profile of such waves in either direction is confined at least in part or entirely within inner layers of cable 1850. In the present illustration, downlink communications represents a communication path from the pedestal 1904 to customer premises 1902, while uplink communications represents a communication path from customer premises 1902 to the pedestal 1904. In an embodiment where cable 1850 comprises one of the embodiments of FIGS. 18G-18H, cable 1850 can also serve the purpose of supplying power to the NID 1910 and 1920 and other equipment of the customer premises 1902 and the pedestal 1904.

In customer premises 1902, DSL signals can originate from a DSL modem 1906 (which may have a built-in router and which may provide wireless services such as WiFi to user equipment shown in the customer premises 1902). The DSL signals can be supplied to NID 1910 by a twisted pair phone 1908. The NID 1910 can utilize the integrated waveguide 1602 to launch within cable 1850 guided electromagnetic waves 1914 directed to the pedestal 1904 on an uplink path. In the downlink path, DSL signals generated by the mini-DSLAM 1924 can flow through a twisted pair phone line 1922 to NID 1920. The waveguide system 1602 integrated in the NID 1920 can convert the DSL signals, or a portion thereof, from electrical signals to guided electromagnetic waves 1914 that propagate within cable 1850 on the downlink path. To provide full duplex communications, the guided electromagnetic waves 1914 on the uplink can be configured to operate at a different carrier frequency and/or a different modulation approach than the guided electromagnetic waves 1914 on the downlink to reduce or avoid interference. Additionally, on the uplink and downlink paths, the guided electromagnetic waves 1914 are guided by a core section of cable 1850, as previously described, and such waves can be configured to have a field intensity profile that confines the guide electromagnetic waves in whole or in part in the inner layers of cable 1850. Although the guided electromagnetic waves 1914 are shown outside of cable 1850, the depiction of these waves is for illustration purposes only. For this reason, the guided electromagnetic waves 1914 are drawn with "hash marks" to indicate that they are guided by the inner layers of cable 1850.

On the downlink path, the integrated waveguide system 1602 of NID 1910 receives the guided electromagnetic waves 1914 generated by NID 1920 and converts them back to DSL signals conforming to the requirements of the DSL modem 1906. The DSL signals are then supplied to the DSL modem 1906 via a set of twisted pair wires of phone line

1908 for processing. Similarly, on the uplink path, the integrated waveguide system 1602 of NID 1920 receives the guided electromagnetic waves 1914 generated by NID 1910 and converts them back to DSL signals conforming to the requirements of the mini-DSLAM 1924. The DSL signals are then supplied to the mini-DSLAM 1924 via a set of twisted pair wires of phone line 1922 for processing. Because of the short length of phone lines 1908 and 1922, the DSL modem 1908 and the mini-DSLAM 1924 can send and receive DSL signals between themselves on the uplink and downlink at very high speeds (e.g., 1 Gbps to 60 Gbps or more). Consequently, the uplink and downlink paths can in most circumstances exceed the data rate limits of traditional DSL communications over twisted pair phone lines.

Typically, DSL devices are configured for asymmetric data rates because the downlink path usually supports a higher data rate than the uplink path. However, cable 1850 can provide much higher speeds both on the downlink and uplink paths. With a firmware update, a legacy DSL modem 1906 such as shown in FIG. 19C can be configured with higher speeds on both the uplink and downlink paths. Similar firmware updates can be made to the mini-DSLAM 1924 to take advantage of the higher speeds on the uplink and downlink paths. Since the interfaces to the DSL modem 1906 and mini-DSLAM 1924 remain as traditional twisted pair phone lines, no hardware change is necessary for a legacy DSL modem or legacy mini-DSLAM other than firmware changes and the addition of the NIDs 1910 and 1920 to perform the conversion from DSL signals to guided electromagnetic waves 1914 and vice-versa. The use of NIDs enables a reuse of legacy modems 1906 and mini-DSLAMs 1924, which in turn can substantially reduce installation costs and system upgrades. For new construction, updated versions of mini-DSLAMs and DSL modems can be configured with integrated waveguide systems to perform the functions described above, thereby eliminating the need for NIDs 1910 and 1920 with integrated waveguide systems. In this embodiment, an updated version of modem 1906 and updated version of mini-DSLAM 1924 would connect directly to cable 1850 and communicate via bidirectional guided electromagnetic wave transmissions, thereby averting a need for transmission or reception of DSL signals using twisted pair phone lines 1908 and 1922.

In an embodiment where use of cable 1850 between the pedestal 1904 and customer premises 1902 is logistically impractical or costly, NID 1910 can be configured instead to couple to a cable 1850' (similar to cable 1850 of the subject disclosure) that originates from a waveguide 108 on a utility pole 118, and which may be buried in soil before it reaches NID 1910 of the customer premises 1902. Cable 1850' can be used to receive and transmit guided electromagnetic waves 1914' between the NID 1910 and the waveguide 108. Waveguide 108 can connect via waveguide 106, which can be coupled to base station 104. Base station 104 can provide data communication services to customer premises 1902 by way of its connection to central office 1930 over fiber 1926'. Similarly, in situations where access from the central office 1926 to pedestal 1904 is not practical over a fiber link, but connectivity to base station 104 is possible via fiber link 1926', an alternate path can be used to connect to NID 1920 of the pedestal 1904 via cable 1850" (similar to cable 1850 of the subject disclosure) originating from pole 116. Cable 1850" can also be buried before it reaches NID 1920.

Figure 20A:
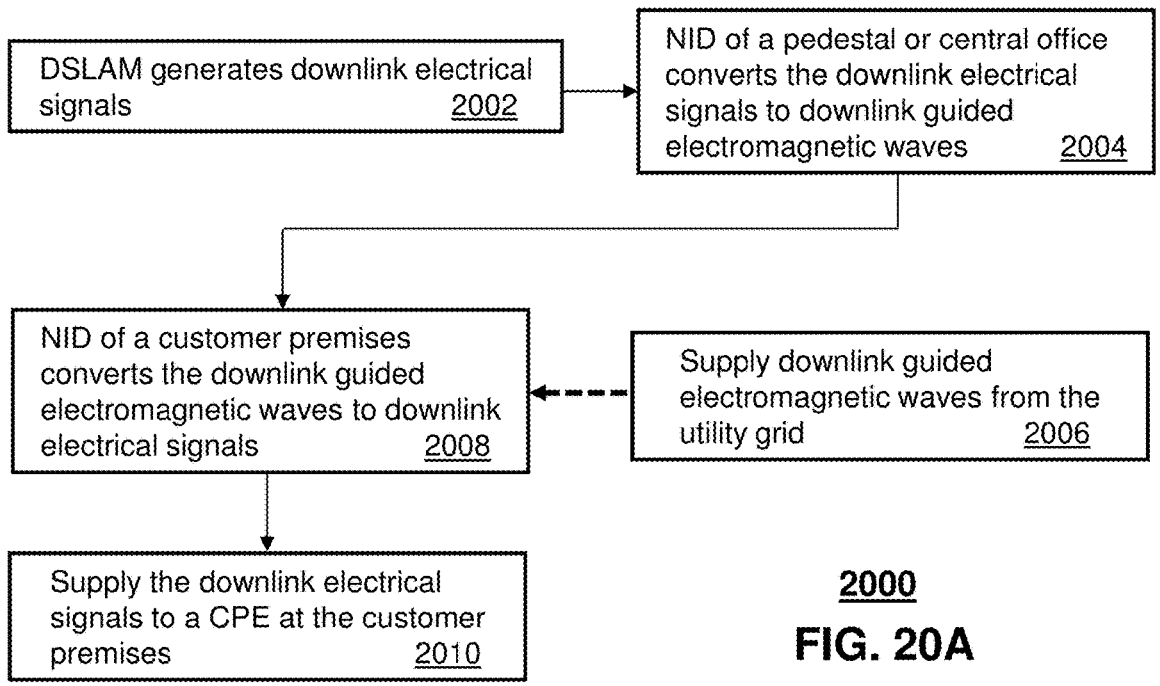
FIG. 20A illustrates a flow diagram of an example, non-limiting embodiment of a method for transmitting downlink signals.
Figure 20B:
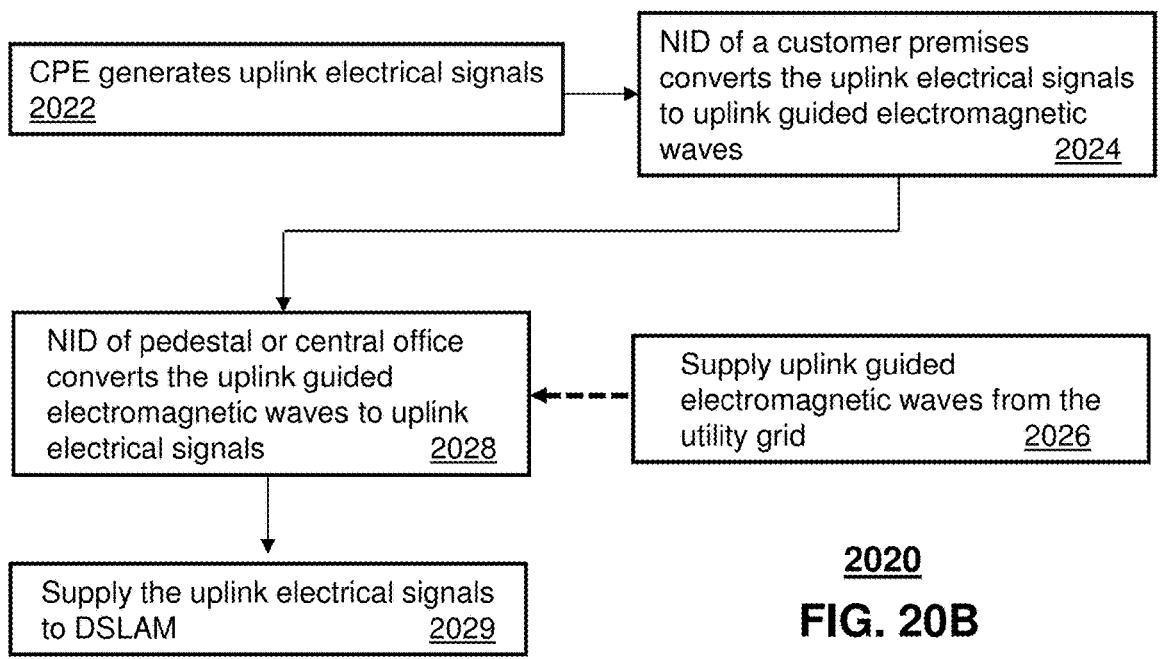
FIG. 20B illustrates a flow diagram of an example, non-limiting embodiment of a method for transmitting uplink signals.

FIGS. 20A and 20B describe embodiments for downlink and uplink communications. Method 2000 of FIG. 20A can begin with step 2002 where electrical signals (e.g., DSL signals) are generated by a DSLAM (e.g., mini-DSLAM 1924 of pedestal 1904 or from central office 1930), which are converted to guided electromagnetic waves 1914 at step 2004 by NID 1920 and which propagate on a transmission medium such as cable 1850 for providing downlink services to the customer premises 1902. At step 2008, the NID 1910 of the customer premises 1902 converts the guided electromagnetic waves 1914 back to electrical signals (e.g., DSL signals) which are supplied at step 2010 to customer premises equipment (CPE) such as DSL modem 1906 over phone line 1908. Alternatively, or in combination, power and/or guided electromagnetic waves 1914' can be supplied from a power line 1850' of a utility grid (having an inner waveguide as illustrated in FIG. 18G or 18H) to NID 1910 as an alternate or additional downlink (and/or uplink) path.

At 2022 of method 2020 of FIG. 20B, the DSL modem 1906 can supply electrical signals (e.g., DSL signals) via phone line 1908 to NID 1910, which in turn at step 2024, converts the DSL signals to guided electromagnetic waves directed to NID 1920 by way of cable 1850. At step 2028, the NID 1920 of the pedestal 1904 (or central office 1930) converts the guided electromagnetic waves 1914 back to electrical signals (e.g., DSL signals) which are supplied at step 2029 to a DSLAM (e.g., mini-DSLAM 1924). Alternatively, or in combination, power and guided electromagnetic waves 1914' can be supplied from a power line 1850' of a utility grid (having an inner waveguide as illustrated in FIG. 18G or 18H) to NID 1920 as an alternate or additional uplink (and/or downlink) path.

Turning now to FIG. 20C, a flow diagram of an example, non-limiting embodiment of a method 2030 for inducing electromagnetic waves on a transmission medium is shown. At step 2032, the waveguides 1865 and 1865' of FIGS. 18N-18T can be configured to generate first electromagnetic waves from a first communication signal (supplied, for example, by a communication device), and induce at step 2034 the first electromagnetic waves with "only" a fundamental wave mode at an interface of the transmission medium. In an embodiment, the interface can be an outer surface of the transmission medium as depicted in FIGS. 18Q and 18R. In another embodiment, the interface can be an inner layer of the transmission medium as depicted in FIGS. 18S and 18T. Turning now to FIG. 20D, a flow diagram of an example, non-limiting embodiment of a method 2040 for receiving electromagnetic waves from a transmission medium is shown. At step 2042, the waveguides 1865 and 1865' of FIGS. 18N-18T can be configured to receive second electromagnetic waves at an interface of a same or different transmission medium described in FIG. 20C. In an embodiment, the second electromagnetic waves can have "only" a fundamental wave mode. In other embodiments, the second electromagnetic waves may have a combination of wave modes such as a fundamental and non-fundamental wave modes. At step 2044, a second communication signal can be generated from the second electromagnetic waves for processing by, for example, a same or different communication device. The embodiments of FIGS. 20C and 20D can be applied to any embodiments described in the subject disclosure.

Turning now to FIG. 20E, a flow diagram of an example, non-limiting embodiment of a method 2050 for inducing electromagnetic waves on a transmission medium is shown. At step 2052, the waveguides 1865 and 1865' of FIGS. 18N-18W can be configured to generate first electromagnetic waves from a first communication signal (supplied, for example, by a communication device), and induce at step 2054 second electromagnetic waves with "only" a non-fundamental wave mode at an interface of the transmission medium. In an embodiment, the interface can be an outer surface of the transmission medium as depicted in FIGS. 18Q and 18R. In another embodiment, the interface can be an inner layer of the transmission medium as depicted in FIGS. 18S and 18T. Turning now to FIG. 20F, a flow diagram of an example, non-limiting embodiment of a method 2060 for receiving electromagnetic waves from a transmission medium is shown. At step 2062, the waveguides 1865 and 1865' of FIGS. 18N-18W can be configured to receive electromagnetic waves at an interface of a same or different transmission medium described in FIG. 20E. In an embodiment, the electromagnetic waves can have "only" a non-fundamental wave mode. In other embodiments, the electromagnetic waves may have a combination of wave modes such as a fundamental and non-fundamental wave modes. At step 2064, a second communication signal can be generated from the electromagnetic waves for processing by, for example, a same or different communication device. The embodiments of FIGS. 20E and 20F can be applied to any embodiments described in the subject disclosure.

While for purposes of simplicity of explanation, the respective processes are shown and described as a series of blocks in FIGS. 20A-20F, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

FIG. 20G illustrates a flow diagram of an example, non-limiting embodiment of a method 2070 for detecting and mitigating disturbances occurring in a communication network, such as, for example, the system of FIGS. 16A and 16B. Method 2070 can begin with step 2072 where a network element, such as the waveguide system 1602 of FIGS. 16A-16B, can be configured to monitor degradation of guided electromagnetic waves on an outer surface of a transmission medium, such as power line 1610. A signal degradation can be detected according to any number of factors including without limitation, a signal magnitude of the guided electromagnetic waves dropping below a certain magnitude threshold, a signal to noise ratio (SNR) dropping below a certain SNR threshold, a Quality of Service (QoS) dropping below one or more thresholds, a bit error rate (BER) exceeding a certain BER threshold, a packet loss rate (PLR) exceeding a certain PLR threshold, a ratio of reflected electromagnetic waves to forward electromagnetic waves exceeding a certain threshold, an unexpected change or alteration to a wave mode, a spectral change in the guided electromagnetic waves indicating an object or objects are causing a propagation loss or scattering of the guided electromagnetic waves (e.g., water accumulation on an outer surface of the transmission medium, a splice in the transmission medium, a broken tree limb, etc.), or any combinations thereof. A sensing device such as, the disturbance sensor 1604b of FIG. 16A, can be adapted to perform one or more of the above signal measurements and determine thereby whether the electromagnetic waves are experiencing signal degradation. Other sensing devices suitable for performing the above measurements are contemplated by the subject disclosure.

If signal degradation is detected at step 2074, the network element can proceed to step 2076 where it can determine which object or objects may be causing the degradation, and once detected, report the detected object(s) to the network management system 1601 of FIGS. 16A-16B. Object detection can be accomplished by spectral analysis or other forms of signal analysis, environmental analysis (e.g., barometric readings, rain detection, etc.), or other suitable techniques for detecting foreign objects that may adversely affect propagation of electromagnetic waves guided by the transmission medium. For example, the network element can be configured to generate spectral data derived from an electromagnetic wave received by the network element. The network element can then compare the spectral data to a plurality of spectral profiles stored in its memory. The plurality of spectral profiles can be pre-stored in a memory of the network element, and can be used to characterize or identify obstructions that may cause a propagation loss or signal degradation when such obstructions are present on an outer surface of the transmission medium.

For example, an accumulation of water on an outer surface of a transmission medium, such as a thin layer of water and/or water droplets, may cause a signal degradation in electromagnetic waves guided by the transmission medium that may be identifiable by a spectral profile comprising spectral data that models such an obstruction. The spectral profile can be generated in a controlled environment (such as a laboratory or other suitable testing environment) by collecting and analyzing spectral data generated by test equipment (e.g., a waveguide system with spectrum analysis capabilities) when receiving electromagnetic waves over an outer surface of a transmission medium that has been subjected to water (e.g., simulated rain water). An obstruction such as water can generate a different spectral signature than other obstructions (e.g., a splice between transmission mediums). A unique spectral signature can be used to identify certain obstructions over others. With this technique, spectral profiles can be generated for characterizing other obstructions such as a fallen tree limb on the transmission medium, a splice, and so on. In addition to spectral profiles, thresholds can be generated for different metrics such as SNR, BER, PLR, and so on. These thresholds can be chosen by a service provider according to desired performance measures for a communication network that utilizing guided electromagnetic waves for transport of data. Some obstructions may also be detected by other methods. For example, rain water may be detected by a rain detector coupled to a network element, fallen tree limbs may be detected by a vibration detector coupled to the network element, and so on.

If a network element does not have access to equipment to detect objects that may be causing a degradation of electromagnetic waves, then the network element can skip step 2076 and proceed to step 2078 where it notifies one or more neighboring network elements (e.g., other waveguide system(s) 1602 in a vicinity of the network element) of the detected signal degradation. If signal degradation is significant, the network element can resort to a different medium for communicating with neighboring network element(s), such as, for example, wireless communications. Alternatively, the network element can substantially reduce the operating frequency of the guided electromagnetic waves (e.g., from 40 GHz to 1 GHz), or communicate with neighboring network elements utilizing other guided electromagnetic waves operating at a low frequency, such as a control channel (e.g., 1 MHz). A low frequency control channel may be much less susceptible to interference by the object(s) causing the signal degradation at much higher operating frequencies.

Figure 20H:
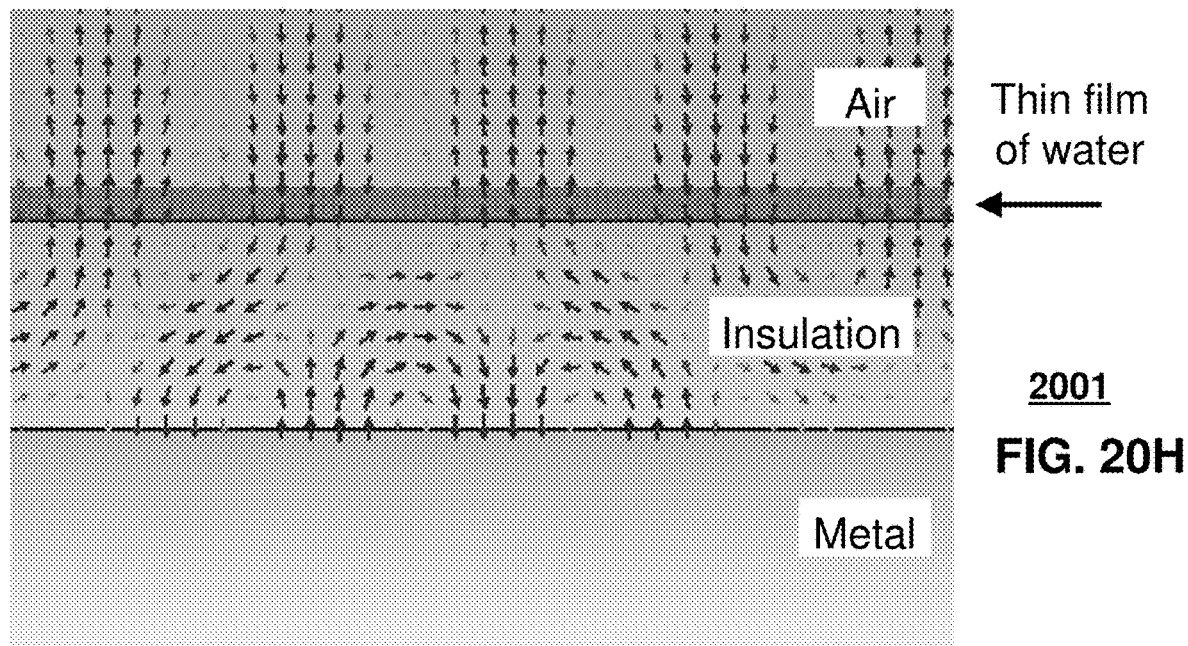
FIG. 20H is a block diagram illustrating an example, non-limiting embodiment of an alignment of fields of an electromagnetic wave to mitigate propagation losses due to water accumulation on a transmission medium in accordance with various aspects described herein.

Once an alternate means of communication is established between network elements, at step 2080 the network element and neighboring network elements can coordinate a process to adjust the guided electromagnetic waves to mitigate the detected signal degradation. The process can include, for example, a protocol for choosing which of the network elements will perform the adjustments to the electromagnetic waves, the frequency and magnitude of adjustments, and goals to achieve a desired signal quality (e.g., QoS, BER, PLR, SNR, etc.). If, for example, the object causing the signal degradation is water accumulation on the outer surface of the transmission medium, the network elements can be configured to adjust a polarization of the electrical fields (e-fields) and/or magnetic fields (h-fields) of the electromagnetic waves to attain a radial alignment of the e-fields as shown in FIG. 20H. In particular, FIG. 20H presents a block diagram 2001 illustrating an example, non-limiting embodiment of an alignment of e-fields of an electromagnetic wave to mitigate propagation losses due to water accumulation on a transmission medium in accordance with various aspects described herein. In this example, the longitudinal section of a cable, such as an insulated metal cable implementation of transmission medium 125, is presented along with field vectors that illustrate the e-fields associated with guided electromagnetic waves that propagate at 40 GHz. Stronger e-fields are presented by darker field vectors relative to weaker e-fields.

In one embodiment, an adjustment in polarization can be accomplished by generating a specific wave mode of the electromagnetic waves (e.g., transverse magnetic (TM) mode, transverse electric (TE) mode, transverse electromagnetic (TEM) mode, or a hybrid of a TM mode and TE mode also known as an HE mode). Assuming, for example, that the network element comprises the waveguide system 1865' of FIG. 18W, an adjustment in a polarization of e-fields can be accomplished by configuring two or more MMICs 1870 to alter a phase, frequency, amplitude or combinations thereof of the electromagnetic waves generated by each MMIC 1870. Certain adjustments may cause, for example, the e-fields in the region of the water film shown in FIG. 20H to align perpendicularly to the surface of the water. Electric fields that are perpendicular (or approximately perpendicular) to the surface of water will induce weaker currents in the water film than e-fields parallel to the water film. By inducing weaker currents, the electromagnetic waves propagating longitudinally will experience less propagation loss. Additionally, it is also desirable for the concentration of the e-fields to extend above the water film into the air. If the concentration of e-fields in the air remains high and the majority of the total field strength is in the air instead of being concentrated in the region of the water and the insulator, then propagation losses will also be reduced. For example, e-fields of electromagnetic waves that are tightly bound to an insulation layer such as, Goubau waves (or TM00 waves—see block diagram 2031 of FIG. 20K), will experience higher propagation losses even though the e-fields may be perpendicular (or radially aligned) to the water film because more of the field strength is concentrated in the region of the water.

Accordingly, electromagnetic waves with e-fields perpendicular (or approximately perpendicular) to a water film having a higher proportion of the field strength in a region of air (i.e., above the water film) will experience less propagation loss than tightly bound electromagnetic waves having more field strength in the insulating or water layers or electromagnetic waves having e-fields in the direction of propagation within the region of the water film that generate greater losses.

FIG. 20H depicts, in a longitudinal view of an insulated conductor, e-field for TM01 electromagnetic waves operating at 40 GHz. FIGS. 20I and 20J, in contrast, depict cross-sectional views 2011 and 2021, respectively, of the insulated conductor of FIG. 20H illustrating the field strength of e-fields in the direction of propagation of the electromagnetic waves (i.e., e-fields directed out of the page of FIGS. 20I and 20J). The electromagnetic waves shown in FIGS. 20I and 20J have a TM01 wave mode at 45 GHz and 40 GHz, respectively. FIG. 20I shows that the intensity of the e-fields in the direction of propagation of the electromagnetic waves is high in a region between the outer surface of the insulation and the outer surface of the water film (i.e., the region of the water film). The high intensity is depicted by a light color (the lighter the color the higher the intensity of the e-fields directed out of the page). FIG. 20I illustrates that there is a high concentration of e-fields polarized longitudinally in the region of the water film, which causes high currents in the water film and consequently high propagation losses. Thus, under certain circumstances, electromagnetic waves at 45 GHz (having a TM01 wave mode) are less suitable to mitigate rain water or other obstructions located on the outer surface of the insulated conductor.

In contrast, FIG. 20J shows that the intensity of the e-fields in the direction of propagation of the electromagnetic waves is weaker in the region of the water film. The lower intensity is depicted by the darker color in the region of the water film. The lower intensity is a result of the e-fields being polarized mostly perpendicular or radial to the water film. The radially aligned e-fields also are highly concentrated in the region of air as shown in FIG. 20H. Thus, electromagnetic waves at 40 GHz (having a TM01 wave mode) produce e-fields that induce less current in the water film than 45 GHz waves with the same wave mode. Accordingly, the electromagnetic waves of FIG. 20J exhibit properties more suitable for reducing propagation losses due to a water film or droplets accumulating on an outer surface of an insulated conductor.

Since the physical characteristics of a transmission medium can vary, and the effects of water or other obstructions on the outer surface of the transmission medium may cause non-linear effects, it may not always be possible to precisely model all circumstances so as to achieve the e-field polarization and e-field concentration in air depicted in FIG. 20H on a first iteration of step 2082. To increase a speed of the mitigation process, a network element can be configured to choose from a look-up table at step 2086 a starting point for adjusting electromagnetic waves. In one embodiment, entries of the look-up table can be searched for matches to a type of object detected at step 2076 (e.g., rain water). In another embodiment, the look-up table can be searched for matches to spectral data derived from the affected electromagnetic wave received by the network elements. Table entries can provide specific parameters for adjusting electromagnetic waves (e.g., frequency, phase, amplitude, wave mode, etc.) to achieve at least a coarse adjustment that achieves similar e-field properties as shown in FIG. 20H. A coarse adjustment can serve to improve the likelihood of converging on a solution that achieves the desirable propagation properties previously discussed in relation to FIGS. 20H and 20J.

Once a coarse adjustment is made at step 2086, the network element can determine at step 2084 whether the adjustment has improved signal quality to a desirable target. Step 2084 can be implemented by a cooperative exchange between network elements. For example, suppose the network element at step 2086 generates an adjusted electromagnetic wave according to parameters obtained from the look-up table and transmits the adjusted electromagnetic wave to a neighboring network element. At step 2084 the network element can determine whether the adjustment has improved signal quality by receiving feedback from a neighboring network element receiving the adjusted electromagnetic waves, analyzing the quality of the received waves according to agreed target goals, and providing the results to the network element. Similarly, the network element can test adjusted electromagnetic waves received from neighboring network elements and can provide feedback to the neighboring network elements including the results of the analysis. While a particular search algorithm is discussed above, other search algorithms such as a gradient search, genetic algorithm, global search or other optimization techniques can likewise be employed. Accordingly, steps 2082, 2086 and 2084 represent an adjustment and testing process performed by the network element and its neighbor(s).

With this in mind, if at step 2084 a network element (or its neighbors) determine that signal quality has not achieved one or more desired parametric targets (e.g., SNR, BER, PLR, etc.), then incremental adjustments can begin at step 2082 for each of the network element and its neighbors. At step 2082, the network element (and/or its neighbors) can be configured to adjust a magnitude, phase, frequency, wave mode and/or other tunable features of the electromagnetic waves incrementally until a target goal is achieved. To perform these adjustments, a network element (and its neighbors) can be configured with the waveguide system 1865' of FIG. 18W. The network element (and its neighbors) can utilize two or more MMICs 1870 to incrementally adjust one or more operational parameters of the electromagnetic waves to achieve e-fields polarized in a particular direction (e.g., away from the direction of propagation in the region of the water film). The two or more MMICs 1870 can also be configured to incrementally adjust one or more operational parameters of the electromagnetic waves that achieve e-fields having a high concentration in a region of air (outside the obstruction).

The iteration process can be a trial-and-error process coordinated between network elements to reduce a time for converging on a solution that improves upstream and downstream communications. As part of the coordination process, for example, one network element can be configured to adjust a magnitude but not a wave mode of the electromagnetic waves, while another network element can be configured to adjust the wave mode and not the magnitude. The number of iterations and combination of adjustments to achieve desirable properties in the electromagnetic waves to mitigate obstructions on an outer surface of a transmission medium can be established by a service provider according to experimentation and/or simulations and programmed into the network elements.

Once the network element(s) detect at step 2084 that signal quality of upstream and downstream electromagnetic waves has improved to a desirable level that achieves one or more parametric targets (e.g. SNR, BER, PLR, etc.), the network elements can proceed to step 2088 and resume communications according to the adjusted upstream and downstream electromagnetic waves. While communications take place at step 2088, the network elements can be configured to transmit upstream and downstream test signals based on the original electromagnetic waves to determine if the signal quality of such waves has improved. These test signals can be transmitted at periodic intervals (e.g., once every 30 seconds or other suitable periods). Each network element can, for example, analyze spectral data of the received test signals to determine if they achieve a desirable spectral profile and/or other parametric target (e.g. SNR, BER, PLR, etc.). If the signal quality has not improved or has improved nominally, the network elements can be configured to continue communications at step 2088 utilizing the adjusted upstream and downstream electromagnetic waves.

If, however, signal quality has improved enough to revert back to utilizing the original electromagnetic waves, then the network element(s) can proceed to step 2092 to restore settings (e.g., original wave mode, original magnitude, original frequency, original phase, original spatial orientation, etc.) that produce the original electromagnetic waves. Signal quality may improve as a result of a removal of the obstruction (e.g., rain water evaporates, field personnel remove a fallen tree limb, etc.). At step 2094, the network elements can initiate communications utilizing the original electromagnetic waves and perform upstream and downstream tests. If the network elements determine at step 2096 from tests performed at step 2094 that signal quality of the original electromagnetic waves is satisfactory, then the network elements can resume communications with the original electromagnetic waves and proceed to step 2072 and subsequent steps as previously described.

A successful test can be determined at step 2096 by analyzing test signals according to parametric targets associated with the original electromagnetic waves (e.g., BER, SNR, PLR, etc.). If the tests performed at step 2094 are determined to be unsuccessful at step 2096, the network element(s) can proceed to steps 2082, 2086 and 2084 as previously described. Since a prior adjustment to the upstream and downstream electromagnetic waves may have already been determined successfully, the network element(s) can restore the settings used for the previously adjusted electromagnetic waves. Accordingly, a single iteration of any one of steps 2082, 2086 and 2084 may be sufficient to return to step 2088.

It should be noted that in some embodiments restoring the original electromagnetic waves may be desirable if, for example, data throughput when using the original electromagnetic waves is better than data throughput when using the adjusted electromagnetic waves. However, when data throughput of the adjusted electromagnetic waves is better or substantially close to the data throughput of the original electromagnetic waves, the network element(s) may instead be configured to continue from step 2088.

Figure 20K:
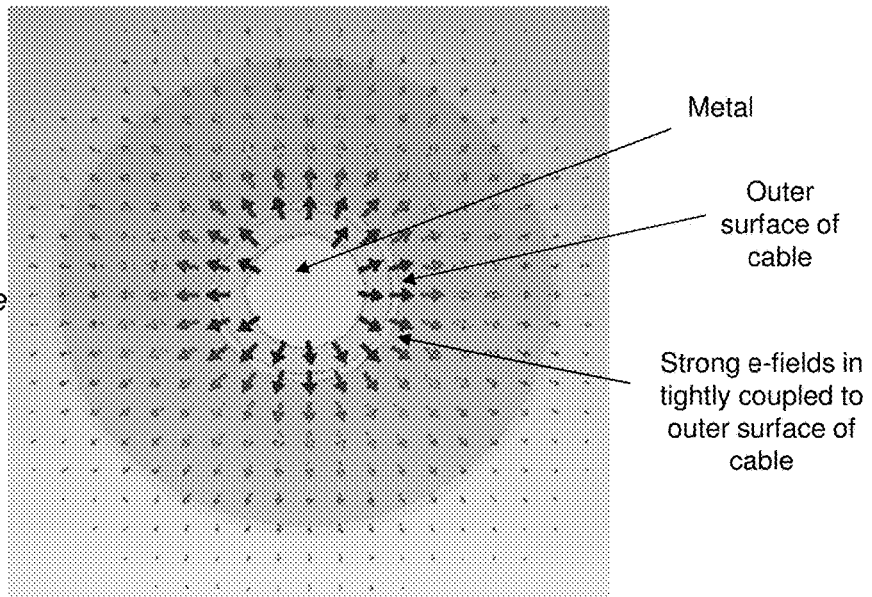
FIG. 20K is a block diagram illustrating an example, non-limiting embodiment of electric fields of a Goubau wave in accordance with various aspects described herein.

It is also noted that although FIGS. 20H and 20K describe a TM01 wave mode, other wave modes (e.g., HE waves, TE waves, TEM waves, etc.) or combination of wave modes may achieve the desired effects shown in FIG. 20H. Accordingly, a wave mode singly or in combination with one or more other wave modes may generate electromagnetic waves with e-field properties that reduce propagation losses as described in relation to FIGS. 20H and 20J. Such wave modes are therefore contemplated as possible wave modes the network elements can be configured to produce.

Figure 20L:
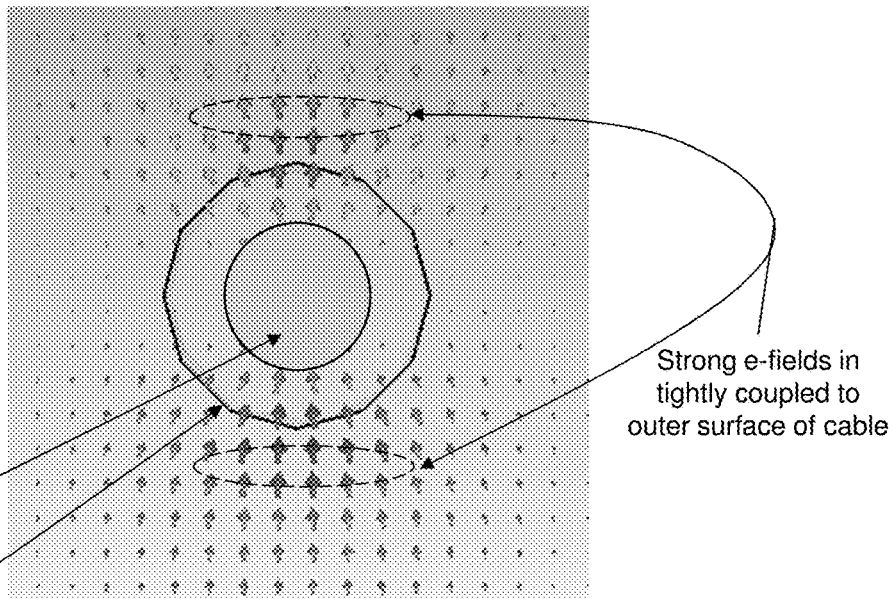
FIG. 20L is a block diagram illustrating an example, non-limiting embodiment of electric fields of a hybrid wave in accordance with various aspects described herein.

It is further noted that method 2070 can be adapted to generate at steps 2082 or 2086 other wave modes that may not be subject to a cutoff frequency. For example, FIG. 20L depicts a block diagram 2041 of an example, non-limiting embodiment of electric fields of a hybrid wave in accordance with various aspects described herein. Waves having an HE mode have linearly polarized e-fields which point away from a direction of propagation of electromagnetic waves and can be perpendicular (or approximately perpendicular) to a region of obstruction (e.g., water film shown in FIGS. 20H-20J). Waves with an HE mode can be configured to generate e-fields that extend substantially outside of an outer surface of an insulated conductor so that more of the total accumulated field strength is in air. Accordingly, some electromagnetic waves having an HE mode can exhibit properties of a large wave mode with e-fields orthogonal or approximately orthogonal to a region of obstruction. As described earlier, such properties can reduce propagation losses. Electromagnetic waves having an HE mode also have the unique property that they do not have a cutoff frequency (i.e., they can operate near DC) unlike other wave modes which have non-zero cutoff frequencies.

Figure 20M:
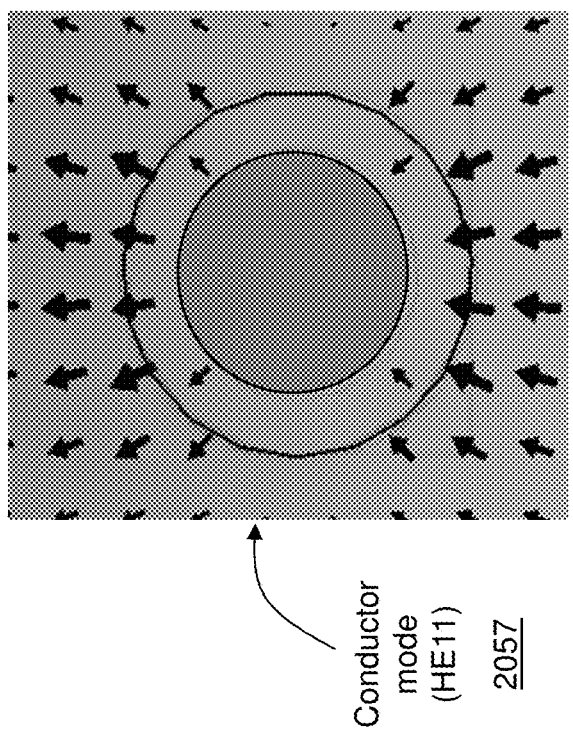
FIG. 20M is a block diagram illustrating an example, non-limiting embodiment of electric field characteristics of a hybrid wave versus a Goubau wave in accordance with various aspects described herein.
Figure 20M:
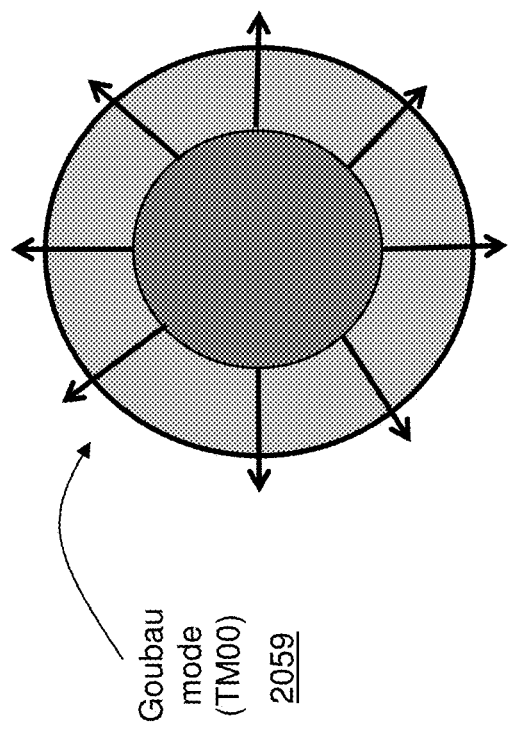
Figure 20M:
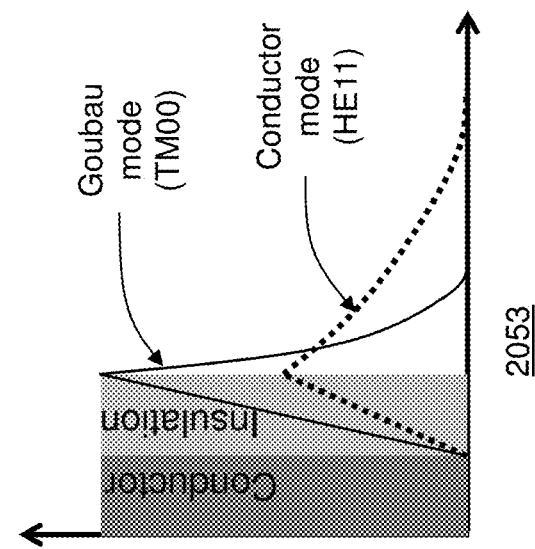
Figure 20M:
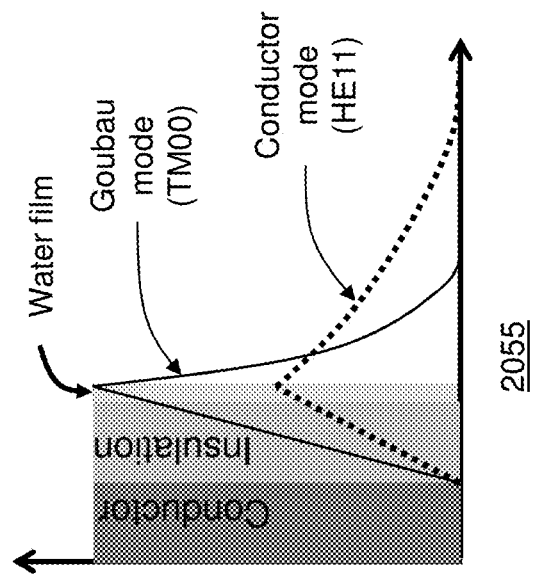

Turning now to FIG. 20M, a block diagram 2051 illustrating an example, non-limiting embodiment of electric field characteristics of a hybrid wave versus a Goubau wave in accordance with various aspects described herein is shown. Diagram 2053 shows a distribution of energy between HE11 mode waves and Goubau waves for an insulated conductor. The energy plots of diagram 2053 assume that the amount of power used to generate the Goubau waves is the same as the HE11 waves (i.e., the area under the energy curves is the same). In the illustration of diagram 2053, Goubau waves have a steep drop in power when Goubau waves extend beyond the outer surface of an insulated conductor, while HE11 waves have a substantially lower drop in power beyond the insulation layer. Consequently, Goubau waves have a higher concentration of energy near the insulation layer than HE 11 waves. Diagram 2055 depicts similar Goubau and HE11 energy curves when a water film is present on the outer surface of the insulator. The difference between the energy curves of diagrams 2053 and 2055 is that the drop in power for the Goubau and the HE11 energy curves begins on an outer edge of the insulator for diagram 2053 and on an outer edge of the water film for diagram 2055. The energy curves diagrams 2053 and 2055, however, depict the same behavior. That is, the electric fields of Goubau waves are tightly bound to the insulation layer, which when exposed to water results in greater propagation losses than electric fields of HE11 waves having a higher concentration outside the insulation layer and the water film. These properties are depicted in the HE11 and Goubau diagrams 2057 and 2059, respectively.

Figure 20N:
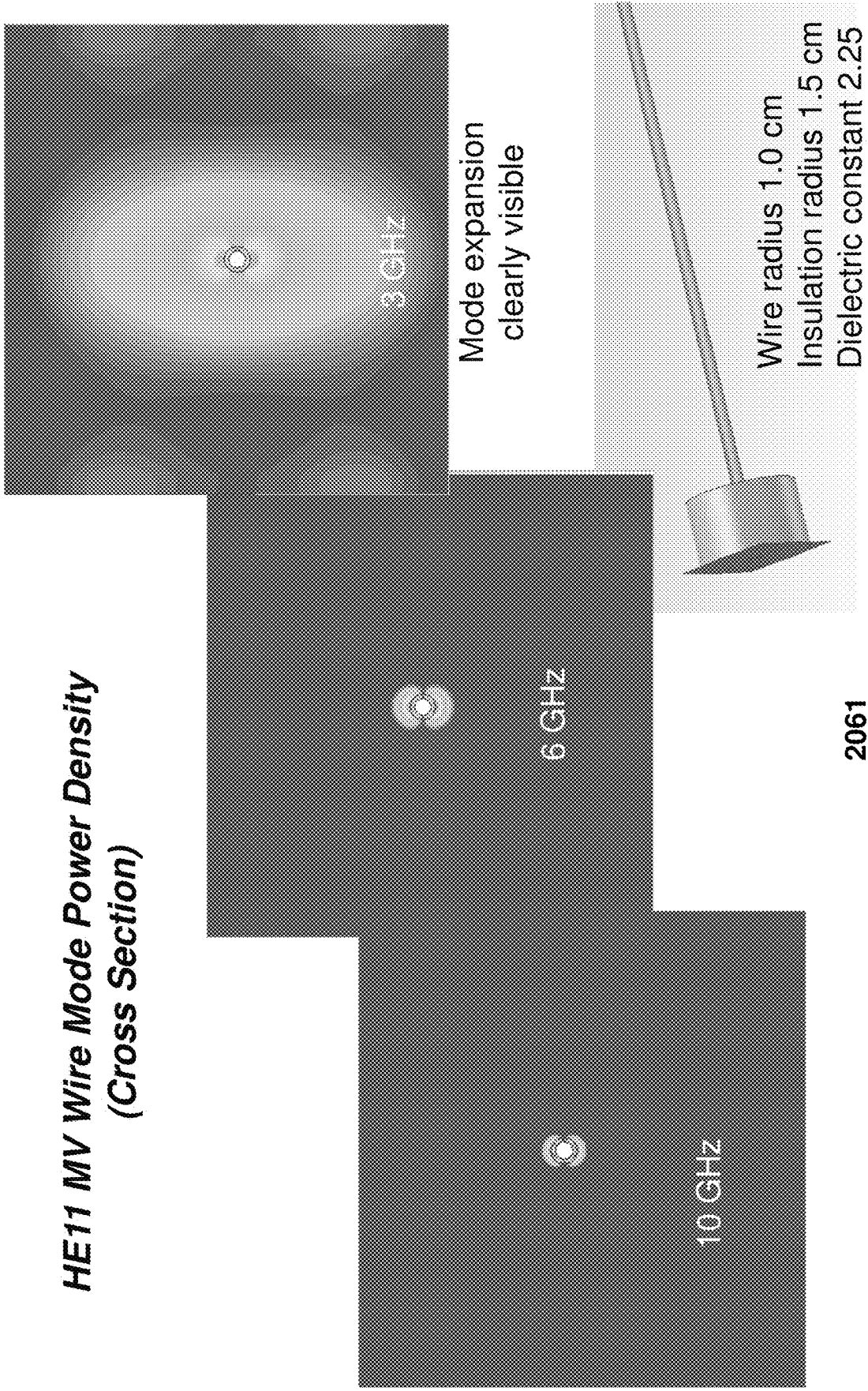
FIG. 20N is a block diagram illustrating an example, non-limiting embodiment of mode sizes of hybrid waves at various operating frequencies in accordance with various aspects described herein.

By adjusting an operating frequency of HE11 waves, e-fields of HE11 waves can be configured to extend substantially above a thin water film as shown in block diagram 2061 of FIG. 20N having a greater accumulated field strength in areas in the air when compared to fields in the insulator and a water layer surrounding the outside of the insulator. FIG. 20N depicts a wire having a radius of 1 cm and an insulation radius of 1.5 cm with a dielectric constant of 2.25. As the operating frequency of HE11 waves is reduced, the e-fields extend outwardly expanding the size of the wave mode. At certain operating frequencies (e.g., 3 GHz) the wave mode expansion can be substantially greater than the diameter of the insulated wire and any obstructions that may be present on the insulated wire.

By having e-fields that are perpendicular to a water film and by placing most of its energy outside the water film, HE11 waves have less propagation loss than Goubau waves when a transmission medium is subjected to water or other obstructions. Although Goubau waves have radial e-fields which are desirable, the waves are tightly coupled to the insulation layer, which results in the e-fields being highly concentrated in the region of an obstruction. Consequently, Goubau waves are still subject to high propagation losses when an obstruction such as a water film is present on the outer surface of an insulated conductor.

Figure 21A:
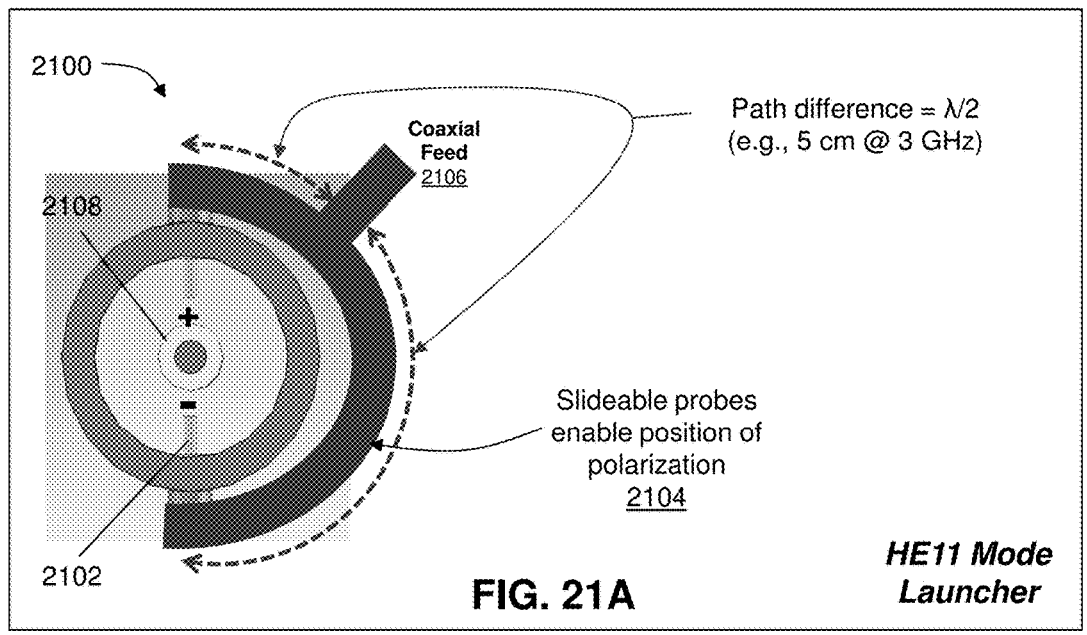
FIGS. 21A and 21B are block diagrams illustrating example, non-limiting embodiments of a waveguide device for launching hybrid waves in accordance with various aspects described herein.
Figure 21B:
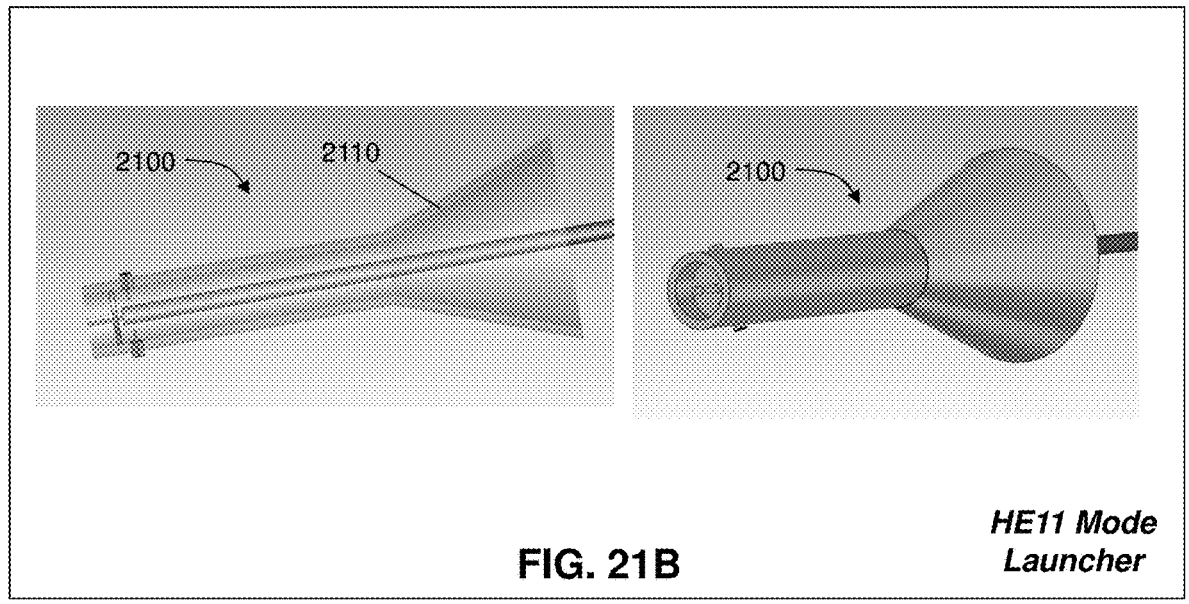

Turning now to FIGS. 21A and 21B, block diagrams illustrating example, non-limiting embodiments of a waveguide system 2100 for launching hybrid waves in accordance with various aspects described herein is shown. The waveguide system 2100 can comprise probes 2102 coupled to a slideable or rotatable mechanism 2104 that enables the probes 2102 to be placed at different positions or orientations relative to an outer surface of an insulated conductor 2108. The mechanism 2104 can comprise a coaxial feed 2106 or other coupling that enables transmission of electromagnetic waves by the probes 2102. The coaxial feed 2106 can be placed at a position on the mechanism 2104 so that the path difference between the probes 2102 is one-half a wavelength or some odd integer multiple thereof. When the probes 2102 generate electromagnetic signals of opposite phase, electromagnetic waves can be induced on the outer surface of the insulated conductor 2108 having a hybrid mode (such as an HE11 mode).

Figure 22:
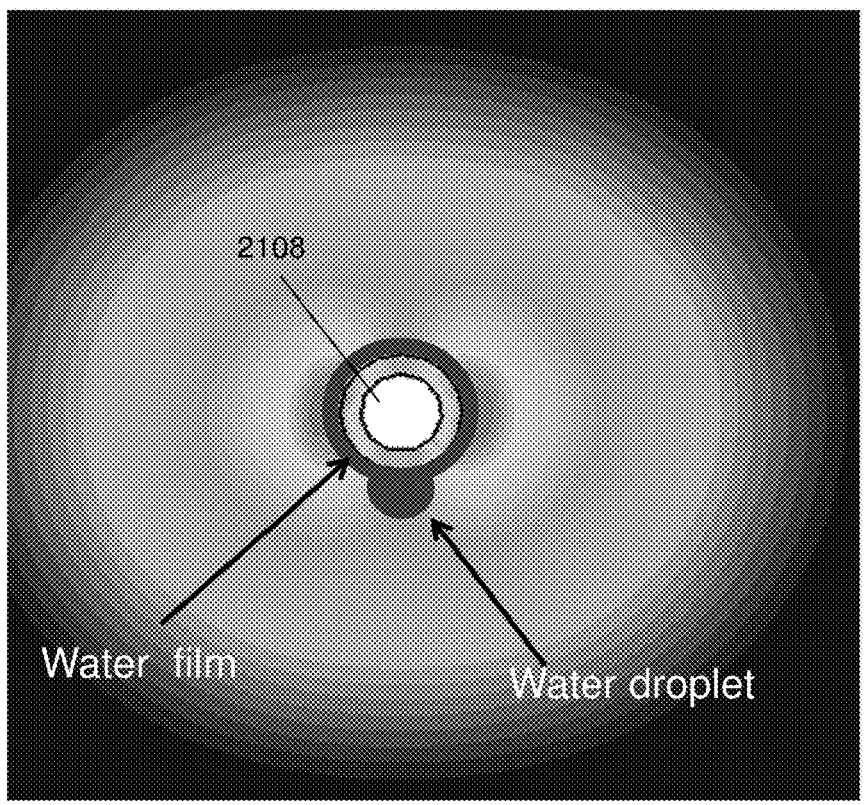
FIG. 22 is a block diagram illustrating an example, non-limiting embodiment of a hybrid wave launched by the waveguide device of FIGS. 21A and 21B in accordance with various aspects described herein.

The mechanism 2104 can also be coupled to a motor or other actuator (not shown) for moving the probes 2102 to a desirable position. In one embodiment, for example, the waveguide system 2100 can comprise a controller that directs the motor to rotate the probes 2102 (assuming they are rotatable) to a different position (e.g., east and west) to generate electromagnetic waves that have a horizontally polarized HE11 mode as shown in a block diagram 2200 of FIG. 22. To guide the electromagnetic waves onto the outer surface of the insulated conductor 2108, the waveguide system 2100 can further comprise a tapered horn 2110 shown in FIG. 21B. The tapered horn 2110 can be coaxially aligned with the insulated conductor 2108. To reduce the cross-sectional dimension of the tapered horn 2110, an additional insulation layer (not shown) can placed on the insulated conductor 2108. The additional insulation layer can be similar to the tapered insulation layer 1879 shown in FIGS. 18Q and 18R. The additional insulation layer can have a tapered end that points away from the tapered horn 2110. The tapered insulation layer 1879 can reduce a size of an initial electromagnetic wave launched according to an HE11 mode. As the electromagnetic waves propagate towards the tapered end of the insulation layer, the HE11 mode expands until it reaches its full size as shown in FIG. 22. In other embodiments, the waveguide system 2100 may not need to use the tapered insulation layer 1879.

FIG. 22 illustrates that HE11 mode waves can be used to mitigate obstructions such as rain water. For example, suppose that rain water has caused a water film to surround an outer surface of the insulated conductor 2108 as shown in FIG. 22. Further assume that water droplets have collected at the bottom of the insulated conductor 2108. As illustrated in FIG. 22, the water film occupies a small fraction of the total HE11 wave. Also, by having horizontally polarized HE11 waves, the water droplets are in a least-intense intense area of the HE11 waves reducing losses caused by the droplets. Consequently, the HE11 waves experience much lower propagation losses than Goubau waves or waves having a mode that is tightly coupled to the insulated conductor 2108 and thus greater energy in the areas occupied by the water.

It is submitted that the waveguide system 2100 of FIGS. 21A-21B can be replaced with other waveguide systems of the subject disclosure capable of generating electromagnetic waves having an HE mode. For example, the waveguide system 1865' of FIG. 18W can be configured to generate electromagnetic waves having an HE mode. In an embodiment, two or more MMICs 1870 of the waveguide system 1865' can be configured to generate electromagnetic waves of opposite phase to generate polarized e-fields such as those present in an HE mode. In another embodiment, different pairs of MMICs 1870 can be selected to generate HE waves that are polarized at different spatial positions (e.g., north and south, west and east, northwest and southeast, northeast and southeast, or other sub-fractional coordinates). Additionally, the waveguide systems of FIGS. 18N-18W can be configured to launch electromagnetic waves having an HE mode onto the core 1852 of one or more embodiments of cable 1850 suitable for propagating HE mode waves.

Although HE waves can have desirable characteristics for mitigating obstructions on a transmission medium, it is submitted that certain wave modes having a cutoff frequency (e.g., TE modes, TM modes, TEM modes or combinations thereof) may also exhibit waves that are sufficiently large and have polarized e-fields that are orthogonal (or approximately orthogonal) to a region of an obstruction enabling their use for mitigating propagation losses caused by the obstruction. Method 2070 can be adapted, for example, to generate such wave modes from a look-up table at step 2086. Wave modes having a cutoff frequency that exhibit, for example, a wave mode larger than the obstruction and polarized e-fields perpendicular (or approximately perpendicular) to the obstruction can be determined by experimentation and/or simulation. Once a combination of parameters (e.g., magnitude, phase, frequency, wave mode(s), spatial positioning, etc.) for generating one or more waves with cutoff frequencies having low propagation loss properties is determined, the parametric results for each wave can be stored in a look-up table in a memory of a waveguide system. Similarly, wave modes with cutoff frequencies exhibiting properties that reduce propagation losses can also be generated iteratively by any of the search algorithms previously described in the process of steps 2082-2084.

While for purposes of simplicity of explanation, the respective processes are shown and described as a series of blocks in FIG. 20G, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 23:
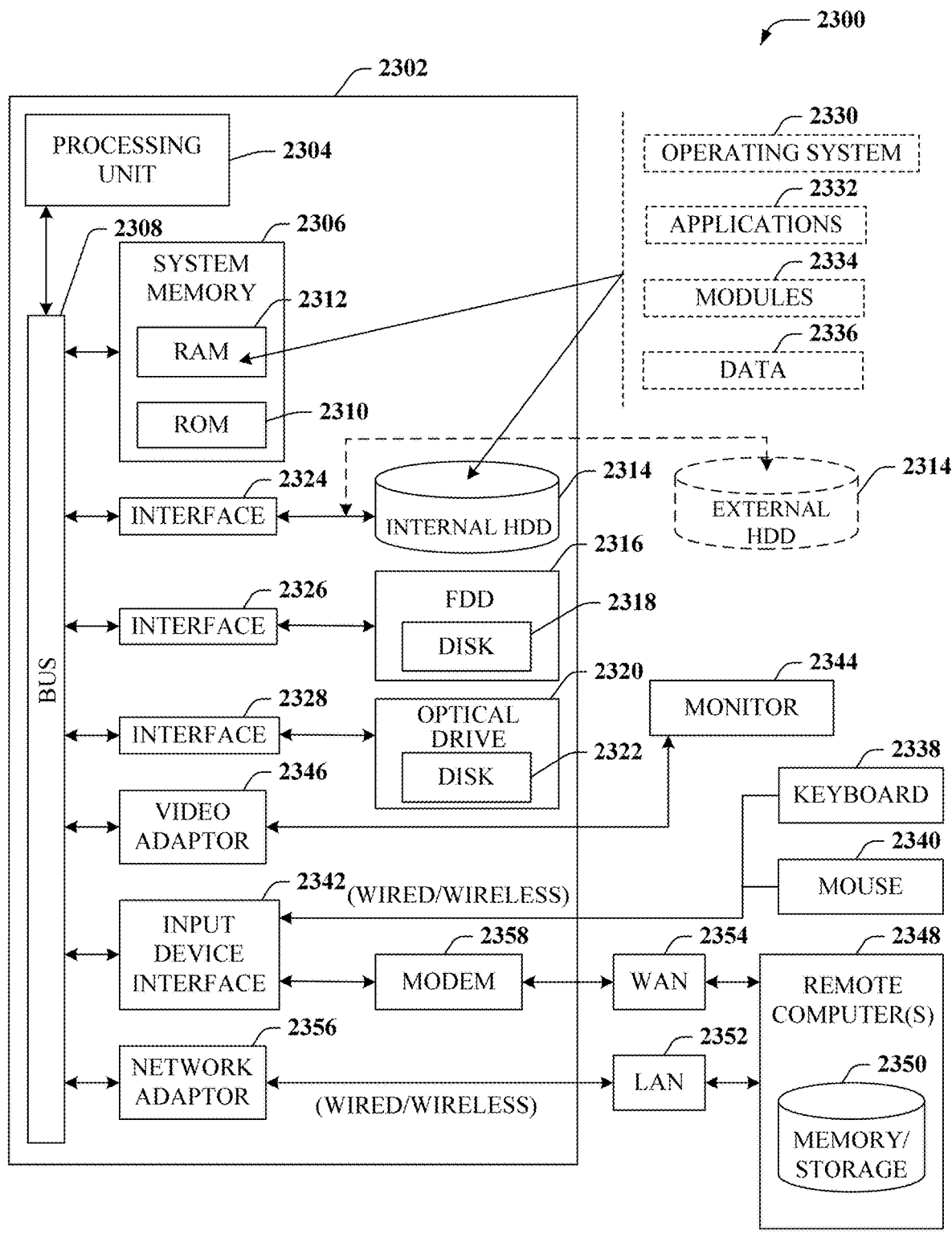
FIG. 23 is a block diagram of an example, non-limiting embodiment of a computing environment in accordance with various aspects described herein.

Referring now to FIG. 23, there is illustrated a block diagram of a computing environment in accordance with various aspects described herein. In order to provide additional context for various embodiments of the embodiments described herein, FIG. 23 and the following discussion are intended to provide a brief, general description of a suitable computing environment 2300 in which the various embodiments of the subject disclosure can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules comprise routines, programs, components, data structures, etc., that perform particular tasks or implement particular abstract data types. Moreover, those skilled in the art will appreciate that the inventive methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes processor as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 23, the example environment 2300 for transmitting and receiving signals via or forming at least part of a base station (e.g., base station devices 1504, macrocell site 1502, or base stations 1614) or central office (e.g., central office 1501 or 1611). At least a portion of the example environment 2300 can also be used for transmission devices 101 or 102. The example environment can comprise a computer 2302, the computer 2302 comprising a processing unit 2304, a system memory 2306 and a system bus 2308. The system bus 2308 couple's system components including, but not limited to, the system memory 2306 to the processing unit 2304. The processing unit 2304 can be any of various commercially available processors. Dual microprocessors and other multiprocessor architectures can also be employed as the processing unit 2304.

The system bus 2308 can be any of several types of bus structure that can further interconnect to a memory bus (with or without a memory controller), a peripheral bus, and a local bus using any of a variety of commercially available bus architectures. The system memory 2306 comprises ROM 2310 and RAM 2312. A basic input/output system (BIOS) can be stored in a non-volatile memory such as ROM, erasable programmable read only memory (EPROM), EEPROM, which BIOS contains the basic routines that help to transfer information between elements within the computer 2302, such as during startup. The RAM 2312 can also comprise a high-speed RAM such as static RAM for caching data.

The computer 2302 further comprises an internal hard disk drive (HDD) 2314 (e.g., EIDE, SATA), which internal hard disk drive 2314 can also be configured for external use in a suitable chassis (not shown), a magnetic floppy disk drive (FDD) 2316, (e.g., to read from or write to a removable diskette 2318) and an optical disk drive 2320, (e.g., reading a CD-ROM disk 2322 or, to read from or write to other high capacity optical media such as the DVD). The hard disk drive 2314, magnetic disk drive 2316 and optical disk drive 2320 can be connected to the system bus 2308 by a hard disk drive interface 2324, a magnetic disk drive interface 2326 and an optical drive interface 2328, respectively. The interface 2324 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2302, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 2312, comprising an operating system 2330, one or more application programs 2332, other program modules 2334 and program data 2336. All or portions of the operating system, applications, modules, and/or data can also be cached in the RAM 2312. The systems and methods described herein can be implemented utilizing various commercially available operating systems or combinations of operating systems. Examples of application programs 2332 that can be implemented and otherwise executed by processing unit 2304 include the diversity selection determining performed by transmission device 101 or 102.

A user can enter commands and information into the computer 2302 through one or more wired/wireless input devices, e.g., a keyboard 2338 and a pointing device, such as a mouse 2340. Other input devices (not shown) can comprise a microphone, an infrared (IR) remote control, a joystick, a game pad, a stylus pen, touch screen or the like. These and other input devices are often connected to the processing unit 2304 through an input device interface 2342 that can be coupled to the system bus 2308, but can be connected by other interfaces, such as a parallel port, an IEEE 1394 serial port, a game port, a universal serial bus (USB) port, an IR interface, etc.

A monitor 2344 or other type of display device can be also connected to the system bus 2308 via an interface, such as a video adapter 2346. It will also be appreciated that in alternative embodiments, a monitor 2344 can also be any display device (e.g., another computer having a display, a smart phone, a tablet computer, etc.) for receiving display information associated with computer 2302 via any communication means, including via the Internet and cloud-based networks. In addition to the monitor 2344, a computer typically comprises other peripheral output devices (not shown), such as speakers, printers, etc.

The computer 2302 can operate in a networked environment using logical connections via wired and/or wireless communications to one or more remote computers, such as a remote computer(s) 2348. The remote computer(s) 2348 can be a workstation, a server computer, a router, a personal computer, portable computer, microprocessor-based entertainment appliance, a peer device or other common network node, and typically comprises many or all of the elements described relative to the computer 2302, although, for purposes of brevity, only a memory/storage device 2350 is illustrated. The logical connections depicted comprise wired/wireless connectivity to a local area network (LAN) 2352 and/or larger networks, e.g., a wide area network (WAN) 2354. Such LAN and WAN networking environments are commonplace in offices and companies, and facilitate enterprise-wide computer networks, such as intranets, all of which can connect to a global communications network, e.g., the Internet.

When used in a LAN networking environment, the computer 2302 can be connected to the local network 2352 through a wired and/or wireless communication network interface or adapter 2356. The adapter 2356 can facilitate wired or wireless communication to the LAN 2352, which can also comprise a wireless AP disposed thereon for communicating with the wireless adapter 2356.

When used in a WAN networking environment, the computer 2302 can comprise a modem 2358 or can be connected to a communications server on the WAN 2354 or has other means for establishing communications over the WAN 2354, such as by way of the Internet. The modem 2358, which can be internal or external and a wired or wireless device, can be connected to the system bus 2308 via the input device interface 2342. In a networked environment, program modules depicted relative to the computer 2302 or portions thereof, can be stored in the remote memory/storage device 2350. It will be appreciated that the network connections shown are example and other means of establishing a communications link between the computers can be used.

The computer 2302 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 24:
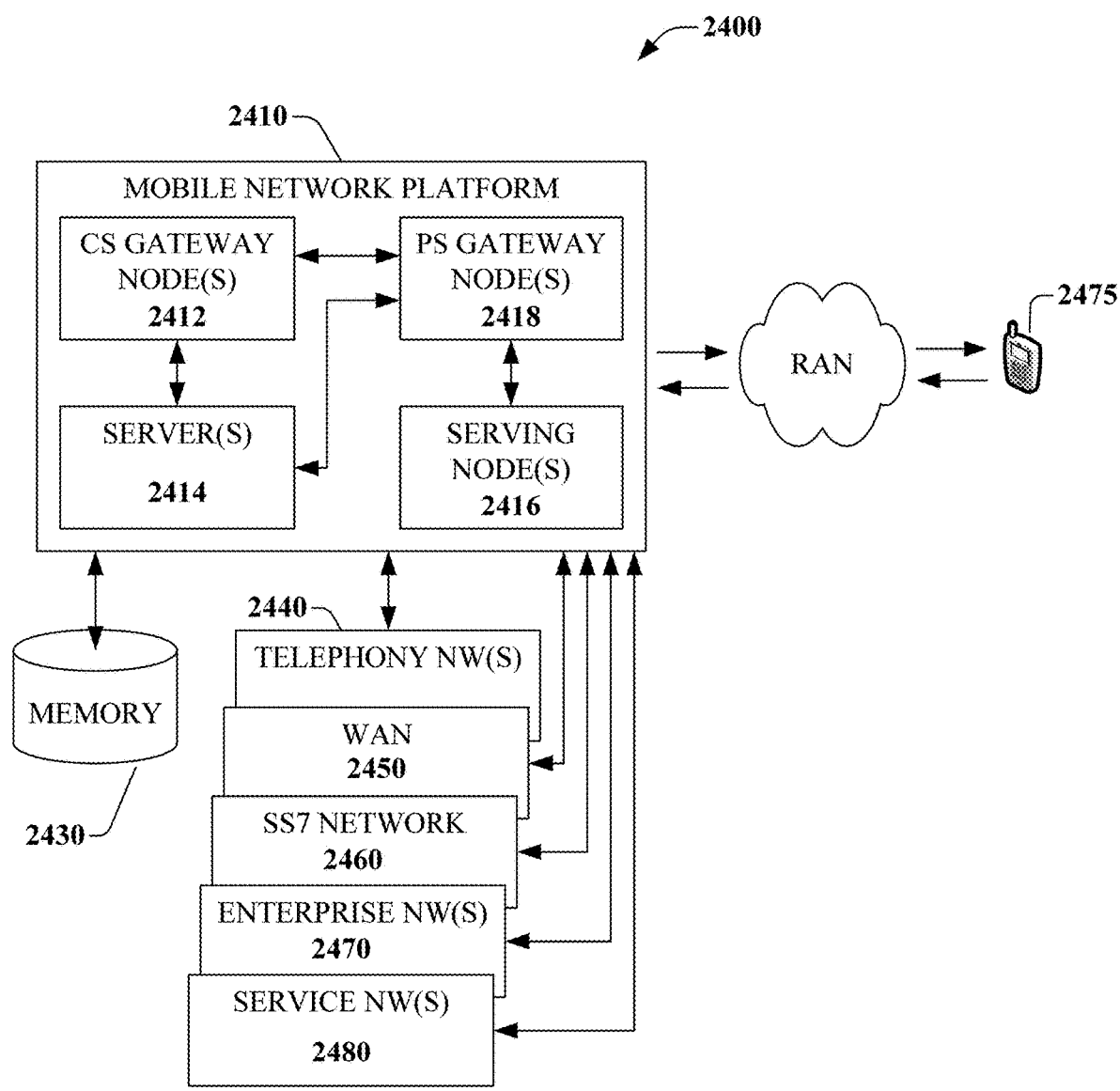
FIG. 24 is a block diagram of an example, non-limiting embodiment of a mobile network platform in accordance with various aspects described herein.

FIG. 24 presents an example embodiment 2400 of a mobile network platform 2410 that can implement and exploit one or more aspects of the disclosed subject matter described herein. In one or more embodiments, the mobile network platform 2410 can generate and receive signals transmitted and received by base stations (e.g., base station devices 1504, macrocell site 1502, or base stations 1614), central office (e.g., central office 1501 or 1611), or transmission device 101 or 102 associated with the disclosed subject matter. Generally, wireless network platform 2410 can comprise components, e.g., nodes, gateways, interfaces, servers, or disparate platforms, that facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, wireless network platform 2410 can be included in telecommunications carrier networks, and can be considered carrier-side components as discussed elsewhere herein. Mobile network platform 2410 comprises CS gateway node(s) 2422 which can interface CS traffic received from legacy networks like telephony network(s) 2440 (e.g., public switched telephone network (PSTN), or public land mobile network (PLMN)) or a signaling system #7 (SS7) network 2470. Circuit switched gateway node(s) 2422 can authorize and authenticate traffic (e.g., voice) arising from such networks. Additionally, CS gateway node(s) 2422 can access mobility, or roaming, data generated through SS7 network 2470; for instance, mobility data stored in a visited location register (VLR), which can reside in memory 2430. Moreover, CS gateway node(s) 2422 interfaces CS-based traffic and signaling and PS gateway node(s) 2418. As an example, in a 3GPP UMTS network, CS gateway node(s) 2422 can be realized at least in part in gateway GPRS support node(s) (GGSN). It should be appreciated that functionality and specific operation of CS gateway node(s) 2422, PS gateway node(s) 2418, and serving node(s) 2416, is provided and dictated by radio technology (ies) utilized by mobile network platform 2410 for telecommunication.

In addition to receiving and processing CS-switched traffic and signaling, PS gateway node(s) 2418 can authorize and authenticate PS-based data sessions with served mobile devices. Data sessions can comprise traffic, or content(s), exchanged with networks external to the wireless network platform 2410, like wide area network(s) (WANs) 2450, enterprise network(s) 2470, and service network(s) 2480, which can be embodied in local area network(s) (LANs), can also be interfaced with mobile network platform 2410 through PS gateway node(s) 2418. It is to be noted that WANs 2450 and enterprise network(s) 2460 can embody, at least in part, a service network(s) like IP multimedia subsystem (IMS). Based on radio technology layer(s) available in technology resource(s) 2417, packet-switched gateway node(s) 2418 can generate packet data protocol contexts when a data session is established; other data structures that facilitate routing of packetized data also can be generated. To that end, in an aspect, PS gateway node(s) 2418 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 2400, wireless network platform 2410 also comprises serving node(s) 2416 that, based upon available radio technology layer(s) within technology resource(s) 2417, convey the various packetized flows of data streams received through PS gateway node(s) 2418. It is to be noted that for technology resource(s) 2417 that rely primarily on CS communication, server node(s) can deliver traffic without reliance on PS gateway node(s) 2418; for example, server node(s) can embody at least in part a mobile switching center. As an example, in a 3GPP UMTS network, serving node(s) 2416 can be embodied in serving GPRS support node(s) (SGSN).

For radio technologies that exploit packetized communication, server(s) 2414 in wireless network platform 2410 can execute numerous applications that can generate multiple disparate packetized data streams or flows, and manage (e.g., schedule, queue, format . . . )) such flows. Such application(s) can comprise add-on features to standard services (for example, provisioning, billing, customer support . . . )) provided by wireless network platform 2410. Data streams (e.g., content(s) that are part of a voice call or data session) can be conveyed to PS gateway node(s) 2418 for authorization/authentication and initiation of a data session, and to serving node(s) 2416 for communication thereafter. In addition to application server, server(s) 2414 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through wireless network platform 2410 to ensure network's operation and data integrity in addition to authorization and authentication procedures that CS gateway node(s) 2422 and PS gateway node(s) 2418 can enact. Moreover, provisioning server(s) can provision services from external network(s) like networks operated by a disparate service provider; for instance, WAN 2450 or Global Positioning System (GPS) network(s) (not shown). Provisioning server(s) can also provision coverage through networks associated to wireless network platform 2410 (e.g., deployed and operated by the same service provider), such as the distributed antennas networks shown in FIG. 1(s) that enhance wireless service coverage by providing more network coverage. Repeater devices such as those shown in FIGS. 7, 8, and 9 also improve network coverage in order to enhance subscriber service experience by way of UE 2475.

It is to be noted that server(s) 2414 can comprise one or more processors configured to confer at least in part the functionality of macro network platform 2410. To that end, the one or more processor can execute code instructions stored in memory 2430, for example. It is should be appreciated that server(s) 2414 can comprise a content manager 2415, which operates in substantially the same manner as described hereinbefore.

In example embodiment 2400, memory 2430 can store information related to operation of wireless network platform 2410. Other operational information can comprise provisioning information of mobile devices served through wireless platform network 2410, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 2430 can also store information from at least one of telephony network(s) 2440, WAN 2450, enterprise network(s) 2470, or SS7 network 2460. In an aspect, memory 2430 can be, for example, accessed as part of a data store component or as a remotely connected memory store.

In order to provide a context for the various aspects of the disclosed subject matter, FIG. 24, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that perform particular tasks and/or implement particular abstract data types.

Figure 25:
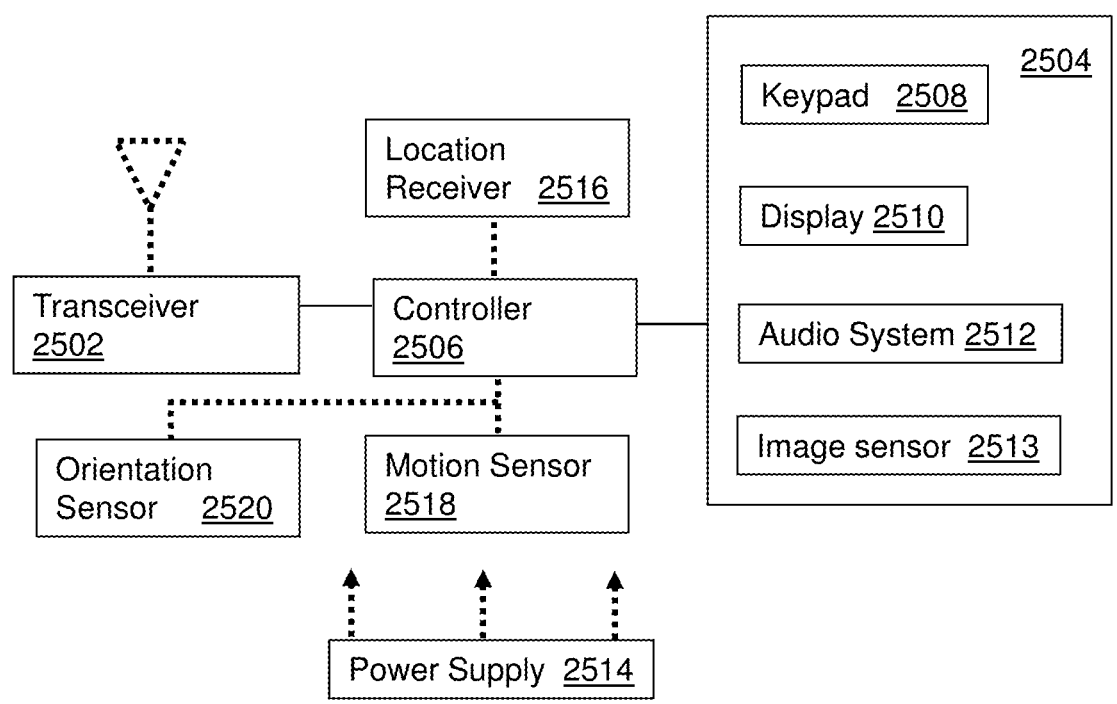
FIG. 25 is a block diagram of an example, non-limiting embodiment of a communication device in accordance with various aspects described herein.

FIG. 25 depicts an illustrative embodiment of a communication device 2500. The communication device 2500 can serve as an illustrative embodiment of devices such as mobile devices and in-building devices referred to by the subject disclosure (e.g., in FIGS. 15, 16A and 16B).

The communication device 2500 can comprise a wireline and/or wireless transceiver 2502 (herein transceiver 2502), a user interface (UI) 2504, a power supply 2514, a location receiver 2516, a motion sensor 2518, an orientation sensor 2520, and a controller 2506 for managing operations thereof. The transceiver 2502 can support short-range or long-range wireless access technologies such as Bluetooth®, ZigBee®, WiFi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-1×, UMTS/HSDPA, GSM/GPRS, TDMA/EDGE, EV/DO, WiMAX, SDR, LTE, as well as other next generation wireless communication technologies as they arise. The transceiver 2502 can also be adapted to support circuit-switched wireline access technologies (such as PSTN), packet-switched wireline access technologies (such as TCP/IP, VoIP, etc.), and combinations thereof.

The UI 2504 can include a depressible or touch-sensitive keypad 2508 with a navigation mechanism such as a roller ball, a joystick, a mouse, or a navigation disk for manipulating operations of the communication device 2500. The keypad 2508 can be an integral part of a housing assembly of the communication device 2500 or an independent device operably coupled thereto by a tethered wireline interface (such as a USB cable) or a wireless interface supporting for example Bluetooth®. The keypad 2508 can represent a numeric keypad commonly used by phones, and/or a QWERTY keypad with alphanumeric keys. The UI 2504 can further include a display 2510 such as monochrome or color LCD (Liquid Crystal Display), OLED (Organic Light Emitting Diode) or other suitable display technology for conveying images to an end user of the communication device 2500. In an embodiment where the display 2510 is touch-sensitive, a portion or all of the keypad 2508 can be presented by way of the display 2510 with navigation features.

The display 2510 can use touch screen technology to also serve as a user interface for detecting user input. As a touch screen display, the communication device 2500 can be adapted to present a user interface having graphical user interface (GUI) elements that can be selected by a user with a touch of a finger. The touch screen display 2510 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 2510 can be an integral part of the housing assembly of the communication device 2500 or an independent device communicatively coupled thereto by a tethered wireline interface (such as a cable) or a wireless interface.

The UI 2504 can also include an audio system 2512 that utilizes audio technology for conveying low volume audio (such as audio heard in proximity of a human ear) and high volume audio (such as speakerphone for hands free operation). The audio system 2512 can further include a microphone for receiving audible signals of an end user. The audio system 2512 can also be used for voice recognition applications. The UI 2504 can further include an image sensor 2513 such as a charged coupled device (CCD) camera for capturing still or moving images.

The power supply 2514 can utilize common power management technologies such as replaceable and rechargeable batteries, supply regulation technologies, and/or charging system technologies for supplying energy to the components of the communication device 2500 to facilitate long-range or short-range portable communications. Alternatively, or in combination, the charging system can utilize external power sources such as DC power supplied over a physical interface such as a USB port or other suitable tethering technologies.

The location receiver 2516 can utilize location technology such as a global positioning system (GPS) receiver capable of assisted GPS for identifying a location of the communication device 2500 based on signals generated by a constellation of GPS satellites, which can be used for facilitating location services such as navigation. The motion sensor 2518 can utilize motion sensing technology such as an accelerometer, a gyroscope, or other suitable motion sensing technology to detect motion of the communication device 2500 in three-dimensional space. The orientation sensor 2520 can utilize orientation sensing technology such as a magnetometer to detect the orientation of the communication device 2500 (north, south, west, and east, as well as combined orientations in degrees, minutes, or other suitable orientation metrics).

The communication device 2500 can use the transceiver 2502 to also determine a proximity to a cellular, WiFi, Bluetooth®, or other wireless access points by sensing techniques such as utilizing a received signal strength indicator (RSSI) and/or signal time of arrival (TOA) or time of flight (TOF) measurements. The controller 2506 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 2500.

Other components not shown in FIG. 25 can be used in one or more embodiments of the subject disclosure. For instance, the communication device 2500 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, non-volatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

Some of the embodiments described herein can also employ artificial intelligence (AI) to facilitate automating one or more features described herein. For example, artificial intelligence can be used in optional training controller 230 evaluate and select candidate frequencies, modulation schemes, MIMO modes, and/or guided wave modes in order to maximize transfer efficiency. The embodiments (e.g., in connection with automatically identifying acquired cell sites that provide a maximum value/benefit after addition to an existing communication network) can employ various AI-based schemes for carrying out various embodiments thereof. Moreover, the classifier can be employed to determine a ranking or priority of the each cell site of the acquired network. A classifier is a function that maps an input attribute vector, $x=(x_1, x_2, x_3, x_4 \ldots x_n)$, to a confidence that the input belongs to a class, that is, $f(x)$=confidence (class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to a predetermined criteria which of the acquired cell sites will benefit a maximum number of subscribers and/or which of the acquired cell sites will add minimum value to the existing communication network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A method, comprising:
   receiving, by a first waveguide system, electromagnetic waves that propagate along a physical transmission medium without requiring an electrical return path;
   responsive to the receiving the electromagnetic waves, detecting, by the first waveguide system, a signal degradation in the electromagnetic waves; and
   coordinating, by the first waveguide system with a second waveguide system, an adjustment of an orientation of at least a portion of electric fields of the electromagnetic waves to mitigate the signal degradation in the electromagnetic waves.

2. The method of claim 1, wherein the coordinating comprises:
   generating, by the first waveguide system, updated electromagnetic waves having an adjusted orientation of at least the portion of electric fields of the electromagnetic waves;
   inducing, by the first waveguide system, propagation of the updated electromagnetic waves along the physical transmission medium; and
   receiving, by the first waveguide system, from the second waveguide system a message indicating a quality of the updated electromagnetic waves.

3. The method of claim 2, wherein the quality of the updated electromagnetic waves is based on a signal to noise ratio.

4. The method of claim 2, wherein the message is received by the first waveguide system as a wireless message.

5. The method of claim 2, wherein the message is included in second electromagnetic waves generated by the second waveguide system, the second electromagnetic waves propagating along the physical transmission medium and received by the first waveguide system.

6. The method of claim 1, wherein the coordinating comprises:
   receiving, by the first waveguide system, updated electromagnetic waves that propagate along the physical transmission medium, the updated electromagnetic waves having an adjusted orientation of at least the portion of electric fields of the electromagnetic waves, and the updated electromagnetic waves being generated by the second waveguide system; and
   sending, by the first waveguide system to the second waveguide system, a message indicating a quality of the updated electromagnetic waves.

7. The method of claim 6, wherein the quality of the updated electromagnetic waves is based on a signal to noise ratio.

8. The method of claim 6, wherein the message is sent to the second waveguide system as a wireless message.

9. The method of claim 6, wherein the message is included in second electromagnetic waves generated by the first waveguide system, wherein the second electromagnetic waves propagate along the physical transmission medium and directed to the second waveguide system.

10. The method of claim 1, further comprising detecting an object causing the signal degradation of the electromagnetic waves.

11. The method of claim 10, wherein the object comprises an accumulation of liquid on an outer surface of the physical transmission medium.

12. The method of claim 1, wherein the adjustment of the orientation of the portion of electric fields of the electromagnetic waves comprises adjusting a polarization of the portion of the electric fields of the electromagnetic waves.

13. The method of claim 12, wherein the polarization comprises an alignment of the portion of the electric fields of the electromagnetic waves that is approximately transversal to a direction of propagation of the electromagnetic waves.

14. The method of claim 1, wherein the coordinating further comprises submitting, by the first waveguide system, a notification message to the second waveguide system of the signal degradation detected by the first waveguide system.

15. A method, comprising:
   transmitting, by a first waveguide system, electromagnetic waves that propagate along a physical transmission medium without requiring an electrical return path; and
   adjusting, by the first waveguide system, an orientation of at least a portion of electric fields of the electromagnetic waves to mitigate a signal degradation determined by a second waveguide system.

16. The method of claim 15, further comprising receiving, by the first waveguide system from the second waveguide system, a message associated with the signal degradation determined by the second waveguide system.

17. The method of claim 16, wherein the message is received by the first waveguide system as a wireless message.

18. A method, comprising:
   determining, by a processing system including a processor, a signal degradation of electromagnetic waves propagating along a physical transmission medium without requiring an electrical return path; and adjusting, by the processing system, a structure of at least a portion of electric fields of the electromagnetic waves to mitigate the signal degradation of the electromagnetic waves.

19. The method of claim 18, wherein the adjusting the structure comprises adjusting an orientation of the electric fields of the electromagnetic waves.

20. The method of claim 18, wherein the determining the signal degradation of the electromagnetic waves comprises:
   determining a signal to noise ratio for the electromagnetic waves; and
   determining that the signal to noise ratio does not satisfy a threshold.

* * * * *